US012545698B2

(12) United States Patent
Che et al.

(10) Patent No.: US 12,545,698 B2
(45) Date of Patent: Feb. 10, 2026

(54) DINUCLEAR PLATINUM (II) RED EMITTERS FOR OLED APPLICATIONS

(71) Applicants: Versitech Limited, Hong Kong (CN); Hong Kong Quantum AI Lab Limited, Hong Kong (CN)

(72) Inventors: Chi-Ming Che, Hong Kong (CN); Minying Xue, Hong Kong (CN); Tsz-Lung Lam, Hong Kong (CN)

(73) Assignees: Versitech Limited, Hong Kong (CN); Hong Kong Quantum AI Lab Limited, Hong Kong (CN)

( * ) Notice: Subject to any disclaimer, the term of this patent is extended or adjusted under 35 U.S.C. 154(b) by 137 days.

(21) Appl. No.: 18/563,295

(22) PCT Filed: May 31, 2022

(86) PCT No.: PCT/CN2022/096294
§ 371 (c)(1),
(2) Date: Nov. 21, 2023

(87) PCT Pub. No.: WO2022/253231
PCT Pub. Date: Dec. 8, 2022

(65) Prior Publication Data
US 2024/0324441 A1 Sep. 26, 2024

Related U.S. Application Data

(60) Provisional application No. 63/195,139, filed on May 31, 2021.

(51) Int. Cl.
*C07F 15/00* (2006.01)
*C09K 11/06* (2006.01)
(Continued)

(52) U.S. Cl.
CPC .......... *C07F 15/0086* (2013.01); *C09K 11/06* (2013.01); *H10K 50/12* (2023.02);
(Continued)

(58) Field of Classification Search
None
See application file for complete search history.

(56) References Cited

U.S. PATENT DOCUMENTS 10,424,746 B2 * 9/2019 Metz ................... H10K 85/341
12,116,378 B2 10/2024 Yam et al.
(Continued)

FOREIGN PATENT DOCUMENTS

CN 1894269 A 1/2007
CN 101667626 A 3/2010
(Continued)

OTHER PUBLICATIONS

Liu, et al., "Multiresponsive Tetradentate Phosphorescent Metal Complexes as Highly Sensitive and Robust Luminescent Oxygen Sensors: Pd(II) Versus Pt(II) and 1,2,3-Triazolyl Versus 1,2,4-Triazolyl", Applied Materials & Interfaces, vol. 11, No. 13, Mar. 11, 2019, pp. 12666-12674.
(Continued)

*Primary Examiner* — Katie L. Hammer
(74) *Attorney, Agent, or Firm* — Pabst Patent Group LLP

(57) ABSTRACT

Platinum (II) complexes ("Pt(II) complexes") that can emit in the red and/or deep red regions and methods of making and using thereof are described. These Pt(II) complexes can have dinuclearity with close Pt—Pt contact and close interplanar distance, allowing for high emission quantum yield, such as >50%, short emission lifetime, such as <3 μs, and high radiative decay rate, such as in the order of $10^5$ $s^{-1}$. The Pt(II) complexes disclosed herein can be included in organic light-emitting devices, such as organic light-emitting diodes
(Continued)

1a

Pt-Pt: 2.856 Å

("OLEDs"), for use in commercial applications. OLEDs containing these red-emitting Pt(II) complexes can have current efficiency and/or external quantum efficiency that are comparable or higher than commercially available red emitters and prolonged operational lifetime, such as a LT95 at 1000 nits>9000 h for a red OLED.

22 Claims, 25 Drawing Sheets

(51) Int. Cl.
  *H10K 50/11* (2023.01)
  *H10K 50/12* (2023.01)
  *H10K 71/12* (2023.01)
  *H10K 71/13* (2023.01)
  *H10K 71/16* (2023.01)
  *H10K 85/30* (2023.01)

(52) U.S. Cl.
  CPC ......... *H10K 85/346* (2023.02); *H10K 85/361* (2023.02); *C09K 2211/185* (2013.01); *H10K 50/11* (2023.02); *H10K 71/12* (2023.02); *H10K 71/135* (2023.02); *H10K 71/164* (2023.02)

(56) References Cited

U.S. PATENT DOCUMENTS

| | | | |
|---|---|---|---|
| 2002/0034656 | A1 | 3/2002 | Thompson et al. |
| 2002/0117662 | A1 | 8/2002 | Nii |
| 2002/0179885 | A1 | 12/2002 | Che et al. |
| 2005/0123751 | A1 | 6/2005 | Tsutsui et al. |
| 2006/0091378 | A1 | 5/2006 | Yam et al. |
| 2008/0036373 | A1 | 2/2008 | Itoh et al. |
| 2009/0206735 | A1 | 8/2009 | Yersin et al. |
| 2013/0228758 | A1 | 9/2013 | Yam et al. |
| 2015/0194616 | A1 | 7/2015 | Li et al. |
| 2017/0365803 | A1* | 12/2017 | Metz ................... H10K 85/657 |
| 2018/0194790 | A1 | 7/2018 | Li et al. |
| 2020/0172562 | A1 | 6/2020 | Yam et al. |
| 2020/0176691 | A1 | 6/2020 | Yam et al. |
| 2023/0165135 | A1 | 5/2023 | Tang et al. |
| 2024/0023360 | A1 | 1/2024 | Mao et al. |
| 2024/0049591 | A1 | 2/2024 | Lo et al. |
| 2024/0083931 | A1 | 3/2024 | Lo et al. |
| 2024/0124494 | A1 | 4/2024 | Che et al. |
| 2024/0247187 | A1 | 7/2024 | Che et al. |
| 2024/0276867 | A1 | 8/2024 | Che et al. |

FOREIGN PATENT DOCUMENTS

| | | |
|---|---|---|
| CN | 102227438 A | 10/2011 |
| CN | 102532003 A | 7/2012 |
| CN | 102666560 A | 9/2012 |
| CN | 102971396 A | 3/2013 |
| CN | 107074895 A | 8/2017 |
| CN | 107880078 A | 4/2018 |
| CN | 108148578 A | 6/2018 |
| CN | 108218878 A | 6/2018 |
| CN | 109841759 A | 6/2019 |
| CN | 110256500 A | 9/2019 |
| CN | 111320613 A | 6/2020 |
| CN | 111662334 A | 9/2020 |
| WO | 2011137429 A2 | 11/2011 |
| WO | 2012102243 A1 | 8/2012 |
| WO | 2013161515 A1 | 10/2013 |
| WO | 2014031977 A1 | 2/2014 |
| WO | 2014128843 A1 | 8/2014 |
| WO | 2014203385 A1 | 12/2014 |
| WO | 2016025921 A1 | 2/2016 |
| WO | 2016079169 A1 | 5/2016 |
| WO | 2019015658 A1 | 1/2019 |
| WO | 2019079505 A1 | 4/2019 |

OTHER PUBLICATIONS

International Search Report received for PCT Patent Application No. PCT/CN2021/127397, mailed on Jan. 25, 2022, 3 pages.
International Search Report received for PCT Patent Application No. PCT/CN2022/096225, mailed on Sep. 8, 2022, 3 pages.
International Search Report received for PCT Patent Application No. PCT/CN2022/096226, mailed on Sep. 8, 2022, 3 pages.
International Search Report received for PCT Patent Application No. PCT/CN2022/096294, mailed on Sep. 7, 2022, 4 pages.
Forrest, Stephen R, "Waiting for Act 2: what lies beyond organic lightemitting diode (OLED) displays for organic electronics?", Nanophotonics., vol. 10, No. 1, 2021, pp. 31-40.
Hirano, et al., "A modular synthesis of highly substituted imidazolium salts", Org Lett., vol. 11, No. 4, Feb. 19, 2009, pp. 1019-1022.
Hong, et al., "A Brief History of OLEDs-Emitter Development and Industry Milestones", Adv Mater., vol. 33, No. 9; e2005630, Mar. 2021, 24 pages.
Jou, et al., "Correction: Approaches for fabricating high efficiency organic light emitting diodes", Journal of Materials Chemistry C., vol. 1, No. 3, Feb. 2015, pp. 2974-3002.
Lee, et al., "Progress in organic semiconducting materials with high thermal stability for organic light-emitting devices", InfoMat., vol. 3, No. 1, Jan. 2021, pp. 61-81.
Leopold, et al., "Binuclear C/\C* Cyclometalated Platinum(II) NHC Complexes with Bridging Amidinate Ligands", Angew Chem Int Ed Engl., vol. 55, No. 51, Dec. 19, 2016, pp. 15779-15782.
Pinter, et al., "Enhanced Photoluminescence Quantum Yields through Excimer Formation of Cyclometalated Platinum(II) N-Heterocyclic Carbene Complexes", Organometallics., vol. 35, No. 5, Mar. 2, 2016, pp. 673-680.
Pinter, et al., "Metallophilic Interactions in Bimetallic Cyclometalated Platinum(II) N-Heterocyclic Carbene Complexes", European Journal of Inorganic Chemistry, vol. 2021, No. 30, Aug. 13, 2021, pp. 3104-3107.
Pinter, et al., "Photophysical Properties of Phosphorescent Mono- and Bimetallic Platinum(II) Complexes with C /\ C* Cyclometalating NHC Ligands", Organometallics, vol. 40, No. 4, Feb. 8, 2021, pp. 557-563.
Pinter, et al., "Sky-Blue Triplet Emitters with Cyclometalated Imidazopyrazine-Based NHC-Ligands and Aromatic Bulky Acetylacetonates", Chemistry., vol. 25, No. 64, Nov. 18, 2019, pp. 14495-14499.
Wang, et al., "Near-Infrared Emission Induced by Shortened Pt-Pt Contact: Diplatinum(II) Complexes with Pyridyl Pyrimidinato Cyclometalates", Inorg Chem., vol. 58, No. 20, Oct. 21, 2019, pp. 13892-13901.
Leopold, et al., "Binuclear C/\C* Cyclometalated Platinum(II) NHC Complexes with Bridging Amidinate Ligands", Angew chem, vol. 128, 2016, pp. 16011-16014.

* cited by examiner

DINUCLEAR PLATINUM (II) RED EMITTERS FOR OLED APPLICATIONS

CROSS-REFERENCE TO RELATED APPLICATION

This application is a National Phase application under 35 U.S.C. 371 of PCT/CN2022/096294, filed May 31, 2022, which claims benefit of and priority to U.S. Provisional Application No. 63/195,139 filed May 31, 2021, which are incorporated herein by reference in their entirety.

FIELD OF THE INVENTION

This invention is generally in the field of platinum (II) complexes and their use as red emitters.

BACKGROUND OF THE INVENTION

Transition metal complexes have gained significant interest in commercial and academic settings as molecular probes, catalysts, and luminescent materials. As luminescent materials, transition metal complexes are increasingly being explored as potential alternatives to pure organic-based materials due to their potential for improved luminescence efficiency compared to pure organic-based materials.

There has been growing attention and efforts in adopting luminescent $d^8$ planar metal complexes (e.g., Pt(II) and Au(III) complexes) as OLED emitters. However, development of high-efficiency red/deep red emitting Pt(II) complexes is still a challenge. According to the energy gap law, the non-radiative decay rate would increase with decreasing energy gap between the excited state and ground state. The emission quantum yield of red-emitting phosphorescent complexes would be lower than those of blue- and green-emitting phosphorescent complexes, assuming that their radiative decay rates are the same. Currently available red-emitting Pt(II) complexes suffer from low room temperature emission quantum yield (i.e., <50%), long emission lifetime (i.e., >3 μs), and short operational lifetime in OLEDs.

There remains a need for Pt(II) complexes that can emit in the red and/or deep red regions.

Therefore, it is the object of the present invention to provide Pt(II) complexes that emit in the red and/or deep red regions.

It is a further object of the present invention to provide devices containing the Pt(II) complexes that emit in the red and/or deep red regions.

It is a further object of the present invention to provide methods for using the Pt(II) complexes that emit in the red and/or deep red regions.

SUMMARY OF THE INVENTION

Platinum (II) complexes ("Pt(II) complexes") that can emit in the red and/or deep red regions and methods of making and using thereof are described. These Pt(II) complexes can have dinuclearity with close Pt—Pt contact and close interplanar distance, allowing for high emission quantum yield and high radiative decay rate, such as in the order of $10^5$ s$^{-1}$.

The Pt(II) complexes can have the structure of Formula I':

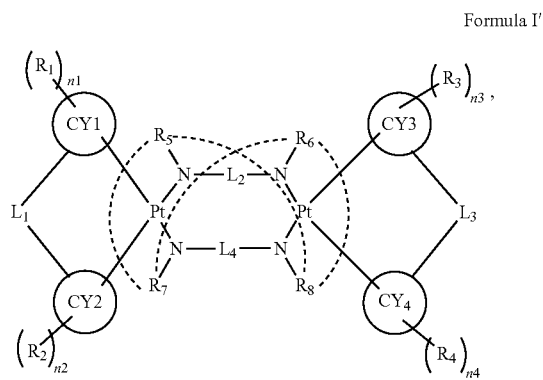

Formula I' where: (a) the compound can have an overall neutral, negative, or positive charge; (b) CY1, CY2, CY3, and CY4 can be independently substituted or unsubstituted aryl, substituted or unsubstituted polyaryl, substituted or unsubstituted heteroaryl, substituted or unsubstituted polyheteroaryl, substituted or unsubstituted heterocyclyl, substituted or unsubstituted cycloalkyl, substituted or unsubstituted cycloalkenyl, or substituted or unsubstituted cycloalkynyl; (c) $R_1$, $R_2$, $R_3$, and $R_4$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol; (d) n1, n2, n3, and n4 can be independently an integer between zero and 10; (e) $L_1$ and $L_3$ can be independently a bond (single, double, or triple), absent, oxygen, sulfur, amino, amido, substituted or unsubstituted alkyl, substituted or unsubstituted alkenyl, carbonyl, sulfonyl, sulfonic acid, phosphoryl, or phosphonyl; (f) $R_5$, $R_6$, $R_7$, and $R_8$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy; (g) $L_2$ and $L_4$ can be independently a bond (single, double, or triple), substituted or unsubstituted alkyl, substituted or unsubstituted alkenyl, amino, amido, or carbonyl; (h) ------ can be absent, a bond (single, double, or triple), a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether; and (i) the substituents can be independently a substituted or unsubstituted alkyl, a substituted or unsubstituted alkenyl, a substituted or unsubstituted alkynyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, a substituted or unsubstituted aralkyl, a substituted or unsubstituted carbonyl, a substituted or unsubstituted alkoxy, a halogen, a hydroxyl, a phenoxy, an aroxy, an alkylthio, a phenylthio, an arylthio, a cyano, an isocyano, a nitro, an carboxyl, an amino, an amido, an oxo, a silyl, a sulfinyl, a sulfonyl, a sulfonic acid, a phosphonium, a phosphanyl, a phosphoryl, a phosphonyl, or a thiol, or a combination thereof.

In some forms, the platinum (II) complex can have the structure of Formula I or I":

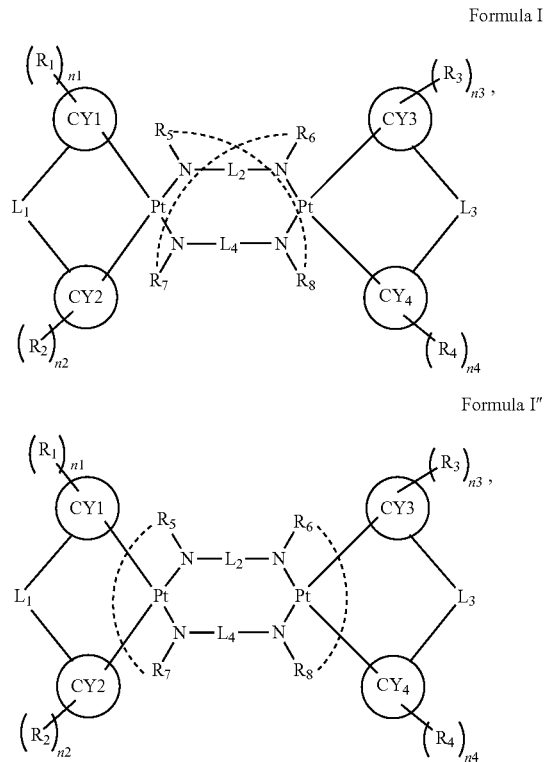

Formula I

Formula I"

In some forms, the platinum (II) complex can have the structure of Formula II or II':

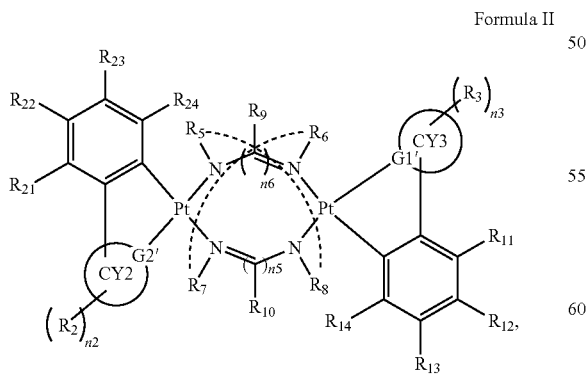

Formula II

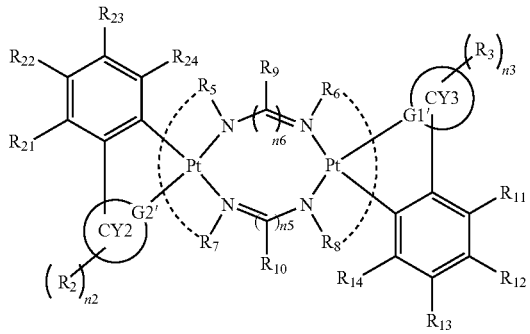

Formula II' where: (a) CY2 and CY3 can be independently substituted or unsubstituted aryl, substituted or unsubstituted polyaryl, substituted or unsubstituted heteroaryl, substituted or unsubstituted polyheteroaryl, substituted or unsubstituted heterocyclyl, substituted or unsubstituted cycloalkyl, substituted or unsubstituted cycloalkenyl, or substituted or unsubstituted cycloalkynyl; (b) $R_2$ and $R_3$ can be independently hydrogen, substituted or unsubstituted alkyl, substituted or unsubstituted aryl, substituted or unsubstituted polyaryl, substituted or unsubstituted heteroaryl, substituted or unsubstituted polyheteroaryl, substituted or unsubstituted heterocyclyl, amino, alkoxy, or aroxy; (c) n2, n3, n5, and n6 can be independently an integer between zero and 10; (d) $R_5$, $R_6$, $R_7$, and $R_8$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy; (e) $R_9$-$R_{14}$ and $R_{21}$-$R_{24}$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol; (f) G1' and G2' can be independently C or N; (g) ------ can be absent, a bond (single, double, or triple), a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether; and (h) the substituents can be as defined above for Formula I.

In some forms, the platinum (II) complex can have the structure of Formula III or III''':

Formula III

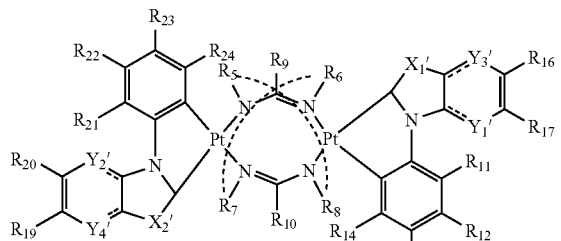

Formula III'''

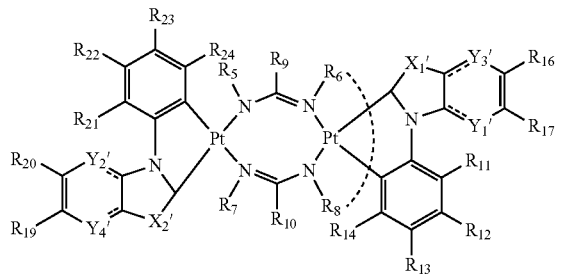

Formula IV

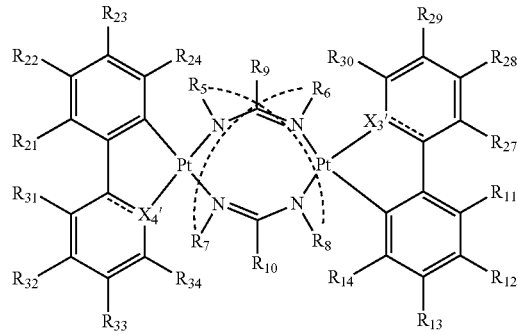

Formula IV'

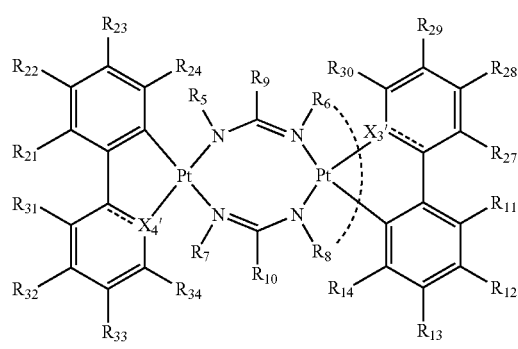

where: (a) $R_5$, $R_6$, $R_7$, and $R_8$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy; (b) $R_9$-$R_{24}$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol; (c) each ------ can be independently absent, a bond (single, double, or triple), a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether; (d) $X_1'$, $X_2'$, $Y_1'$, $Y_2'$, $Y_3'$, and $Y_4'$ can be independently O, S, $CR_{15}$, or $NR_{18}$, $R_{15}$ and $R_{18}$ can be independently absent, hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol; and (e) the substituents can be as defined above for Formula I.

In some forms, the platinum (II) complex can have the structure of Formula IV or IV':

where: (a) $R_5$, $R_6$, $R_7$, and $R_8$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy; (b) $R_9$-$R_{24}$ and $R_{27}$-$R_{34}$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol; (c) each ------ can be independently absent, a bond (single, double, or triple), a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether; (d) $X_3'$ and $X_4'$ can be independently O, S, $CR_{25}$, or $NR_{26}$, $R_{25}$ and $R_{26}$ can be independently absent, hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol; and (e) the substituents can be as defined above for Formula I.

In some forms, $R_{11}$, $R_{12}$, $R_{21}$, $R_{22}$ can be hydrogen or $R_{11}$ and $R_{12}$ together can forms and/or $R_{21}$ and $R_{22}$ together can form the structure of Formula V:

Formula V

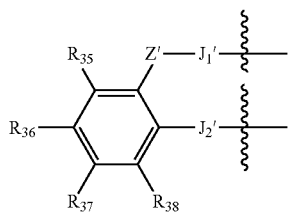

where: (a) Z' can be O, S, $CR_{39}$, or $NR_{40}$, $R_{39}$ and $R_{40}$ can be independently absent, hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol; (b) $J_1'$ and $J_2'$ can be independently

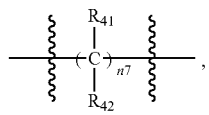

$R_{41}$ and $R_{42}$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol, and optionally $J_1'$ and $J_2'$ together form a substituted or unsubstituted cycloalkyl, a substituted or unsubstituted cycloalkenyl, or a substituted or unsubstituted cycloalkynyl; (c) n7 can be independently an integer from 0 to 4; and (d) $R_{35}$-$R_{38}$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol.

In some forms, the ------ between $R_5$ and $R_8$, between $R_6$ and $R_7$, between $R_5$ and $R_7$, and/or between $R_6$ and $R_8$ can be absent, a single bond, a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether. In some forms,

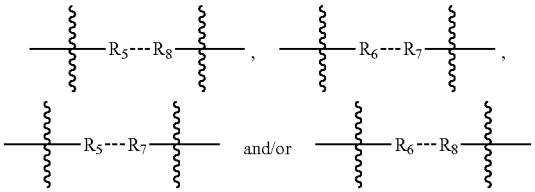

can have a structure:

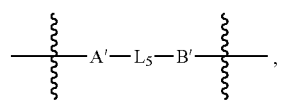

where: (a) A' and B' can be independently substituted or unsubstituted cycloalkyl, substituted or unsubstituted cycloalkenyl, substituted or unsubstituted cycloalkynyl, substituted or unsubstituted aryl, substituted or unsubstituted polyaryl, substituted or unsubstituted heteroaryl, substituted or unsubstituted polyheteroaryl, or substituted or unsubstituted heterocyclyl; and (b) each occurrence of $L_5$ can be independently ether, polyether, alkoxyl, thioether, sulfonyl, substituted or unsubstituted heterocyclyl, substituted or unsubstituted aryl, substituted or unsubstituted alkyl, substituted or unsubstituted alkenyl, or substituted or unsubstituted alkynyl. In some forms, A' and B' can be independently substituted or unsubstituted aryl or substituted or unsubstituted polyaryl; and $L_5$ can have a structure:

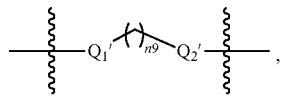

where: (a) $Q_1'$ and $Q_2'$ can be independently O or S; and (b) n9 can be an integer from 1 to 10, such as from 1 to 6, e.g. 1, 2, or 6.

The Pt(II) complexes disclosed herein can be included in organic light-emitting devices, such as organic light-emitting diodes ("OLEDs"), for use in commercial applications.

BRIEF DESCRIPTION OF THE DRAWINGS

FIGS. 1A-1F are schematics showing the X-ray crystal structures of Pt(II) complexes 1a (FIG. 1A), 1b (FIG. 1B), 3a (FIG. 1C), 3b (FIG. 1D), 1c (FIG. 1E), and 2b' (FIG. 1F).

DETAILED DESCRIPTION OF THE INVENTION

I. Definitions

Figure 1A:
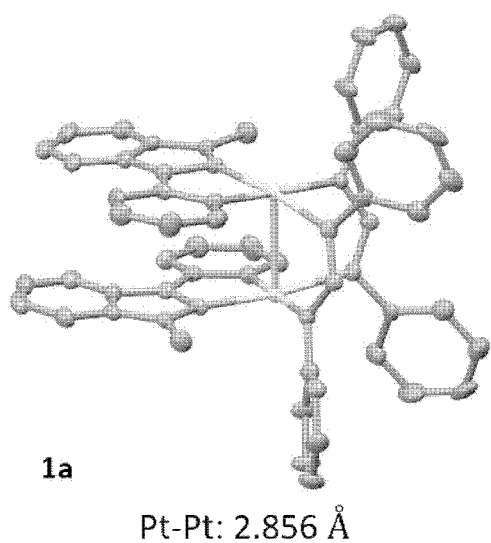
Figure 1B:
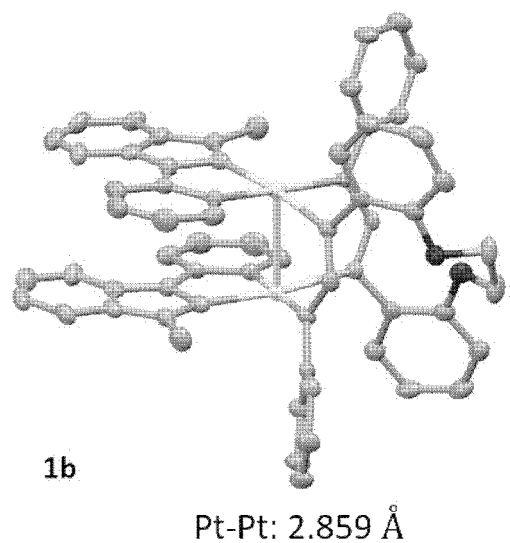
Figure 1C:
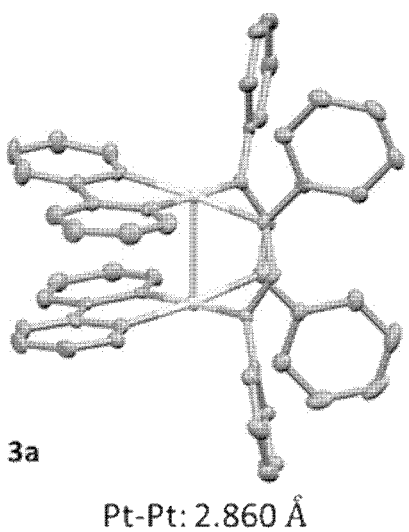
Figure 1D:
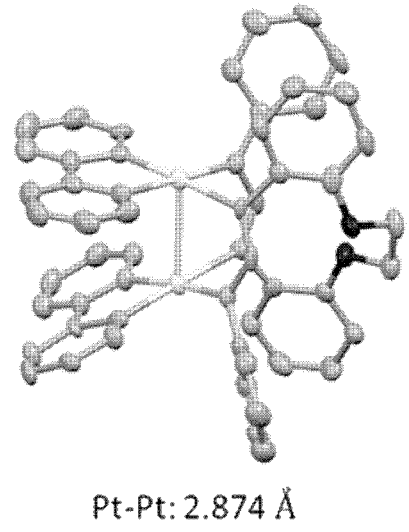
Figure 2A:
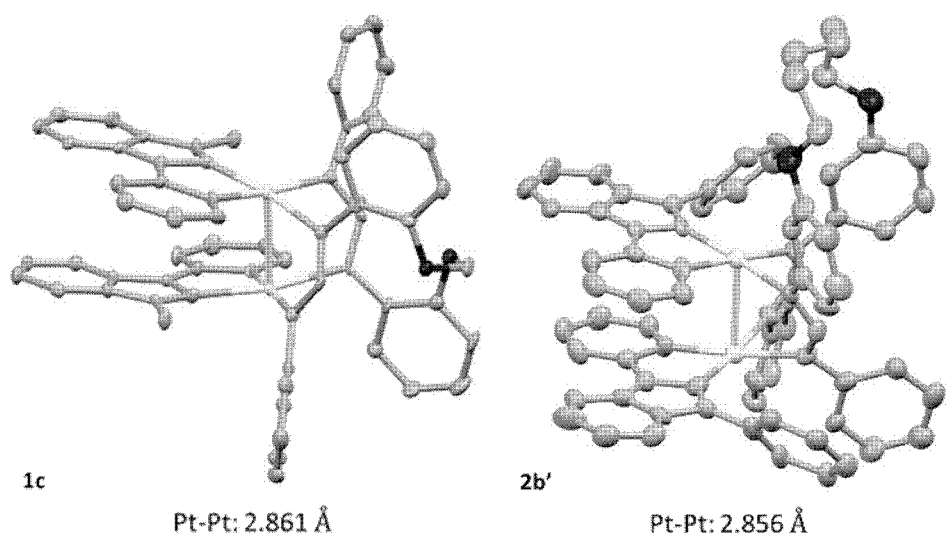
FIGS. 2A-2H are graphs showing the emission spectra of Pt(II) complex 1a and 1b in PMMA (FIG. 2A) and MCP (FIG. 2B) films, Pt(II) complex 1b-1d and 1b'-1d' in PMMA (FIG. 2C) and MCP (FIG. 2D) films, Pt(II) complex 2a-4a and 3b in PMMA (FIG. 2E) and MCP (FIG. 2F) films, and Pt(II) complex 2b and 2b' in $CH_2Cl_2$ (FIG. 2G) and PMMA (FIG. 2H), at room temperature.
Figure 2A:
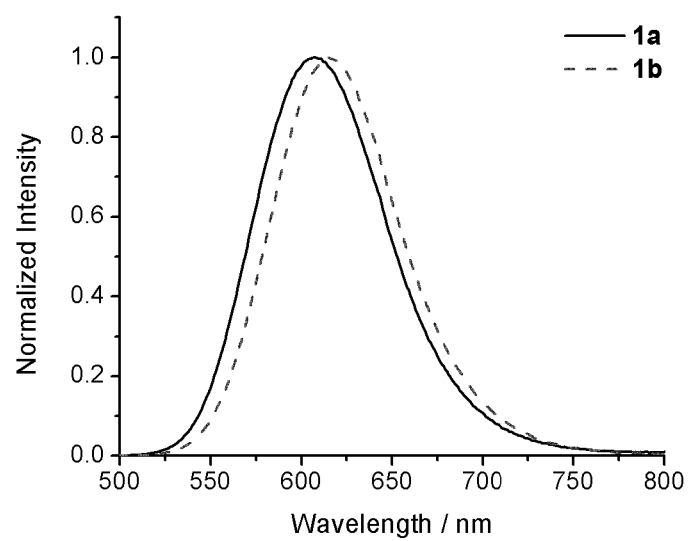
Figure 2B:
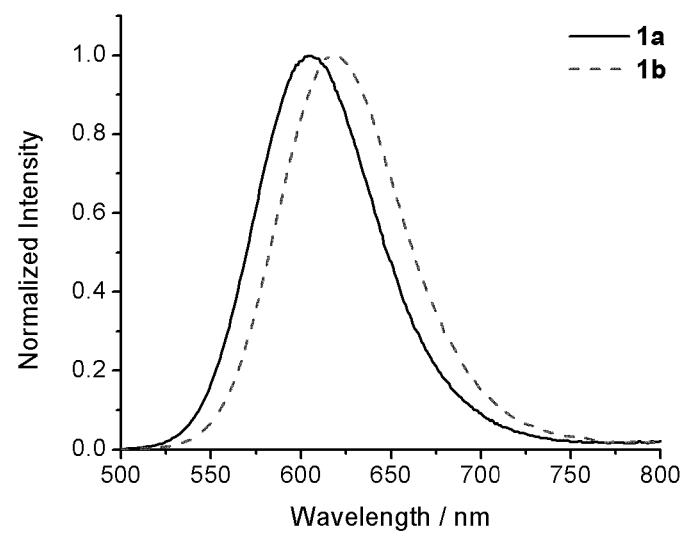
Figure 2C:
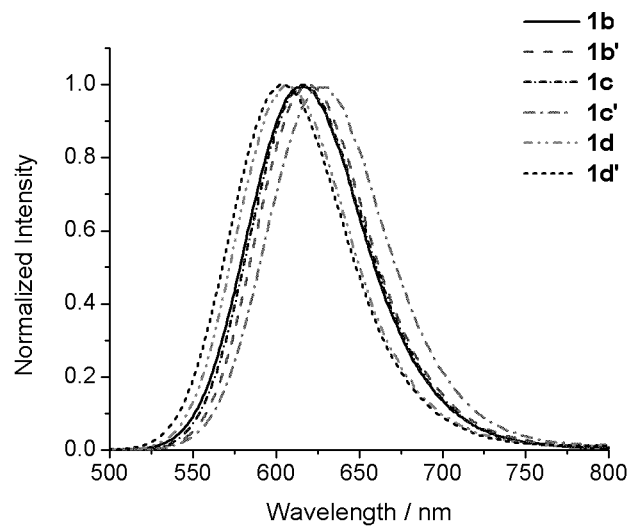
Figure 2D:
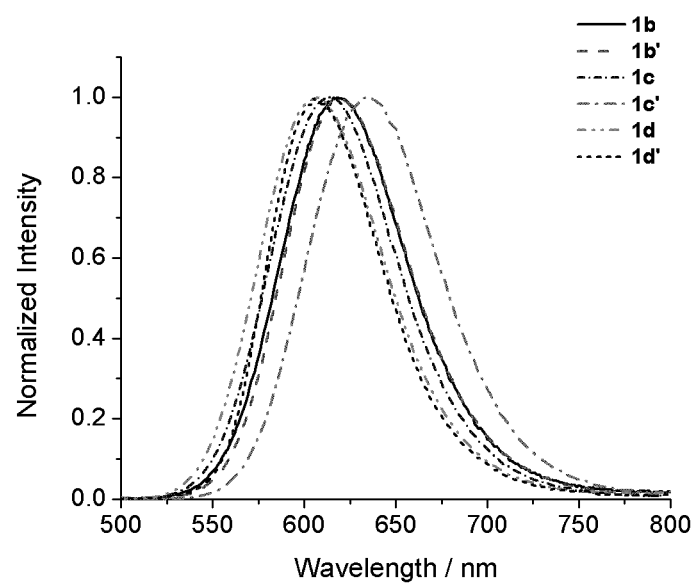
Figure 2E:
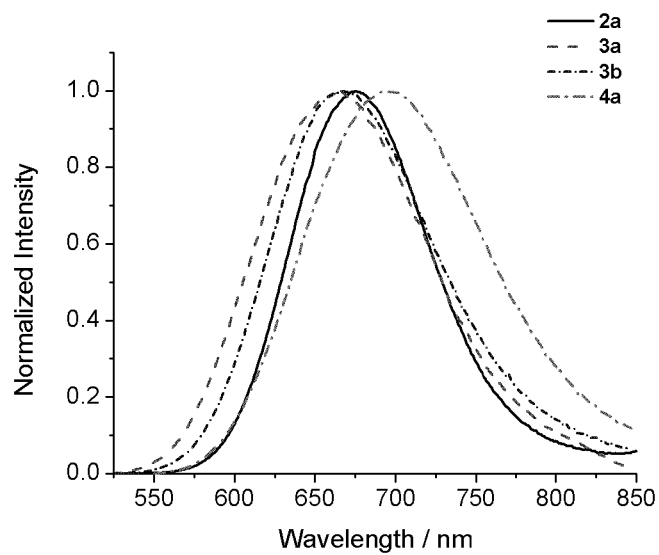
Figure 2F:
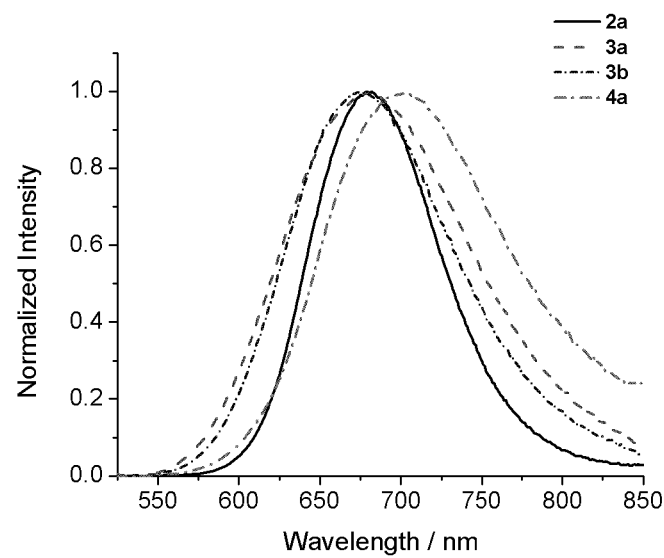
Figure 2G:
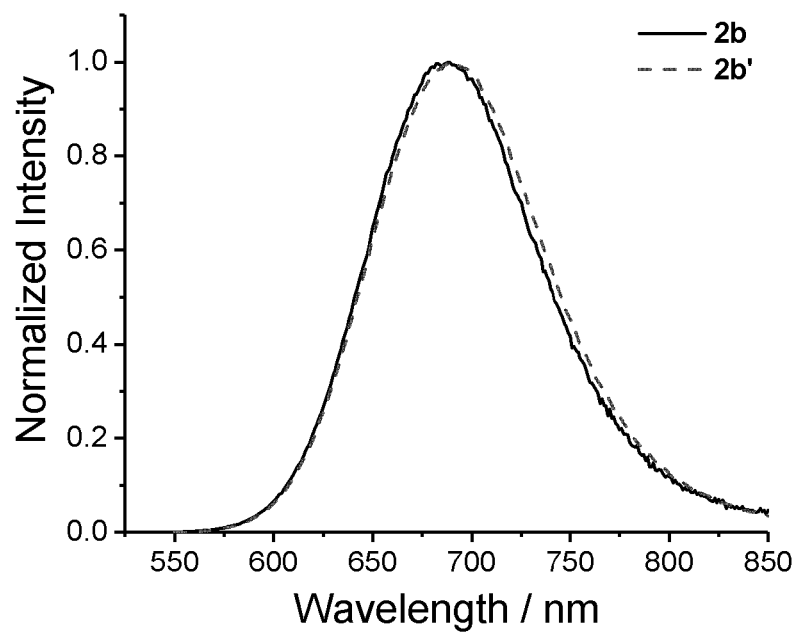
Figure 2H:
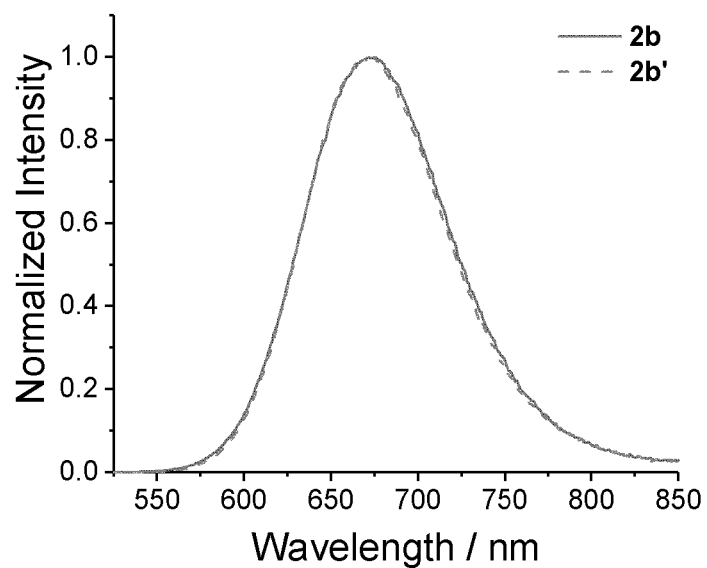
Figure 3A:
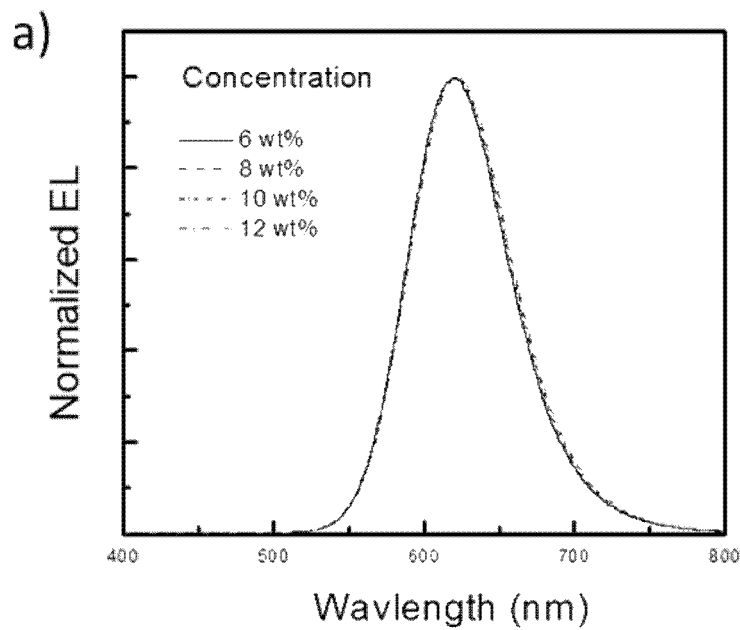
FIGS. 3A-3D are graphs showing the electrochemiluminescence ("EL") spectra (FIG. 3A), external quantum efficiency (FIG. 3B), luminance (FIG. 3C), and current density (FIG. 3D) of devices (system I) containing Pt(II) complex 1a at doping concentrations of 6 wt %, 8 wt %, 10 wt %, and 12 wt %. System I device structure: ITO/HAT-CN (5 nm)/TAPC (20 nm)/Tris-PCz (10 nm)/Tris-PCz:B4PYPPM:Pt-1a (30 nm)/B4PYPPM (50 nm)/Liq (1 nm)/Al (100 nm).
Figure 3B:
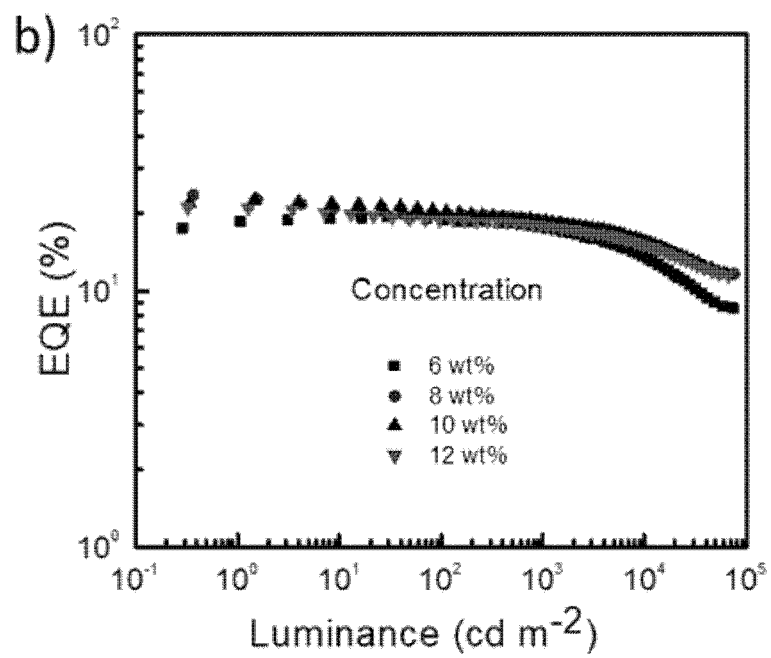
Figure 3C:
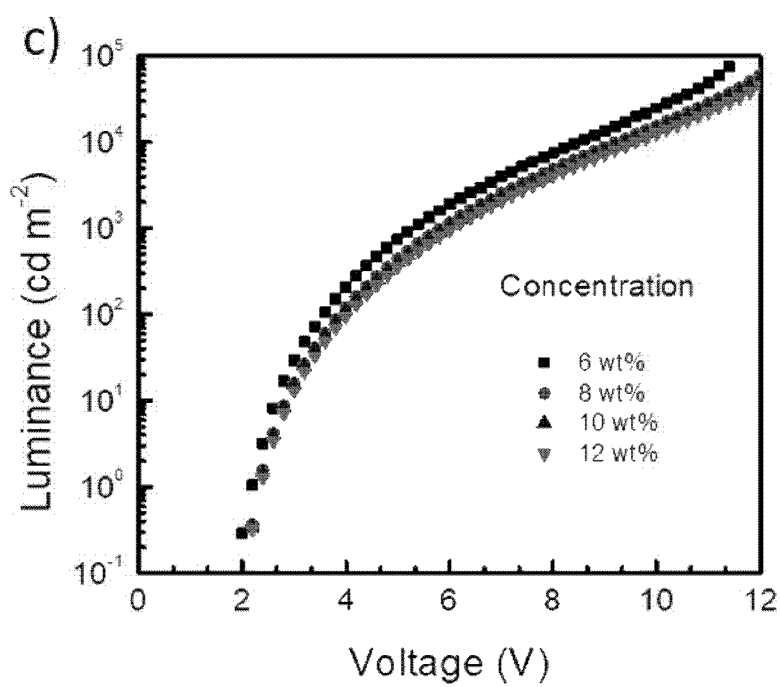
Figure 3D:
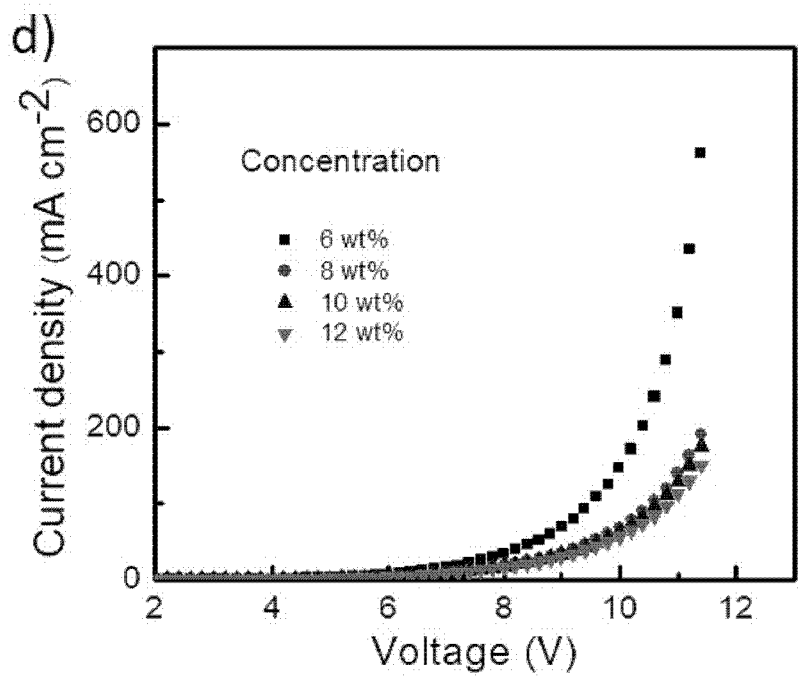
Figure 4A:
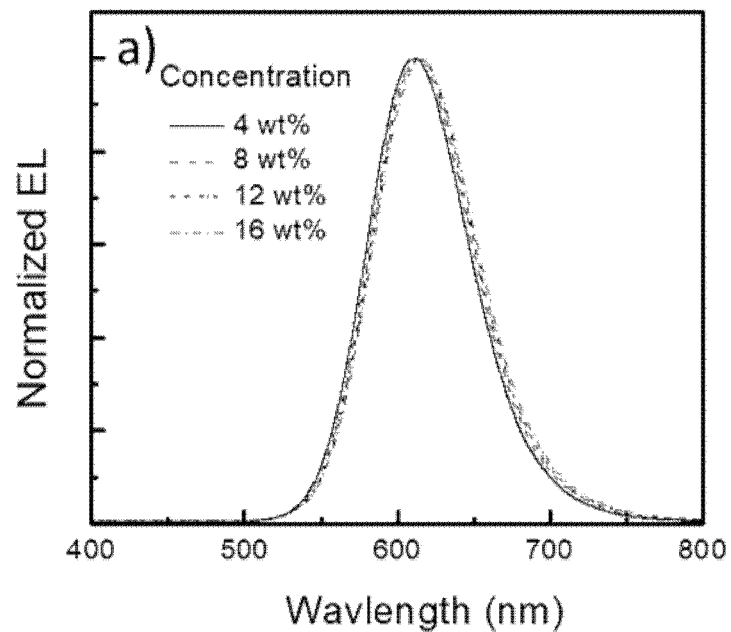
FIGS. 4A-4D are graphs showing the EL spectra (FIG. 4A), external quantum efficiency (FIG. 4B), luminance (FIG. 4C), and current density (FIG. 4D) of devices (system II) containing Pt(II) complex 1a at doping concentrations of 4 wt %, 8 wt %, 12 wt %, and 16 wt %. System II device structure: ITO/HAT-CN (5 nm)/TAPC (40 nm)/TCTA (10 nm)/TCTA:TPBi:Pt-1a/TPBi (10 nm)/TmPyPb(40 nm)/LiF (1.2 nm)/Al (100 nm).
Figure 4B:
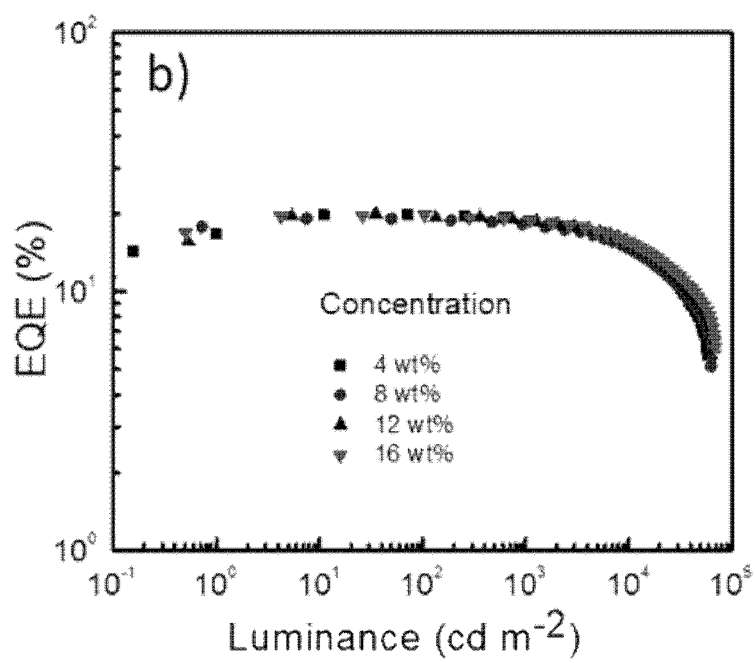
Figure 4C:
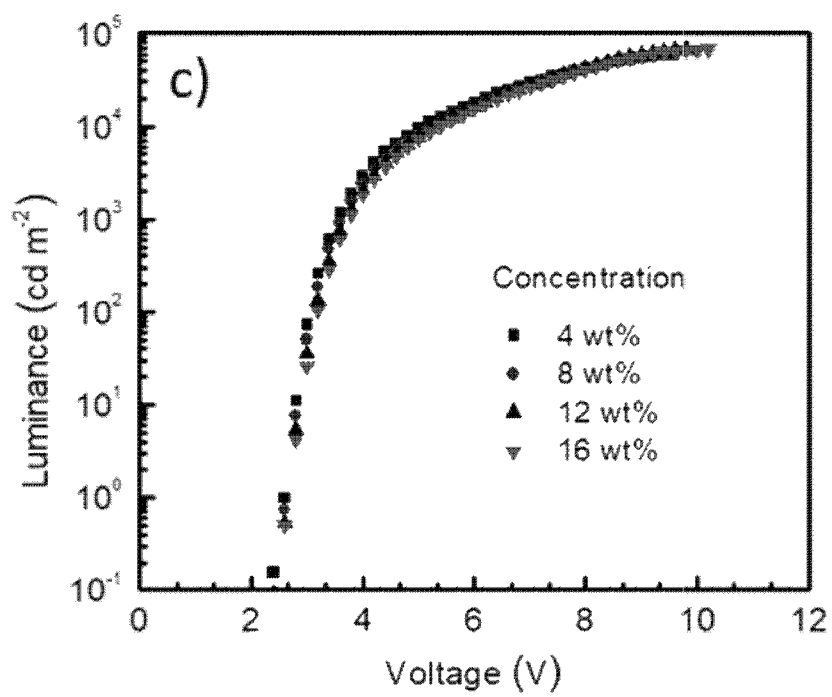
Figure 4D:
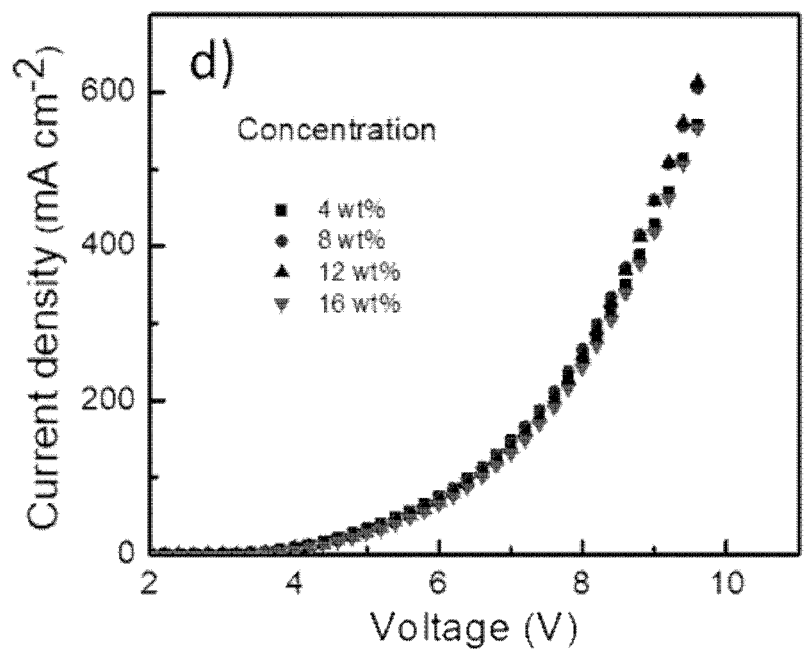
Figure 5A:
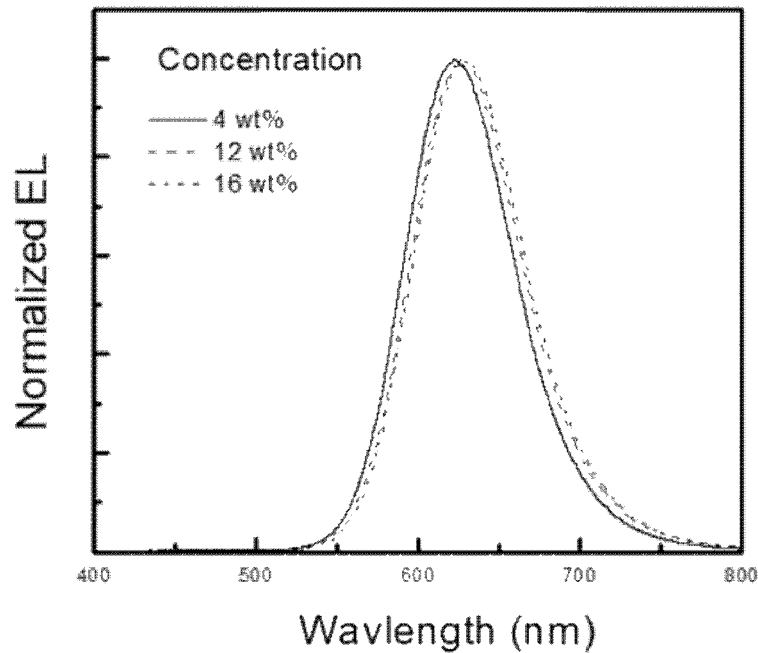
FIGS. 5A-5D are graphs showing the EL spectra (FIG. 5A), external quantum efficiency (FIG. 5B), luminance (FIG. 5C), and current density (FIG. 5D) of devices containing Pt(II) complex 1b at doping concentrations of 4 wt %, 12 wt %, and 16 wt %. Device structure: ITO/HAT-CN (5 nm)/TAPC (40 nm)/TCTA (10 nm)/TCTA:TPBi:Pt-1b (20 nm)/TPBi (40 nm)/LiF (1.2 nm)/Al (100 nm).
Figure 5B:
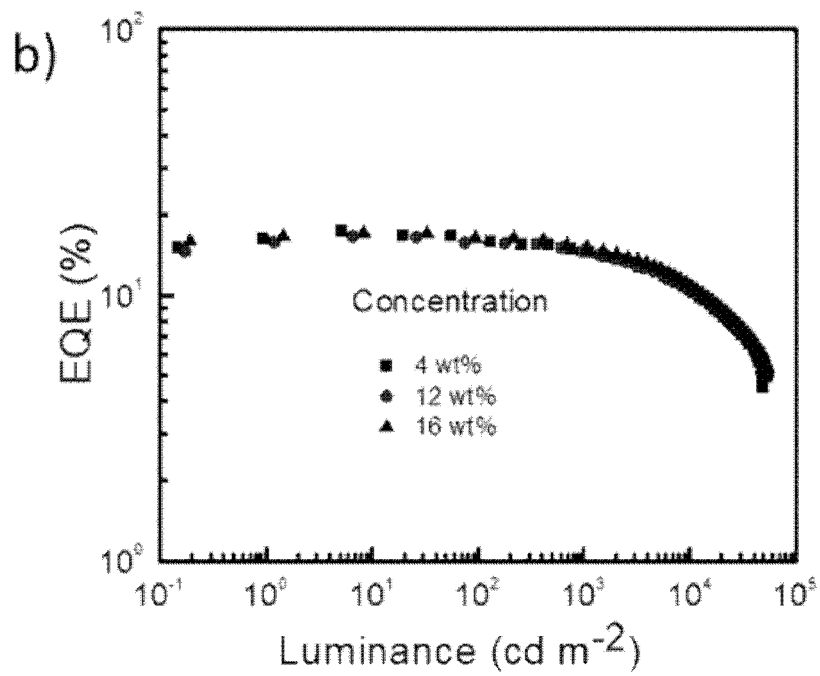
Figure 5C:
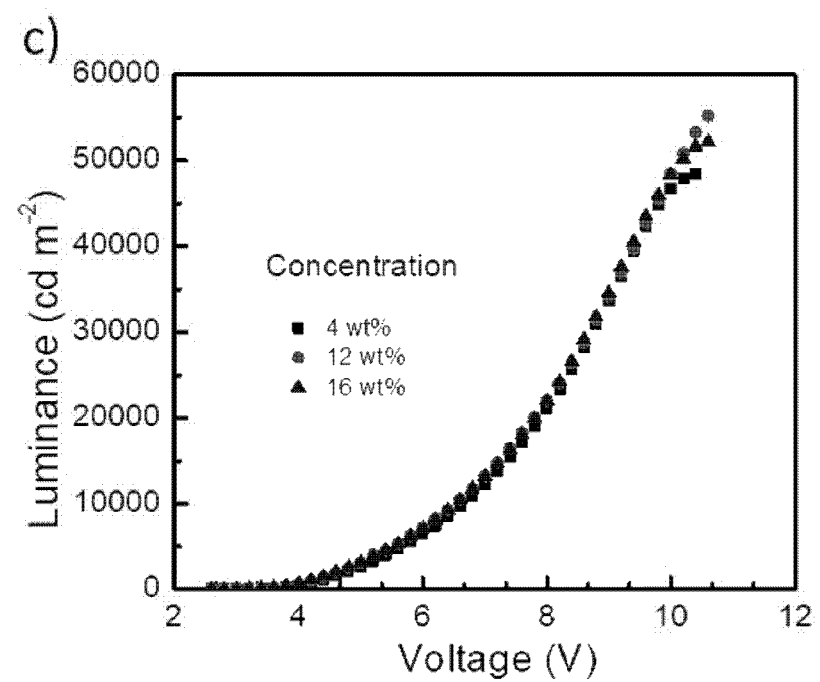
Figure 5D:
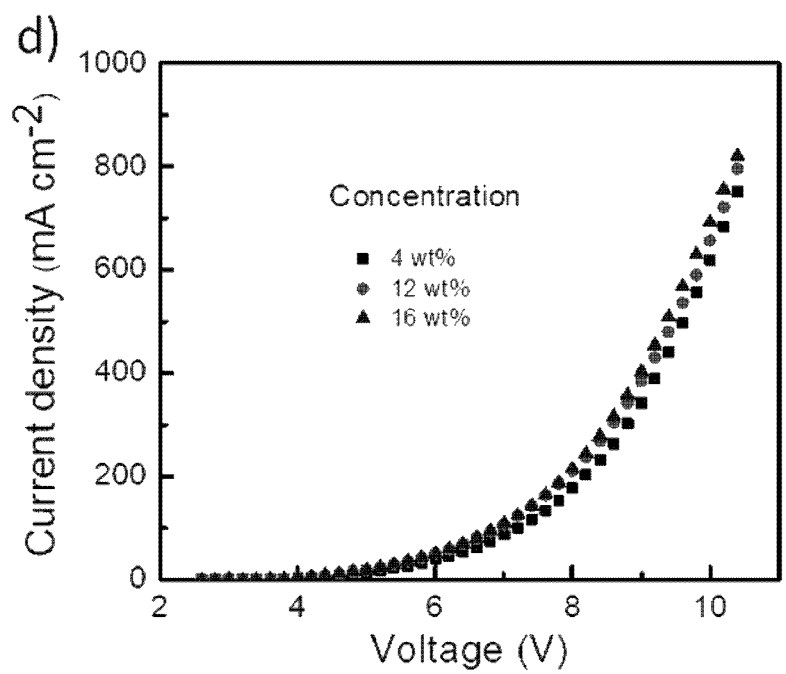
Figure 6A:
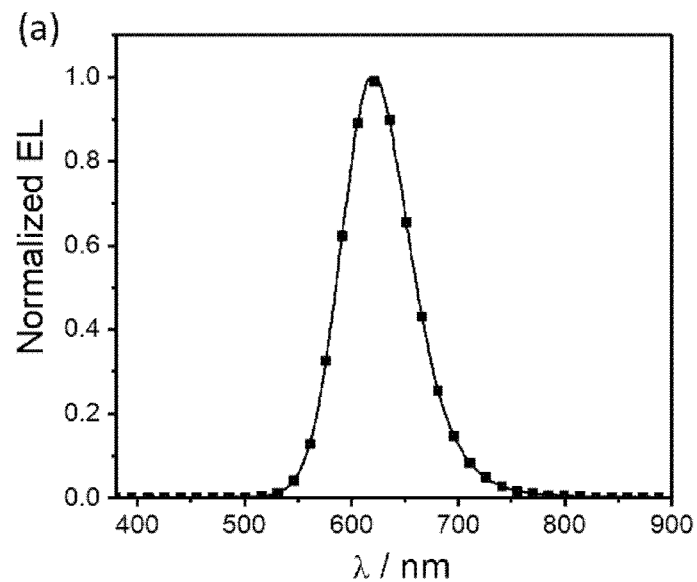
FIGS. 6A-6B are graphs showing the EL spectra (FIG. 6A) and external quantum efficiency (FIG. 6B) of devices containing Pt(II) complex 1d' at doping concentrations of 4 wt %. Device structure: ITO/HAT-CN (5 nm)/TAPC (40 nm)/TCTA (10 nm)/Pt-1d':TCTA:TPBi (20 nm)/TPBi (10 nm)/TmPyPb (40 nm)/LiF (1.2 nm)/Al (100 nm).
Figure 6B:
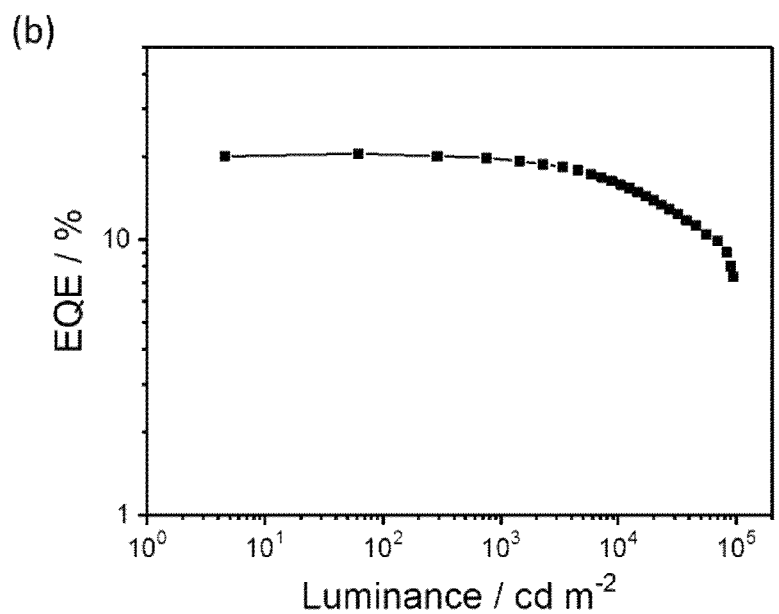
Figure 7A:
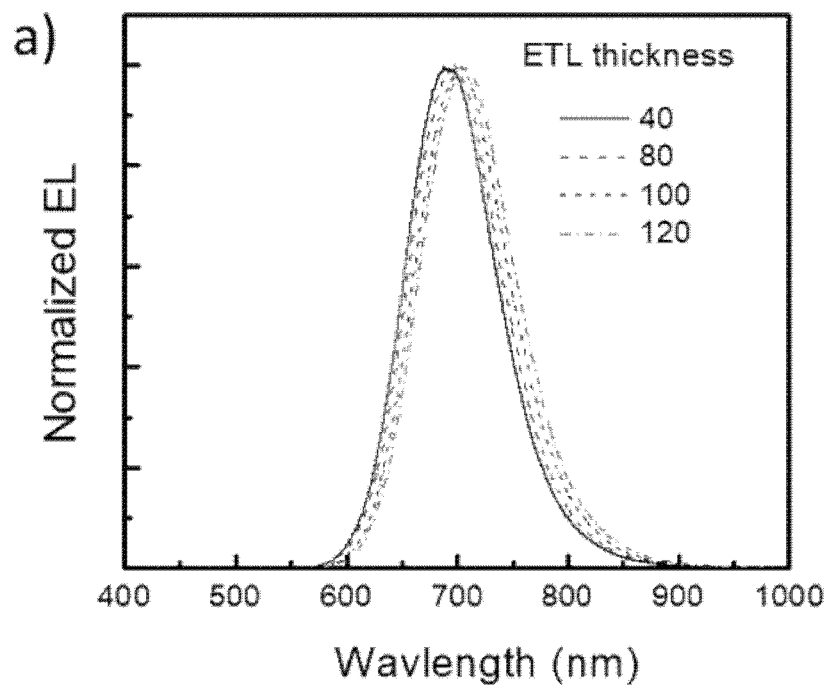
FIGS. 7A-7D are graphs showing the EL spectra (FIG. 7A), external quantum efficiency (FIG. 7B), radiant flux (FIG. 7C), current density (FIG. 7D), external quantum efficiency (FIG. 7E), and luminance (FIG. 7F) of devices containing Pt(II) complex 2a at a doping concentration of 6 wt % and electron transport layer ("ETL") of 40 nm, 80 nm, 100 nm, and 120 nm. Device structure: ITO/HAT-CN (6 nm)/TAPC (40 nm)/TcTa (10 nm)/Pt-2a (6 wt %):TcTa:TPBi (1:1) (20 nm)/TPBi (10 nm)/Liq:LE-T321 (1:1) (ETL)/Liq (1 nm)/Al (100 nm).
Figure 7B:
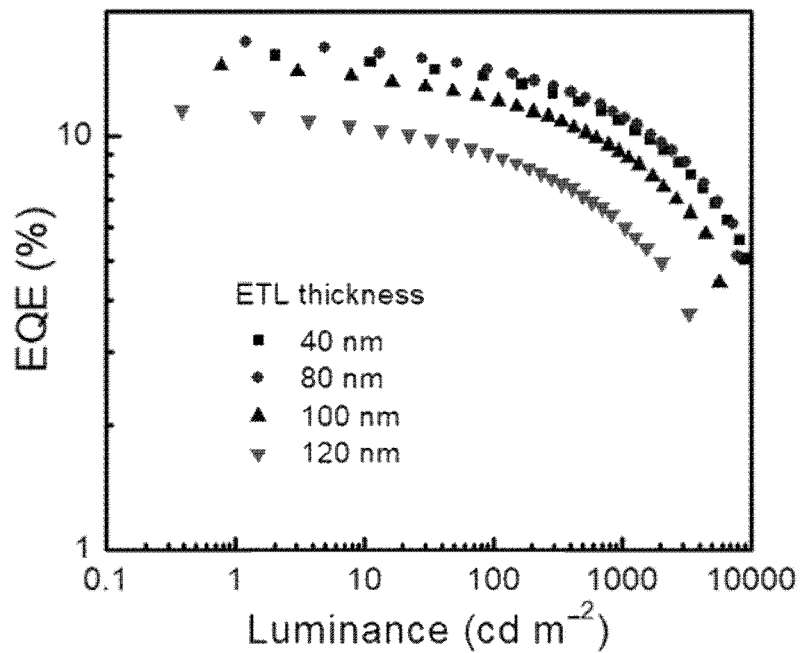
Figure 7C:
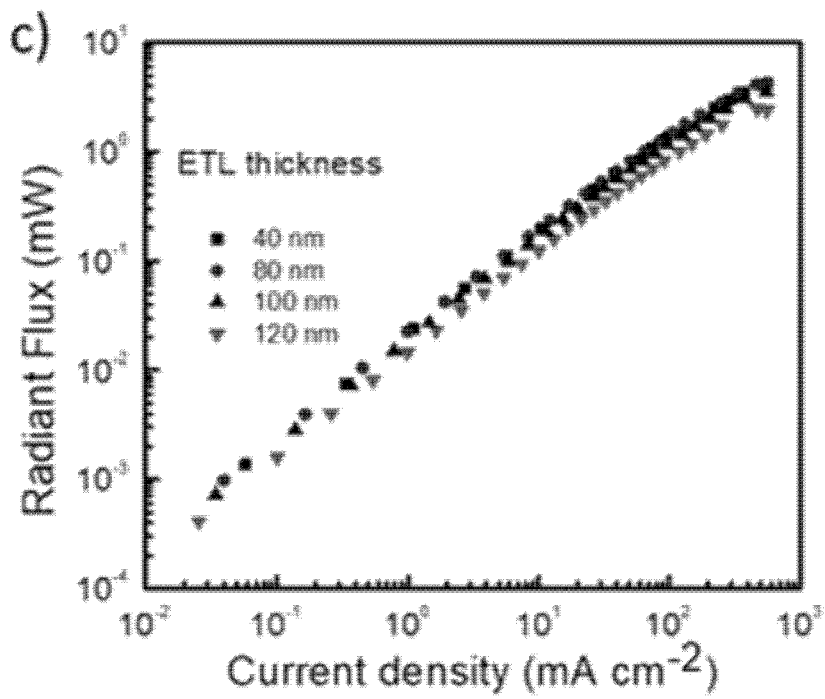
Figure 7D:
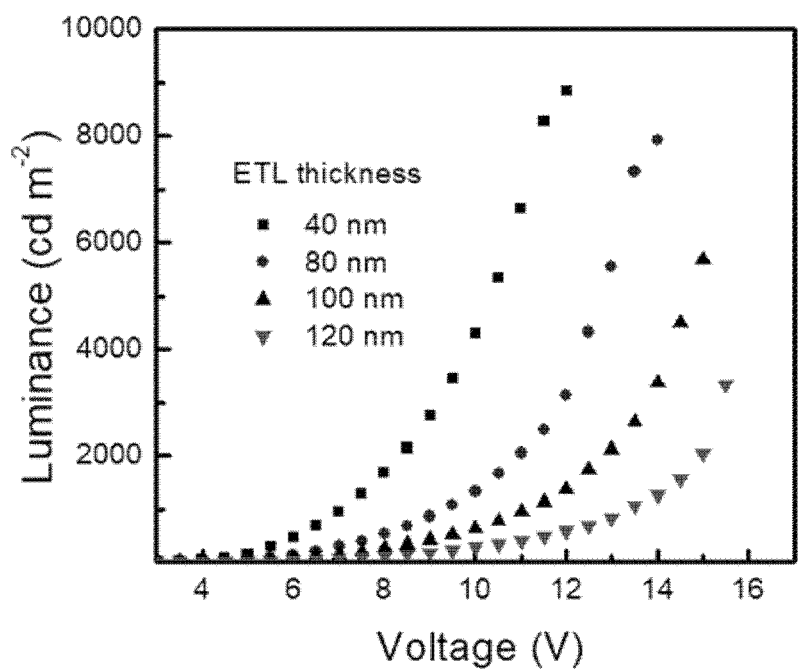
Figure 8A:
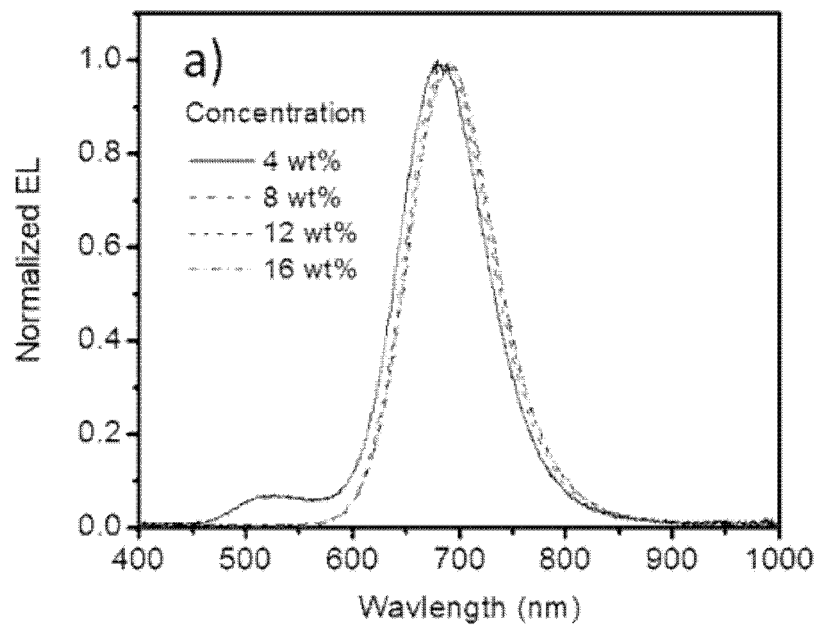
FIGS. 8A-8D are graphs showing the EL spectra (FIG. 8A), external quantum efficiency (FIG. 8B), luminance (FIG. 8C), and current density (FIG. 8D) of devices containing Pt(II) complex 2a at doping concentrations of 4 wt %, 8 wt %, 12 wt %, and 16 wt %. Device structure: ITO/HAT-CN (10 nm)/Pt-2a (40 nm)/Compound-EB (5 nm)/Pt-2a:Compound-RH (40 nm)/Compound-HB (5 nm)/Compound-ET:Liq (35:65) (35 nm)/Liq (1 nm)/Al (100 nm).
Figure 8B:
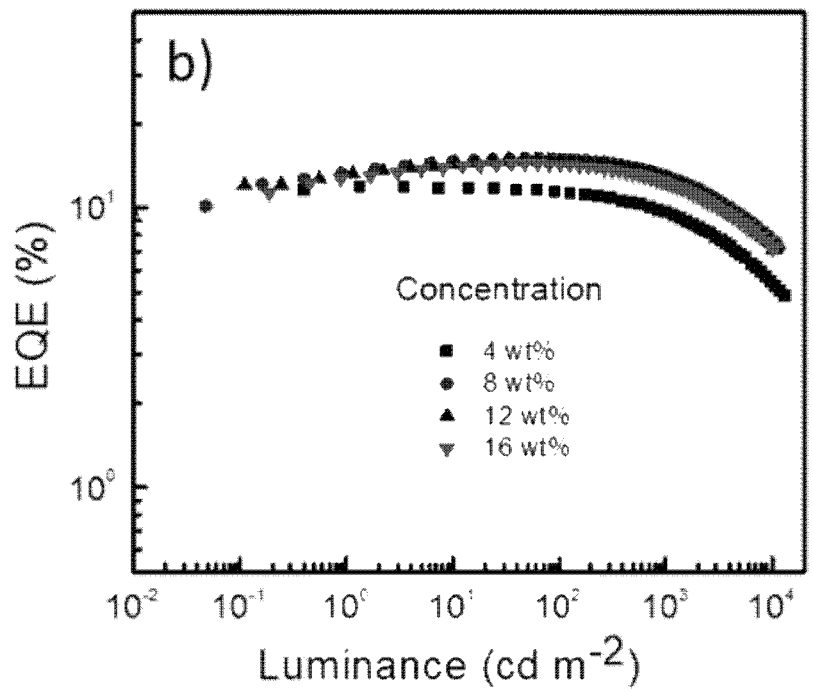
Figure 8C:
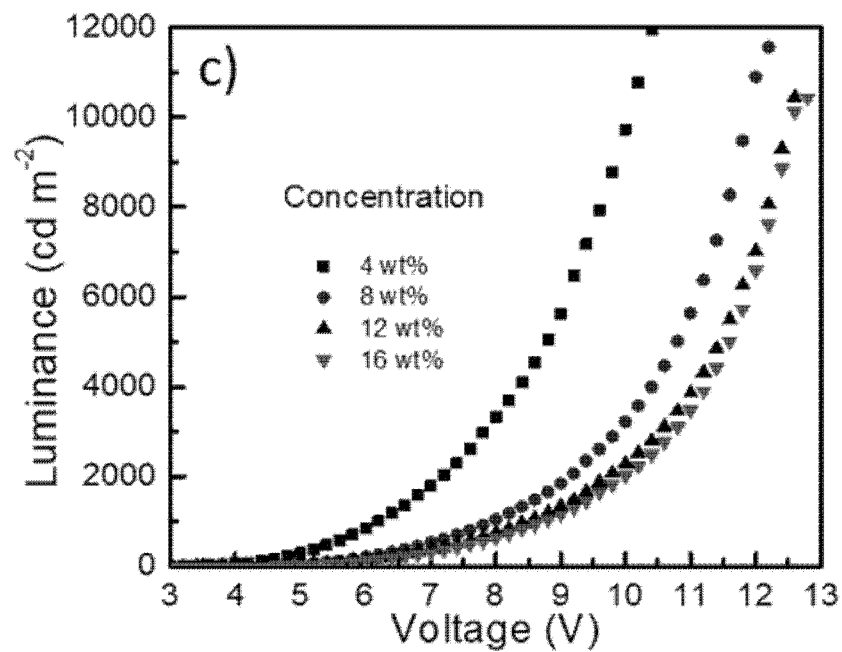
Figure 8D:
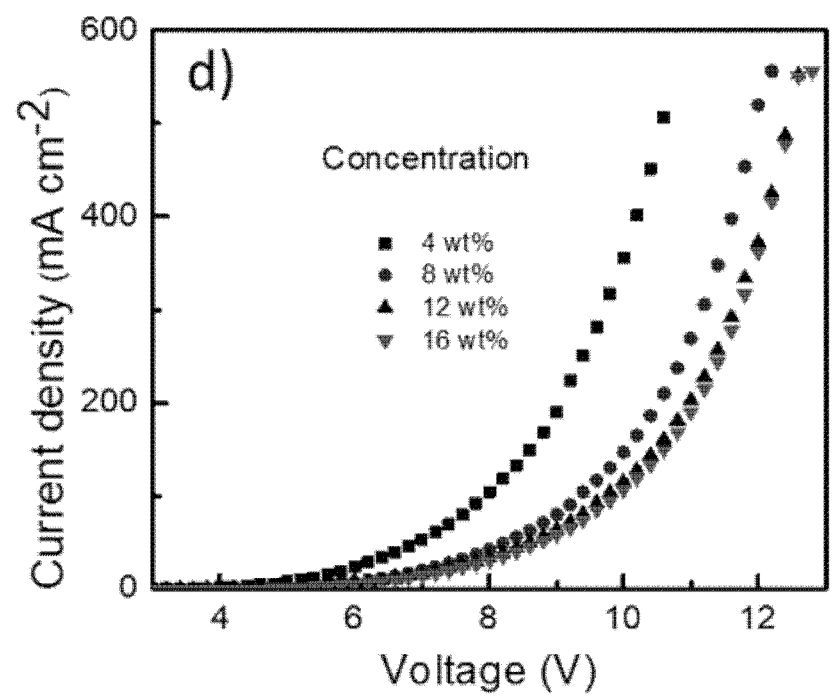
Figure 9A:
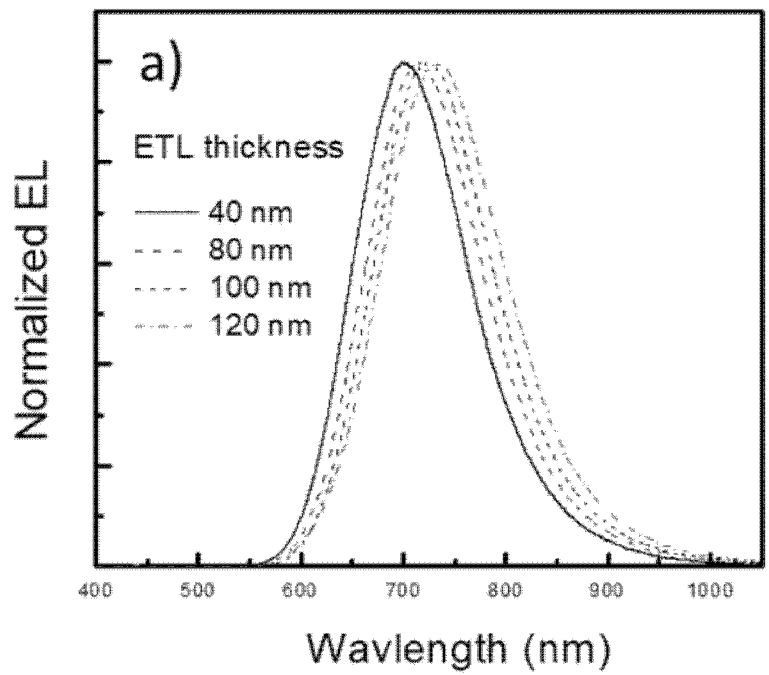
FIGS. 9A-9D are graphs showing the EL spectra (FIG. 9A), external quantum efficiency (FIG. 9B), radiant flux (FIG. 9C), and current density (FIG. 9D) of devices containing Pt(II) complex 4a at a doping concentration of 6 wt % and ETL of 40 nm, 80 nm, 100 nm, and 120 nm. Device structure: ITO/HAT-CN (6 nm)/TAPC (40 nm)/TcTa (10 nm)/Pt-4a (6 wt %):TcTa:TPBi (1:1) (20 nm)/TPBi (10 nm)/Liq:LE-T321 (1:1) (ETL)/Liq (1 nm)/Al (100 nm).
Figure 9B:
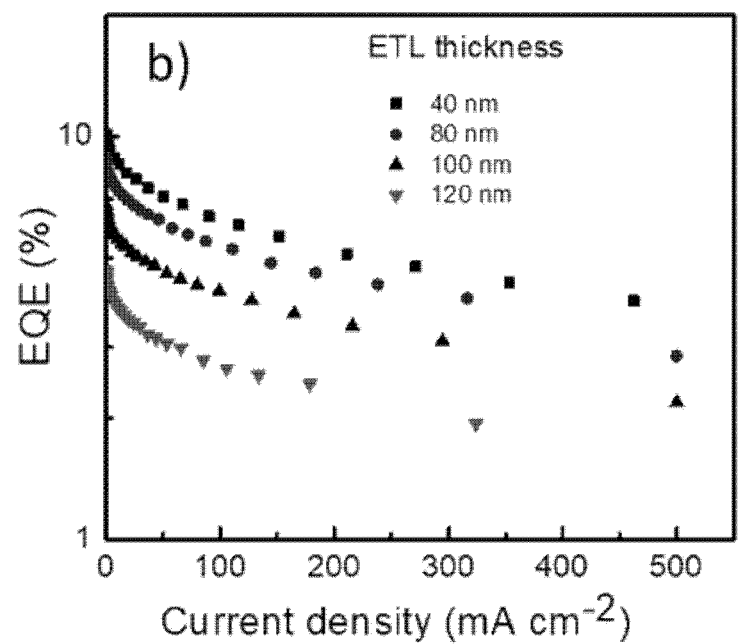
Figure 9C:
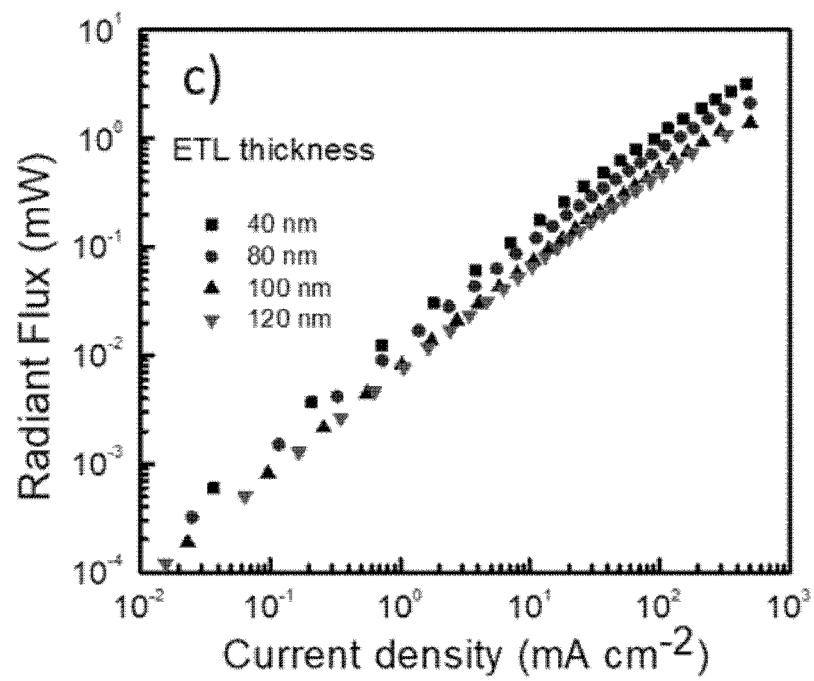
Figure 9D:
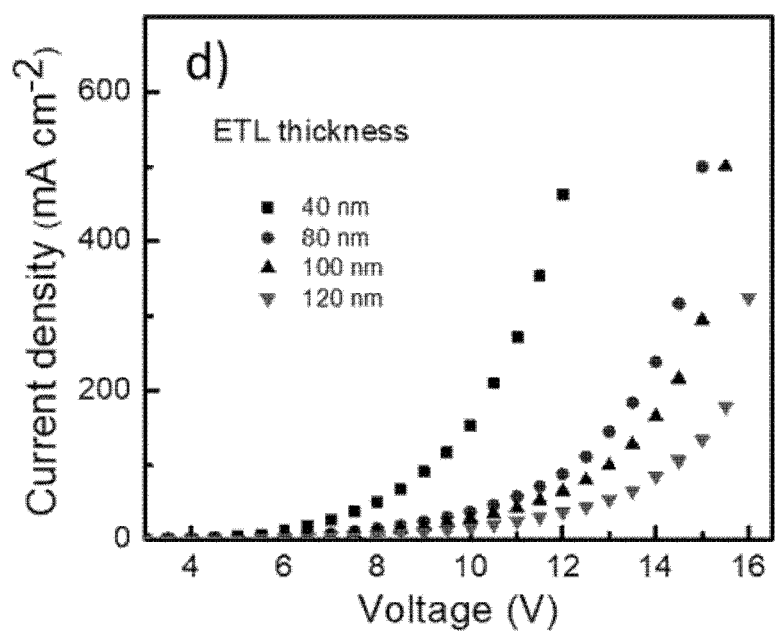
Figure 10:
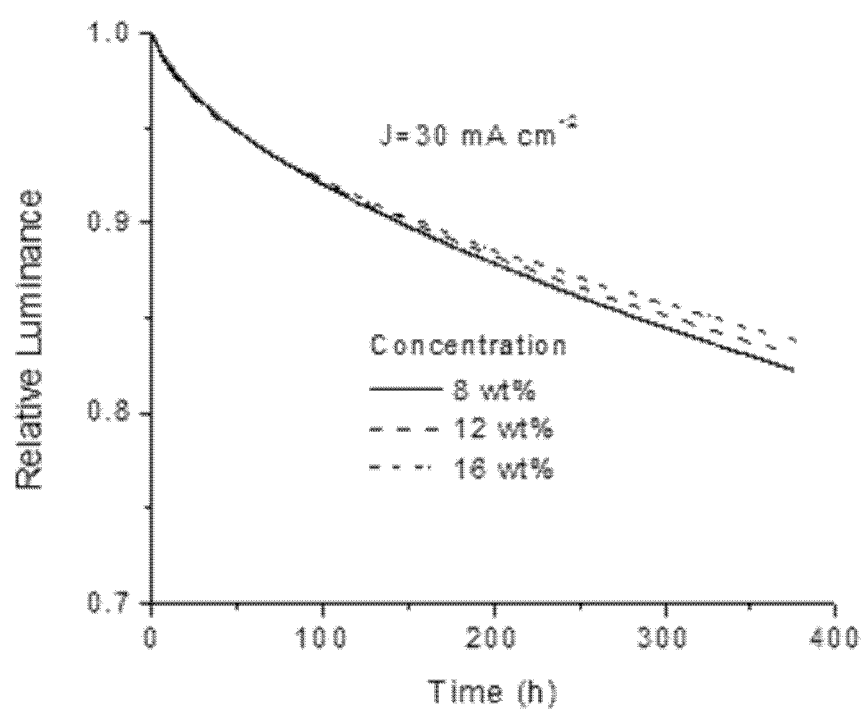
FIG. 10 is a graph showing the device lifetime measurement results of vapor-deposited devices with Pt(II) complex 1a at doping concentrations of 8 wt %, 12 wt %, and 16 wt %.
Figure 11:
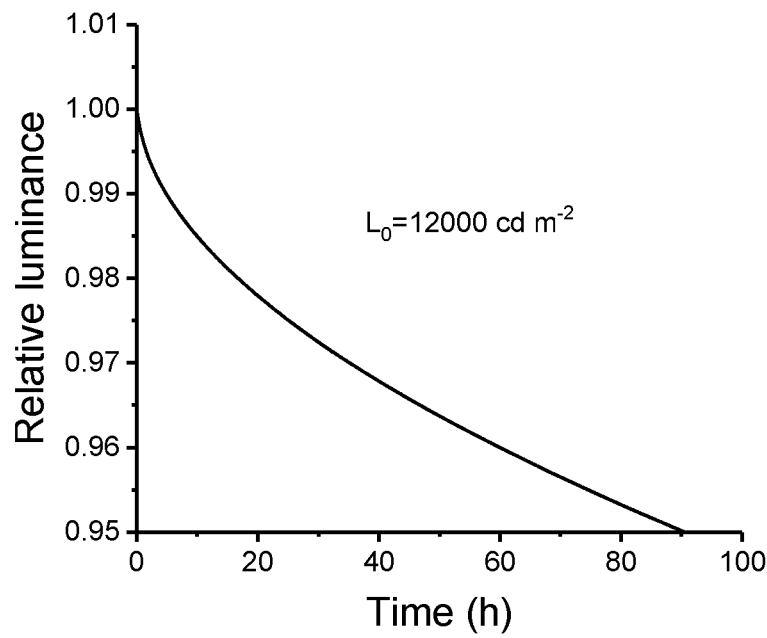
FIG. 11 is a graph showing the device lifetime measurement results of vapor-deposited devices with Pt(II) complex 1d' at a doping concentration of 4 wt %. Device structure: ITO/HAT-CN (10 nm)/PT-301 (40 nm)/Compound-EB (5 nm)/Pt-1d' (4 wt %): Compound-RH (40 nm)/Compound-HB (5 nm)/Compound-ET:Liq (35:65) (35 nm)/Liq (1 nm)/Al (100 nm).
Figure 12:
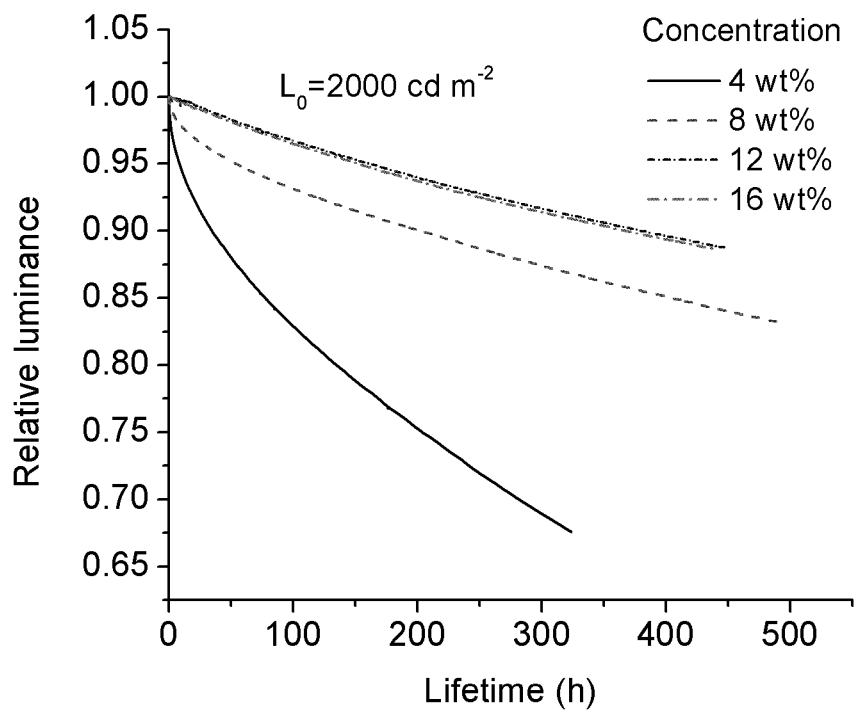
FIG. 12 is a graph showing the device lifetime measurement results of vapor-deposited devices with Pt(II) complex 2a at doping concentrations of 4 wt %, 8 wt %, 12 wt %, and 16 wt %.

It is to be understood that the disclosed complexes, compositions, and methods are not limited to specific synthetic methods, specific analytical techniques, or to particular reagents unless otherwise specified, and, as such, may vary. It is also to be understood that the terminology used herein is for the purpose of describing particular forms and embodiments only and is not intended to be limiting.

"Substituted," as used herein, refers to all permissible substituents of the compounds or functional groups described herein. In the broadest sense, the permissible substituents include acyclic and cyclic, branched and unbranched, carbocyclic and heterocyclic, aromatic and nonaromatic substituents of organic compounds. Illustrative substituents include, but are not limited to, halogens, hydroxyl groups, or any other organic groupings containing any number of carbon atoms, preferably 1-14 carbon atoms, and optionally include one or more heteroatoms such as oxygen, sulfur, or nitrogen grouping in linear, branched, or cyclic structural formats. Representative substituents include a substituted or unsubstituted alkyl, a substituted or unsubstituted alkenyl, a substituted or unsubstituted alkynyl, a substituted or unsubstituted heterocyclyl, a substituted or unsubstituted phenyl, a substituted or unsubstituted aryl, a substituted or unsubstituted heteroaryl, a substituted or unsubstituted polyaryl, a substituted or unsubstituted polyheteroaryl, a substituted or unsubstituted aralkyl, a halogen, a hydroxyl, an alkoxy, a phenoxy, an aroxy, a silyl, a thiol, an alkylthio, a substituted alkylthio, a phenylthio, an arylthio, a cyano, an isocyano, a nitro, a substituted or unsubstituted carbonyl, a carboxyl, an amino, an amido, an oxo, a sulfinyl, a sulfonyl, a sulfonic acid, a phosphonium, a phosphanyl, a phosphoryl, a phosphonyl, an amino acid. Such a substituted or unsubstituted alkyl, a substituted or unsubstituted alkenyl, a substituted or unsubstituted alkynyl, a substituted or unsubstituted heterocyclyl, a substituted or unsubstituted phenyl, a substituted or unsubstituted aryl, a substituted or unsubstituted heteroaryl, a substituted or unsubstituted polyaryl, a substituted or unsubstituted polyheteroaryl, a substituted or unsubstituted aralkyl, a halogen, a hydroxyl, an alkoxy, a phenoxy, an aroxy, a silyl, a thiol, an alkylthio, a substituted alkylthio, a phenylthio, an arylthio, a cyano, an isocyano, a nitro, a substituted or unsubstituted carbonyl, a carboxyl, an amino, an amido, an oxo, a sulfinyl, a sulfonyl, a sulfonic acid, a phosphonium, a phosphanyl, a phosphoryl, a phosphonyl, and an amino acid can be further substituted.

Heteroatoms such as nitrogen may have hydrogen substituents and/or any permissible substituents of organic compounds described herein which satisfy the valences of the heteroatoms. It is understood that "substitution" or "substituted" includes the implicit proviso that such substitution is in accordance with permitted valence of the substituted atom and the substituent, and that the substitution results in a stable compound, i.e. a compound that does not spontaneously undergo transformation such as by rearrangement, cyclization, elimination, etc.

"Alkyl," as used herein, refers to the radical of saturated aliphatic groups, including straight-chain alkyl groups, branched-chain alkyl, and cycloalkyl (alicyclic). In some forms, a straight chain or branched chain alkyl has 30 or fewer carbon atoms in its backbone (e.g., $C_1$-$C_{30}$ for straight chains, $C_3$-$C_{30}$ for branched chains), 20 or fewer, 15 or fewer, or 10 or fewer. Alkyl includes methyl, ethyl, n-propyl, isopropyl, n-butyl, isobutyl, t-butyl, pentyl, hexyl, heptyl, octyl, decyl, tetradecyl, hexadecyl, eicosyl, tetracosyl and the like. Likewise, a cycloalkyl is a non-aromatic carbon-based ring composed of at least three carbon atoms, such as a nonaromatic monocyclic or nonaromatic polycyclic ring containing 3-30 carbon atoms, 3-20 carbon atoms, or 3-10 carbon atoms in their ring structure, and have 5, 6 or 7 carbons in the ring structure. Cycloalkyls containing a polycyclic ring system can have two or more non-aromatic rings in which two or more carbons are common to two adjoining rings (i.e., "fused cycloalkyl rings"). Examples of cycloalkyl groups include, but are not limited to, cyclopropyl, cyclobutyl, cyclopentyl, cyclohexyl, cycloheptyl, cyclooctanyl, etc.

The term "alkyl" as used throughout the specification, examples, and claims is intended to include both "unsubstituted alkyls" and "substituted alkyls," the latter of which refers to alkyl moieties having one or more substituents replacing a hydrogen on one or more carbons of the hydrocarbon backbone. Such substituents can be any substituents described above, e.g., halogen (such as fluorine, chlorine, bromine, or iodine), hydroxyl, carbonyl (such as a carboxyl, alkoxycarbonyl, formyl, or an acyl), thiocarbonyl (such as a thioester, a thioacetate, or a thioformate), aryl, alkoxyl, aralkyl, phosphonium, phosphanyl, phosphonyl, phosphoryl, phosphate, phosphonate, a phosphinate, amino, amido, amidine, imine, cyano, nitro, azido, oxo, sulfhydryl, thiol, alkylthio, silyl, sulfinyl, sulfate, sulfonate, sulfamoyl, sulfonamido, sulfonyl, heterocyclyl, an aromatic or heteroaromatic moiety. —NRR', wherein R and R' are independently hydrogen, alkyl, or aryl, and wherein the nitrogen atom is optionally quaternized; —SR, wherein R is a phosphonyl, a sulfinyl, a silyl a hydrogen, an alkyl, or an aryl; —CN; —NO$_2$; —COOH; carboxylate; —COR, —COOR, or —CON(R)$_2$, wherein R is hydrogen, alkyl, or aryl; imino, silyl, ether, haloalkyl (such as —CF3, —CH$_2$—CF$_3$, —CCl$_3$); —CN; —NCOCOCH$_2$CH$_2$; —NCOCOCHCH; and —NCS; and combinations thereof. The term "alkyl" also includes "heteroalkyl".

It will be understood by those skilled in the art that the moieties substituted on the hydrocarbon chain can themselves be substituted, if appropriate. For instance, the substituents of a substituted alkyl may include halogen, hydroxy, nitro, thiols, amino, aralkyl, azido, imino, amido, phosphonium, phosphanyl, phosphoryl (including phosphonate and phosphinate), oxo, sulfonyl (including sulfate, sulfonamido, sulfamoyl and sulfonate), and silyl groups, as well as ethers, alkylthios, carbonyls (including ketones, aldehydes, carboxylates, and esters), haloalkyls, —CN and the like. Cycloalkyls can be substituted in the same manner.

Unless the number of carbons is otherwise specified, "lower alkyl" as used herein means an alkyl group, as defined above, but having from one to ten carbons, more preferably from one to six carbon atoms in its backbone structure. Likewise, "lower alkenyl" and "lower alkynyl" have similar chain lengths.

"Heteroalkyl," as used herein, refers to straight or branched chain, or cyclic carbon-containing alkyl radicals, or combinations thereof, containing at least one heteroatom. Suitable heteroatoms include, but are not limited to, O, N, Si, P and S, wherein the nitrogen, phosphorous and sulfur atoms are optionally oxidized, and the nitrogen heteroatom is optionally quaternized. For example, the term "heterocycloalkyl group" is a cycloalkyl group as defined above where at least one of the carbon atoms of the ring is substituted with a heteroatom such as, but not limited to, nitrogen, oxygen, sulphur, or phosphorus.

The term "alkenyl" as used herein is a hydrocarbon group of from 2 to 24 carbon atoms and structural formula containing at least one carbon-carbon double bond. Alkenyl groups include straight-chain alkenyl groups, branched-chain alkenyl, and cycloalkenyl. A cycloalkenyl is a non-aromatic carbon-based ring composed of at least three carbon atoms and at least one carbon-carbon double bond, such as a nonaromatic monocyclic or nonaromatic polycyclic ring containing 3-30 carbon atoms and at least one carbon-carbon double bond, 3-20 carbon atoms and at least one carbon-carbon double bond, or 3-10 carbon atoms and at least one carbon-carbon double bond in their ring structure, and have 5, 6 or 7 carbons and at least one carbon-carbon double bond in the ring structure. Cycloalkenyls containing a polycyclic ring system can have two or more non-aromatic rings in which two or more carbons are common to two adjoining rings (i.e., "fused cycloalkenyl rings") and contain at least one carbon-carbon double bond. Asymmetric structures such as (AB)C=C(C'D) are intended to include both the E and Z isomers. This may be presumed in structural formulae herein wherein an asymmetric alkene is present, or it may be explicitly indicated by the bond symbol C. The term "alkenyl" as used throughout the specification, examples, and claims is intended to include both "unsubstituted alkenyls" and "substituted alkenyls," the latter of which refers to alkenyl moieties having one or more substituents replacing a hydrogen on one or more carbons of the hydrocarbon backbone. The term "alkenyl" also includes "heteroalkenyl".

The term "substituted alkenyl" refers to alkenyl moieties having one or more substituents replacing one or more hydrogen atoms on one or more carbons of the hydrocarbon backbone. Such substituents can be any substituents described above, e.g., halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphonium, phosphanyl, phosphoryl, phosphate, phosphonate, phosphinate, amino (e.g. quaternized amino), amido, amidine, imine, cyano, nitro, azido, oxo, sulfhydryl, alkylthio, sulfate, sulfonate, sulfamoyl, sulfonamido, sulfonyl, heterocyclyl, alkylaryl, haloalkyl, —CN, aryl, heteroaryl, polyaryl, polyheteroaryl, and combinations thereof.

"Heteroalkenyl," as used herein, refers to straight or branched chain, or cyclic carbon-containing alkenyl radicals, or combinations thereof, containing at least one heteroatom. Suitable heteroatoms include, but are not limited to, O, N, Si, P and S, wherein the nitrogen, phosphorous and sulfur atoms are optionally oxidized, and the nitrogen heteroatom is optionally quarternized. For example, the term "heterocycloalkenyl group" is a cycloalkenyl group where at least one of the carbon atoms of the ring is substituted with a heteroatom such as, but not limited to, nitrogen, oxygen, sulphur, or phosphorus.

The term "alkynyl group" as used herein is a hydrocarbon group of 2 to 24 carbon atoms and a structural formula containing at least one carbon-carbon triple bond. Alkynyl groups include straight-chain alkynyl groups, branched-chain alkynyl, and cycloalkynyl. A cycloalkynyl is a nonaromatic carbon-based ring composed of at least three carbon atoms and at least one carbon-carbon triple bond, such as a nonaromatic monocyclic or nonaromatic polycyclic ring containing 3-30 carbon atoms and at least one carbon-carbon triple bond, 3-20 carbon atoms and at least one carbon-carbon triple bond, or 3-10 carbon atoms and at least one carbon-carbon triple bond in their ring structure, and have 5, 6 or 7 carbons and at least one carbon-carbon triple bond in the ring structure. Cycloalkynyls containing a polycyclic ring system can have two or more non-aromatic rings in which two or more carbons are common to two adjoining rings (i.e., "fused cycloalkynyl rings") and contain at least one carbon-carbon triple bond. Asymmetric structures such as (AB)C≡C(C"D) are intended to include both the E and Z isomers. This may be presumed in structural formulae herein wherein an asymmetric alkyne is present, or it may be explicitly indicated by the bond symbol C. The term "alkynyl" as used throughout the specification, examples, and claims is intended to include both "unsubstituted alkynyls" and "substituted alkynyls," the latter of which refers to alkynyl moieties having one or more substituents replacing a hydrogen on one or more carbons of the hydrocarbon backbone. The term "alkynyl" also includes "heteroalkynyl".

The term "substituted alkynyl" refers to alkynyl moieties having one or more substituents replacing one or more hydrogen atoms on one or more carbons of the hydrocarbon backbone. Such substituents can be any substituents described above, e.g., halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphonium, phosphanyl, phosphoryl, phosphate, phosphonate, phosphinate, amino (e.g. quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, polyaryl, polyheteroaryl, and combinations thereof.

"Heteroalkynyl," as used herein, refers to straight or branched chain, or cyclic carbon-containing alkynyl radicals, or combinations thereof, containing at least one heteroatom. Suitable heteroatoms include, but are not limited to, O, N, Si, P and S, wherein the nitrogen, phosphorous and sulfur atoms are optionally oxidized, and the nitrogen heteroatom is optionally quaternized. For example, the term "heterocycloalkynyl group" is a cycloalkynyl group where at least one of the carbon atoms of the ring is substituted with a heteroatom such as, but not limited to, nitrogen, oxygen, sulphur, or phosphorus.

The term "aryl" as used herein is any $C_5$-$C_{26}$ carbon-based aromatic group, heteroaromatic, fused aromatic, or fused heteroaromatic. For example, "aryl," as used herein can include 5-, 6-, 7-, 8-, 9-, 10-, 14-, 18-, and 24-membered single-ring aromatic groups, including, but not limited to, benzene, naphthalene, anthracene, phenanthrene, chrysene, pyrene, corannulene, coronene, etc. "Aryl" further encompasses polycyclic ring systems having two or more cyclic rings in which two or more carbons are common to two adjoining rings (i.e., "fused aromatic rings"), wherein at least one of the rings is aromatic, e.g., the other cyclic ring or rings can be cycloalkyls, cycloalkenyls, cycloalkynyls, aryls and/or heterocycles. The aryl group can be substituted with one or more groups including, but not limited to, alkyl, alkynyl, alkenyl, aryl, halide, nitro, amino, ester, ketone, aldehyde, hydroxy, carboxylic acid, or alkoxy.

The term "substituted aryl" refers to an aryl group, wherein one or more hydrogen atoms on one or more aromatic rings are substituted with one or more substituents. Such substituents can be any substituents described above, e.g., halogen, azide, alkyl, aralkyl, alkenyl, alkynyl, cycloalkyl, hydroxyl, alkoxy, carbonyl (such as a ketone, aldehyde, carboxyl, alkoxycarbonyl, formyl, or an acyl), silyl, ether, ester, thiocarbonyl (such as a thioester, a thioacetate, or a thioformate), alkoxyl, phosphonium, phosphanyl, phosphoryl, phosphate, phosphonate, phosphinate, amino (e.g. quarternized amino), amido, amidine, imine, cyano, nitro, azido, sulfhydryl, imino, alkylthio, sulfate, sulfonate, sulfamoyl, sulfonamido, sulfonyl, heterocyclyl, alkylaryl, haloalkyl (such as $CF_3$, —$CH_2$—$CF_3$, —$CCl_3$), —CN, aryl, heteroaryl, and combinations thereof.

"Heterocycle" and "heterocyclyl" are used interchangeably, and refer to a cyclic radical attached via a ring carbon or nitrogen atom of a non-aromatic monocyclic or polycyclic ring containing 3-30 ring atoms, 3-20 ring atoms, 3-10 ring atoms, or 5-6 ring atoms, where each ring contains carbon and one to four heteroatoms each selected from the group consisting of non-peroxide oxygen, sulfur, and N(Y) wherein Y is absent or is H, O, $C_1$-$C_{10}$ alkyl, phenyl or benzyl, and optionally containing 1-3 double bonds and optionally substituted with one or more substituents. Heterocyclyl are distinguished from heteroaryl by definition. Heterocycles can be a heterocycloalkyl, a heterocycloalkenyl, a heterocycloalkynyl, etc, such as piperazinyl, piperidinyl, piperidonyl, 4-piperidonyl, dihydrofuro[2,3-b]tetrahydrofuran, morpholinyl, piperazinyl, piperidinyl, piperidonyl, 4-piperidonyl, piperonyl, pyranyl, 2H-pyrrolyl, 4H-quinolizinyl, quinuclidinyl, tetrahydrofuranyl, 6H-1,2,5-thiadiazinyl. Heterocyclic groups can optionally be substituted with one or more substituents as defined above for alkyl and aryl.

The term "heteroaryl" refers to $C_5$-$C_{30}$-membered aromatic, fused aromatic, biaromatic ring systems, or combinations thereof, in which one or more carbon atoms on one or more aromatic ring structures have been substituted with a heteroatom. Suitable heteroatoms include, but are not limited to, oxygen, sulfur, and nitrogen. Broadly defined, "heteroaryl," as used herein, includes 5-, 6-, 7-, 8-, 9-, 10-, 14-, 18-, and 24-membered single-ring aromatic groups that may include from one to four heteroatoms, for example, pyrrole, furan, thiophene, imidazole, oxazole, thiazole, triazole, tetrazole, pyrazole, pyridine, pyrazine, pyridazine and pyrimidine, and the like. The heteroaryl group may also be referred to as "aryl heterocycles" or "heteroaromatics". "Heteroaryl" further encompasses polycyclic ring systems having two or more rings in which two or more carbons are common to two adjoining rings (i.e., "fused rings") wherein at least one of the rings is heteroaromatic, e.g., the other cyclic ring or rings can be cycloalkyls, cycloalkenyls, cycloalkynyls, aryls, heterocycles, or combinations thereof. Examples of heteroaryl rings include, but are not limited to, benzimidazolyl, benzofuranyl, benzothiofuranyl, benzothiophenyl, benzoxazolyl, benzoxazolinyl, benzthiazolyl, benztriazolyl, benztetrazolyl, benzisoxazolyl, benzisothiazolyl, benzimidazolinyl, carbazolyl, 4aH-carbazolyl, carbolinyl, chromanyl, chromenyl, cinnolinyl, decahydroquinolinyl, 2H,6H-1,5,2-dithiazinyl, furanyl, furazanyl, imidazolidinyl, imidazolinyl, imidazolyl, 1H-indazolyl, indolenyl, indolinyl, indolizinyl, indolyl, 3H-indolyl, isatinoyl, isobenzofuranyl, isochromanyl, isoindazolyl, isoindolinyl, isoindolyl, isoquinolinyl, isothiazolyl, isoxazolyl, methylenedioxyphenyl, naphthyridinyl, octahydroisoquinolinyl, 1,2,3-oxadiazolyl, 1,2,4-oxadiazolyl, 1,2,5-oxadiazolyl, 1,3,4-oxadiazolyl, oxazolidinyl, oxazolyl, oxindolyl, pyrimidinyl, phenanthridinyl, phenanthrolinyl, phenazinyl, phenothiazinyl, phenoxathinyl, phenoxazinyl, phthalazinyl, pteridinyl, purinyl, pyrazinyl, pyrazolidinyl, pyrazolinyl, pyrazolyl, pyridazinyl, pyridooxazole, pyridoimidazole, pyridothiazole, pyridinyl, pyridyl, pyrimidinyl, pyrrolidinyl, pyrrolinyl, pyrrolyl, quinazolinyl, quinolinyl, quinoxalinyl, tetrahydroisoquinolinyl, tetrahydroquinolinyl, tetrazolyl, 1,2,3-thiadiazolyl, 1,2,4-thiadiazolyl, 1,2,5-thiadiazolyl, 1,3,4-thiadiazolyl, thianthrenyl, thiazolyl, thienyl, thienothiazolyl, thienooxazolyl, thienoimidazolyl, thiophenyl and xanthenyl. One or more of the rings can be substituted as defined below for "substituted heteroaryl".

The term "substituted heteroaryl" refers to a heteroaryl group in which one or more hydrogen atoms on one or more heteroaromatic rings are substituted with one or more substituents. Such substituents can be any substituents described above, e.g., halogen, azide, alkyl, aralkyl, alkenyl, alkynyl, cycloalkyl, hydroxyl, alkoxy, carbonyl (such as a ketone, aldehyde, carboxyl, alkoxycarbonyl, formyl, or an acyl), silyl, ether, ester, thiocarbonyl (such as a thioester, a thioacetate, or a thioformate), alkoxyl, phosphonium, phosphanyl, phosphoryl, phosphate, phosphonate, phosphinate, amino (e.g. quarternized amino), amido, amidine, imine, cyano, nitro, azido, sulfhydryl, imino, alkylthio, sulfate, sulfonate, sulfamoyl, sulfonamido, sulfonyl, heterocyclyl, alkylaryl, haloalkyl (such as CF3, —CH$_2$—CF$_3$, —CCl$_3$), —CN, aryl, heteroaryl, and combinations thereof.

The term "polyaryl" refers to a chemical moiety that includes two or more aryls, heteroaryls, and combinations thereof. The aryls, heteroaryls, and combinations thereof, are fused, or linked via a single bond, ether, ester, carbonyl, amide, sulfonyl, sulfonamide, alkyl, azo, and combinations thereof. For example, a "polyaryl" can be polycyclic ring systems having two or more cyclic rings in which two or more carbons are common to two adjoining rings (i.e., "fused aromatic rings"), wherein two or more of the rings are aromatic. When two or more heteroaryls are involved, the chemical moiety can be referred to as a "polyheteroaryl."

The term "substituted polyaryl" refers to a polyaryl in which one or more of the aryls, heteroaryls are substituted, with one or more substituents. Such substituents can be any substituents described above, e.g., halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphonium, phosphanyl, phosphoryl, phosphate, phosphonate, phosphinate, amino (e.g. quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof. When two or more heteroaryls are involved, the chemical moiety can be referred to as a "substituted polyheteroaryl."

The term "cyclic ring" refers to a substituted or unsubstituted monocyclic ring or a substituted or unsubstituted polycyclic ring (such as those formed from single or fused ring systems), such as a substituted or unsubstituted cycloalkyl, a substituted or unsubstituted cycloalkenyl, a substituted or unsubstituted cycloalkynyl, a substituted or unsubstituted heterocyclyl, a substituted or unsubstituted aryl, a substituted or unsubstituted polyaryl, a substituted or unsubstituted heteroaryl, and a substituted or unsubstituted polyheteroaryl, that have from three to 30 carbon atoms, as geometric constraints permit. The substituted cycloalkyls, cycloalkenyls, cycloalkynyls, and heterocyclyls are substituted as defined above for the alkyls, alkenyls, alkynyls, heterocyclyls, aryls, heteroaryl, polyaryls, and polyheteroaryls, respectively.

The term "aralkyl" as used herein is an aryl group or a heteroaryl group having an alkyl, alkynyl, or alkenyl group as defined above attached to the aromatic group, such as an aryl, a heteroaryl, a polyaryl, or a polyheteroaryl. An example of an aralkyl group is a benzyl group.

The terms "alkoxyl" or "alkoxy," "aroxy" or "aryloxy," generally describe compounds represented by the formula —OR$^v$, wherein R$^v$ includes, but is not limited to, a substituted or unsubstituted alkyl, a substituted or unsubstituted alkenyl, a substituted or unsubstituted alkynyl, a substituted or unsubstituted cycloalkyl, a substituted or unsubstituted heterocyclyl, a substituted or unsubstituted cycloalkenyl, a substituted or unsubstituted heterocycloalkenyl, a substituted or unsubstituted aryl, a substituted or unsubstituted heteroaryl, a substituted or unsubstituted polyaryl, a substituted or unsubstituted polyheteroaryl, a substituted or unsubstituted arylalkyl, a substituted or unsubstituted heteroalkyl, a substituted or unsubstituted alkylaryl, a substituted or unsubstituted alkylheteroaryl, a substituted or unsubstituted aralkyl, a substituted or unsubstituted carbonyl, a phosphonium, a phosphanyl, a phosphonyl, a sulfinyl, a silyl, a thiol, an amido, and an amino. Exemplary alkoxyl groups include methoxy, ethoxy, propyloxy, tert-butoxy and the like. A "lower alkoxy" group is an alkoxy group containing from one to six carbon atoms. An "ether" is two functional groups covalently linked by an oxygen as defined below. Accordingly, the substituent of an alkyl that renders that alkyl an ether is or resembles an alkoxyl, such as can be represented by one of —O-alkyl, —O-alkenyl, —O-alkynyl, —O-aryl, —O-heteroaryl, —O-polyaryl, —O-polyheteroaryl, —O-heterocyclyl, etc.

The term "substituted alkoxy" refers to an alkoxy group having one or more substituents replacing one or more hydrogen atoms on one or more carbons of the alkoxy backbone. Such substituents can be any substituents described above, e.g., halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphonium, phosphanyl, phosphoryl, phosphate, phosphonate, phosphinate, amino (e.g. quarternized amino), amido, amidine, imine, cyano, nitro, azido, sulfhydryl, alkylthio, oxo, sulfate, sulfonate, sulfamoyl, sulfonamido, sulfonyl, heterocyclyl, alkylaryl, haloalkyl, —CN, aryl, heteroaryl, and combinations thereof.

The term "ether" as used herein is represented by the formula A$^2$OA$^1$, where A$^2$ and A$^1$ can be, independently, a substituted or unsubstituted alkyl, a substituted or unsubstituted alkenyl, a substituted or unsubstituted alkynyl, a substituted or unsubstituted heterocyclyl, a substituted or unsubstituted aryl, a substituted or unsubstituted heteroaryl, a substituted or unsubstituted aralkyl, a substituted or unsubstituted polyaryl, a substituted or unsubstituted polyheteroaryl, a phosphonium, a phosphanyl, a phosphonyl, a sulfinyl, a silyl, a thiol, a substituted or unsubstituted carbonyl, an alkoxy, an amido, or an amino, described above.

The term "polyether" as used herein is represented by the formula:

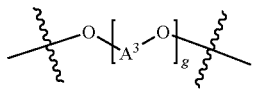

where $A^3$, $A^2$, and $A^1$ can be, independently, a substituted or unsubstituted alkyl, a substituted or unsubstituted alkenyl, a substituted or unsubstituted alkynyl, a substituted or unsubstituted heterocyclyl, a substituted or unsubstituted aryl, a substituted or unsubstituted heteroaryl, a substituted or unsubstituted aralkyl, a substituted or unsubstituted polyaryl, a substituted or unsubstituted polyheteroaryl, a phosphonium, a phosphanyl, a substituted or unsubstituted carbonyl, an alkoxy, an amido, or an amino, described above; g can be a positive integer from 1 to 30.

The term "phenoxy" is art recognized, and refers to a compound of the formula —OR wherein $R^v$ is (i.e., $-O-C_6H_5$). One of skill in the art recognizes that a phenoxy is a species of the aroxy genus.

The term "substituted phenoxy" refers to a phenoxy group, as defined above, having one or more substituents replacing one or more hydrogen atoms on one or more carbons of the phenyl ring. Such substituents include, but are not limited to, halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphonium, phosphanyl, phosphanyl, phosphoryl, phosphate, phosphonate, phosphinate, amino (e.g. quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof.

The terms "aroxy" and "aryloxy," as used interchangeably herein, are represented by —O-aryl or —O-heteroaryl, wherein aryl and heteroaryl are as defined herein.

The terms "substituted aroxy" and "substituted aryloxy," as used interchangeably herein, represent —O-aryl or —O-heteroaryl, having one or more substituents replacing one or more hydrogen atoms on one or more ring atoms of the aryl and heteroaryl, as defined herein. Such substituents can be any substituents described above, e.g., halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphonium, phosphanyl, phosphanyl, phosphoryl, phosphate, phosphonate, phosphinate, amino (e.g. quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, polyaryl, polyheteroaryl, and combinations thereof.

The term "amino" as used herein includes the group (primary amino)

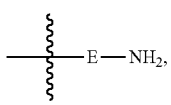

(secondary amino)

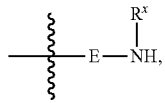

(tertiary amino)

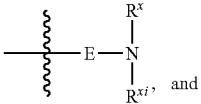

(quaternary amino)

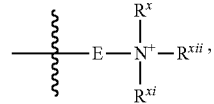

wherein, E is absent, or E is substituted or unsubstituted alkyl, substituted or unsubstituted alkenyl, substituted or unsubstituted alkynyl, substituted or unsubstituted aralkyl, substituted or unsubstituted aryl, substituted or unsubstituted heteroaryl, a substituted or unsubstituted polyaryl, a substituted or unsubstituted polyheteroaryl, substituted or unsubstituted heterocyclyl, wherein independently of E, $R^x$, $R^{xi}$, and $R^{xii}$ each independently represent a substituted or unsubstituted alkyl, a substituted or unsubstituted alkenyl, a substituted or unsubstituted alkynyl, a substituted or unsubstituted carbonyl, a substituted or unsubstituted heterocyclyl, a substituted or unsubstituted aralkyl (e.g. a substituted or unsubstituted alkylaryl, a substituted or unsubstituted arylalkyl), a substituted or unsubstituted aryl, a substituted or unsubstituted heteroaryl, a substituted or unsubstituted polyaryl, a substituted or unsubstituted polyheteroaryl, a substituted or unsubstituted heterocyclyl, a hydroxyl, an alkoxy, a phosphonium, a phosphanyl, a phosphonyl, a sulfinyl, a silyl, a thiol, an amido, an amino, or $-(CH_2)_m-R'''$; $R'''$ represents a hydroxyl group, a substituted or unsubstituted carbonyl group, a substituted or unsubstituted aryl, a substituted or unsubstituted cycloalkyl, a substituted or unsubstituted cycloalkenyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, an alkoxy, a phosphonium, a phosphanyl, an amido, or an amino; and m is zero or an integer ranging from 1 to 8. The term "quaternary amino" also includes the groups where the nitrogen, $R^x$, $R^{xi}$, and $R^{xii}$ with the $N^+$ to which they are attached complete a heterocyclyl or heteroaryl having from 3 to 14 atoms in the ring structure.

The terms "amide" or "amido" are used interchangeably, refer to both "unsubstituted amido" and "substituted amido" and are represented by the general formula:

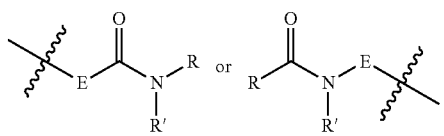

wherein, E is absent, or E is a substituted or unsubstituted alkyl, a substituted or unsubstituted alkenyl, a substituted or unsubstituted alkynyl, a substituted or unsubstituted aralkyl, a substituted or unsubstituted aryl, substituted or unsubstituted heteroaryl, a substituted or unsubstituted polyaryl, a substituted or unsubstituted polyheteroaryl, or a substituted or unsubstituted heterocyclyl, wherein independently of E, R and R' each independently represent a hydrogen, a substituted or unsubstituted alkyl, a substituted or unsubstituted alkenyl, a substituted or unsubstituted alkynyl, a substituted or unsubstituted carbonyl, a substituted or unsubstituted heterocyclyl, a substituted or unsubstituted aralkyl (e.g. a substituted or unsubstituted alkylaryl, a substituted or unsubstituted arylalkyl), a substituted or unsubstituted aryl, a substituted or unsubstituted heteroaryl, a substituted or unsubstituted polyaryl, a substituted or unsubstituted polyheteroaryl, a substituted or unsubstituted heterocyclyl, a hydroxyl, an alkoxy, a phosphonium, a phosphanyl, a phosphonyl, a sulfinyl, a silyl, a thiol, an amido, an amino, or —(CH$_2$)$_m$—R''', or R and R' taken together with the N atom to which they are attached complete a heterocycle having from 3 to 14 atoms in the ring structure; R''' represents a hydroxyl group, a substituted or unsubstituted carbonyl group, a substituted or unsubstituted aryl, a substituted or unsubstituted cycloalkyl, a substituted or unsubstituted cycloalkenyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, an alkoxy, a phosphonium, a phosphanyl, an amido, or an amino; and m is zero or an integer ranging from 1 to 8. In some forms, when E is oxygen, a carbamate is formed.

"Carbonyl," as used herein, is art-recognized and includes such moieties as can be represented by the general formula:

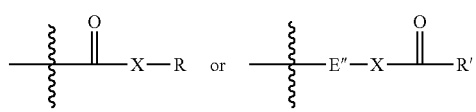

wherein X is a bond, or represents an oxygen or a sulfur, and R represents a hydrogen, a substituted or unsubstituted alkyl, a substituted or unsubstituted alkenyl, a substituted or unsubstituted alkynyl, a substituted or unsubstituted carbonyl, a substituted or unsubstituted heterocyclyl, a substituted or unsubstituted aralkyl (e.g. a substituted or unsubstituted alkylaryl, a substituted or unsubstituted arylalkyl), a substituted or unsubstituted aryl, a substituted or unsubstituted heteroaryl, a substituted or unsubstituted polyaryl, a substituted or unsubstituted polyheteroaryl, a substituted or unsubstituted heterocyclyl, a hydroxyl, an alkoxy, a phosphonium, a phosphanyl, an amido, an amino, or —(CH$_2$)$_m$—R'', or a pharmaceutical acceptable salt; E'' is absent, or E'' is substituted or unsubstituted alkyl, substituted or unsubstituted alkenyl, substituted or unsubstituted alkynyl, substituted or unsubstituted aralkyl, substituted or unsubstituted aryl, substituted or unsubstituted heteroaryl, a substituted or unsubstituted polyaryl, a substituted or unsubstituted polyheteroaryl, substituted or unsubstituted heterocyclyl; R' represents a hydrogen, a substituted or unsubstituted alkyl, a substituted or unsubstituted alkenyl, a substituted or unsubstituted alkynyl, a substituted or unsubstituted carbonyl, a substituted or unsubstituted heterocyclyl, a substituted or unsubstituted aralkyl (e.g. a substituted or unsubstituted alkylaryl, a substituted or unsubstituted arylalkyl), a substituted or unsubstituted aryl, a substituted or unsubstituted heteroaryl, a substituted or unsubstituted polyaryl, a substituted or unsubstituted polyheteroaryl, a substituted or unsubstituted heterocyclyl, a hydroxyl, an alkoxy, a phosphonium, a phosphanyl, an amido, an amino, or —(CH$_2$)$_m$—R''; R'' represents a hydroxyl group, a substituted or unsubstituted carbonyl group, a substituted or unsubstituted aryl, a substituted or unsubstituted cycloalkyl, a substituted or unsubstituted cycloalkenyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, an alkoxy, a phosphonium, a phosphanyl, an amido, or an amino; and m is zero or an integer ranging from 1 to 8. Where X is oxygen and R is defined as above, the moiety is also referred to as a carboxyl group. When X is oxygen and R is hydrogen, the formula represents a "carboxylic acid". Where X is oxygen and R' is hydrogen, the formula represents a "formate". Where X is oxygen and R or R' is not hydrogen, the formula represents an "ester". In general, where the oxygen atom of the above formula is replaced by a sulfur atom, the formula represents a "thiocarbonyl" group. Where X is sulfur and R or R' is not hydrogen, the formula represents a "thioester". Where X is sulfur and R is hydrogen, the formula represents a "thiocarboxylic acid". Where X is sulfur and R' is hydrogen, the formula represents a "thioformate". Where X is a bond and R is not hydrogen, the above formula represents a "ketone". Where X is a bond and R is hydrogen, the above formula represents an "aldehyde".

The term "substituted carbonyl" refers to a carbonyl, as defined above, wherein one or more hydrogen atoms in R, R' or a group to which the moiety

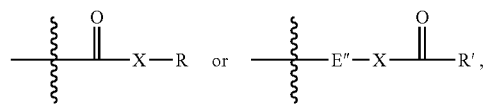

is attached, are independently substituted. Such substituents can be any substituents described above, e.g., halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphonium, phosphanyl, phosphoryl, phosphate, phosphonate, phosphinate, amino (e.g. quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof.

The term "carboxyl" is as defined above for carbonyl and is defined more specifically by the formula —R$^{iv}$COOH, wherein R$^{iv}$ is a substituted or unsubstituted alkyl, a substituted or unsubstituted alkenyl, a substituted or unsubstituted alkynyl, a substituted or unsubstituted heterocyclyl, a substituted or unsubstituted alkylaryl, a substituted or unsubstituted arylalkyl, a substituted or unsubstituted aryl, a substituted or unsubstituted polyaryl, a substituted or unsubstituted polyheteroaryl, or a substituted or unsubstituted heteroaryl.

The term "substituted carboxyl" refers to a carboxyl, as defined above, wherein one or more hydrogen atoms in R$^{iv}$ are substituted. Such substituents can be any substituents described above, e.g., halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphonium, phosphanyl, phosphoryl, phosphate, phosphonate, phosphinate, amino (e.g. quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, polyaryl, polyheteroaryl, and combinations thereof.

The term "phosphanyl" is represented by the formula

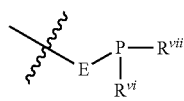

wherein, E is absent, or E is a substituted or unsubstituted alkyl, a substituted or unsubstituted alkenyl, a substituted or unsubstituted alkynyl, a substituted or unsubstituted aralkyl, a substituted or unsubstituted cycloalkyl, a substituted or unsubstituted aryl, a substituted or unsubstituted heteroaryl, a substituted or unsubstituted polyaryl, a substituted or unsubstituted polyheteroaryl, a substituted or unsubstituted heterocyclyl, wherein independently of E, $R^{vi}$ and $R^{vii}$ each independently represent a hydrogen, a substituted or unsubstituted alkyl, a substituted or unsubstituted alkenyl, a substituted or unsubstituted alkynyl, a substituted or unsubstituted carbonyl, a substituted or unsubstituted heterocyclyl, a substituted or unsubstituted aralkyl (e.g. a substituted or unsubstituted alkylaryl, a substituted or unsubstituted arylalkyl, etc.), a substituted or unsubstituted aryl, a substituted or unsubstituted heteroaryl, a substituted or unsubstituted polyaryl, a substituted or unsubstituted polyheteroaryl, a substituted or unsubstituted heterocyclyl, a hydroxyl, an alkoxy, a phosphonium, a phosphanyl, a phosphonyl, a sulfinyl, a silyl, a thiol, an amido, an amino, or —$(CH_2)_m$—$R'''$, or $R^{vi}$ and $R^{vii}$ taken together with the P atom to which they are attached complete a heterocycle having from 3 to 14 atoms in the ring structure; $R'''$ represents a hydroxyl group, a substituted or unsubstituted carbonyl group, a substituted or unsubstituted aryl, a substituted or unsubstituted cycloalkyl, a substituted or unsubstituted cycloalkenyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, an alkoxy, a phosphonium, a phosphanyl, an amido, or an amino; and m is zero or an integer ranging from 1 to 8.

The term "phosphonium" is represented by the formula

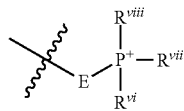

wherein, E is absent, or E is a substituted or unsubstituted alkyl, a substituted or unsubstituted alkenyl, a substituted or unsubstituted alkynyl, a substituted or unsubstituted aralkyl, a substituted or unsubstituted cycloalkyl, a substituted or unsubstituted aryl, a substituted or unsubstituted heteroaryl, a substituted or unsubstituted polyaryl, a substituted or unsubstituted polyheteroaryl, a substituted or unsubstituted heterocyclyl, wherein independently of E, $R^{vi}$, $R^{vii}$, and $R^{viii}$ each independently represent a hydrogen, a substituted or unsubstituted alkyl, a substituted or unsubstituted alkenyl, a substituted or unsubstituted alkynyl, a substituted or unsubstituted carbonyl, a substituted or unsubstituted heterocyclyl, a substituted or unsubstituted aralkyl (e.g. a substituted or unsubstituted alkylaryl, a substituted or unsubstituted arylalkyl, etc.), a substituted or unsubstituted aryl, a substituted or unsubstituted heteroaryl, a substituted or unsubstituted polyaryl, a substituted or unsubstituted polyheteroaryl, a substituted or unsubstituted heterocyclyl, a hydroxyl, an alkoxy, a phosphonium, a phosphanyl, a phosphonyl, a sulfinyl, a silyl, a thiol, an amido, an amino, or —$(CH_2)_m$—$R'''$, or $R^{vi}$, $R^{vii}$, and $R^{viii}$ taken together with the $P^+$ atom to which they are attached complete a heterocycle having from 3 to 14 atoms in the ring structure; $R'''$ represents a hydroxyl group, a substituted or unsubstituted carbonyl group, a substituted or unsubstituted aryl, a substituted or unsubstituted cycloalkyl, a substituted or unsubstituted cycloalkenyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, an alkoxy, a phosphonium, a phosphanyl, an amido, or an amino; and m is zero or an integer ranging from 1 to 8.

The term "phosphonyl" is represented by the formula

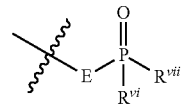

wherein E is absent, or E is a substituted or unsubstituted alkyl, a substituted or unsubstituted alkenyl, a substituted or unsubstituted alkynyl, a substituted or unsubstituted aralkyl (e.g., a substituted or unsubstituted alkylaryl, a substituted or unsubstituted arylalkyl, etc.), a substituted or unsubstituted aryl, a substituted or unsubstituted heteroaryl, a substituted or unsubstituted polyaryl, a substituted or unsubstituted polyheteroaryl, a substituted or unsubstituted heterocyclyl, oxygen, alkoxy, aroxy, or substituted alkoxy or substituted aroxy, wherein, independently of E, $R^{vi}$ and $R^{vii}$ are independently a hydrogen, a substituted or unsubstituted alkyl, a substituted or unsubstituted alkenyl, a substituted or unsubstituted alkynyl, a substituted or unsubstituted carbonyl, a substituted or unsubstituted heterocyclyl, a substituted or unsubstituted aralkyl (e.g. a substituted or unsubstituted alkylaryl, a substituted or unsubstituted arylalkyl, etc.), a substituted or unsubstituted aryl, a substituted or unsubstituted heteroaryl, a substituted or unsubstituted polyaryl, a substituted or unsubstituted polyheteroaryl, a substituted or unsubstituted heterocyclyl, a hydroxyl, an alkoxy, a phosphonium, a phosphanyl, a phosphonyl, a sulfinyl, a silyl, a thiol, an amido, an amino, or —$(CH_2)_m$—$R'''$, or $R^{vi}$ and $R^{vii}$ taken together with the P atom to which they are attached complete a heterocycle having from 3 to 14 atoms in the ring structure; $R'''$ represents a hydroxyl group, a substituted or unsubstituted carbonyl group, a substituted or unsubstituted aryl, a substituted or unsubstituted cycloalkyl, a substituted or unsubstituted cycloalkenyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, an alkoxy, a phosphonium, a phosphanyl, an amido, or an amino; and m is zero or an integer ranging from 1 to 8.

The term "substituted phosphonyl" represents a phosphonyl in which E, $R^{vi}$ and $R^{vii}$ are independently substituted. Such substituents can be any substituents described above, e.g., halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphoryl, phosphate, phosphonate, phosphinate, amino (e.g. quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, polyaryl, polyheteroaryl, and combinations thereof.

The term "phosphoryl" defines a phosphonyl in which E is absent, oxygen, alkoxy, aroxy, substituted alkoxy or substituted aroxy, as defined above, and independently of E, $R^{vi}$ and $R^{vii}$ are independently hydroxyl, alkoxy, aroxy, substituted alkoxy or substituted aroxy, as defined above. When E is oxygen, the phosphoryl cannot be attached to another chemical species, such as to form an oxygen-oxygen bond, or other unstable bonds, as understood by one of ordinary skill in the art. When E, $R^{vi}$ and $R^{vii}$ are substituted, the substituents include, but are not limited to, halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphoryl, phosphate, phosphonate, phosphinate, amino (e.g. quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, polyaryl, polyheteroaryl, and combinations thereof.

The term "sulfinyl" is represented by the formula

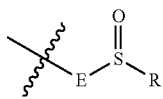

wherein E is absent, or E is a substituted or unsubstituted alkyl, a substituted or unsubstituted alkenyl, a substituted or unsubstituted alkynyl, a substituted or unsubstituted aralkyl (e.g., a substituted or unsubstituted alkylaryl, a substituted or unsubstituted arylalkyl, etc.), a substituted or unsubstituted aryl, a substituted or unsubstituted heteroaryl, a substituted or unsubstituted heterocyclyl, a substituted or unsubstituted polyaryl, a substituted or unsubstituted polyheteroaryl, wherein independently of E, R represents a hydrogen, a substituted or unsubstituted alkyl, a substituted or unsubstituted alkenyl, a substituted or unsubstituted alkynyl, a substituted or unsubstituted carbonyl, a substituted or unsubstituted heterocyclyl, a substituted or unsubstituted aralkyl (e.g. a substituted or unsubstituted alkylaryl, a substituted or unsubstituted arylalkyl), a substituted or unsubstituted aryl, a substituted or unsubstituted heteroaryl, a substituted or unsubstituted polyaryl, a substituted or unsubstituted polyheteroaryl, a substituted or unsubstituted heterocyclyl, a hydroxyl, an alkoxy, a phosphonium, a phosphanyl, a phospho-nyl, a silyl, a thiol, an amido, an amino, or —(CH$_2$)$_m$—R''', or E and R taken together with the S atom to which they are attached complete a heterocycle having from 3 to 14 atoms in the ring structure; R''' represents a hydroxyl group, a substituted or unsubstituted carbonyl group, a substituted or unsubstituted aryl, a substituted or unsubstituted cycloalkyl, a substituted or unsubstituted cycloalkenyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, an alkoxy, a phosphonium, a phosphanyl, an amido, or an amino; and m is zero or an integer ranging from 1 to 8.

The term "sulfonyl" is represented by the formula

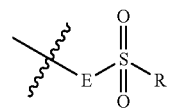

wherein E is absent, or E is a substituted or unsubstituted alkyl, a substituted or unsubstituted alkenyl, a substituted or unsubstituted alkynyl, a substituted or unsubstituted aralkyl (e.g., a substituted or unsubstituted alkylaryl, a substituted or unsubstituted arylalkyl, etc.), a substituted or unsubstituted aryl, a substituted or unsubstituted heteroaryl, a substituted or unsubstituted heterocyclyl, a substituted or unsubstituted polyaryl, a substituted or unsubstituted polyheteroaryl, wherein independently of E, R represents a hydrogen, a substituted or unsubstituted alkyl, a substituted or unsubstituted alkenyl, a substituted or unsubstituted alkynyl, a substituted or unsubstituted carbonyl, a substituted or unsubstituted heterocyclyl, a substituted or unsubstituted aralkyl (e.g. a substituted or unsubstituted alkylaryl, a substituted or unsubstituted arylalkyl), a substituted or unsubstituted aryl, a substituted or unsubstituted heteroaryl, a substituted or unsubstituted polyaryl, a substituted or unsubstituted polyheteroaryl, a substituted or unsubstituted heterocyclyl, a hydroxyl, an alkoxy, a phosphonium, a phosphanyl, an amido, an amino, or —(CH$_2$)$_m$—R''', or E and R taken together with the S atom to which they are attached complete a heterocycle having from 3 to 14 atoms in the ring structure; R''' represents a hydroxyl group, a substituted or unsubstituted carbonyl group, a substituted or unsubstituted aryl, a substituted or unsubstituted cycloalkyl, a substituted or unsubstituted cycloalkenyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, an alkoxy, a phosphonium, a phosphanyl, an amido, or an amino; and m is zero or an integer ranging from 1 to 8.

The term "substituted sulfonyl" represents a sulfonyl in which E, R, or both, are independently substituted. Such substituents can be any substituents described above, e.g., halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphonium, phosphanyl, phosphoryl, phosphate, phosphonate, phosphinate, amino (e.g. quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, polyaryl, polyheteroaryl, and combinations thereof.

The term "sulfonic acid" refers to a sulfonyl, as defined above, wherein R is hydroxyl, and E is absent, or E is substituted or unsubstituted cycloalkyl, substituted or unsubstituted heterocyclyl, substituted or unsubstituted alkylaryl, substituted or unsubstituted arylalkyl, substituted or unsubstituted aryl, a substituted or unsubstituted polyaryl, a substituted or unsubstituted polyheteroaryl, or substituted or unsubstituted heteroaryl.

The term "sulfate" refers to a sulfonyl, as defined above, wherein E is absent, oxygen, alkoxy, aroxy, substituted alkoxy or substituted aroxy, as defined above, and R is independently hydroxyl, alkoxy, aroxy, substituted alkoxy or substituted aroxy, as defined above. When E is oxygen, the sulfate cannot be attached to another chemical species, such as to form an oxygen-oxygen bond, or other unstable bonds, as understood by one of ordinary skill in the art.

The term "sulfonate" refers to a sulfonyl, as defined above, wherein E is oxygen, alkoxy, aroxy, substituted alkoxy or substituted aroxy, as defined above, and R is independently hydrogen, substituted or unsubstituted alkyl, substituted or unsubstituted alkenyl, substituted or unsubstituted alkynyl, substituted or unsubstituted amino, substituted or unsubstituted cycloalkyl, substituted or unsubstituted heterocyclyl, substituted or unsubstituted aralkyl, substituted or unsubstituted alkylaryl, substituted or unsubstituted arylalkyl, substituted or unsubstituted aryl, substituted or unsubstituted heteroaryl, a substituted or unsubstituted polyaryl, a substituted or unsubstituted polyheteroaryl, —(CH$_2$)$_m$—R''', R''' represents a hydroxy group, substituted or unsubstituted carbonyl group, an aryl, a cycloalkyl ring, a cycloalkenyl ring, a heterocycle, an amido, an amino, or a polycycle; and m is zero or an integer ranging from 1 to 8. When E is oxygen, sulfonate cannot be attached to another chemical species, such as to form an oxygen-oxygen bond, or other unstable bonds, as understood by one of ordinary skill in the art.

The term "sulfamoyl" refers to a sulfonamide or sulfonamide represented by the formula

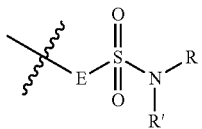

wherein E is absent, or E is substituted or unsubstituted alkyl, a substituted or unsubstituted alkenyl, a substituted or unsubstituted alkynyl, a substituted or unsubstituted aralkyl (e.g., a substituted or unsubstituted alkylaryl, a substituted or unsubstituted cycloalkyl, etc.), a substituted or unsubstituted aryl, a substituted or unsubstituted heteroaryl, a substituted or unsubstituted polyaryl, a substituted or unsubstituted polyheteroaryl, a substituted or unsubstituted heterocyclyl, wherein independently of E, R and R' each independently represent a hydrogen, a substituted or unsubstituted alkyl, a substituted or unsubstituted alkenyl, a substituted or unsubstituted alkynyl, a substituted or unsubstituted carbonyl, a substituted or unsubstituted heterocyclyl, a substituted or unsubstituted aralkyl (e.g. a substituted or unsubstituted alkylaryl, a substituted or unsubstituted arylalkyl, etc.), a substituted or unsubstituted aryl, a substituted or unsubstituted heteroaryl, a substituted or unsubstituted polyaryl, a substituted or unsubstituted polyheteroaryl, a substituted or unsubstituted heterocyclyl, a hydroxyl, an alkoxy, a phosphonium, a phosphanyl, an amido, an amino, or —(CH$_2$)$_m$—R''', or R and R' taken together with the N atom to which they are attached complete a heterocycle having from 3 to 14 atoms in the ring structure; R''' represents a hydroxyl group, a substituted or unsubstituted carbonyl group, a substituted or unsubstituted aryl, a substituted or unsubstituted cycloalkyl, a substituted or unsubstituted cycloalkenyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, an alkoxy, a phosphonium, a phosphanyl, an amido, or an amino; and m is zero or an integer ranging from 1 to 8.

The terms "thiol" are used interchangeably and are represented by —SR, where R can be a hydrogen, a substituted or unsubstituted alkyl, a substituted or unsubstituted alkenyl, a substituted or unsubstituted alkynyl, a substituted or unsubstituted heterocyclyl, a substituted or unsubstituted aryl, a substituted or unsubstituted heteroaryl, a substituted or unsubstituted aralkyl (e.g. a substituted or unsubstituted alkylaryl, a substituted or unsubstituted arylalkyl, etc.), a substituted or unsubstituted polyaryl, a substituted or unsubstituted polyheteroaryl, a substituted or unsubstituted carbonyl, a phosphonium, a phosphanyl, an amido, an amino, an alkoxy, an oxo, a phosphonyl, a sulfinyl, or a silyl, described above.

The term "alkylthio" refers to an alkyl group, as defined above, having a sulfur radical attached thereto. The "alkylthio" moiety is represented by —S-alkyl. Representative alkylthio groups include methylthio, ethylthio, and the like. The term "alkylthio" also encompasses cycloalkyl groups having a sulfur radical attached thereto.

The term "substituted alkylthio" refers to an alkylthio group having one or more substituents replacing one or more hydrogen atoms on one or more carbon atoms of the alkylthio backbone. Such substituents include, but are not limited to, halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphonium, phosphanyl, phosphoryl, phosphate, phosphonate, phosphinate, amino (e.g. quaternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof.

The term "phenylthio" is art recognized, and refers to —S—C$_6$H$_5$, i.e., a phenyl group attached to a sulfur atom.

The term "substituted phenylthio" refers to a phenylthio group, as defined above, having one or more substituents replacing a hydrogen on one or more carbons of the phenyl ring. Such substituents include, but are not limited to, halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphonium, phosphanyl, phosphoryl, phosphate, phosphonate, phosphinate, amino (e.g. quaternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof.

"Arylthio" refers to —S-aryl or —S-heteroaryl groups, wherein aryl and heteroaryl as defined herein.

The term "substituted arylthio" represents —S-aryl or —S-heteroaryl, having one or more substituents replacing a hydrogen atom on one or more ring atoms of the aryl and heteroaryl rings as defined herein. Such substituents include, but are not limited to, halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphonium, phosphanyl, phosphoryl, phosphate, phosphonate, phosphinate, amino (e.g. quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof.

Numerical ranges disclosed herein of any type, disclose individually each possible number that such a range could reasonably encompass, as well as any sub-ranges and combinations of sub-ranges encompassed therein.

II. Compositions

Pt(II) complexes that can emit in red and/or deep red regions are described herein. The Pt(II) complexes can contain a dinuclear center and bidentate and/or tetradentatge ligands. These can display red to deep red emissions with emission maxima spanning across 600 nm to 1000 nm (preferably 600 nm to 730 nm) and high emission quantum yield. For example, the Pt(II) complexes disclosed herein show an emission maxima in a range from 600 nm to 730 nm and have a high room temperature emission quantum yield of >50%, such as up to 80%, as measured by absolute measurement methods or relative measurement methods using a standard references, such as Pt(tpdbp), and a short emission lifetime of <3 μs, such as down 10 to 1.3 μs.

Without being bound to any theories, these dinuclear Pt(II) complexes have close Pt—Pt contact of ~2.85-2.87 Å and close interplanar distance below 3.3 Å. This dinuclearity feature allows enhanced metal character in $^3$MMLCT (metal-metal-to-ligand charge transfer) excited state, resulting in the high stability, high emission quantum yield, and high radiative decay rate (in the order of $10^5$ s$^{-1}$) of these Pt(II) complexes. Such a high radiative decay rate outweighs the increased non-radiative decay rate, which is commonly observed in red emitters.

A. Platinum (II) Complexes

The platinum (II) complex can have the structure of Formula I':

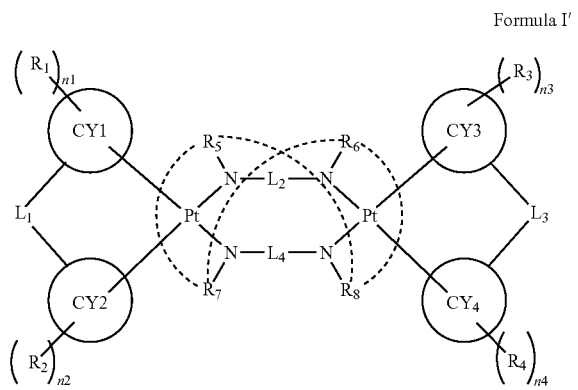

Formula I' where: (a) the compound can have an overall neutral, negative, or positive charge; (b) CY1, CY2, CY3, and CY4 can be independently substituted or unsubstituted aryl, substituted or unsubstituted polyaryl, substituted or unsubstituted heteroaryl, substituted or unsubstituted polyheteroaryl, substituted or unsubstituted heterocyclyl, substituted or unsubstituted cycloalkyl, substituted or unsubstituted cycloalkenyl, or substituted or unsubstituted cycloalkynyl; (c) $R_1$, $R_2$, $R_3$, and $R_4$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol; (d) n1, n2, n3, and n4 can be independently an integer between zero and 10; (e) $L_1$ and $L_3$ can be independently a bond (single, double, or triple), absent, oxygen, sulfur, amino, amido, substituted or unsubstituted alkyl, substituted or unsubstituted alkenyl, carbonyl, sulfonyl, sulfonic acid, phosphoryl, or phosphonyl; (f) $R_5$, $R_6$, $R_7$, and $R_8$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy; (g) $L_2$ and $L_4$ can be independently a bond (single, double, or triple), substituted or unsubstituted alkyl, substituted or unsubstituted alkenyl, amino, amido, or carbonyl; (h) ------ can be absent, a bond (single, double, or triple), a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether; and (i) the substituents can be independently a substituted or unsubstituted alkyl, a substituted or unsubstituted alkenyl, a substituted or unsubstituted alkynyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, a substituted or unsubstituted aralkyl, a substituted or unsubstituted carbonyl, a substituted or unsubstituted alkoxy, a halogen, a hydroxyl, a phenoxy, an aroxy, an alkylthio, a phenylthio, an arylthio, a cyano, an isocyano, a nitro, an carboxyl, an amino, an amido, an oxo, a silyl, a sulfinyl, a sulfonyl, a sulfonic acid, a phosphonium, a phosphanyl, a phosphoryl, a phosphonyl, or a thiol, or a combination thereof.

In some forms, the platinum (II) complex can have the structure of Formula I or I":

Formula I

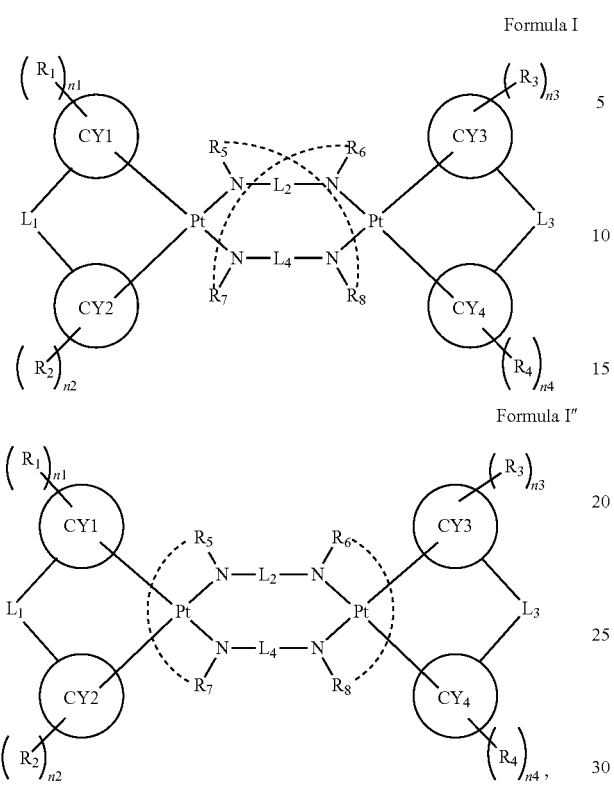

Formula I″ where: (a) the compound can have an overall neutral, negative, or positive charge; (b) CY1, CY2, CY3, and CY4 can be independently substituted or unsubstituted aryl, substituted or unsubstituted polyaryl, substituted or unsubstituted heteroaryl, substituted or unsubstituted polyheteroaryl, substituted or unsubstituted heterocyclyl, substituted or unsubstituted cycloalkyl, substituted or unsubstituted cycloalkenyl, or substituted or unsubstituted cycloalkynyl; (c) $R_1$, $R_2$, $R_3$, and $R_4$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol; (d) n1, n2, n3, and n4 can be independently an integer between zero and 10; (e) $L_1$ and $L_3$ can be independently a bond (single, double, or triple), absent, oxygen, sulfur, amino, amido, substituted or unsubstituted alkyl, substituted or unsubstituted alkenyl, carbonyl, sulfonyl, sulfonic acid, phosphoryl, or phosphonyl; (f) $R_5$, $R_6$, $R_7$, and $R_8$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy; (g) $L_2$ and $L_4$ can be independently a bond (single, double, or triple), substituted or unsubstituted alkyl, substituted or unsubstituted alkenyl, amino, amido, or carbonyl; (h) ------ can e absent, a bond (single, double, or triple), a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether; and (i) the substituents can be independently a substituted or unsubstituted alkyl, a substituted or unsubstituted alkenyl, a substituted or unsubstituted alkynyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, a substituted or unsubstituted aralkyl, a substituted or unsubstituted carbonyl, a substituted or unsubstituted alkoxy, a halogen, a hydroxyl, a phenoxy, an aroxy, an alkylthio, a phenylthio, an arylthio, a cyano, an isocyano, a nitro, an carboxyl, an amino, an amido, an oxo, a silyl, a sulfinyl, a sulfonyl, a sulfonic acid, a phosphonium, a phosphanyl, a phosphoryl, a phosphonyl, or a thiol, or a combination thereof.

In some forms, the platinum (II) complexes are isomers having the structure of Formula Ia, Ia', Ib, or Ib':

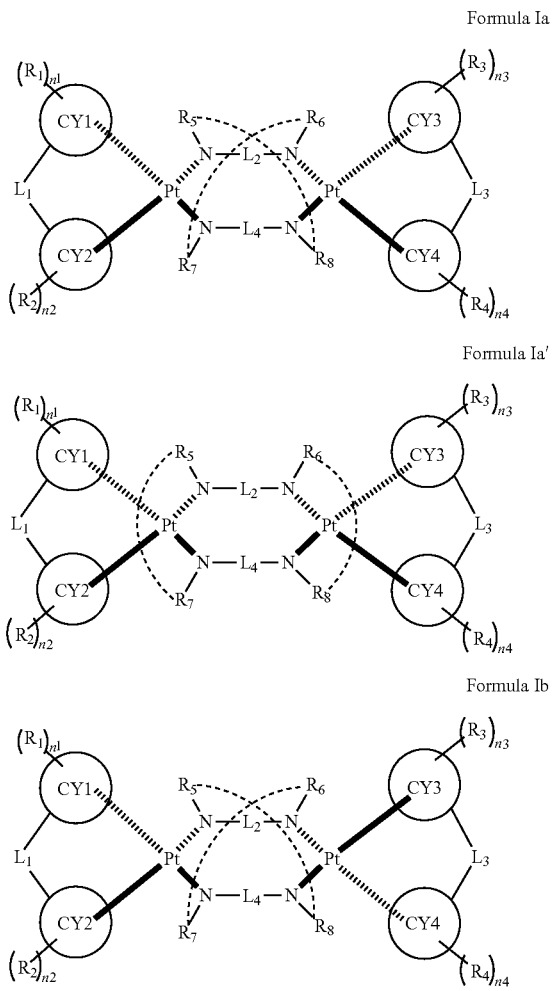

Formula Ia

Formula Ia'

Formula Ib

-continued

Formula Ib'

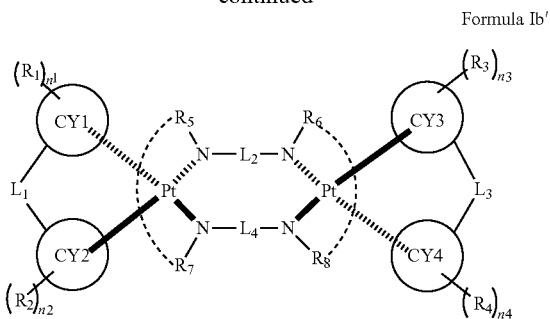

where CY1, CY2, CY3, CY4, $R_1$, $R_2$, $R_3$, $R_4$, n1, n2, n3, n4, $L_1$, $L_3$, $R_5$, $R_6$, $R_7$, $R_8$, $L_2$, $L_4$, ------, and the substituents can be as defined above for Formula I.

In some forms of Formulae I, I', I", Ia, Ia', Ib, and/or Ib', the platinum (II) complex can have an overall neutral charge. In some forms of Formulae I, Ia, and/or Ib, CY1, CY2, CY3, and CY4 can be independently substituted or unsubstituted aryl, substituted or unsubstituted polyaryl, substituted or unsubstituted heteroaryl, substituted or unsubstituted polyheteroaryl, or substituted or unsubstituted heterocyclyl.

In some forms, the platinum (II) complex can have the structure of Formula II or II':

Formula II

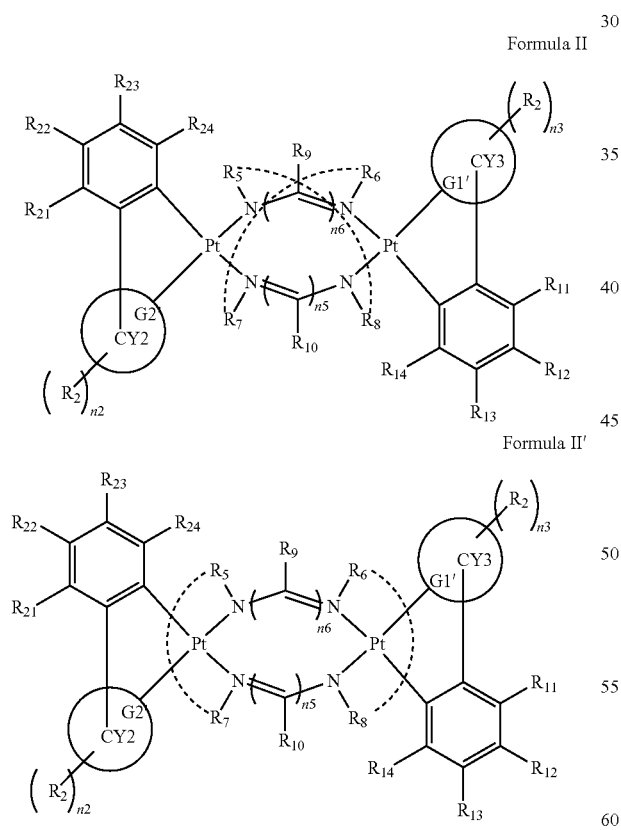

Formula II' where: (a) CY2 and CY3 can be independently substituted or unsubstituted aryl, substituted or unsubstituted polyaryl, substituted or unsubstituted heteroaryl, substituted or unsubstituted polyheteroaryl, substituted or unsubstituted heterocyclyl, substituted or unsubstituted cycloalkyl, substituted or unsubstituted cycloalkenyl, or substituted or unsubstituted cycloalkynyl; (b) $R_2$ and $R_3$ can be independently hydrogen, substituted or unsubstituted alkyl, substituted or unsubstituted aryl, substituted or unsubstituted polyaryl, substituted or unsubstituted heteroaryl, substituted or unsubstituted polyheteroaryl, substituted or unsubstituted heterocyclyl, amino, alkoxy, or aroxy; (c) n2, n3, n5, and n6 can be independently an integer between zero and 10; (d) $R_5$, $R_6$, $R_7$, and $R_8$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy; (e) $R_9$ and $R_{10}$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol; (f) $R_{11}$-$R_{14}$ and $R_{21}$-$R_{24}$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol, and optionally $R_{11}$ and $R_{12}$ together, $R_{12}$ and $R_{13}$ together, $R_{13}$ and $R_{14}$ together, $R_{21}$ and $R_{22}$ together, $R_{22}$ and $R_{23}$ together, and/or $R_{23}$ and $R_{24}$ together can form a substituted or unsubstituted aryl, a substituted or unsubstituted polyaryl, a substituted or unsubstituted heteroaryl, a substituted or unsubstituted polyheteroaryl, a substituted or unsubstituted cycloalkyl, a substituted or unsubstituted cycloalkenyl, a substituted or unsubstituted cycloalkynyl, or a substituted or unsubstituted heterocyclyl, such as a substituted or unsubstituted cycloalkyl, a substituted or unsubstituted aryl, or a substituted or unsubstituted heteroaryl; (g) G1' and G2' can be independently C or N; (h) ------ can be absent, a bond (single, double, or triple), a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether; and (i) the substituents can be as defined above for Formula I.

In some forms, the platinum (II) complexes are isomers having the structure of Formula IIa, IIa', IIb, or IIb':

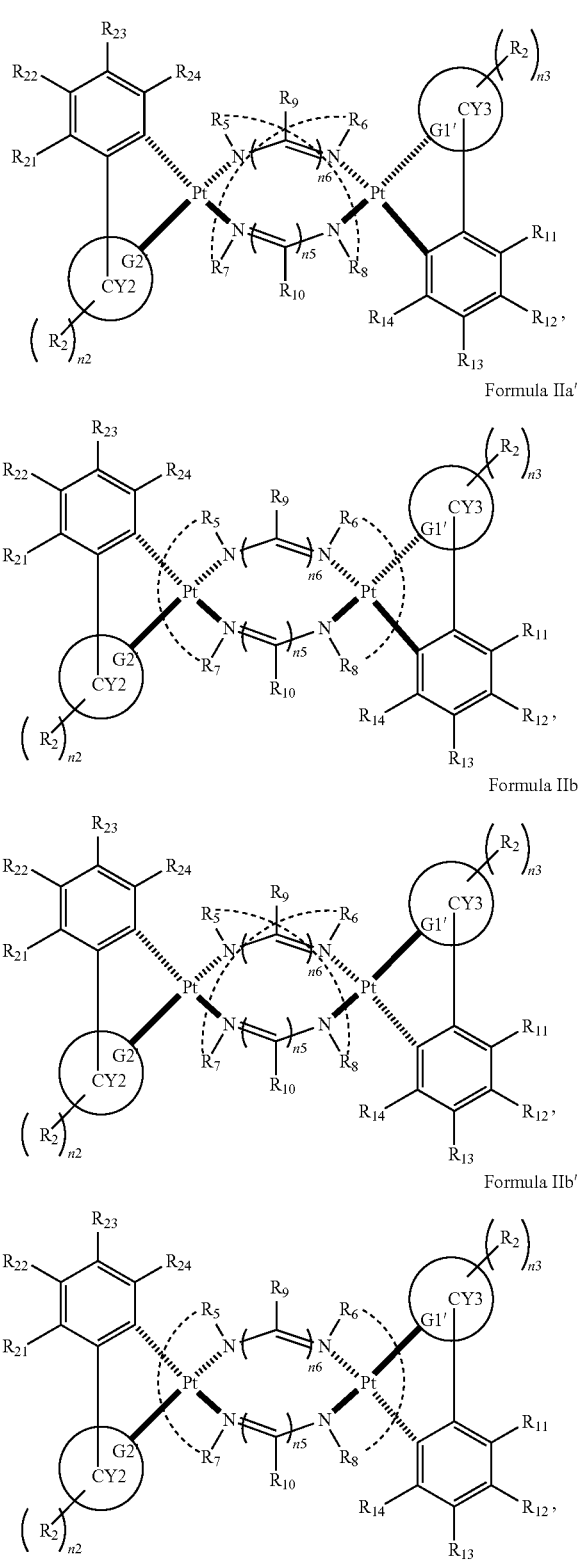

Formula IIa

Formula IIa'

Formula IIb

Formula IIb' where CY2, CY3, $R_2$, $R_3$, n2, n3, n5, n6, $R_5$-$R_8$, $R_9$-$R_{14}$, $R_{21}$-$R_{24}$, G1' and G2', ------, and the substituents can be as defined above for Formula II.

In some forms of Formulae I, I', I", Ia, Ia', Ib, Ib', II, II', IIa, IIa', IIb, and/or IIb', CY2 and CY3 can be independently substituted or unsubstituted heteroaryl, substituted or unsubstituted polyheteroaryl, or substituted or unsubstituted heterocyclyl. In some forms of Formulae I, I', I", Ia, Ia', Ib, Ib', II, II', IIa, IIa', IIb, and/or IIb', n2 and n3 are independently an integer between 2 and 4, and two adjacent $R_2$ and/or two adjacent $R_3$ forms a substituted or unsubstituted aryl, substituted or unsubstituted polyaryl, substituted or unsubstituted heteroaryl, substituted or unsubstituted polyheteroaryl, substituted or unsubstituted heterocyclyl, substituted or unsubstituted cycloalkyl, substituted or unsubstituted cycloalkenyl, or substituted or unsubstituted cycloalkynyl.

In some forms, the platinum (II) complex can have the structure of Formula III' or

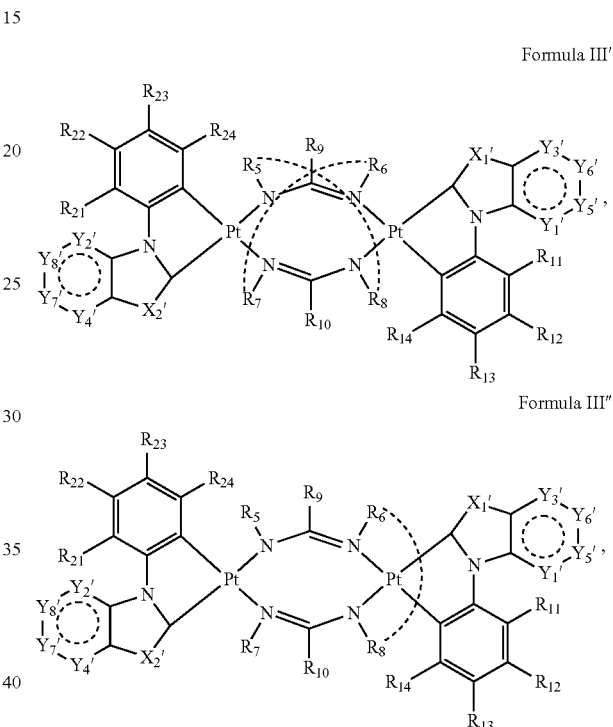

Formula III'

Formula III"

where: (a) $R_5$, $R_6$, $R_7$, and $R_8$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy; (b) $R_9$ and $R_{10}$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol; (c) $R_{11}$-$R_{14}$ and $R_{21}$-$R_{24}$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol, and optionally $R_{11}$ and $R_{12}$ together, $R_{12}$ and $R_{13}$ together, $R_{13}$ and $R_{14}$ together, $R_{21}$ and $R_{22}$ together, $R_{22}$ and $R_{23}$ together, and/or $R_{23}$ and $R_{24}$ together can form a substituted or unsubstituted aryl, a substituted or unsubstituted polyaryl, a substituted or unsubstituted heteroaryl, a substituted or unsubstituted polyheteroaryl, a substituted or unsubstituted cycloalkyl, a substituted or unsubstituted cycloalkenyl, a substituted or unsubstituted cycloalkynyl, or a substituted or unsubstituted heterocyclyl, such as a substituted or unsubstituted cycloalkyl, a substituted or unsubstituted aryl, or a substituted or unsubstituted heteroaryl; (d) each ------ can be independently absent, a bond (single, double, or triple), a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether; (e) $X_1'$, $X_2'$, $Y_1'$-$Y_8'$ can be independently O, S, $CR_{15}$, or $NR_{18}$, $R_{15}$ and $R_{18}$ can be independently absent, hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol; and (f) the substituents can be as defined above for Formula I.

In some forms, the platinum (II) complex can have the structure of Formula III or III''':

Formula III

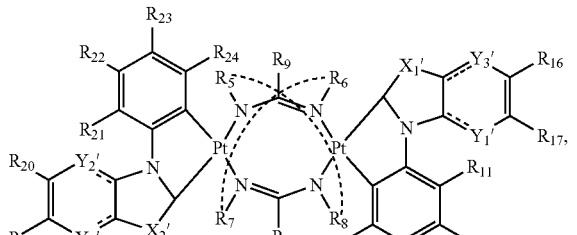

Formula III''''

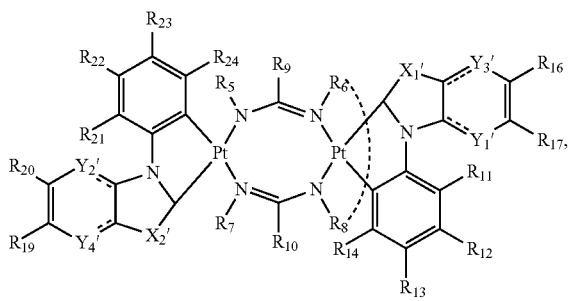

where: (a) $R_5$, $R_6$, $R_7$, and $R_7$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy; (b) $R_9$ and $R_{10}$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol; (c) $R_{11}$-$R_{14}$, $R_{19}$, $R_{17}$, and $R_{19}$-$R_{24}$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol, and optionally $R_1$ and $R_{12}$ together, $R_{12}$ and $R_{13}$ together, $R_{13}$ and $R_{14}$ together, $R_{10}$ and $R_{17}$ together, $R_{19}$ and $R_{20}$ together, $R_{21}$ and $R_{22}$ together, $R_{22}$ and $R_{23}$ together, and/or $R_{23}$ and $R_{24}$ together can form a substituted or unsubstituted aryl, a substituted or unsubstituted polyaryl, a substituted or unsubstituted heteroaryl, a substituted or unsubstituted polyheteroaryl, a substituted or unsubstituted cycloalkyl, a substituted or unsubstituted cycloalkenyl, a substituted or unsubstituted cycloalkynyl, or a substituted or unsubstituted heterocyclyl, such as a substituted or unsubstituted cycloalkyl, a substituted or unsubstituted aryl, or a substituted or unsubstituted heteroaryl; (d) each ------ can be independently absent, a bond (single, double, or triple), a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether; (e) $X_1'$, $X_2'$, $Y_1'$, $Y_2'$, $Y_3'$, and $Y_4'$ can be independently O, S, $CR_{15}$, or $NR_{18}$, $R_{15}$ and $R_{18}$ can be independently absent, hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol; and (f) the substituents can be as defined above for Formula I.

In some forms, the platinum (II) complexes are isomers having the structure of Formula IIIa, IIIa', IIIb, or IIIb':

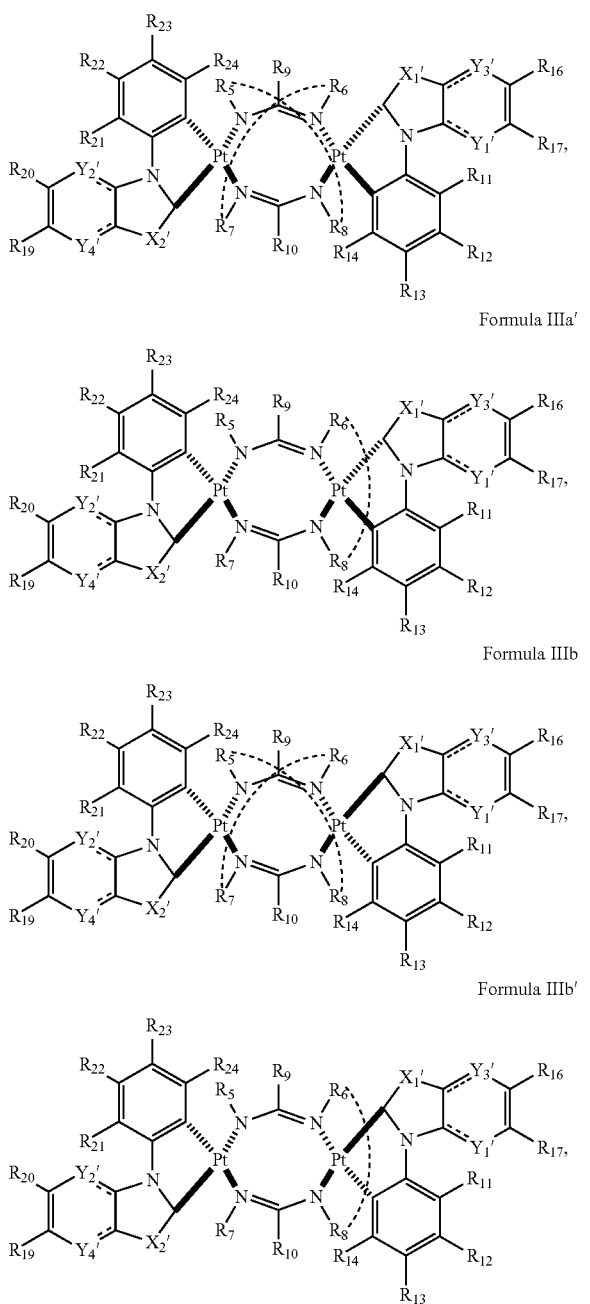

Formula IIIa

Formula IIIa'

Formula IIIb

Formula IIIb' where $R_5$-$R_{24}$, ------, $X_1'$, $X_2'$, $Y_1'$, $Y_2'$, $Y_3'$, $Y_4'$, and the substituents can be as defined above for Formula III.

In some forms of Formulae III, III', III'', III''', IIIa, IIIa', IIIb, and/or IIIb', $X_1'$, $X_2'$, $Y_1'$, $Y_2'$, $Y_3'$, and $Y_4'$ can be independently $CR_{15}$ or $NR_{18}$, $R_{15}$ and $R_{18}$ can be independently absent, hydrogen, substituted or unsubstituted alkyl, or substituted or unsubstituted aryl. In some forms of Formulae III, III', IIIa, and/or IIIb, $X_1'$, $X_2'$, $Y_1'$ and/or $Y_3'$, and $Y_2'$ and/or $Y_4'$ can be independently $NR_{18}$, each occurrence of $R_{18}$ can be absent, hydrogen, substituted or unsubstituted alkyl, or substituted or unsubstituted aryl. In some forms of Formulae III, III', III'', III''', IIIa, IIIa', IIIb, and/or IIIb', $R_{16}$, $R_{17}$, $R_{19}$, and $R_{20}$ can be independently hydrogen, halogen, nitrile, nitro, amino, substituted or unsubstituted alkyl, substituted or unsubstituted alkenyl, substituted or unsubstituted alkynyl, substituted or unsubstituted aryl, substituted or unsubstituted heteroaryl, substituted or unsubstituted heterocyclyl, or hydroxyl, or $R_{16}$ and $R_{17}$, $R_{19}$ and $R_{20}$, $R_{22}$ and $R_{23}$, and/or $R_{12}$ and $R_{13}$, together form an substituted or unsubstituted aryl, substituted or unsubstituted polyaryl, substituted or unsubstituted heteroaryl, substituted or unsubstituted polyheteroaryl, substituted or unsubstituted heterocyclyl, substituted or unsubstituted cycloalkyl, substituted or unsubstituted cycloalkenyl, or substituted or unsubstituted cycloalkynyl. In some forms of Formulae III, III', III'', III''', IIIa, IIIa', IIIb, and/or IIIb', $R_{16}$ and $R_{17}$ and/or $R_{19}$ and $R_{20}$, together form an substituted or unsubstituted aryl, substituted or unsubstituted polyaryl, substituted or unsubstituted heteroaryl, substituted or unsubstituted polyheteroaryl, substituted or unsubstituted heterocyclyl, substituted or unsubstituted cycloalkyl, substituted or unsubstituted cycloalkenyl, or substituted or unsubstituted cycloalkynyl. In some forms of Formulae III, III', III'', III''', IIIa, IIIa', IIIb, and/or IIIb', $R_{12}$ and $R_{13}$ and/or $R_{22}$ and $R_{23}$, together form an substituted or unsubstituted aryl, substituted or unsubstituted polyaryl, substituted or unsubstituted heteroaryl, substituted or unsubstituted polyheteroaryl, substituted or unsubstituted heterocyclyl, substituted or unsubstituted cycloalkyl, substituted or unsubstituted cycloalkenyl, or substituted or unsubstituted cycloalkynyl.

In some forms, the platinum (II) complex can have the structure of Formula IV or IV':

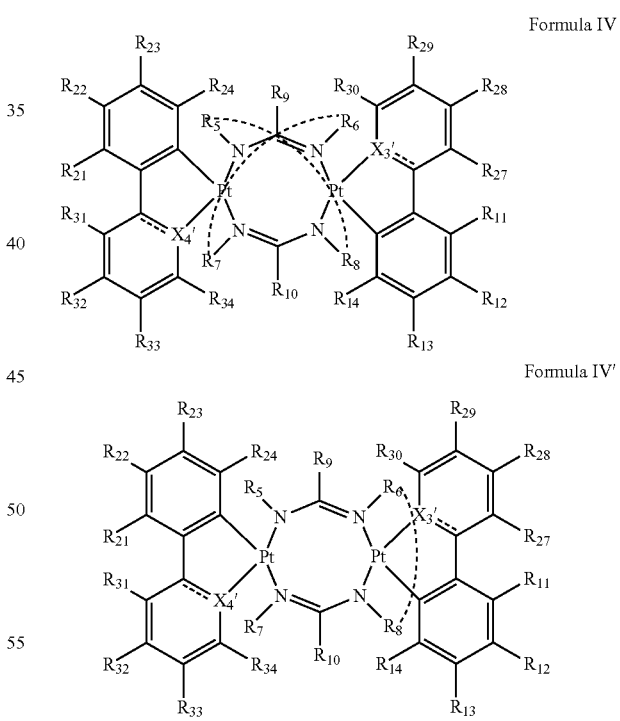

Formula IV

Formula IV' where: (a) $R_5$, $R_6$, $R_7$, and $R_8$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy; (b) $R_9$ and $R_{10}$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol; (c) $R_{11}$-$R_{14}$, $R_{21}$-$R_{24}$, and $R_{27}$-$R_{34}$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol, and optionally $R_{11}$ and $R_{12}$ together, $R_{12}$ and $R_{13}$ together, $R_{13}$ and $R_{14}$ together, $R_{21}$ and $R_{22}$ together, $R_{22}$ and $R_{23}$ together, $R_{23}$ and $R_{24}$, $R_{27}$ and $R_{28}$ together, $R_{28}$ and $R_{29}$ together, $R_{29}$ and $R_{30}$ together, $R_{31}$ and $R_{32}$ together, $R_{32}$ and $R_{33}$ together, and/or $R_{33}$ and $R_{34}$ together, can form a substituted or unsubstituted aryl, a substituted or unsubstituted polyaryl, a substituted or unsubstituted heteroaryl, a substituted or unsubstituted polyheteroaryl, a substituted or unsubstituted cycloalkyl, a substituted or unsubstituted cycloalkenyl, a substituted or unsubstituted cycloalkynyl, or a substituted or unsubstituted heterocyclyl, such as a substituted or unsubstituted cycloalkyl, a substituted or unsubstituted aryl, or a substituted or unsubstituted heteroaryl; (d) each ------ can be independently absent, a bond (single, double, or triple), a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether; (e) $X_3'$ and $X_4'$ can be independently $CR_{25}$ or $NR_{26}$, $R_{25}$ and $R_{26}$ can be independently absent, hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol; and (f) the substituents can be as defined above for Formula I.

In some forms, the platinum (II) complexes are isomers having the structure of Formula IVa, IVa', IVb, or IVb':

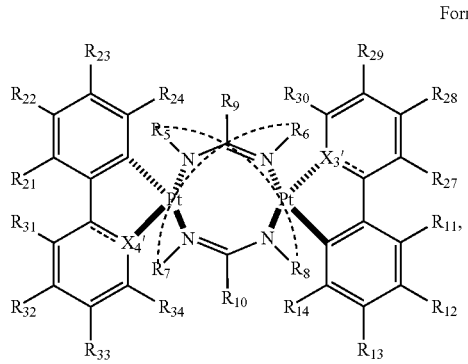

Formla IVa

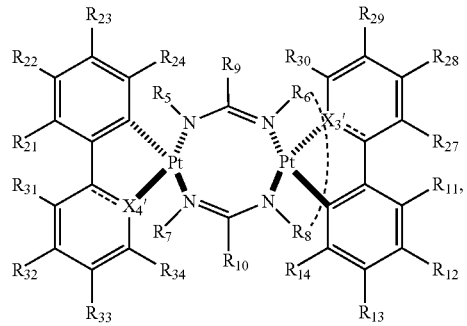

Formula IVa'

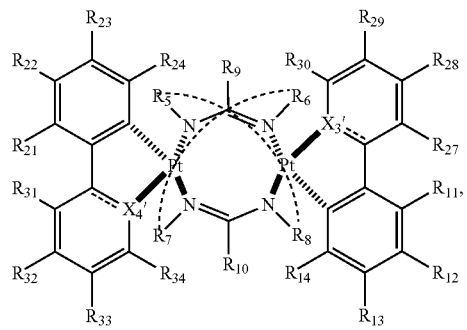

Formula IVb

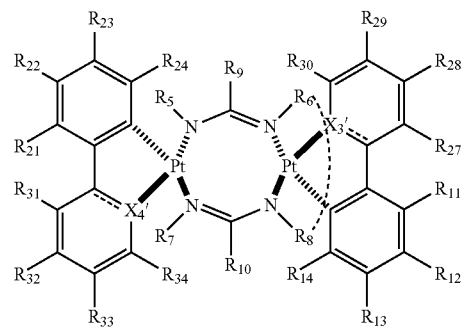

Formula IVb' where $R_5$-$R_{24}$, $R_{27}$-$R_{34}$, ------, $X_3'$, $X_4'$, and the substituents can be as defined above for Formula IV.

In some forms of Formulae IV, IV', IVa, IVa', IVb, and/or IVb', $X_3'$ and $X_4'$ can be independently $CR_{25}$ or $NR_{26}$, $R_{25}$ and $R_{26}$ can be independently absent, hydrogen, substituted or unsubstituted alkyl, substituted or unsubstituted aryl. In some forms of Formulae IV, IVa, and/or IVb, $X_3'$ and $X_4'$ can be independently $NR_{26}$, each occurrence of $R_{26}$ can be independently absent, hydrogen, substituted or unsubstituted alkyl, substituted or unsubstituted aryl. In some forms of Formulae IV, IV', IVa, IVa', IVb, and/or IVb', $R_{27}$-$R_{34}$ can be independently hydrogen, substituted or unsubstituted alkyl, substituted or unsubstituted aryl, substituted or unsubstituted heteroaryl, substituted or unsubstituted heterocyclyl, or hydroxyl. In some forms of Formulae IV, IV', IVa, IVa', IVb, and/or IVb', $R_{27}$-$R_{34}$ can be independently hydrogen, substituted or unsubstituted alkyl, or substituted or unsubstituted aryl.

In some forms of Formulae II, II', IIa, IIa', IIb, IIb', III, III', III'', III''', IIIa, IIIa', IIIb, IIIb', IV, IV', IVa, IVa', IVb, and/or IVb', $R_9$ and $R_{10}$ can be independently hydrogen or substituted or unsubstituted alkyl. In some forms of Formulae II, II', IIa, IIa', IIb, IIb', III, III', III'', III''', IIIa, IIIa', IIIb, IIIb', IV, IV', IVa, IVa', IVb, and/or IVb', $R_{11}$-$R_{14}$ and $R_{21}$-$R_{24}$ can be independently hydrogen, substituted or unsubstituted alkyl, substituted or unsubstituted aryl, substituted or unsubstituted heteroaryl, substituted or unsubstituted polyheteroaryl, substituted or unsubstituted heterocyclyl, hydroxyl, alkoxy, or aroxy. In some forms of Formulae II, II', IIa, IIa', IIb, IIb', III, III', III'', III''', IIIa, IIIa', IIIb, IIIb', IV, IV', IVa, IVa', IVb, and/or IVb', $R_1$, $R_{12}$, $R_{21}$, $R_{22}$ can be hydrogen or $R_{11}$ and $R_{12}$ together can form a substituted or unsubstituted heteroaryl, substituted or unsubstituted polyheteroaryl, or substituted or unsubstituted heterocyclyl and/or $R_{21}$ and $R_{22}$ together can form a substituted or unsubstituted heteroaryl, substituted or unsubstituted polyheteroaryl, or substituted or unsubstituted heterocyclyl.

In some forms of Formulae II, II', IIa, IIa', IIb, IIb', III, III', III'', III''', IIIa, IIIa', IIIb, IIIb', IV, IV', IVa, IVa', IVb, and/or IVb', Ru, $R_{12}$, $R_{21}$, $R_{22}$ can be hydrogen or Ru and $R_{12}$ together can forms and/or $R_{21}$ and $R_{22}$ together can form the structure of Formula V:

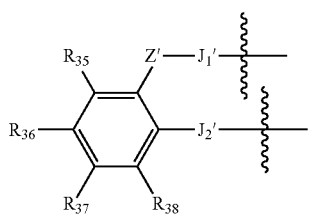

Formula V where: (a) Z' can be O, S, $CR_{39}$, or $NR_{40}$, $R_{39}$ and $R_{40}$ can be independently absent, hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol; (b) $J_1'$ and $J_2'$ can be independently

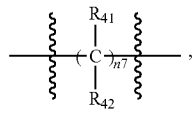

$R_{41}$ and $R_{42}$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol, and optionally $J_1'$ and $J_2'$ together can form a substituted or unsubstituted cycloalkyl, a substituted or unsubstituted cycloalkenyl, or a substituted or unsubstituted cycloalkynyl; (c) n7 can be independently an integer from 0 to 4; and (d) $R_{35}$-$R_{38}$ can be independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol.

In some forms of Formula V, n7 can be 0 and Z' can be O, S, or $NR_{40}$, each occurrence of $R_{40}$ can be independently hydrogen, substituted or unsubstituted alkyl, substituted or unsubstituted aryl, substituted or unsubstituted heteroaryl, substituted or unsubstituted heterocyclyl, or hydroxyl. In some forms of Formula V, $R_{35}$-$R_{38}$ can be independently hydrogen, substituted or unsubstituted alkyl, substituted or unsubstituted aryl, substituted or unsubstituted heteroaryl, substituted or unsubstituted polyheteroaryl, or substituted or unsubstituted heterocyclyl, hydroxyl, alkoxy, or aroxy.

In some forms of Formula V, $J_1'$ and $J_2'$ together can form a substituted or unsubstituted cycloalkyl, a substituted or unsubstituted cycloalkenyl, or a substituted or unsubstituted cycloalkynyl, such as an unsubstituted cycloalkyl, an unsubstituted cycloalkenyl, or an unsubstituted cycloalkynyl, for example, an unsubstituted cycloalkyl. The cycloalkyl, cycloalkenyl, and cycloalkynyl for Formula V can be monocyclic or polycyclic, such as a $C_3$-$C_{30}$, $C_4$-$C_{30}$, $C_4$-$C_{25}$, $C_4$-$C_{20}$, $C_4$-$C_{18}$, $C_4$-$C_{16}$, $C_4$-$C_{15}$, $C_4$-$C_{14}$, $C_4$-$C_{13}$, $C_4$-$C_{12}$, $C_4$-$C_{10}$, $C_4$-$C_9$, $C_4$-$C_8$, $C_4$-$C_7$, $C_4$-$C_6$, or $C_4$-$C_5$ monocyclic or polycyclic cycloalkyl, cycloalkenyl, or cycloalkynyl. For example, $J_1'$ and $J_2'$ together can form a monocyclic or polycyclic alkyl as shown below:

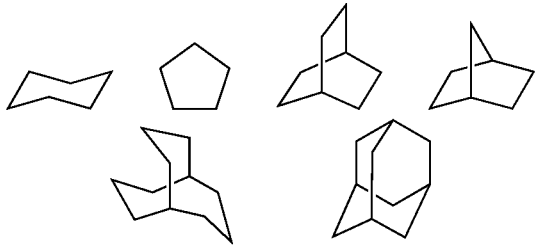

In some forms, the platinum (II) complex can contain one or two tetradentate ligands, each tetradentate ligand is in place of two bidentate bridging ligands. The inclusion of a tetradentate ligand in these platinum (II) complexes allows subtle structure refinement. For example, the replace of two bidentate bridging ligands with one tetradentate bridging ligand in these Pt(II) complexes narrows the full width at half maximum (FWHM) by about 30 nm in the emission profile, and retains the coordination mainframe and other photophysical properties, such as the shortened emission lifetime.

In some forms of Formulae I, I', I'', Ia, Ia', Ib, Ib', II, II', IIa, IIa', IIb, IIb', III, III', III'', III''', IIIa, IIa', IIIb, IIb', IV, IV', IVa, IVa', IVb, and/or IVb', any one of the ------ between $R_5$ and $R_8$, between $R_6$ and $R_7$, between $R_5$ and $R_7$, and between $R_6$ and $R_8$ can be absent, a single bond, a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether. In some forms, at least one ------ is not absent, such that the platinum (II) complex can contain one or two tetradentate ligands, each tetradentate ligand is in place of two bidentate bridging ligands. The inclusion of a tetradentate ligand in these platinum (II) complexes allows subtle structure refinement. For example, the replace of two bidentate bridging ligands with one tetradentate bridging ligand in these Pt(II) complexes narrows the full width at half maximum (FWHM) by about 30 nm in the emission profile, and retains the coordination mainframe and other photophysical properties, such as the shortened emission lifetime.

In some forms of Formulae I, I', I'', Ia, Ia', Ib, Ib', II, II', IIa, IIa', IIb, IIb', III, III', III'', III''', IIIa, IIIa', IIIb, IIIb', IV, IV', IVa, IVa', IVb, and/or IVb', any one of

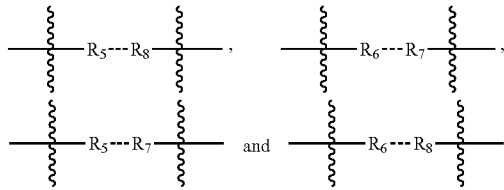

and can have a structure:

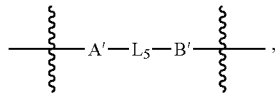

where: (a) A' and B' can be independently substituted or unsubstituted cycloalkyl, substituted or unsubstituted cycloalkenyl, substituted or unsubstituted cycloalkynyl, substituted or unsubstituted aryl, substituted or unsubstituted polyaryl, substituted or unsubstituted heteroaryl, substituted or unsubstituted polyheteroaryl, or substituted or unsubstituted heterocyclyl, such as a substituted or unsubstituted aryl; and (b) each occurrence of $L_5$ can be independently ether, polyether, alkoxyl, thioether, sulfonyl, substituted or unsubstituted heterocyclyl, substituted or unsubstituted aryl, substituted or unsubstituted alkyl, substituted or unsubstituted alkenyl, or substituted or unsubstituted alkynyl. In some forms, A' and B' can be independently substituted or unsubstituted aryl or substituted or unsubstituted polyaryl; and $L_5$ can have a structure:

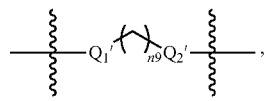

where: (a) $Q_1'$ and $Q_2'$ can be independently absent, O or S; and (b) n9 can be an integer from 1 to 10, such as from 1 to 6, e.g. 1, 2, or 6.

In some forms of Formulae I, I', I'', Ia, Ia', Ib, Ib', II, II', IIa, IIa', IIb, IIb', III, III', III'', III''', IIIa, IIIa', IIIb, IIIb', IV, IV', IVa, IVa', IVb, and/or IVb', the substituents for a substituted functional group can be a substituted or unsubstituted alkyl, a substituted or unsubstituted alkenyl, a substituted or unsubstituted alkynyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, a substituted or unsubstituted aralkyl, a carbonyl, an alkoxy, an aroxy, an amino, an amido, or a hydroxyl, or a combination thereof.

In some forms of Formulae I, I', I'', Ia, Ia', Ib, Ib', II, II', IIa, IIa', IIb, IIb', III, III', III'', III''', IIIa, IIIa', IIIb, IIIb', IV, IV', IVa, IVa', IVb, and/or IVb', the substituents for a substituted functional group can be an unsubstituted alkyl, an unsubstituted alkenyl, an unsubstituted alkynyl, an unsubstituted heterocyclyl, an unsubstituted aryl, an unsubstituted heteroaryl, an unsubstituted aralkyl, a carboxyl, an ester, a thioester, a hydroxyl, an alkoxy, an amino, or an amido, or a combination thereof.

In some forms of Formulae I, I', I'', Ia, Ia', Ib, Ib', II, II', IIa, IIa', IIb, IIb', III, III', III'', III''', IIIa, IIIa', IIIb, IIIb', IV, IV', IVa, IVa', IVb, and/or IVb', the alkyl can be a linear alkyl, a branched alkyl, or a cyclic alkyl (either monocyclic or polycyclic). Exemplary alkyl include a linear $C_1$-$C_{30}$ alkyl, a branched $C_4$-$C_{30}$ alkyl, a cyclic $C_3$-$C_{30}$ alkyl, a linear $C_1$-$C_{20}$ alkyl, a branched $C_4$-$C_{20}$ alkyl, a cyclic $C_3$-$C_{20}$ alkyl, a linear $C_1$-$C_{10}$ alkyl, a branched $C_4$-$C_{10}$ alkyl, a cyclic $C_3$-$C_{10}$ alkyl, a linear $C_1$-$C_6$ alkyl, a branched $C_4$-$C_6$ alkyl, a cyclic $C_3$-$C_6$ alkyl, a linear $C_1$-$C_4$ alkyl, cyclic $C_3$-$C_4$ alkyl, such as a linear $C_1$-$C_{10}$, $C_1$-$C_9$, $C_1$-$C_8$, $C_1$-$C_7$, $C_1$-$C_6$, $C_1$-$C_5$, $C_1$-$C_4$, $C_1$-$C_3$, $C_1$-$C_2$ alkyl group, a branched $C_3$-$C_9$, $C_3$-$C_9$, $C_3$-$C_8$, $C_3$-$C_7$, $C_3$-$C_6$, $C_3$-$C_5$, $C_3$-$C_4$ alkyl group, or a cyclic $C_3$-$C_9$, $C_3$-$C_9$, $C_3$-$C_8$, $C_3$-$C_7$, $C_3$-$C_6$, $C_3$-$C_5$, $C_3$-$C_4$ alkyl group. The cyclic alkyl can be monocyclic alkyl or polycyclic alkyl, such as a $C_3$-$C_{30}$, $C_4$-$C_{30}$, $C_4$-$C_{25}$, $C_4$-$C_{20}$, $C_4$-$C_{18}$, $C_4$-$C_{16}$, $C_4$-$C_{15}$, $C_4$-$C_{14}$, $C_4$-$C_{13}$, $C_4$-$C_{12}$, $C_4$-$C_{10}$, $C_4$-$C_9$, $C_4$-$C_8$, $C_4$-$C_7$, $C_4$-$C_6$, or $C_4$-$C_5$ monocyclic or polycyclic alkyl group.

In some forms of Formulae I, I', I'', Ia, Ia', Ib, Ib', II, II', IIa, IIa', IIb, IIb', III, III', III'', III''', IIIa, IIa', IIIb, IIIb', IV, IV', IVa, IVa', IVb, and/or IVb', the alkenyl can be a linear alkenyl, a branched alkenyl, or a cyclic alkenyl (either monocyclic or polycyclic). Exemplary alkenyl include a linear $C_1$-$C_{30}$ alkenyl, a branched $C_4$-$C_{30}$ alkenyl, a cyclic $C_3$-$C_{30}$ alkenyl, a linear $C_1$-$C_{20}$ alkenyl, a branched $C_4$-$C_{20}$ alkenyl, a cyclic $C_3$-$C_{20}$ alkenyl, a linear $C_1$-$C_{10}$ alkenyl, a branched $C_4$-$C_{10}$ alkenyl, a cyclic $C_3$-$C_{10}$ alkenyl, a linear $C_1$-$C_6$ alkenyl, a branched $C_4$-$C_6$ alkenyl, a cyclic $C_3$-$C_6$ alkenyl, a linear $C_1$-$C_4$ alkenyl, cyclic $C_3$-$C_4$ alkenyl, such as a linear $C_1$-$C_{10}$, $C_1$-$C_9$, $C_1$-$C_8$, $C_1$-$C_7$, $C_1$-$C_6$, $C_1$-$C_5$, $C_1$-$C_4$, $C_1$-$C_3$, $C_1$-$C_2$ alkenyl group, a branched $C_3$-$C_9$, $C_3$-$C_9$, $C_3$-$C_8$, $C_3$-$C_7$, $C_3$-$C_6$, $C_3$-$C_5$, $C_3$-$C_4$ alkenyl group, or a cyclic $C_3$-$C_9$, $C_3$-$C_9$, $C_3$-$C_8$, $C_3$-$C_7$, $C_3$-$C_6$, $C_3$-$C_5$, $C_3$-$C_4$ alkenyl group. The cyclic alkenyl can be monocyclic alkenyl or polycyclic alkenyl, such as a $C_3$-$C_{30}$, $C_4$-$C_{30}$, $C_4$-$C_{25}$, $C_4$-$C_{20}$, $C_4$-$C_{18}$, $C_4$-$C_{16}$, $C_4$-$C_{15}$, $C_4$-$C_{14}$, $C_4$-$C_{13}$, $C_4$-$C_{12}$, $C_4$-$C_{10}$, $C_4$-$C_9$, $C_4$-$C_8$, $C_4$-$C_7$, $C_4$-$C_6$, or $C_4$-$C_5$ monocyclic or polycyclic alkenyl group.

In some forms of Formulae I, I', I'', Ia, Ia', Ib, Ib', II, II', IIa, IIa', IIb, IIb', III, III', III'', III''', IIIa, IIIa', IIIb, IIIb', IV, IV', IVa, IVa', IVb, and/or IVb', the alkynyl can be a linear alkynyl, a branched alkynyl, or a cyclic alkynyl (either monocyclic or polycyclic). Exemplary alkynyl include a linear $C_1$-$C_{30}$ alkynyl, a branched $C_4$-$C_{30}$ alkynyl, a cyclic $C_3$-$C_{30}$ alkynyl, a linear $C_1$-$C_{20}$ alkynyl, a branched $C_4$-$C_{20}$ alkynyl, a cyclic $C_3$-$C_{20}$ alkynyl, a linear $C_1$-$C_{10}$ alkynyl, a branched $C_4$-$C_{10}$ alkynyl, a cyclic $C_3$-$C_{10}$ alkynyl, a linear $C_1$-$C_6$ alkynyl, a branched $C_4$-$C_6$ alkynyl, a cyclic $C_3$-$C_6$ alkynyl, a linear $C_1$-$C_4$ alkynyl, cyclic $C_3$-$C_4$ alkynyl, such as a linear $C_1$-$C_{10}$, $C_1$-$C_9$, $C_1$-$C_8$, $C_1$-$C_7$, $C_1$-$C_6$, $C_1$-$C_5$, $C_1$-$C_4$, $C_1$-$C_3$, $C_1$-$C_2$ alkynyl group, a branched $C_3$-$C_9$, $C_3$-$C_9$, $C_3$-$C_8$, $C_3$-$C_7$, $C_3$-$C_6$, $C_3$-$C_5$, $C_3$-$C_4$ alkynyl group, or a cyclic $C_3$-$C_9$, $C_3$-$C_9$, $C_3$-$C_8$, $C_3$-$C_7$, $C_3$-$C_6$, $C_3$-$C_5$, $C_3$-$C_4$ alkynyl group. The cyclic alkynyl can be monocyclic or polycyclic alkynyl, such as a $C_3$-$C_{30}$, $C_4$-$C_{30}$, $C_4$-$C_{25}$, $C_4$-$C_{20}$, $C_4$-$C_{18}$, $C_4$-$C_{16}$, $C_4$-$C_{15}$, $C_4$-$C_{14}$, $C_4$-$C_{13}$, $C_4$-$C_{12}$, $C_4$-$C_{10}$, $C_4$-$C_9$, $C_4$-$C_8$, $C_4$-$C_7$, $C_4$-$C_6$, or $C_4$-$C_5$ monocyclic or polycyclic alkynyl group.

It is understood that any of the exemplary alkyl, alkenyl, and alkynyl groups can be heteroalkyl, heteroalkenyl, and heteroalkynyl, respectively. For example, the alkyl can be a linear $C_2$-$C_{30}$ heteroalkyl, a branched $C_4$-$C_{30}$ heteroalkyl, a cyclic $C_3$-$C_{30}$ heteroalkyl (i.e. a heterocycloalkyl), a linear $C_1$-$C_{20}$ heteroalkyl, a branched $C_4$-$C_{20}$ heteroalkyl, a cyclic $C_3$-$C_{20}$ heteroalkyl, a linear $C_1$-$C_{10}$ heteroalkyl, a branched $C_4$-$C_{10}$ heteroalkyl, a cyclic $C_3$-$C_{10}$ heteroalkyl, a linear $C_1$-$C_6$ heteroalkyl, a branched $C_4$-$C_6$ heteroalkyl, a cyclic $C_3$-$C_6$ heteroalkyl, a linear $C_1$-$C_4$ heteroalkyl, cyclic $C_3$-$C_4$ heteroalkyl, such as a linear $C_1$-$C_{10}$, $C_1$-$C_9$, $C_1$-$C_8$, $C_1$-$C_7$, $C_1$-$C_6$, $C_1$-$C_5$, $C_1$-$C_4$, $C_1$-$C_3$, $C_1$-$C_2$ heteroalkyl group, a branched $C_3$-$C_9$, $C_3$-$C_9$, $C_3$-$C_8$, $C_3$-$C_7$, $C_3$-$C_6$, $C_3$-$C_5$, $C_3$-$C_4$ heteroalkyl group, or a cyclic $C_3$-$C_9$, $C_3$-$C_9$, $C_3$-$C_8$, $C_3$-$C_7$, $C_3$-$C_6$, $C_3$-$C_5$, $C_3$-$C_4$ heteroalkyl group. The cyclic heteroalkyl can be monocyclic or polycyclic, such as a $C_3$-$C_{30}$, $C_4$-$C_{30}$, $C_4$-$C_{25}$, $C_4$-$C_{20}$, $C_4$-$C_{18}$, $C_4$-$C_{16}$, $C_4$-$C_{15}$, $C_4$-$C_{14}$, $C_4$-$C_{13}$, $C_4$-$C_{12}$, $C_4$-$C_{10}$, $C_4$-$C_9$, $C_4$-$C_8$, $C_4$-$C_7$, $C_4$-$C_6$, or $C_4$-$C_5$ monocyclic or polycyclic heteroalkyl group.

For example, the alkenyl can be a linear $C_2$-$C_{30}$ heteroalkenyl, a branched $C_4$-$C_{30}$ heteroalkenyl, a cyclic $C_3$-$C_{30}$ heteroalkenyl (i.e. a heterocycloalkenyl), a linear $C_1$-$C_{20}$ heteroalkenyl, a branched $C_4$-$C_{20}$ heteroalkenyl, a cyclic $C_3$-$C_{20}$ heteroalkenyl, a linear $C_1$-$C_{10}$ heteroalkenyl, a branched $C_4$-$C_{10}$ heteroalkenyl, a cyclic $C_3$-$C_{10}$ heteroalkenyl, a linear $C_1$-$C_6$ heteroalkenyl, a branched $C_4$-$C_6$ heteroalkenyl, a cyclic $C_3$-$C_6$ heteroalkenyl, a linear $C_1$-$C_4$ heteroalkenyl, cyclic $C_3$-$C_4$ heteroalkenyl, such as a linear $C_1$-$C_{10}$, $C_1$-$C_9$, $C_1$-$C_8$, $C_1$-$C_7$, $C_1$-$C_6$, $C_1$-$C_5$, $C_1$-$C_4$, $C_1$-$C_3$, $C_1$-$C_2$ heteroalkenyl group, a branched $C_3$-$C_9$, $C_3$-$C_9$, $C_3$-$C_8$, $C_3$-$C_7$, $C_3$-$C_6$, $C_3$-$C_5$, $C_3$-$C_4$ heteroalkenyl group, or a cyclic $C_3$-$C_9$, $C_3$-$C_9$, $C_3$-$C_8$, $C_3$-$C_7$, $C_3$-$C_6$, $C_3$-$C_5$, $C_3$-$C_4$ heteroalkenyl group. The cyclic heteroalkenyl can be monocyclic or polycyclic, such as a $C_3$-$C_{30}$, $C_4$-$C_{30}$, $C_4$-$C_{25}$, $C_4$-$C_{20}$, $C_4$-$C_{18}$, $C_4$-$C_{16}$, $C_4$-$C_{15}$, $C_4$-$C_{14}$, $C_4$-$C_{13}$, $C_4$-$C_{12}$, $C_4$-$C_{10}$, $C_4$-$C_9$, $C_4$-$C_8$, $C_4$-$C_7$, $C_4$-$C_6$, or $C_4$-$C_5$ monocyclic or polycyclic heteroalkenyl group.

For example, the alkynyl can be a linear $C_2$-$C_{30}$ heteroalkynyl, a branched $C_4$-$C_{30}$ heteroalkynyl, a cyclic $C_3$-$C_{30}$ heteroalkynyl (i.e. a heterocycloalkynyl), a linear $C_1$-$C_{20}$ heteroalkynyl, a branched $C_4$-$C_{20}$ heteroalkynyl, a cyclic $C_3$-$C_{20}$ heteroalkynyl, a linear $C_1$-$C_{10}$ heteroalkynyl, a branched $C_4$-$C_{10}$ heteroalkynyl, a cyclic $C_3$-$C_{10}$ heteroalkynyl, a linear $C_1$-$C_6$ heteroalkynyl, a branched $C_4$-$C_6$ heteroalkynyl, a cyclic $C_3$-$C_6$ heteroalkynyl, a linear $C_1$-$C_4$ heteroalkynyl, cyclic $C_3$-$C_4$ heteroalkynyl, such as a linear $C_1$-$C_{10}$, $C_1$-$C_9$, $C_1$-$C_8$, $C_1$-$C_7$, $C_1$-$C_6$, $C_1$-$C_5$, $C_1$-$C_4$, $C_1$-$C_3$, $C_1$-$C_2$ heteroalkynyl group, a branched $C_3$-$C_9$, $C_3$-$C_9$, $C_3$-$C_8$, $C_3$-$C_7$, $C_3$-$C_6$, $C_3$-$C_5$, $C_3$-$C_4$ heteroalkynyl group, or a cyclic $C_3$-$C_9$, $C_3$-$C_9$, $C_3$-$C_8$, $C_3$-$C_7$, $C_3$-$C_6$, $C_3$-$C_5$, $C_3$-$C_4$ heteroalkynyl group. The cyclic heteroalkynyl can be monocyclic or polycyclic, such as a $C_3$-$C_{30}$, $C_4$-$C_{30}$, $C_4$-$C_{25}$, $C_4$-$C_{20}$, $C_4$-$C_{18}$, $C_4$-$C_{16}$, $C_4$-$C_{15}$, $C_4$-$C_{14}$, $C_4$-$C_{13}$, $C_4$-$C_{12}$, $C_4$-$C_{10}$, $C_4$-$C_9$, $C_4$-$C_8$, $C_4$-$C_7$, $C_4$-$C_6$, or $C_4$-$C_5$ monocyclic or polycyclic heteroalkynyl group.

For example, the aryl group can be a $C_5$-$C_{30}$ aryl, a $C_5$-$C_{20}$ aryl, a $C_5$-$C_{12}$ aryl, a $C_5$-$C_1$ aryl, a $C_5$-$C_9$ aryl, a $C_6$-$C_{20}$ aryl, a $C_6$-$C_{12}$ aryl, a $C_6$-$C_{11}$ aryl, or a $C_6$-$C_9$ aryl. It is understood that the aryl can be a heteroaryl, such as a $C_5$-$C_{30}$ heteroaryl, a $C_5$-$C_{20}$ heteroaryl, a $C_5$-$C_{12}$ heteroaryl, a $C_5$-$C_{11}$ heteroaryl, a $C_5$-$C_9$ heteroaryl, a $C_6$-$C_{30}$ heteroaryl, a $C_6$-$C_{20}$ heteroaryl, a $C_6$-$C_{12}$ heteroaryl, a $C_6$-$C_{11}$ heteroaryl, or a $C_6$-$C_9$ heteroaryl. The polyaryl group can be a $C_{10}$-$C_{30}$ polyaryl, a $C_{10}$-$C_{20}$ polyaryl, a $C_{10}$-$C_{12}$ polyaryl, a $C_{10}$-$C_{11}$ polyaryl, or a $C_{12}$-$C_{20}$ polyaryl. It is understood that the aryl can be a polyheteroaryl, such as a $C_{10}$-$C_{30}$ polyheteroaryl, a $C_{10}$-$C_{20}$ polyheteroaryl, a $C_{10}$-$C_{12}$ polyheteroaryl, a $C_{10}$-$C_{11}$ polyheteroaryl, or a $C_{12}$-$C_{20}$ polyheteroaryl.

The Pt(II) complexes may contain one or more chiral centers or may otherwise be capable of existing as multiple stereoisomers. These may be pure (single) stereoisomers or mixtures of stereoisomers, such as enantiomers, diastereomers, and enantiomerically or diastereomerically enriched mixtures. The Pt(II) complexes may be capable of existing as geometric isomers. Accordingly, it is to be understood that the present invention includes pure geometric isomers or mixtures of geometric isomers.

2. Exemplary Platinum(II) Complexes

Exemplary Pt(II) complexes are presented below.

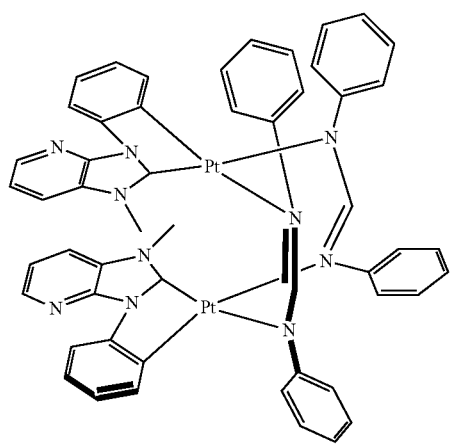

1a

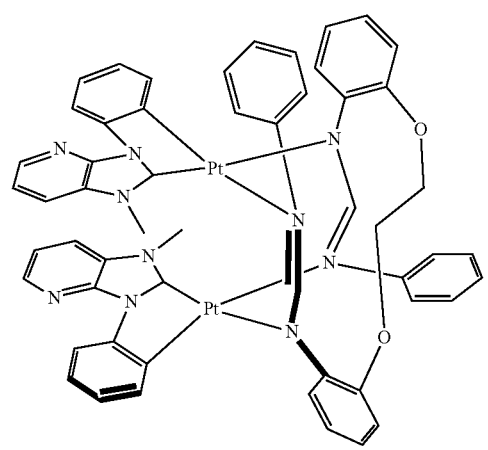

1b

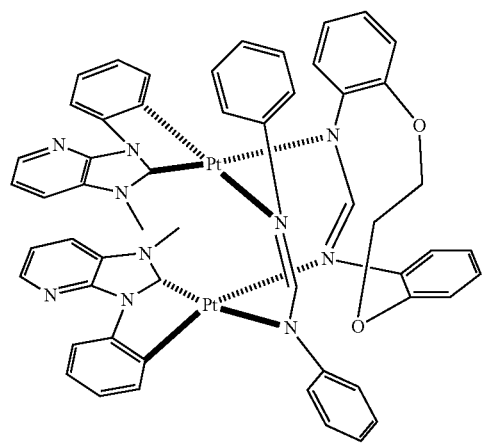
1b'
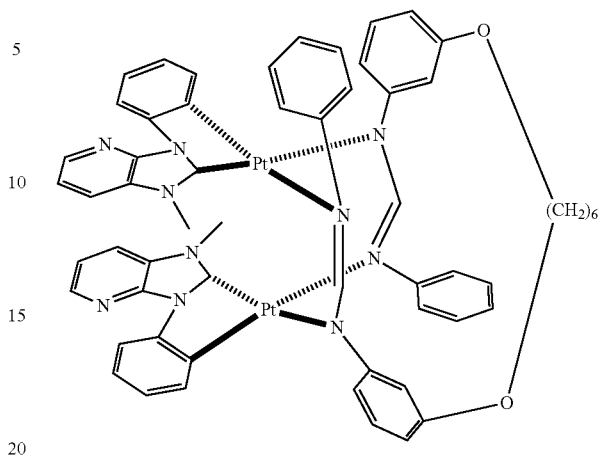
1d
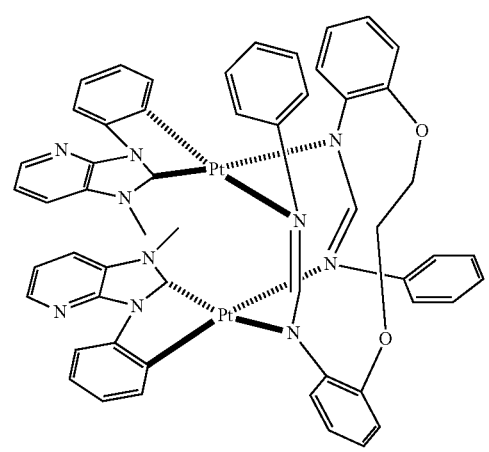
1c
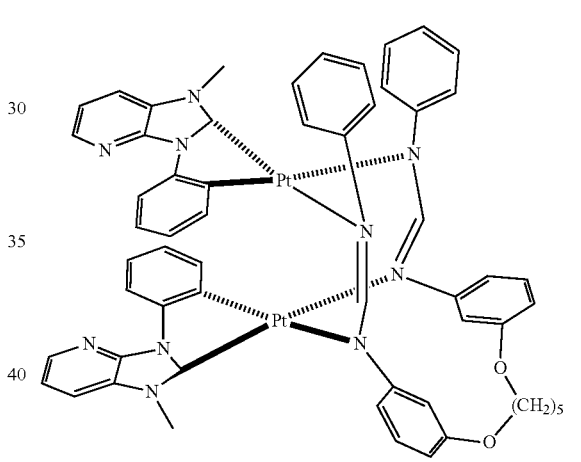
1d'
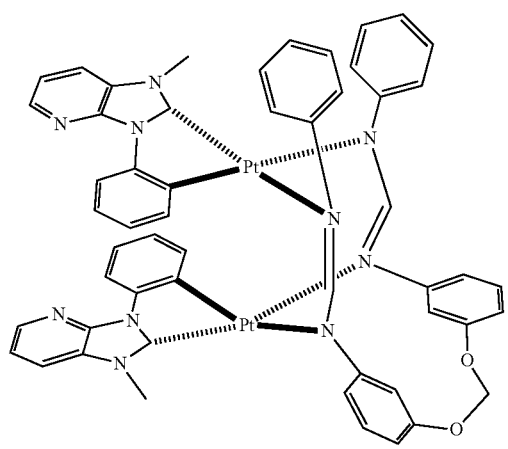
1c'
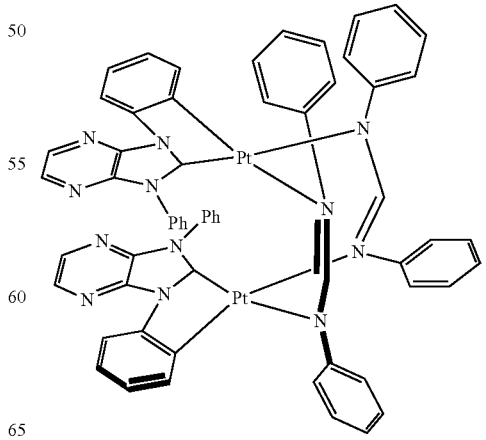
2a

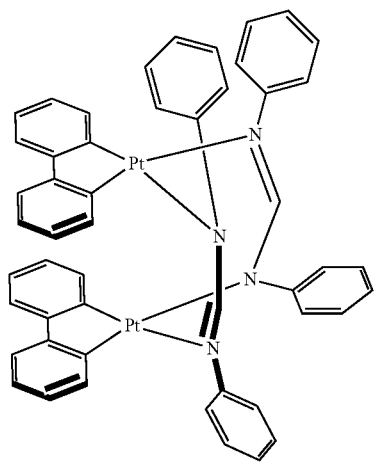
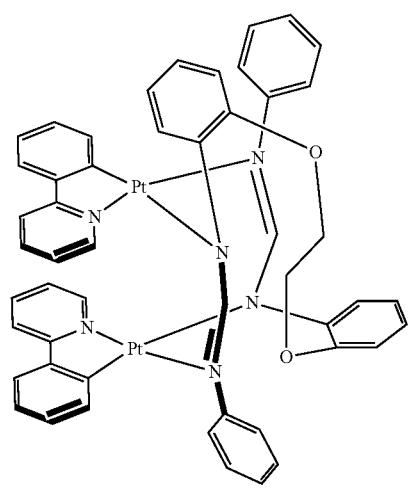
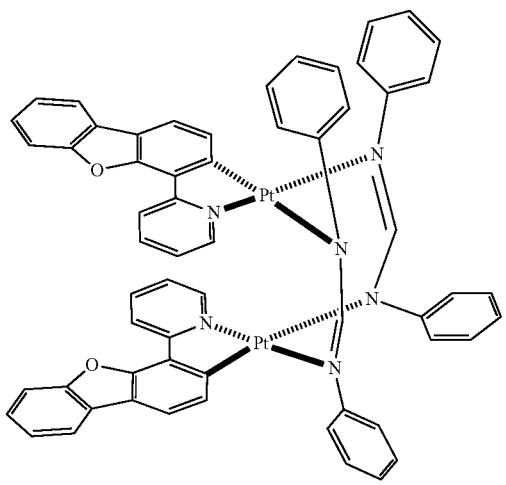
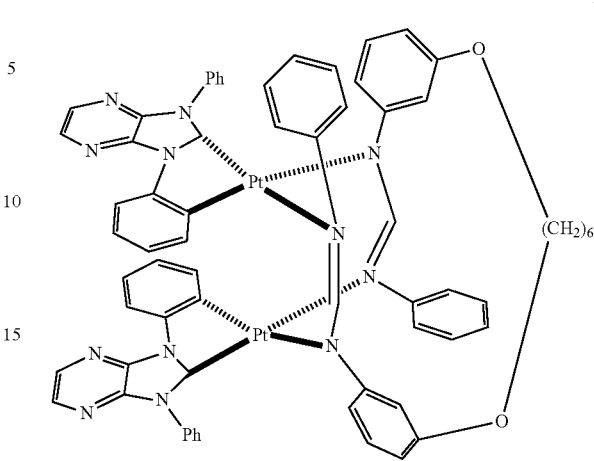
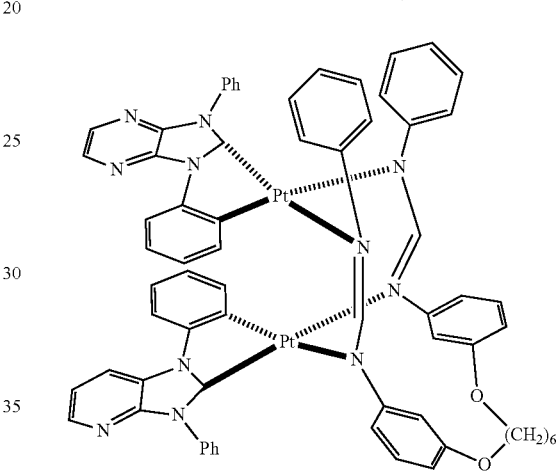
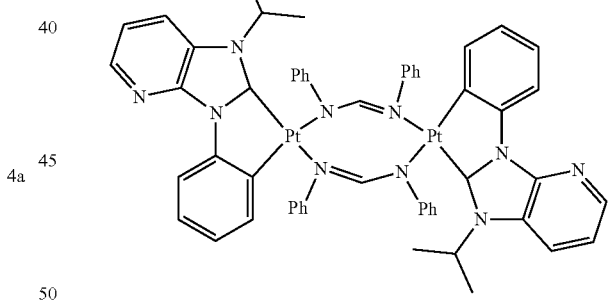
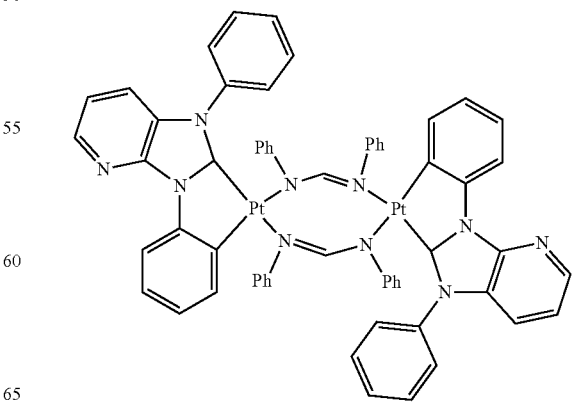

51
-continued
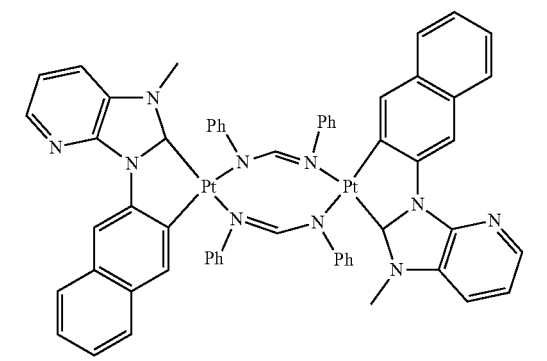
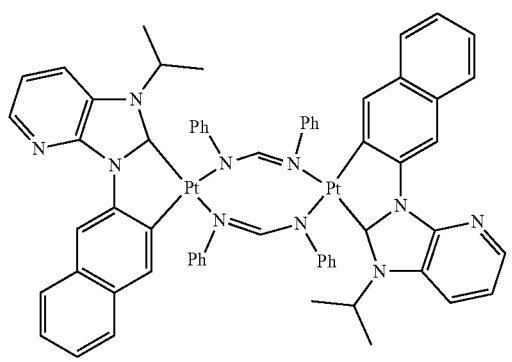
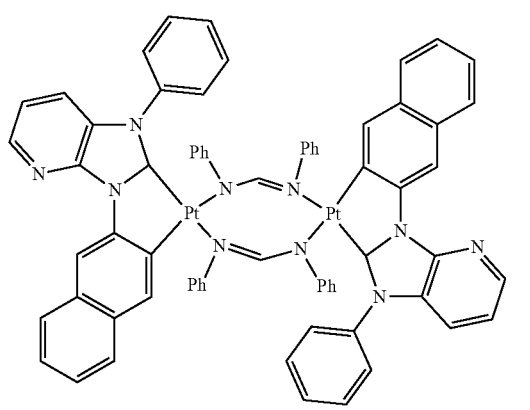
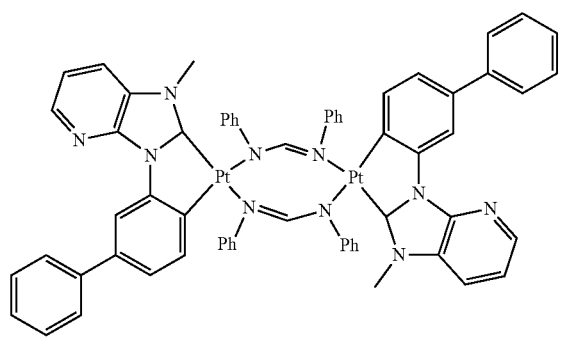
52
-continued
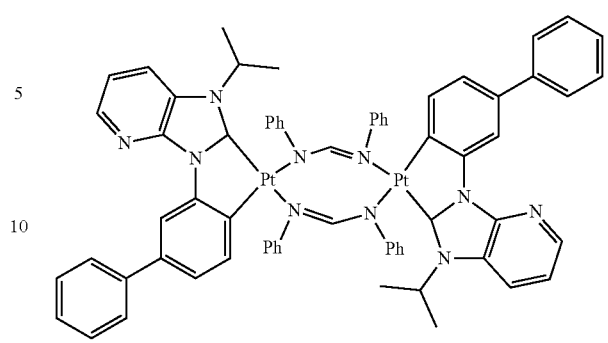
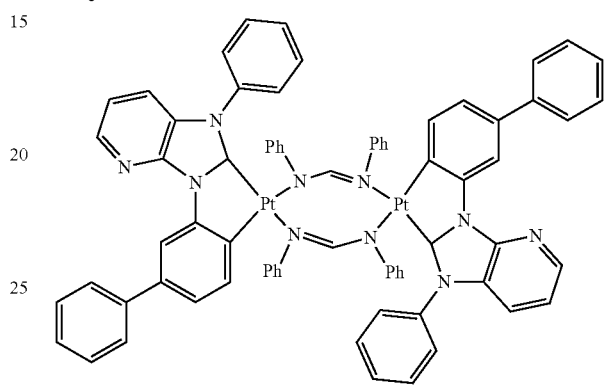
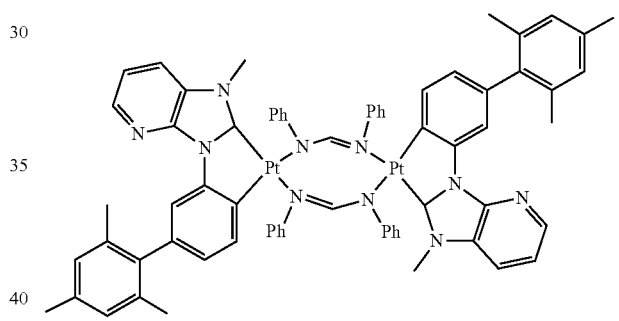
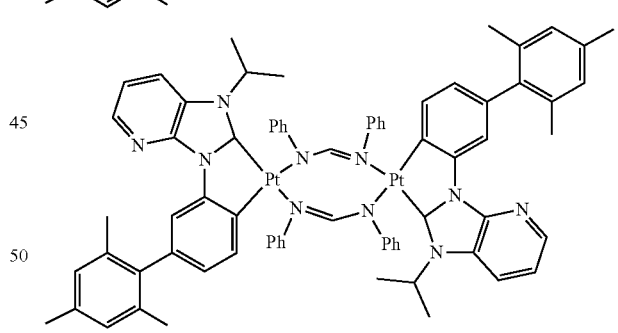
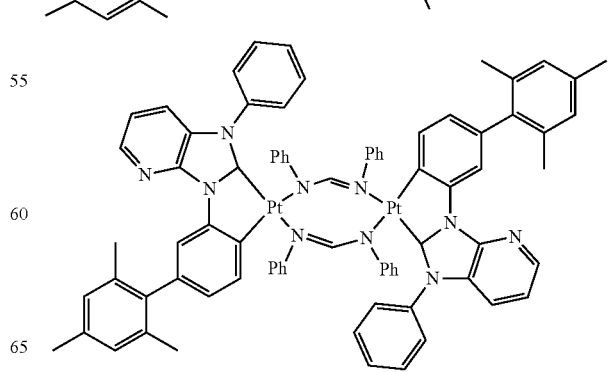

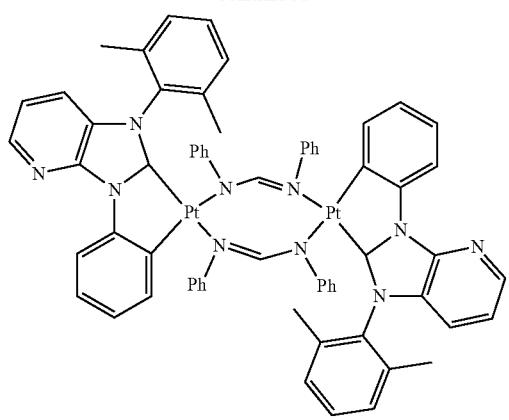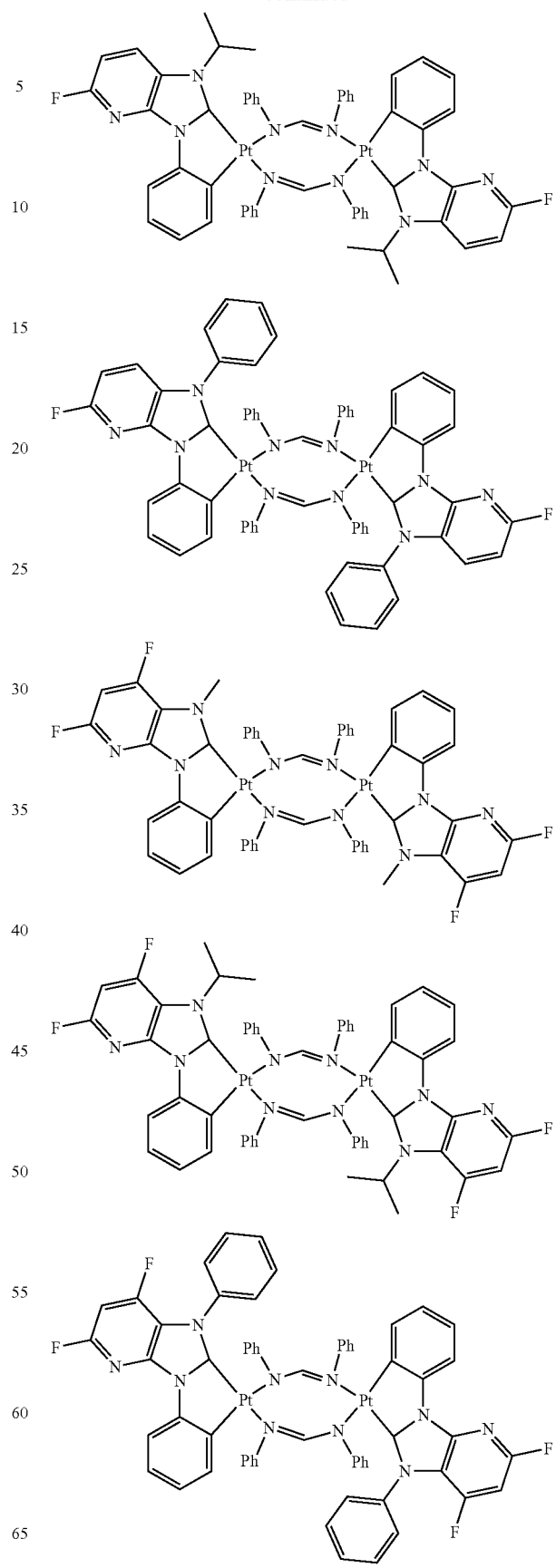

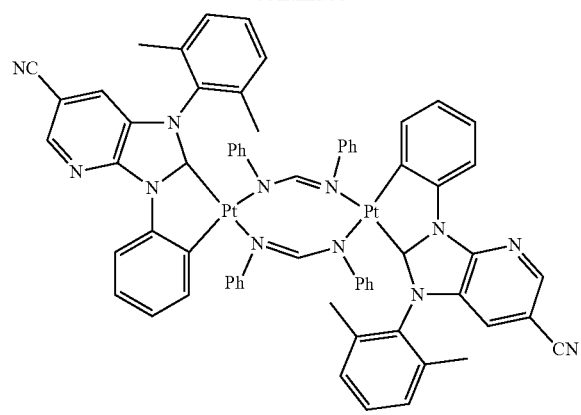
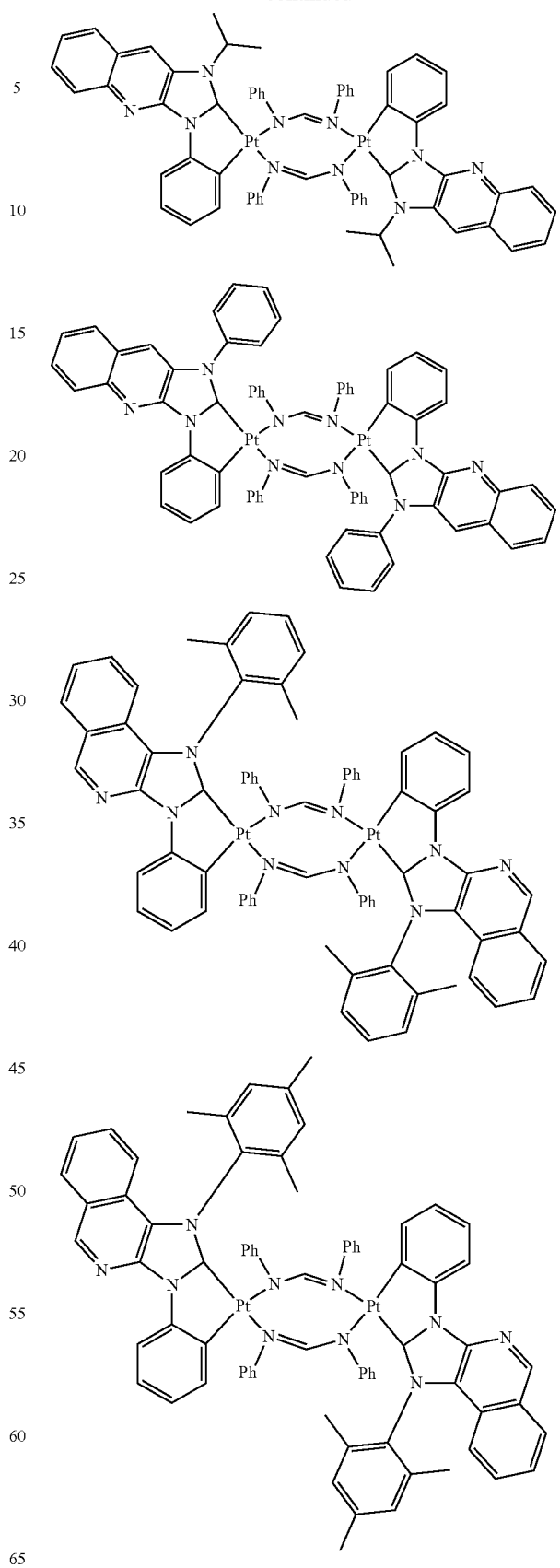

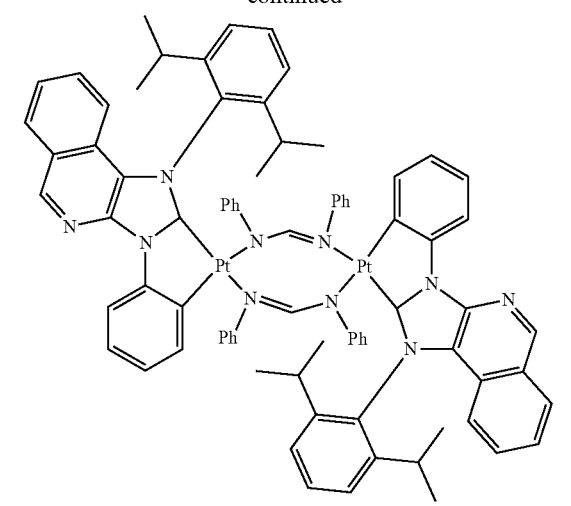
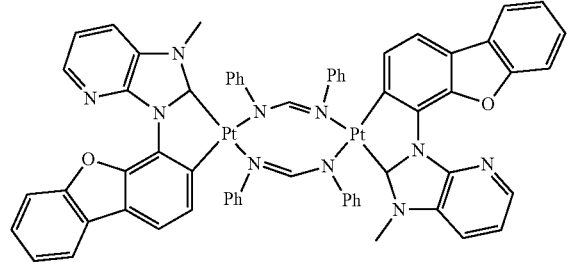
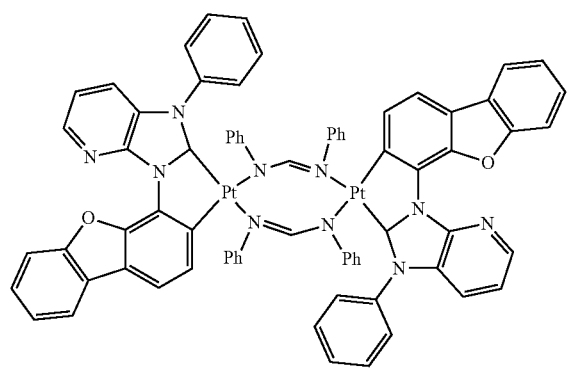
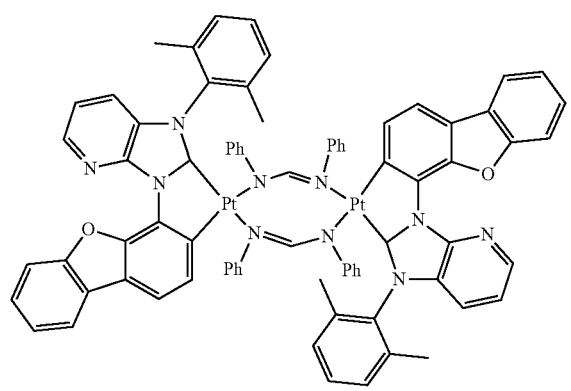
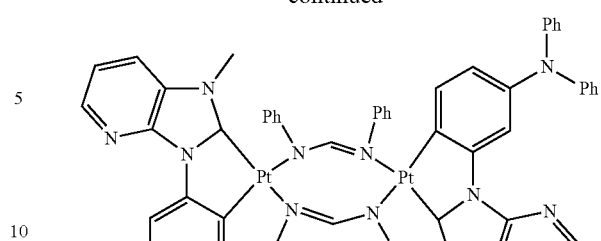
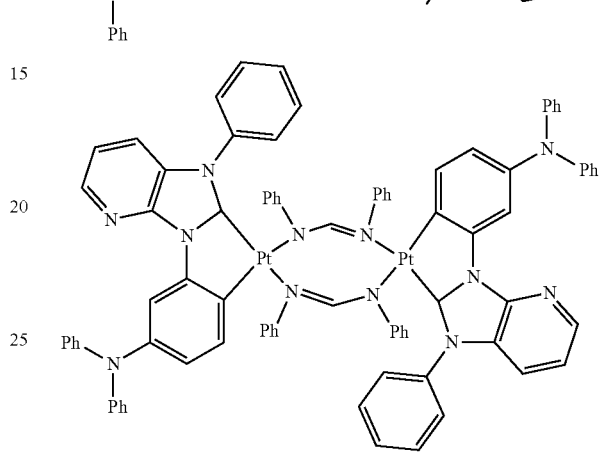
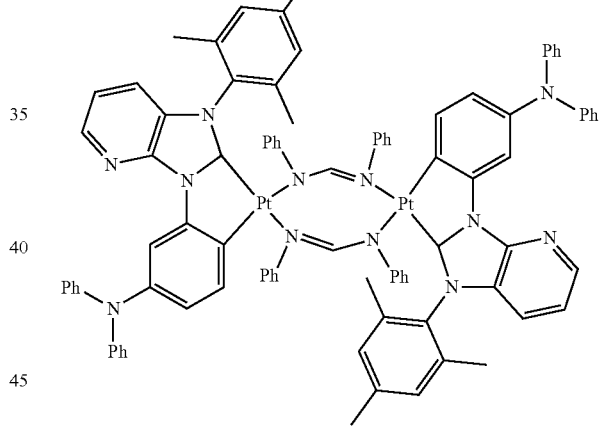
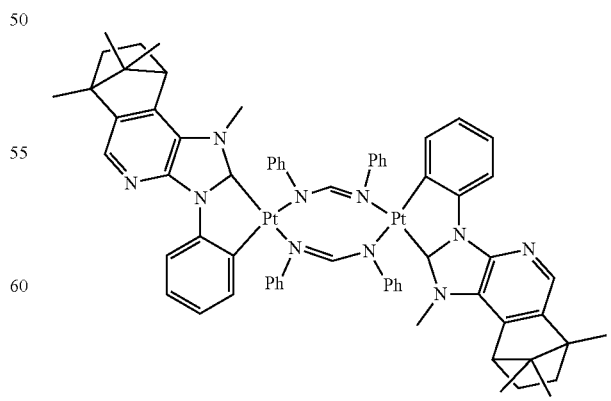

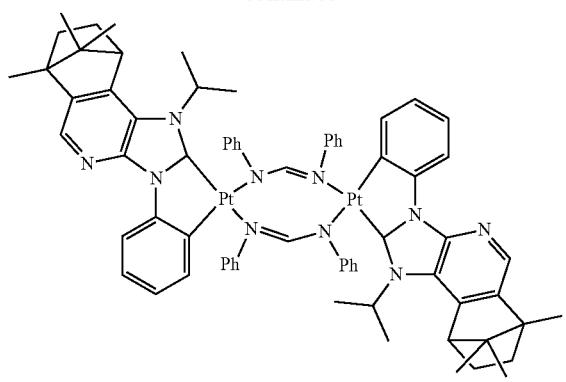
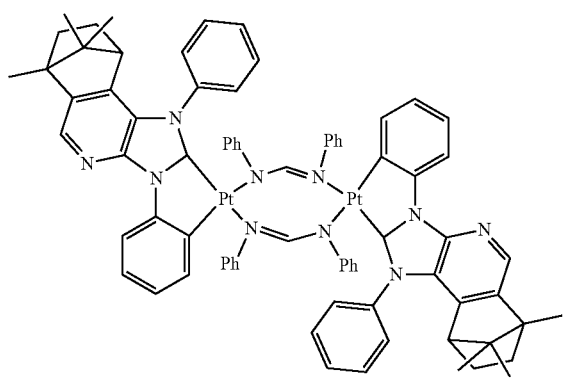
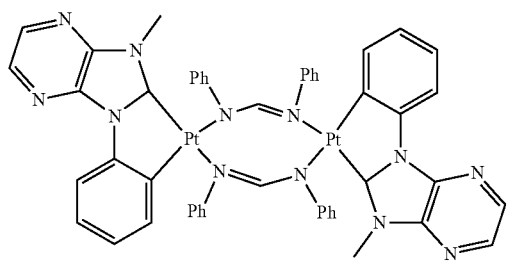
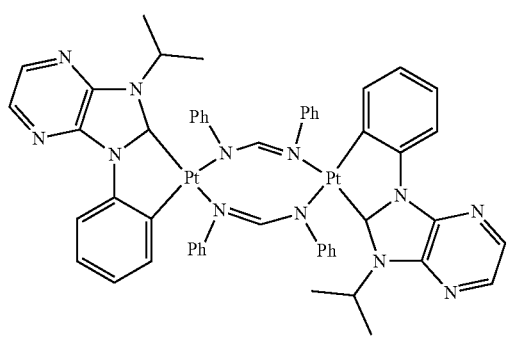
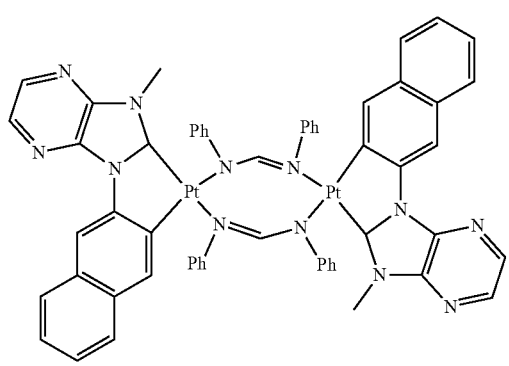
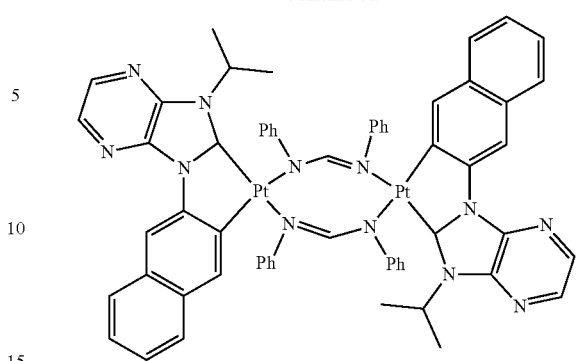
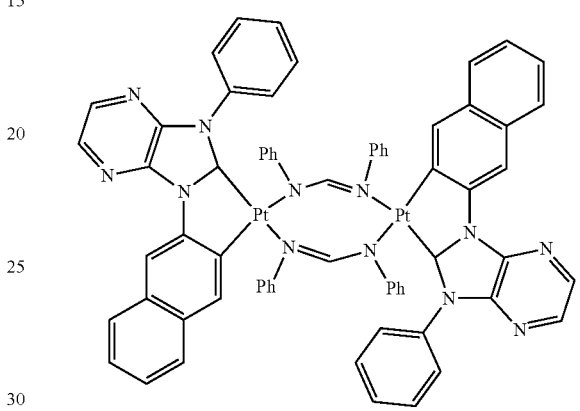
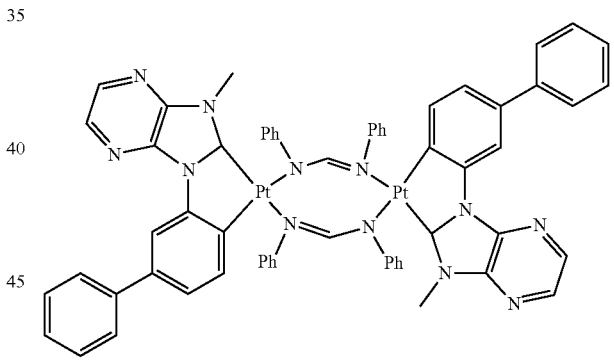
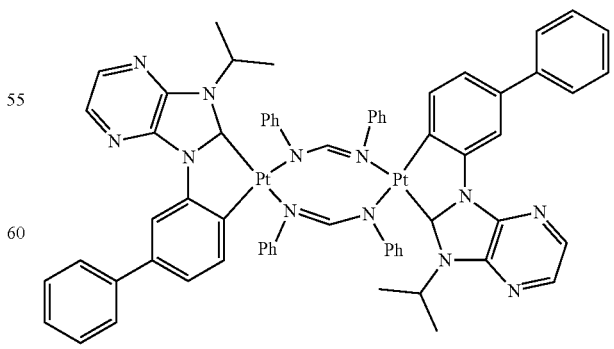

-continued
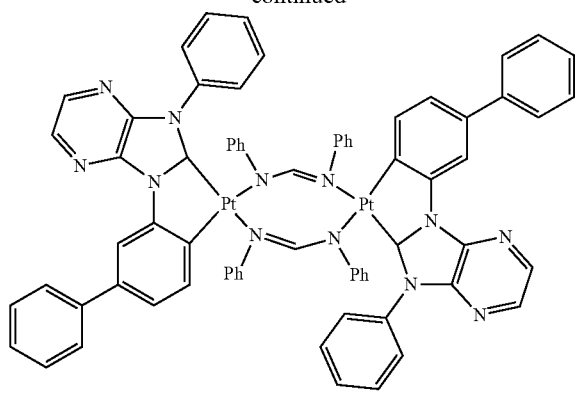
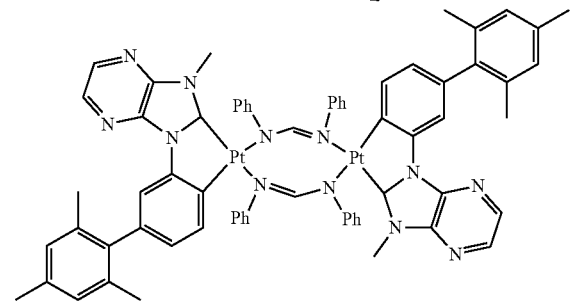
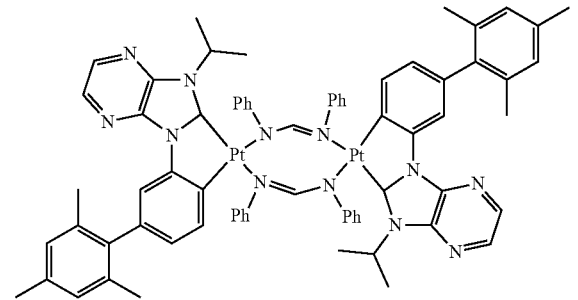
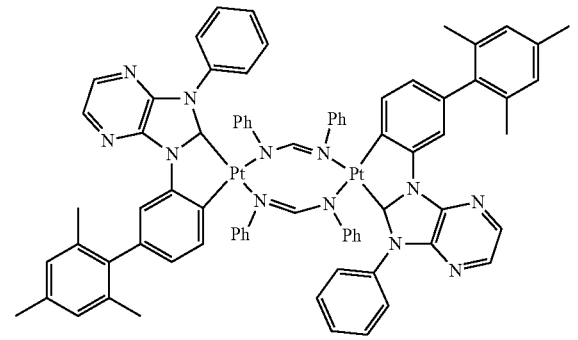
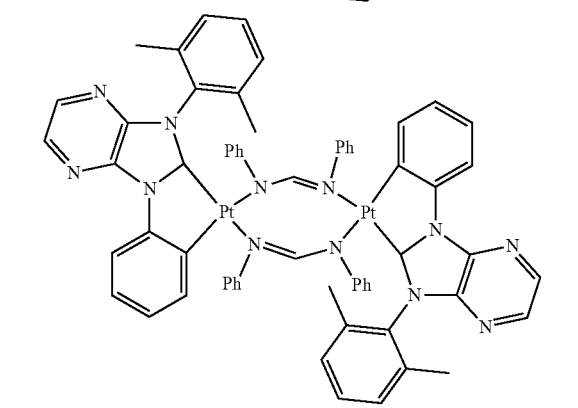
-continued
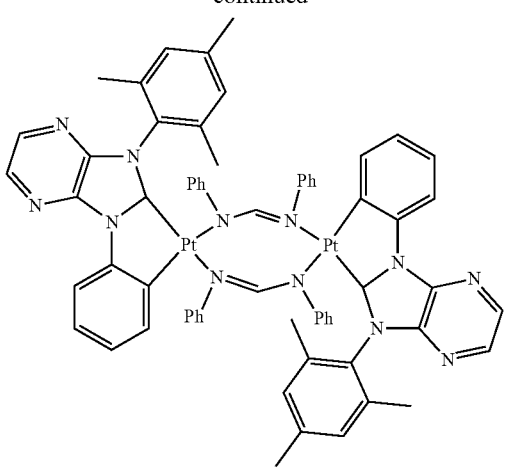
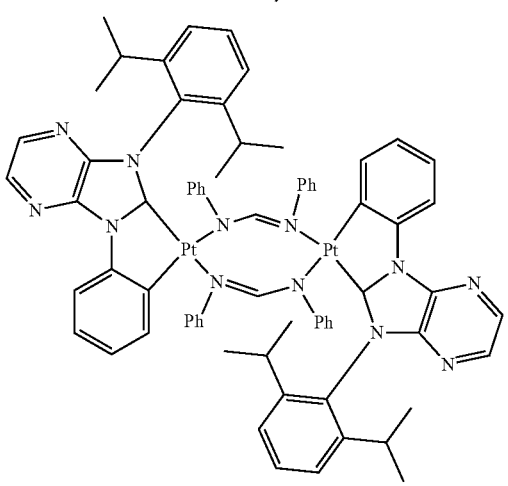
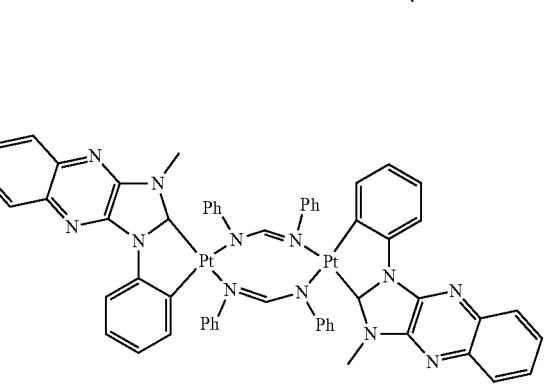
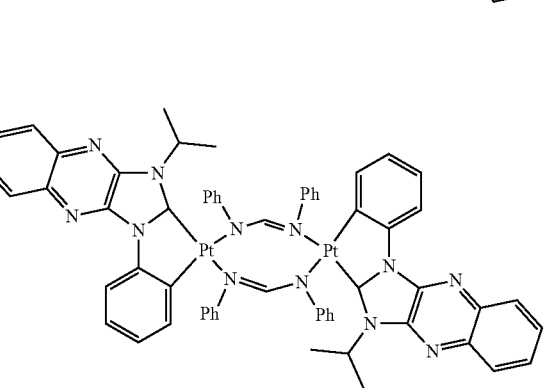

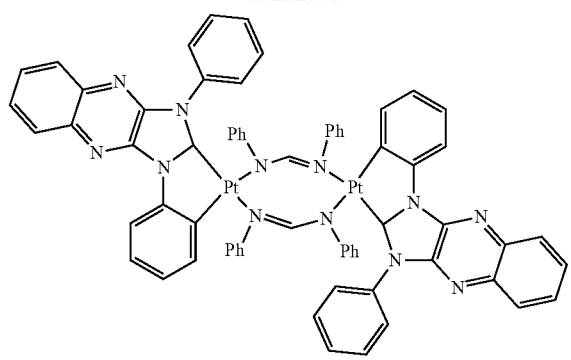
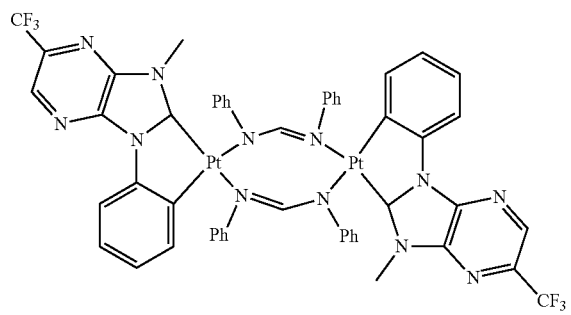
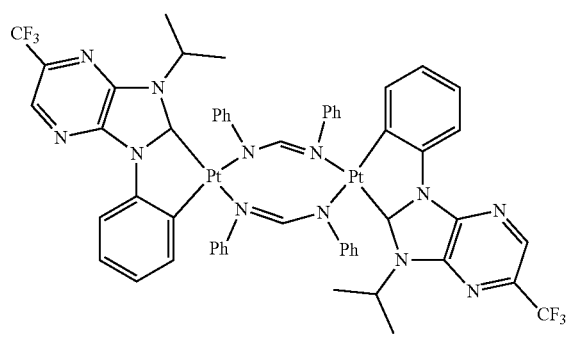
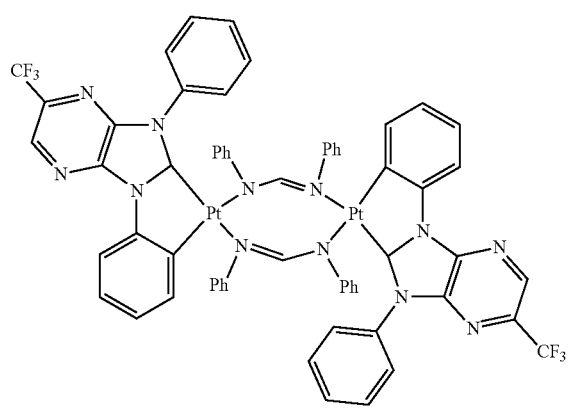
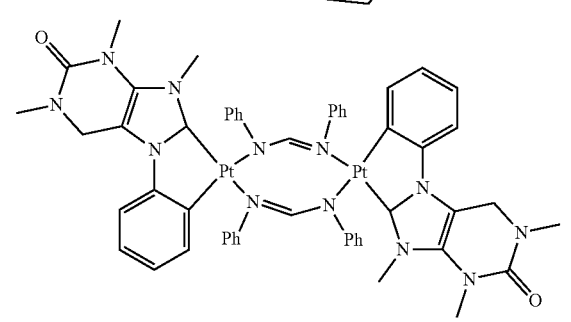
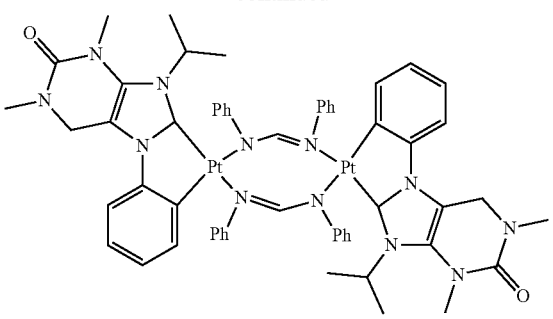
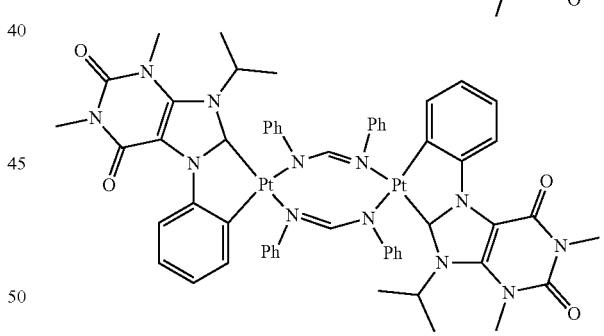
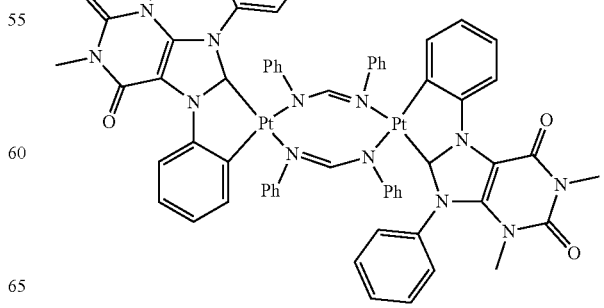

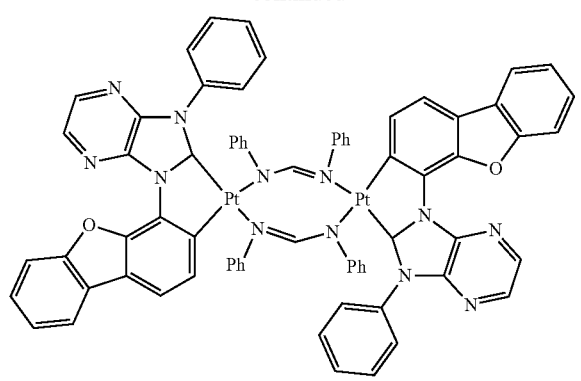
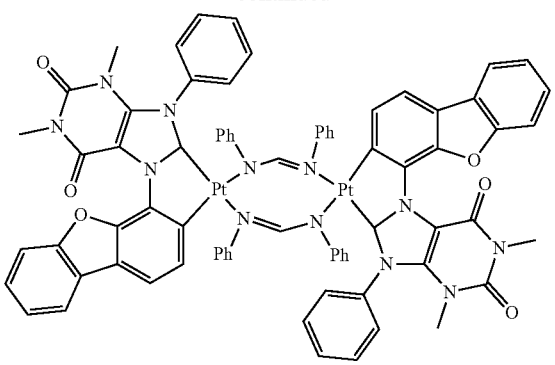
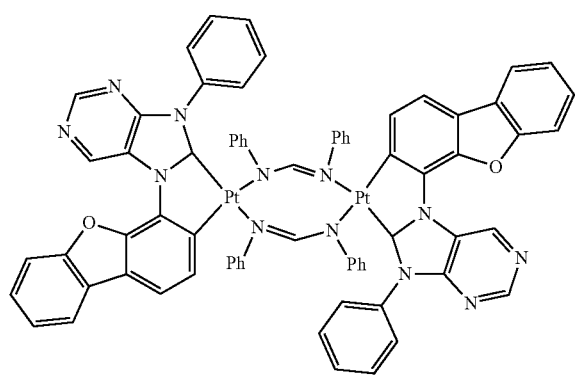
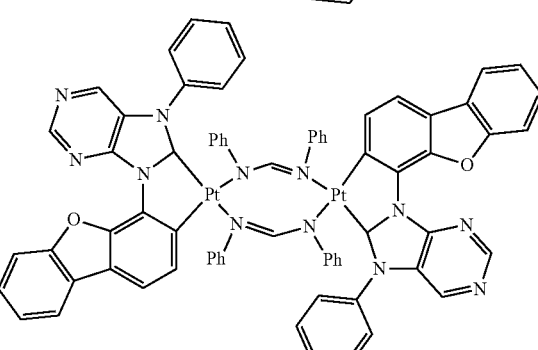
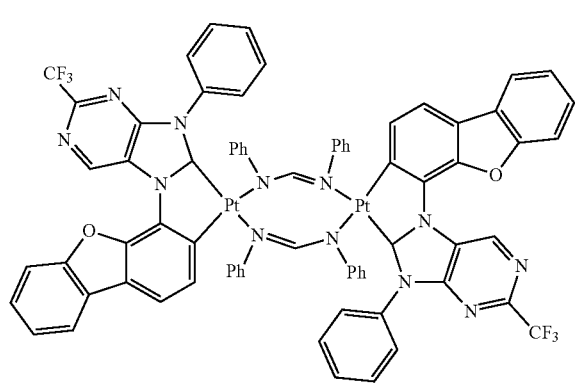
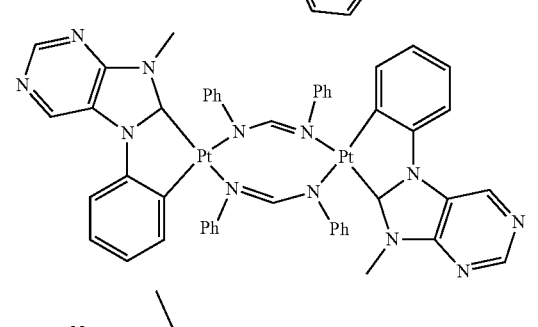
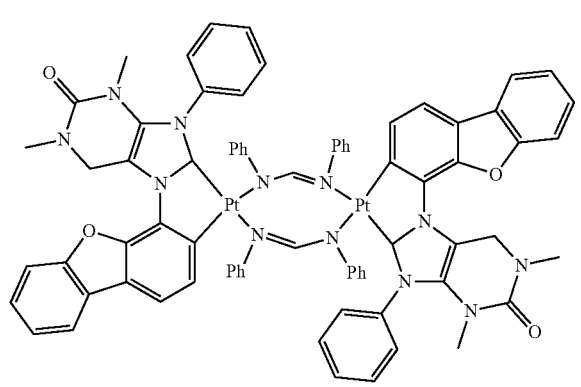
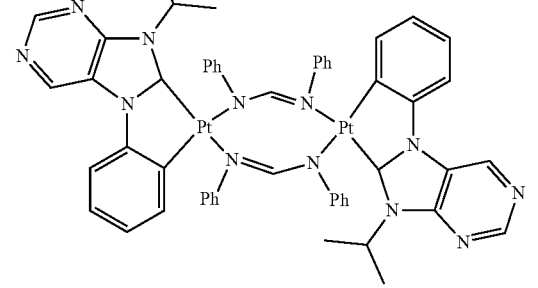
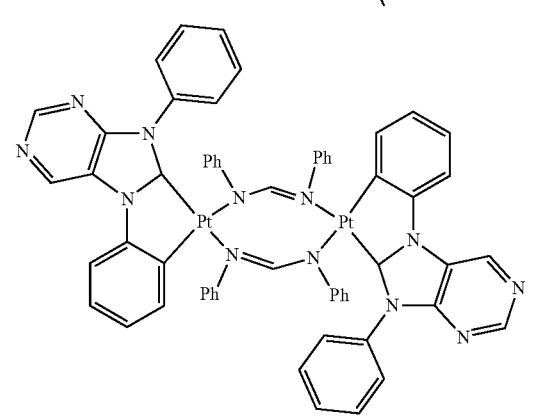

-continued
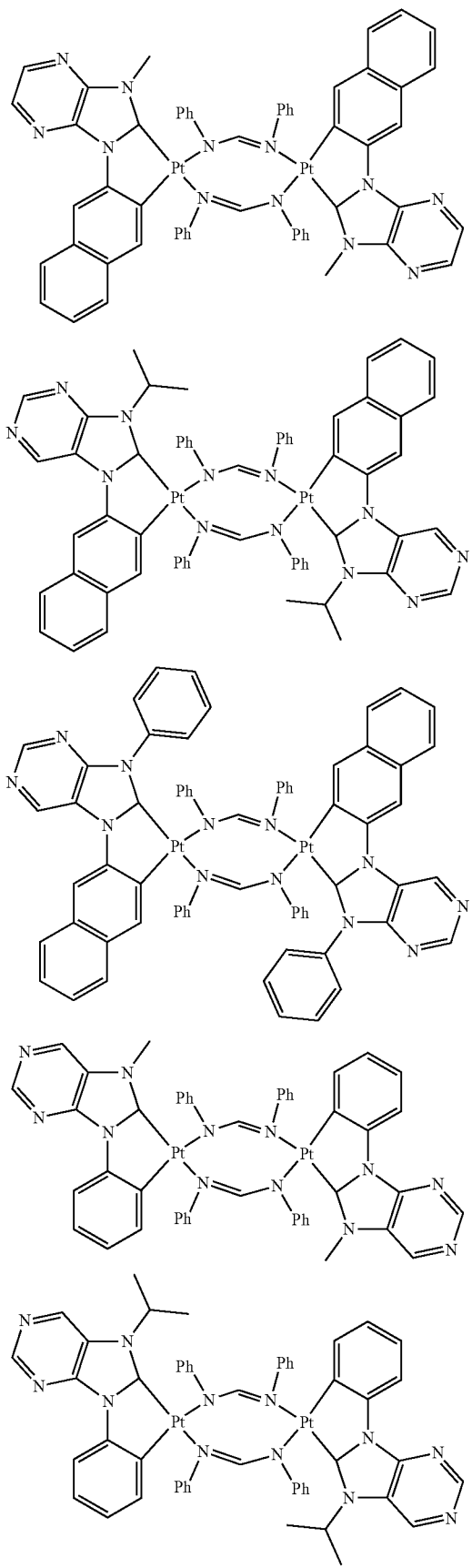
-continued
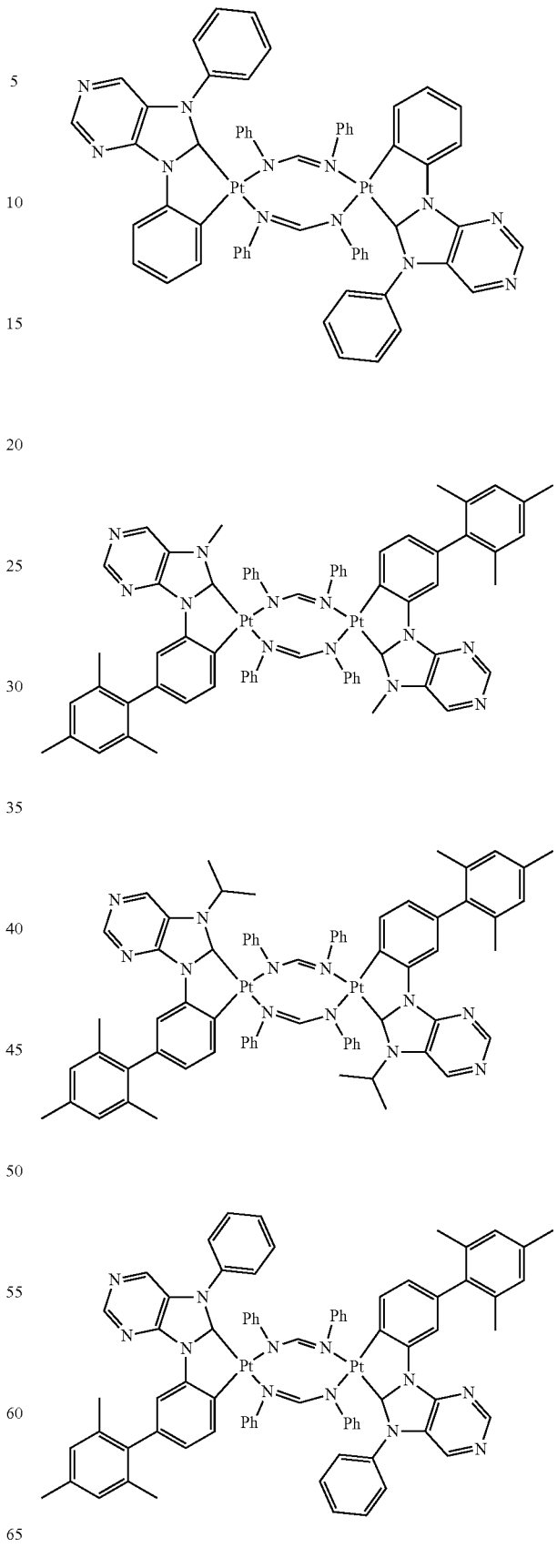

69
-continued
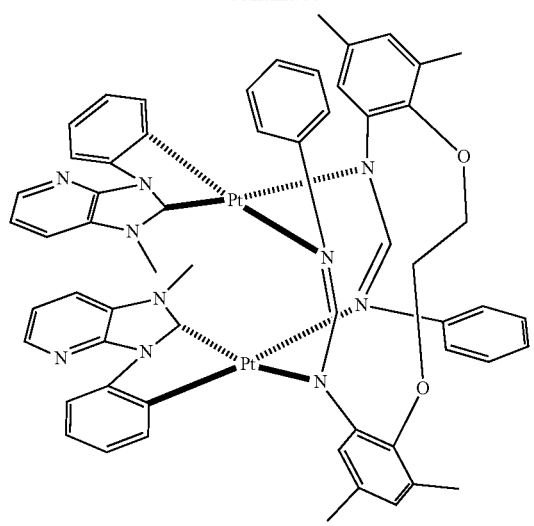
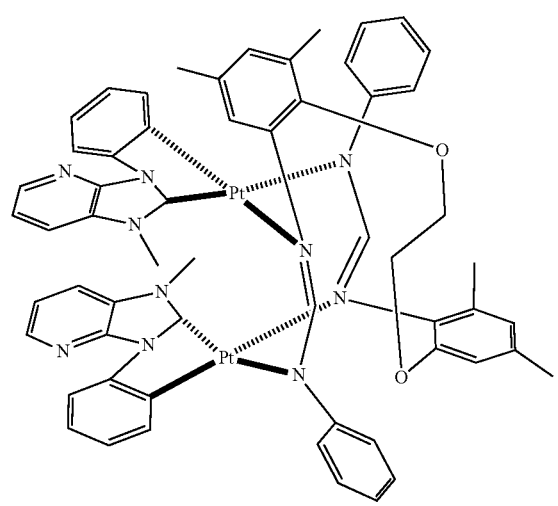
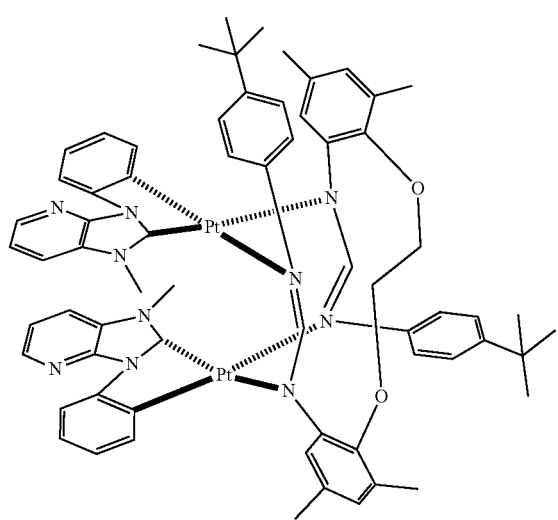
70
-continued
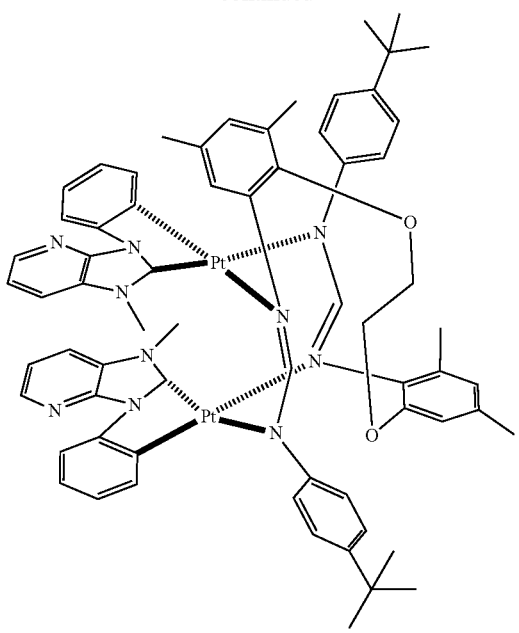
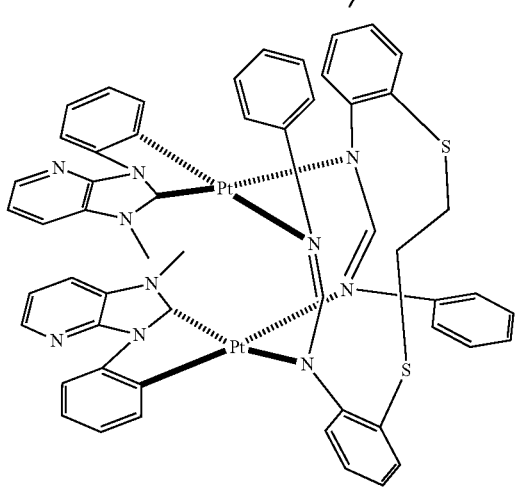
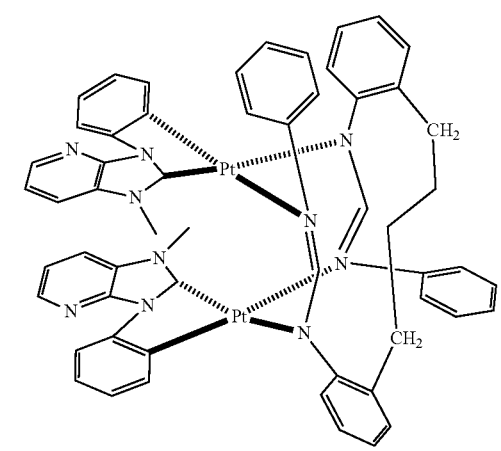

71
-continued
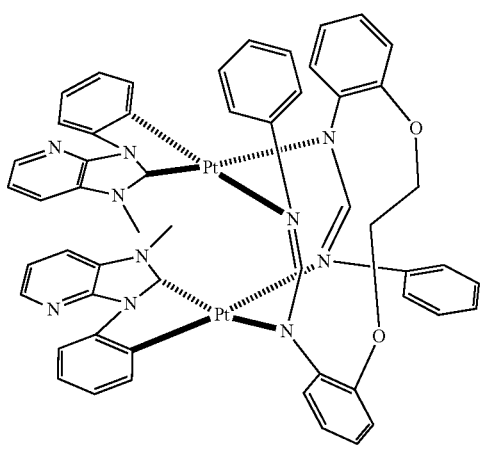
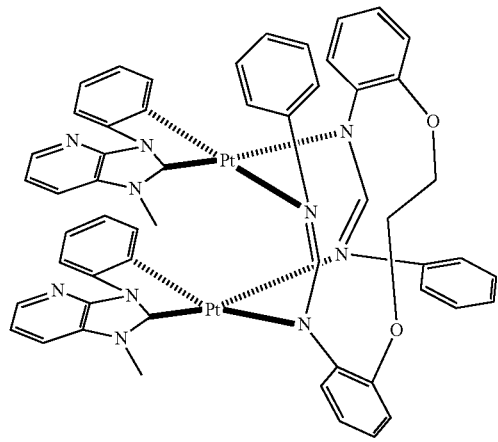
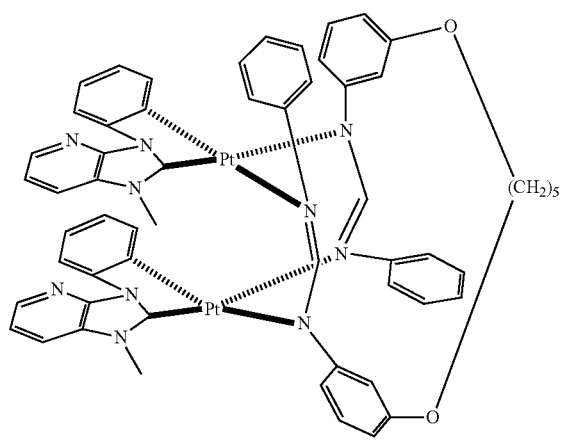
72
-continued
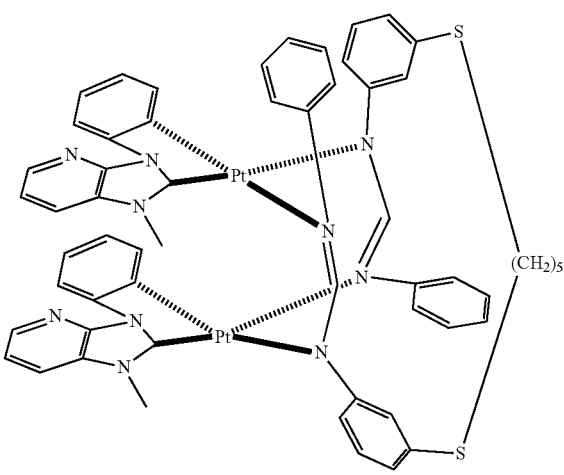
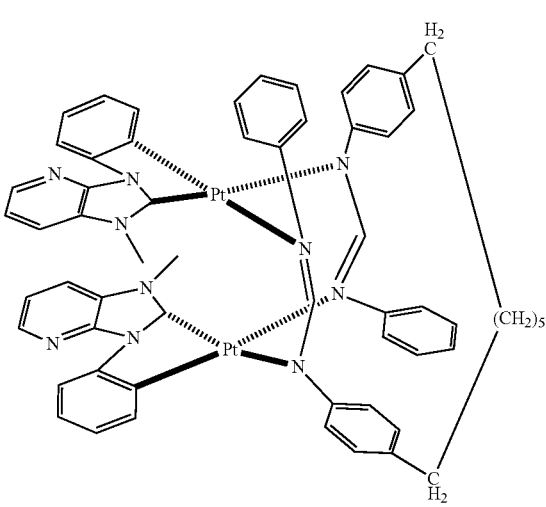

73
-continued
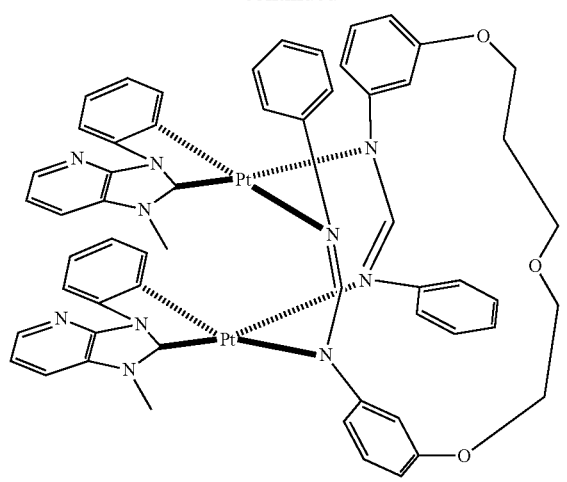
74
-continued
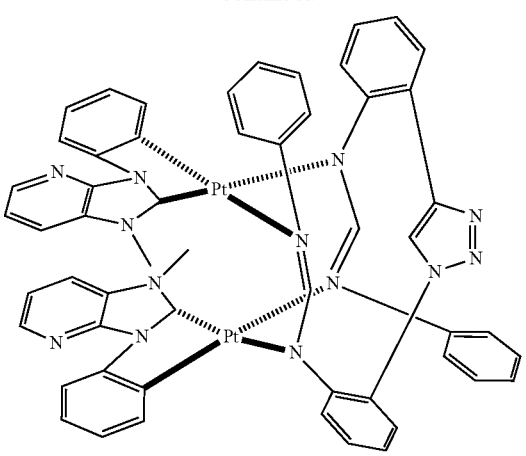
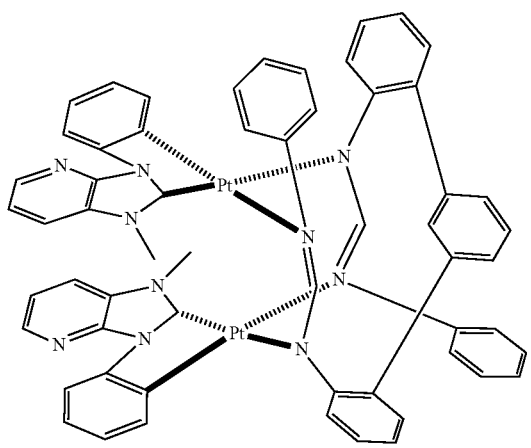
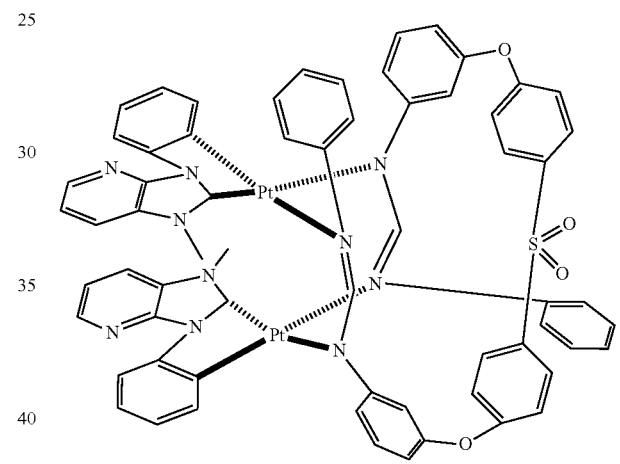
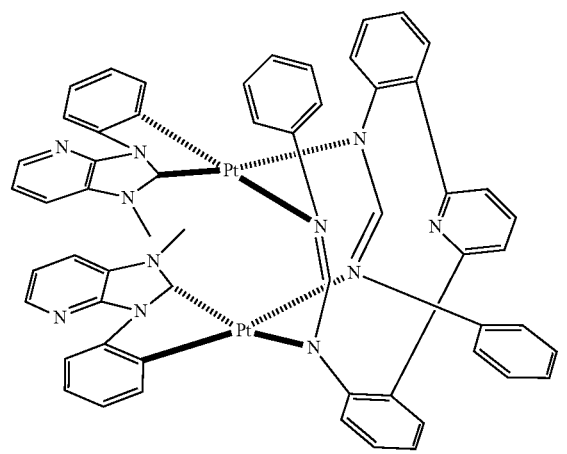
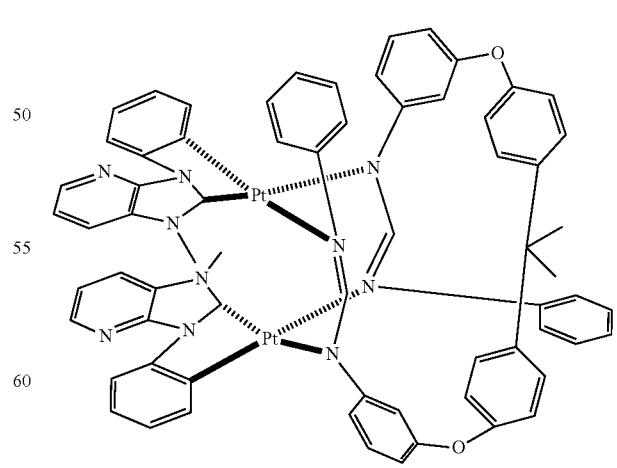

-continued

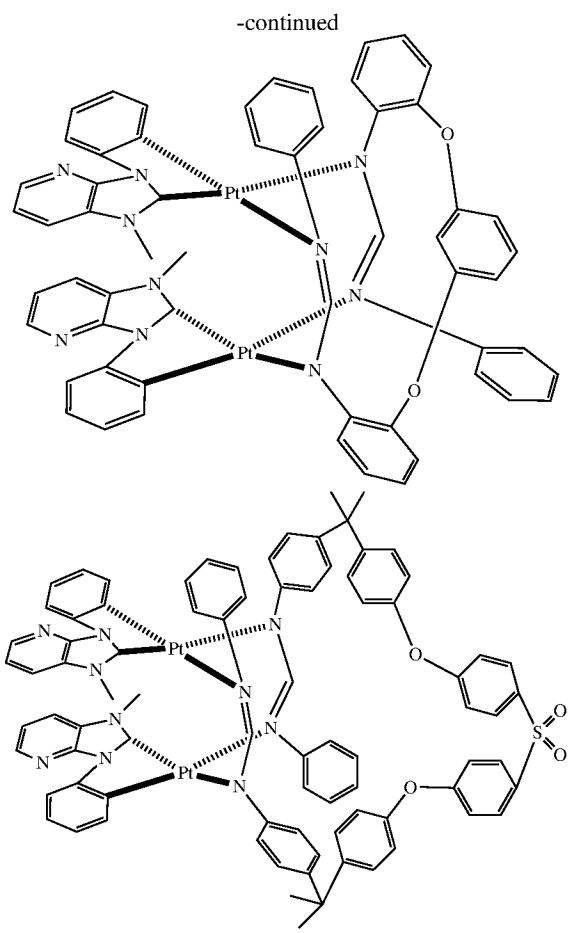

3. Photophysical Properties

The photophysical properties of the Pt(II) complexes can be evaluated by emission lifetime ("$\tau_{em}$" or "$\tau$"), radiative decay rate ("$k_r$"), emission quantum yield ("QY" or "$\Psi_{em}$"), maximum emission wavelength ("$\lambda_{max}$"), and/or full width at half maximum ("FWHM"). Techniques for measuring the $\tau_{em}$, $k_r$, QY, $\lambda_{max}$ and FWHM of platinum (II) complexes are known. For example, these parameters can be obtained by measuring the emission spectra of a platinum (II) complex. For example, based on the measured emission spectra, the $\tau_{em}$ of the platinum (II) complex can be obtained as follows: (i) monitor the intensity of emission decay as a function of time using a Quanta Ray GCR 150-10 pulsed Nd:YAG laser system (pulse output: 355 nm), and (ii) determine the $\tau_{em}$ by fitting the exponential decay of formula (1) using Origin software, where $I_0$ is the initial emission intensity, I(t) is the emission intensity at time t, $\tau$ is the emission lifetime, and t is the time.

$$I(t) = I_0 e^{-t/\tau} \qquad \text{formula (1)}$$

The $k_r$ of the platinum (II) complex can be obtained using $k_r = \Phi_{em}/\tau_{em}$. The $\Phi_{em}$ values of these Pt complexes can be measured by known methods, such as direct measurements or relative methods. For example, the $\Phi_{em}$ of the disclosed Pt(II) complexes in solutions or thin films, can be directly obtained by absolute measurement using Hamamatsu C11347 Quantaurus-QY Absolute PL quantum yield spectrometer (PL stands for photoluminescence). For example, the solution $\Phi_{em}$ of the disclosed Pt(II) complexes in the near infrared ("NIR") region (i.e., $\lambda_{max}$ in a range from 700 nm to about 1000 nm), such as complex 4a ($\lambda_{max}=753_{(max)}$, 903 nm), can be measured by relative method using Pt(tpdbp) as standard reference $\Phi_r$:0.51, $\lambda_{em}$=770 nm). In relative methods, $\Phi_{em}$ can be calculated by the equation: $\Phi_{em}=\Phi_r (B_r/B_s) (n_s/n_r)^2 (D_s/D_r)$, where r and s represent sample and reference standard respectively, $B=1-10^{-AL}$, where A is the absorbance at excitation wavelength and L is the optical path length in cm, n is the refractive index of solvents, and D is the integrated emission intensity.

The $\lambda_{max}$ and FWHM of the platinum (II) complex can be directly measured from the emission spectra.

In some forms, the platinum (II) complex of any one of Formulae I-IV can have an emission lifetime ($\tau_{em}$) of up to 3.0 μs, up to 2.5 μs, up to 2.0 μs, in a range from 0.5 μs to 3.0 μs, from 0.8 μs to 3.0 μs, from 1.0 μs to 3.0 μs, from 0.5 μs to 2.5 μs, from 0.8 μs to 2.5 μs, from 1.0 μs to 2.5 μs, from 0.5 μs to 2.0 μs, from 0.8 μs to 2.0 μs, or from 1.0 μs to 2.0 μs, in solution or in films, such as obtained based on the emission spectra of the platinum (II) complex as described above.

In some forms, the platinum (II) complex of any one of Formulae I-IV can have a radiative decay rate ($k_r$) of at least $1.0 \times 10^5$ s$^{-1}$, at least $1.4 \times 10^5$ s$^{-1}$, in a range from $1.0 \times 10^5$ s$^{-1}$ to $25.0 \times 10^5$ s$^{-1}$, from $1.0 \times 10^5$ s$^{-1}$ to $20.0 \times 10^5$ s$^{-1}$, from $1.0 \times 10^5$ s$^{-1}$ to $15.0 \times 10^5$ s$^{-1}$, from $1.0 \times 10^5$ s$^{-1}$ to $12.0 \times 10^5$ s$^{-1}$, from $1.0 \times 10^5$ s$^{-1}$ to $10.0 \times 10^5$ s$^{-1}$, from $1.0 \times 10^5$ s$^{-1}$ to $8.0 \times 10^5$ s$^{-1}$, from $1.0 \times 10^5$ s$^{-1}$ to $6.0 \times 10^5$ s$^{-1}$, from $1.4 \times 10^5$ s$^{-1}$ to $25.0 \times 10^5$ s$^{-1}$, from $1.4 \times 10^5$ s$^{-1}$ to $20.0 \times 10^5$ s$^{-1}$, from $1.4 \times 10^5$ s$^{-1}$ to $15.0 \times 10^5$ s$^{-1}$, from $1.4 \times 10^5$ s$^{-1}$ to $12.0 \times 10^5$ s$^{-1}$, from $1.4 \times 10^5$ s$^{-1}$ to $10.0 \times 10^5$ s$^{-1}$, from $1.4 \times 10^5$ s$^{-1}$ to $8.0 \times 10^5$ s$^{-1}$, or from $1.4 \times 10^5$ s$^{-1}$ to $6.0 \times 10^5$ s$^{-1}$, in solution or in films, such as obtained based on the emission spectra of the platinum (II) complex as described above.

In some forms, the platinum (II) complex of any one of Formulae I-IV can have an emission quantum yield ("QY" or "$\Phi_{em}$") of at least 50%, at least 55%, at least 60%, at least 65%, at least 70%, in a range from 50% to 90%, from 55% to 90%, from 60% to 90%, from 50% to 80%, from 55% to 80%, or from 60% to 80%, in solution or in films, at room temperature, such as obtained based on the emission spectra of the platinum (II) complex as described above.

In some forms, the platinum (II) complex of any one of Formulae I-IV can have a maximum emission wavelength ("$\lambda_{max}$") in a range from 600 nm to 1000 nm, from 600 nm to 760 nm, from 600 nm to 735 nm, from 604 nm to 733 nm, from 600 nm to 700 nm, from 700 nm to 1000 nm, from 700 nm to 760 nm, or from 704 nm to 760 nm, such as obtained based on the emission spectra of the platinum (II) complex as described above. As used herein, near infrared ("Near-IR" or "NIR") $\lambda_{max}$ is in the range of 700 nm to 1000 nm, inclusive. As used herein, red $\lambda_{max}$ is in the range of 600 nm to 700 nm, inclusive. A $\lambda_{max}$ of exactly 700 nm can be considered either red or near infrared. However, in the context of a range of $\lambda_{max}$, whether 700 nm should be considered a near infrared $\lambda_{max}$ or a red $\lambda_{max}$ can be determined by whether 700 nm is the high endpoint or the low endpoint. In the context of a range of $\lambda_{max}$ that spans below and above 700 nm, the range, and the 700 nm point, can be considered to encompass both red $\lambda_{max}$ and near infrared $\lambda_{max}$.

In some forms, the platinum (II) complex of any one of Formulae I-IV can have a full width at half maximum ("FWHM") of up to 270 nm, up to 250 nm, up to 220 nm, up to 200 nm, up to 180 nm, up to 160 nm, up to 145 nm, up to 135 nm, up to 120 nm, up to 110 nm, up to 100 nm, up to 90 nm, up to 80 nm, in a range from 50 nm to 270 nm, from 50 nm to 250 nm, from 50 nm to 220 nm, from 50 nm to 200 nm, from 50 nm to 180 nm, from 50 nm to 160 nm, from 50 nm to 145 nm, from 50 nm to 110 nm, from 60 nm to 270 nm, from 60 nm to 250 nm, from 60 nm to 220 nm, from 60 nm to 200 nm, from 60 nm to 145 nm, from 70 nm to 200 nm, or from 70 nm to 145 nm, such as obtained based on the emission spectra of the platinum (II) complex as described above. In some forms, the platinum (II) complex contains one or two tetradentate ligands having a full width at half maximum ("FWHM") of up to 240 nm, up to 220 nm, up to 190 nm, up to 170 nm, up to 155 nm, up to 145 nm, up to 135 nm, up to 120 nm, up to 110 nm, up to 100 nm, up to 90 nm, up to 80 nm, in a range from 20 nm to 240 nm, from 20 nm to 220 nm, from 20 nm to 190 nm, from 20 nm to 170 nm, from 20 nm to 155 nm, from 20 nm to 145 nm, from 20 nm to 110 nm, from 20 nm to 100 nm, from 30 nm to 240 nm, from 30 nm to 220 nm, from 30 nm to 190 nm, from 30 nm to 170 nm, from 30 nm to 155 nm, from 30 nm to 145 nm, from 30 nm to 110 nm, from 40 nm to 240 nm, from 40 nm to 220 nm, from 40 nm to 190 nm, from 40 nm to 170 nm, from 40 nm to 155 nm, from 40 nm to 145 nm, from 40 nm to 115 nm, from 40 nm to 100 nm, from 50 nm to 115 nm, or from 50 nm to 100 nm, such as obtained based on the emission spectra of the platinum (II) complex as described above.

In some forms, the platinum (II) complex of any one of Formulae I-IV can have a $\tau_{em}$, a $k_r$, a QY, a $\lambda_{max}$ and/or a FWHM in any one of the above-described ranges. In some forms, the platinum (II) complex of any one of Formulae I-IV can have a $\tau_{em}$ of up to 3.0 μs, up to 2.5 μs, up to 2.0 μs, in a range from 0.5 μs to 3.0 μs, from 0.8 μs to 3.0 μs, from 1.0 μs to 3.0 μs, from 0.5 μs to 2.5 μs, from 0.8 μs to 2.5 μs, from 1.0 μs to 2.5 μs, from 0.5 μs to 2.0 μs, from 0.8 μs to 2.0 μs, or from 1.0 μs to 2.0 μs, in solution or in films; and a QY of at least 50%, at least 55%, at least 60%, at least 65%, at least 70%, in a range from 50% to 90%, from 55% to 90%, from 60% to 90%, from 50% to 80%, from 55% to 80%, or from 60% to 80%, in solution or in films, at room temperature, such as obtained based on the emission spectra of the platinum (II) complex as described above. In some forms, the platinum (II) complex of any one of Formulae I-IV can have a $\tau_{em}$ of up to 3.0 μs, up to 2.5 μs, up to 2.0 μs, in a range from 0.5 μs to 3.0 μs, from 0.8 μs to 3.0 μs, from 1.0 μs to 3.0 μs, from 0.5 μs to 2.5 μs, from 0.8 μs to 2.5 μs, from 1.0 μs to 2.5 μs, from 0.5 μs to 2.0 μs, from 0.8 μs to 2.0 μs, or from 1.0 μs to 2.0 μs, in solution or in films; a $k_r$ of at least $1.0 \times 10^5$ s$^{-1}$, at least $1.4 \times 10^5$ s$^{-1}$, in a range from $1.0 \times 10^5$ s$^{-1}$ to $25.0 \times 10^5$ s$^{-1}$, from $1.0 \times 10^5$ s$^{-1}$ to $20.0 \times 10^5$ s$^{-1}$, from $1.0 \times 10^5$ s$^{-1}$ to $15.0 \times 10^5$ s$^{-1}$, from $1.0 \times 10^5$ s$^{-1}$ to $12.0 \times 10^5$ s$^{-1}$, from $1.0 \times 10^5$ s$^{-1}$ to $10.0 \times 10^5$ s$^{-1}$, from $1.0 \times 10^5$ s$^{-1}$ to $8.0 \times 10^5$ s$^{-1}$, from $1.0 \times 10^5$ s$^{-1}$ to $6.0 \times 10^5$ s$^{-1}$, from $1.4 \times 10^5$ s$^{-1}$ to $25.0 \times 10^5$ s$^{-1}$, from $1.4 \times 10^5$ s$^{-1}$ to $20.0 \times 10^5$ s$^{-1}$, from $1.4 \times 10^5$ s$^{-1}$ to $15.0 \times 10^5$ s$^{-1}$, from $1.4 \times 10^5$ s$^{-1}$ to $12.0 \times 10^5$ s$^{-1}$, from $1.4 \times 10^5$ s$^{-1}$ to $10.0 \times 10^5$ s$^{-1}$, from $1.4 \times 10^5$ s$^{-1}$ to $8.0 \times 10^5$ s$^{-1}$, or from $1.4 \times 10^5$ s$^{-1}$ to $6.0 \times 10^5$ s$^{-1}$, in solution or in films; a QY of at least 50%, at least 55%, at least 60%, at least 65%, at least 70%, in a range from 50% to 90%, from 55% to 90%, from 60% to 90%, from 50% to 80%, from 55% to 80%, or from 60% to 80%, in solution or in films, at room temperature; a $\lambda_{max}$ in a range from 600 nm to 1000 nm, from 600 nm to 760 nm, from 600 nm to 735 nm, from 604 nm to 733 nm, from 600 nm to 700 nm, from 700 nm to 1000 nm, from 700 nm to 760 nm, or from 704 nm to 760 nm; and a FWHM of up to 270 nm, up to 250 nm, up to 220 nm, up to 200 nm, up to 180 nm, up to 160 nm, up to 145 nm, up to 135 nm, up to 120 nm, up to 110 nm, up to 100 nm, up to 90 nm, up to 80 nm, in a range from 50 nm to 270 nm, from 50 nm to 250 nm, from 50 nm to 220 nm, from 50 nm to 200 nm, from 50 nm to 180 nm, from 50 nm to 160 nm, from 50 nm to 145 nm, from 50 nm to 110 nm, from 60 nm to 270 nm, from 60 nm to 250 nm, from 60 nm to 220 nm, from 60 nm to 200 nm, from 60 nm to 145 nm, from 70 nm to 200 nm, or from 70 nm to 145 nm, such as obtained based on the emission spectra of the platinum (II) complex as described above.

Exemplary solutions suitable for measuring the $\tau_{em}$, $k_r$, QY, $\lambda_{max}$ and/or FWHM of the Pt(II) complexes include those that contain an organic solvent. Exemplary organic solvents suitable for use to form the measurement solutions include, but are not limited to, methylcyclopropane, dichloromethane and toluene, and a combination thereof. Optionally, the solutions for measuring the $\tau_{em}$, $k_r$, QY, $\lambda_{max}$ and/or FWHM of the Pt(II) complexes is degassed with an inert gas, such as nitrogen, argon, or helium, or a combination thereof. Suitable thin films for measuring the $\tau_{em}$, $k_r$, QY, $\lambda_{max}$ and/or FWHM of the Pt(II) complexes include films having a thickness between 10 nm and 5 μm, inclusive, or between 10 nm and 200 nm, inclusive. The films can also contain organic compounds as hot materials. Exemplary organic compounds that can be used as a host material in the films include, but are not limited to, 1,3-bis(N-carbazolyl) benzene (mCP), 3,3'-di(9H-carbazol-9-yl)-1,1'-biphenyl (mCBP), poly(methyl methacrylate) (PMMA), polystyrene (PS), 2,8-bis(diphenylphosphoryl)dibenzo[b,d]furan (PPF), bis[2-(diphenylphosphino)phenyl]ether oxide (DPEPO).

B. Devices Containing Platinum (II) Complexes

Organic light-emitting components, such as light-emitting diodes (OLEDs), containing one or more of the Pt(II) complexes are described. Other examples of organic light-emitting devices suitable for incorporation of the Pt(II) complexes disclosed herein include, but are not limited to, light-emitting electrochemical cells (LEECs). Devices containing one or more OLEDs containing one or more of the Pt(II) complexes include, but are not limited to, stationary visual display units, mobile visual display units, and illumination devices, such as smart phones, televisions, monitors, digital cameras, tablet computers, and lighting fixtures that usually operate at room temperatures, wearable devices, and medical monitoring devices.

In some forms, the Pt(II) complexes can be incorporated in a light-emitting layer. In some forms, the light-emitting layer can be incorporated in an organic light-emitting component, such as an OLED. Organic light-emitting components can contain one or more light-emitting layers, where each light-emitting layer can contain one or more the disclosed Pt(II) complexes. In some forms, the light-emitting layer or each light-emitting layer when two or more light-emitting layers are included in the organic light-emitting component further includes one or more host materials, such as those described above. Typically, the total concentration of the one or more host materials is greater than the total concentration of the one or more Pt(II) complexes in the light-emitting layer or each light-emitting layer of the two or more light-emitting layers. The term "total concentration of the one or more Pt(II) complexes" refers to the sum of the weight of the one or more Pt(II) complexes relative to the sum of the weights of all of the materials used in one light-emitting layer in an organic light-emitting device, such as an OLED. The term "total concentration of the one or more one or more host materials" refers to the sum of the weight of the one or more host materials relative to the sum of the weights of all of the materials used in one light-emitting layer in an organic light-emitting device, such as an OLED.

The organic light-emitting devices can contain a suitable amount of the Pt(II) complexes in the light-emitting layer or each light-emitting layer of the two or more light-emitting layers of the device. For example, the total concentration of the one or more Pt(II) complexes in the light-emitting layer or each light-emitting layer of the two or more light-emitting layers is up to 50 wt %, up to 40 wt %, up to 30 wt %, up to 20 wt %, at least 1 wt %, in a range from about 1 wt % to about 50 wt %, from about 1 wt % to about 40 wt %, from about 1 wt % to about 30 wt %, from about 1 wt % to about 20 wt %, from about 2 wt % to about 50 wt %, from about 2 wt % to about 40 wt %, from about 2 wt % to about 30 wt %, from about 2 wt % to about 20 wt %, from about 4 wt % to about 50 wt %, from about 4 wt % to about 40 wt %, from about 4 wt % to about 30 wt %, from about 4 wt % to about 20 wt %, from about 1 wt % to about 16 wt %, from about 2 wt % to about 16 wt %, from about 4 wt % to about 16 wt %, such as about 4 wt %, about 6 wt %, about 8 wt %, about 10 wt %, about 12 wt %, or about 16 wt %.

In some forms, the organic light-emitting component, such as an OLED, can further include an anode, a cathode, a hole transport region, and an electron transport region. The hole transport region can include a hole injection layer and/or a hole transport layer, and optionally an electron blocking layer. The electron transport region can include an electron transport layer and/or an electron injection layer, and optionally a hole blocking layer. The light-emitting layer can be located in between the anode and the cathodes. The hole transport region can be located in between the anode and the light-emitting layer. The electron transport region can be located in between the cathode and the light-emitting layer. The specific components and arrangement of the components in each of the hole transport region and the electron transport region depend on the specific use.

Figure 13:
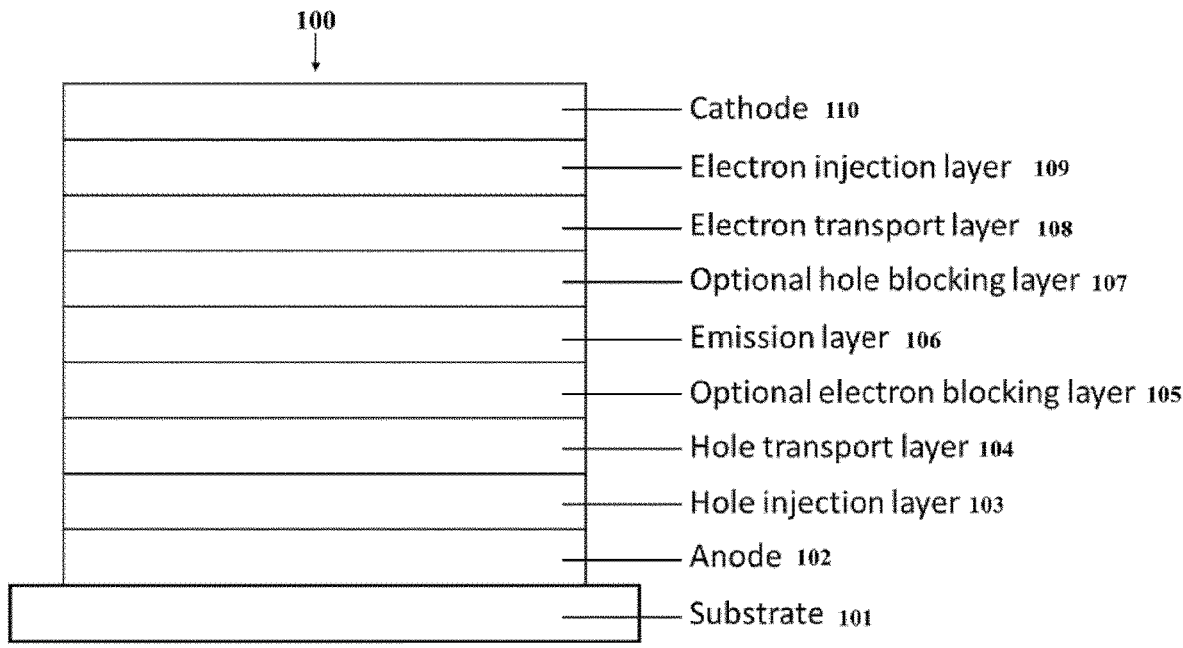
FIG. 13 is a scheme illustrating a non-limiting example of an organic light-emitting diode device, 100, having a multilayer architecture.
Figure 14A:
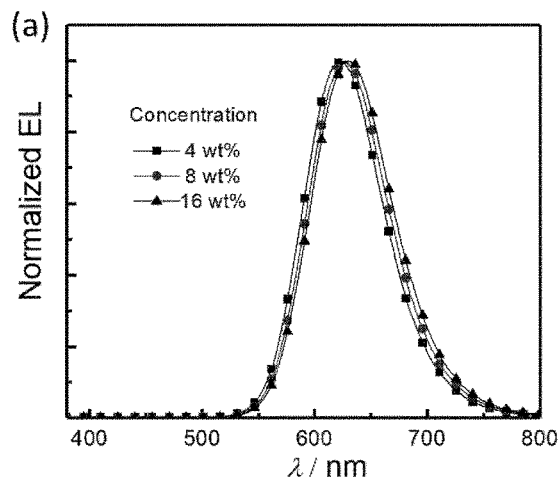
FIGS. 14A-14B are graphs showing the EL spectra (FIG. 14A) and external quantum efficiency (FIG. 14B) of vapor-deposited devices containing Pt(II) complex 1c at a doping concentrations of 4 wt %, 8 wt %, and 16 wt %, respectively. Device structure: ITO/HAT-CN (5 nm)/TAPC (40 nm)/TCTA (10 nm)/Pt-1c: TCTA:TPBi (20 nm)/TPBi (10 nm)/TmPyPb (40 nm)/LiF (1.2 nm)/Al (100 nm).
Figure 14B:
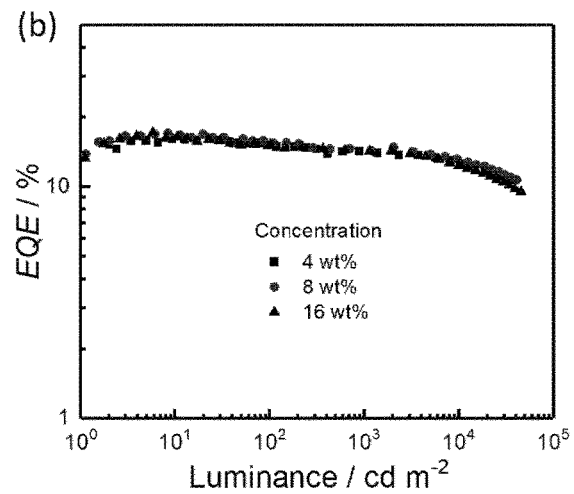
Figure 15A:
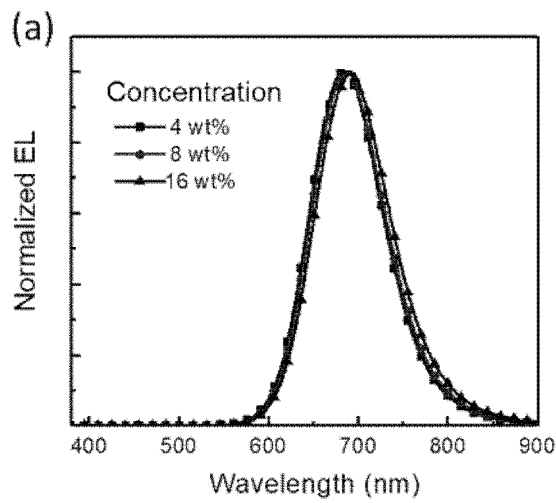
FIGS. 15A-15D are graphs showing the EL spectra (FIG. 15A), external quantum efficiency (FIG. 15B), current density (FIG. 15C), and luminance (FIG. 15D) of vapor-deposited devices containing Pt(II) complex 2b' at a doping concentrations of 4 wt %, 8 wt %, and 16 wt %, respectively. Device structure: ITO/HAT-CN (5 nm)/TAPC (40 nm)/TCTA (10 nm)/Pt-2b': TCTA:TPBi (20 nm)/TPBi (10 nm)/TmPyPb (40 nm)/LiF (1.2 nm)/Al (100 nm).
Figure 15B:
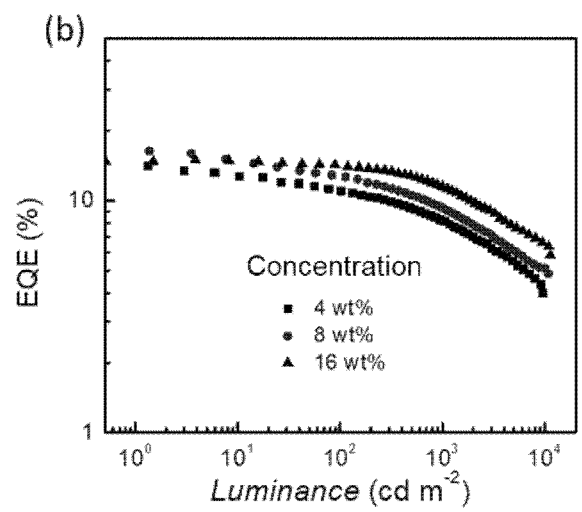
Figure 15C:
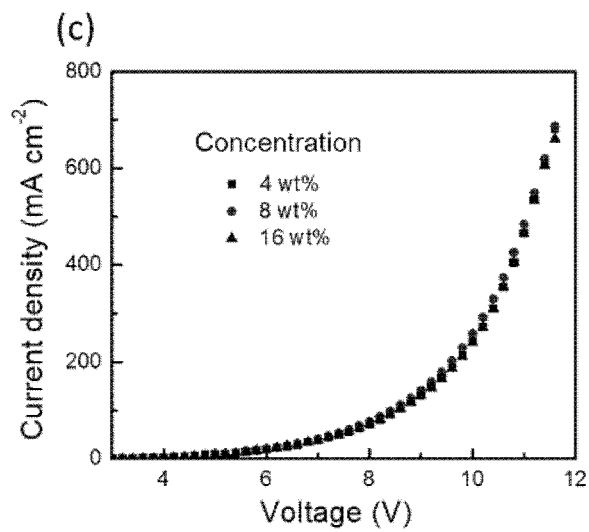
Figure 15D:
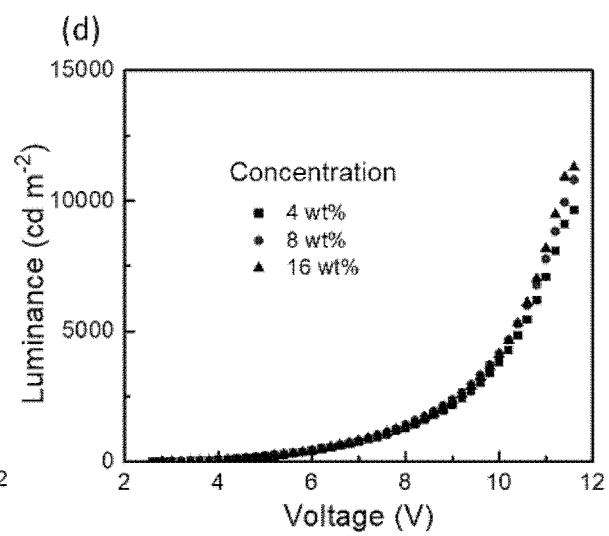
Figure 16:
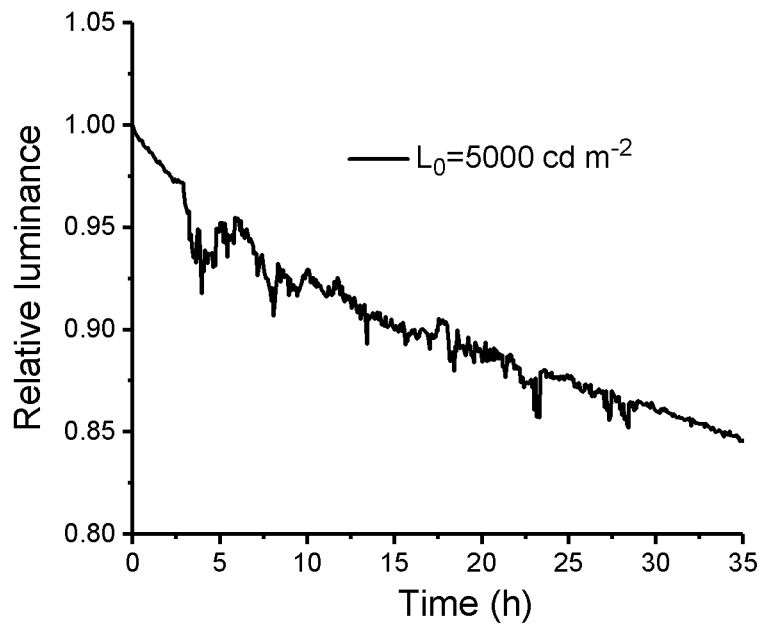
FIG. 16 is a graph showing the lifetime measurement results for OLED containing Pt(II) complex 1b.
Figure 17:
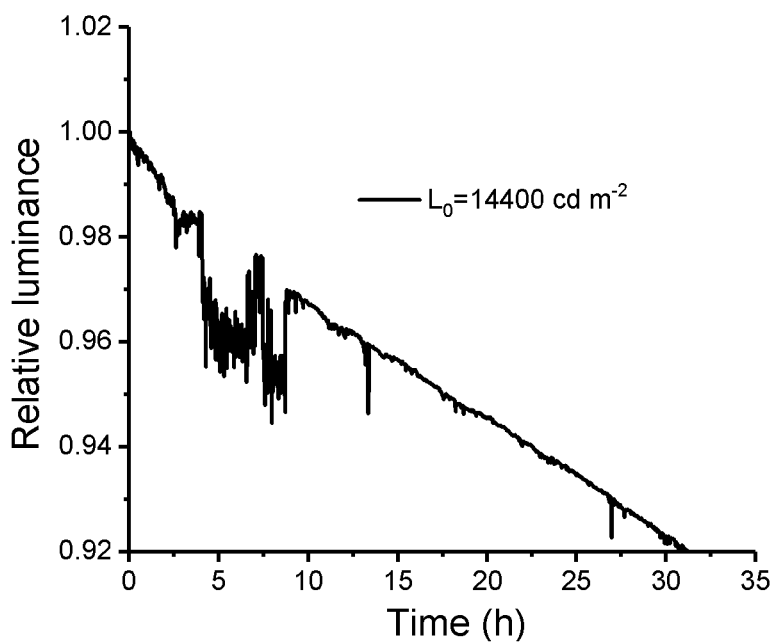
FIG. 17 is a graph showing the lifetime measurement results for OLED containing Pt(II) complex 1c.
Figure 18:
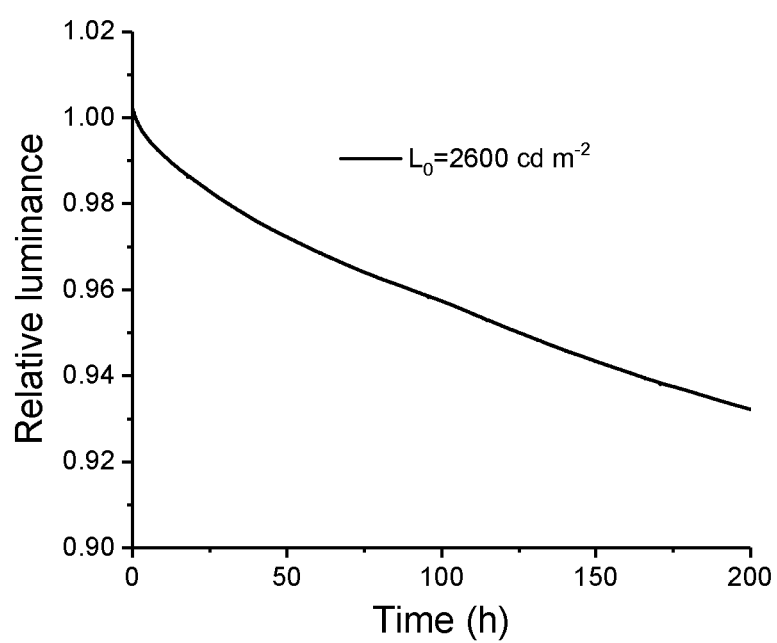
FIG. 18 is a graph showing the lifetime measurement results for OLED containing Pt(II) complex 2b'.

An exemplary OLED containing the Pt(II) complexes is illustrated in FIG. 13. As shown in FIG. 13, the exemplary OLED 100 includes multiple layers, which are, from bottom to top, a substrate 101, an anode 102, a hole injection layer 103, a hole transport layer 104, an optional electron blocking layer 105, an emission layer 106, an optional hole blocking layer 107, an electron transport layer 108, an electron injection layer 109, and a cathode 110. The emission layer 106 is formed by one or more of the Pt(II) complexes disclosed herein. Suitable materials for forming the anode, the hole injection layer, the hole transport layer, the optional electron blocking layer, the optional hole blocking layer, the electron transport layer, the electron injection layer, and the cathode are known in the art, see, for example, those described in Hong, et al., *Adv. Mater.* 2021, U.S. Pat. No. 2,005,630; Lee, et al., *InfoMat.* 2021, 3, 61-81; and Jou, et al., *J. Mater. Chem. C,* 2015, 3, 2974-3002. The dimensions of each layer in the OLED, such as the shape, the length, the width, and/or the thickness of each layer can be varied depending on the specific use of the OLED. More specific exemplary OLEDs are described in the Examples below.

These organic light-emitting devices can emit in the red to deep red regions with high efficiency and prolonged operational lifetime. Without being bound to any theories, the shortened emission lifetime of the Pt(II) complexes disclosed herein can reduce the efficiency roll-off and extend the operational lifetime of phosphorescent OLEDs. The stability gained from the dinuclearity of these Pt(II) complexes can extend the operational lifetime of red-emitting Pt-based OLEDs.

The performance of OLEDs containing the disclosed Pt(II) complexes can be evaluated using current efficiency ("CE") at 1000 cd m$^{-2}$, power efficiency ("PE") at 1000 cd m$^{-2}$, external quantum efficiency ("EQE") at 1000 cd m$^{-2}$, and/or LT95 at 1000 cd m$^{-2}$. Techniques for measuring the current efficiency, power efficiency, external quantum efficiency, and/or LT95 at 1000 cd m$^{-2}$ are known. For example, the EQE, CE, and PE of an electroluminescence device can be obtained by using a Keithley 2400 source-meter and an absolute external quantum efficiency measurement system (C9920-12, Hamamatsu Photonics), where all devices can be encapsulated in a 200-nm-thick $Al_2O_3$ thin film deposited by atomic layer deposition (ALD) in a Kurt J. Lesker SPECTROS ALD system before measurements.

In some forms, OLEDs containing the disclosed Pt(II) complexes can have a current efficiency ("CE") at 1000 cd m$^{-2}$ of at least 18 cd A-', at least 20 cd/A, at least 25 cd/A, at least 30 cd/A, in a range from 18 cd/A to 60 cd/A, from 20 cd/A to 60 cd/A, from 25 cd/A to 60 cd/A, from 30 cd/A to 60 cd/A, from 18 cd/A to 50 cd/A, from 20 cd/A to 50 cd/A, from 25 cd/A to 50 cd/A, from 30 cd/A to 50 cd/A, from 18 cd/A to 40 cd/A, from 20 cd/A to 40 cd/A, from 25 cd/A to 40 cd/A, or from 30 cd/A to 40 cd/A.

In some forms, OLEDs containing the disclosed Pt(II) complexes can have a power efficiency ("PE") at 1000 cd/m$^2$ of at least 6 lm/W, at least 10 lm/W, at least 15 lm/W, at least 20 lm/W, at least 25 lm/W, in a range from 6 lm/W to 60 lm/W, from 10 lm/W to 60 lm/W, from 15 lm/W to 60 lm/W, from 20 lm/W to 60 lm/W, from 6 lm/W to 50 lm/W, from 10 lm/W to 50 lm/W, from 15 lm/W to 50 lm/W, from 20 lm/W to 50 lm/W, from 6 lm/W to 40 lm/W, from 10 lm/W to 40 lm/W, from 15 lm/W to 40 lm/W, from 20 lm/W to 40 lm/W, from 6 lm/W to 35 lm/W, from 10 lm/W to 35 lm/W, from 15 lm/W to 35 lm/W, from 20 lm/W to 35 lm/W, from 6 lm/W to 30 lm/W, from 10 lm/W to 30 lm/W, from 15 lm/W to 30 lm/W, or from 20 lm/W to 30 lm/W.

In some forms, OLEDs containing the disclosed Pt(II) complexes having $\lambda_{max}$ in a range from about 600 nm to about 700 nm can have an external quantum efficiency ("EQE") at 1000 cd m$^{-2}$ of at least 10%, at least 11%, at least 12%, at least 13%, at least 14%, at least 15%, in a range from 10% to 40%, from 10% to 20%, from 10% to 20%, from 11% to 40%, from 11% to 30%, from 11% to 20%, from 12% to 20%, from 12% to 40%, from 12% to 30%, from 13% to 20%, from 13% to 40%, from 13% to 30%, from 14% to 20%, from 14% to 40%, from 14% to 30%, from 15% to 40%, from 15% to 30%, or from 15% to 20% for an OLED containing a single light-emitting layer of the platinum (II) complexes. In some forms, OLEDs containing the disclosed Pt(II) complexes having $\lambda_{max}$ in a range from about 600 nm to about 700 nm can have an external quantum efficiency ("EQE") at 1000 cd m$^{-2}$ of at least 20%, at least 30%, in a range from 20% to 60%, from 20% to 50%, from 20% to 40%, from 25% to 60%, from 25% to 50%, from 25% to 40%, from 30% to 60%, from 30% to 50%, from 30% to 40%, from 35% to 60%, from 35% to 50%, from 35% to 40%, from 40% to 60%, from 40% to 50%, or from 40% to 40% for an OLED containing three light-emitting layers of the platinum (II) complexes. In some forms, NIR OLEDs containing the disclosed Pt(II) complexes having $\lambda_{max}$ in a range from 700 nm to about 1000 nm can have an external quantum efficiency ("EQE") at 100 mA cm$^{-2}$ of at least 2.5%, at least 4%, at least 5%, at least 6%, in a range from 2.5% to 20%, from 4% to 20%, from 5% to 20%, or from 6% to 20%.

In some forms, OLEDs containing the disclosed Pt(II) complexes having $\lambda_{max}$ in a range from about 600 nm to about 700 nm can have a LT95 at 1000 cd/m$^2$ of at least 9000 h, at least 9300 h, or at least 9500 h, such as at least 9000 h, at least 9300 h, or at least 9500 h. In some forms, NIR OLEDs containing the disclosed Pt(II) complexes having $\lambda_{max}$ in a range from 700 nm to about 1000 nm can have a LT95 at 1000 cd/m$^2$ of at least 1000 h, at least 1200 h, at least 1500 h, at least 2000 h, at least 2500 h, at least 3000 h, at least 3500 h, at least 4000 h, at least 4500 h, at least 5000 h, at least 5500 h, at least 6000 h, at least 6500 h, at least 7000 h, at least 7500 h, at least 8000 h, at least 8500 h, 9000 h, at least 9300 h, or at least 9500 h, such as at least 1000 h, at least 1200 h, at least 1500 h, or at least 2000 h.

In some forms, the OLEDs containing the disclosed Pt(II) complexes can have a current efficiency, a power efficiency, an external quantum efficiency, and/or a LT95 at 1000 cd m$^{-2}$ in any one of the above-described ranges. In some forms, the OLEDs containing the disclosed Pt(II) complexes having $\lambda_{max}$ in a range from about 600 nm to about 700 nm can have a CE at 1000 cd m$^{-2}$ of at least 18 cd A$^{-1}$, at least 20 cd/A, at least 25 cd/A, at least 30 cd/A, in a range from 18 cd/A to 60 cd/A, from 20 cd/A to 60 cd/A, from 25 cd/A to 60 cd/A, from 30 cd/A to 60 cd/A, from 18 cd/A to 50 cd/A, from 20 cd/A to 50 cd/A, from 25 cd/A to 50 cd/A, from 30 cd/A to 50 cd/A, from 18 cd/A to 40 cd/A, from 20 cd/A to 40 cd/A, from 25 cd/A to 40 cd/A, or from 30 cd/A to 40 cd/A; and a EQE at 1000 cd m$^{-2}$ of at least 10%, at least 11%, at least 12%, at least 13%, at least 14%, at least 15%, in a range from 10% to 40%, from 10% to 20%, from 10% to 20%, from 11% to 40%, from 11% to 30%, from 11% to 20%, from 12% to 20%, from 12% to 40%, from 12% to 30%, from 13% to 20%, from 13% to 40%, from 13% to 30%, from 14% to 20%, from 14% to 40%, from 14% to 30%, from 15% to 40%, from 15% to 30%, or from 15% to 20% (for a single light-emitting layer of the platinum (II) complexes).

In some forms, NIR OLEDs containing the disclosed Pt(II) complexes having $\lambda_{max}$ in a range from 700 nm to about 1000 nm can have a CE at 1000 cd m$^{-2}$ of at least 18 cd A-', at least 20 cd/A, at least 25 cd/A, at least 30 cd/A, in a range from 18 cd/A to 60 cd/A, from 20 cd/A to 60 cd/A, from 25 cd/A to 60 cd/A, from 30 cd/A to 60 cd/A, from 18 cd/A to 50 cd/A, from 20 cd/A to 50 cd/A, from 25 cd/A to 50 cd/A, from 30 cd/A to 50 cd/A, from 18 cd/A to 40 cd/A, from 20 cd/A to 40 cd/A, from 25 cd/A to 40 cd/A, or from 30 cd/A to 40 cd/A; and a EQE at 100 mA cm$^{-2}$ of at least 2.5%, at least 4%, at least 5%, at least 6%, in a range from 2.5% to 20%, from 4% to 20%, from 5% to 20%, or from 6% to 20%.

In some forms, the OLEDs containing the disclosed Pt(II) complexes having $\lambda_{max}$ in a range from about 600 nm to about 700 nm can have a CE at 1000 cd m$^{-2}$ of at least 18 cd A$^{-1}$, at least 20 cd/A, at least 25 cd/A, at least 30 cd/A, in a range from 18 cd/A to 60 cd/A, from 20 cd/A to 60 cd/A, from 25 cd/A to 60 cd/A, from 30 cd/A to 60 cd/A, from 18 cd/A to 50 cd/A, from 20 cd/A to 50 cd/A, from 25 cd/A to 50 cd/A, from 30 cd/A to 50 cd/A, from 18 cd/A to 40 cd/A, from 20 cd/A to 40 cd/A, from 25 cd/A to 40 cd/A, or from 30 cd/A to 40 cd/A; a PE at 1000 cd/m$^2$ of at least 6 lm/W, at least 10 lm/W, at least 15 lm/W, at least 20 lm/W, at least 25 lm/W, in a range from 6 lm/W to 60 lm/W, from 10 lm/W to 60 lm/W, from 15 lm/W to 60 lm/W, from 20 lm/W to 60 lm/W, from 6 lm/W to 50 lm/W, from 10 lm/W to 50 lm/W, from 15 lm/W to 50 lm/W, from 20 lm/W to 50 lm/W, from 6 lm/W to 40 lm/W, from 10 lm/W to 40 lm/W, from 15 lm/W to 40 lm/W, from 20 lm/W to 40 lm/W, from 6 lm/W to 35 lm/W, from 10 lm/W to 35 lm/W, from 15 lm/W to 35 lm/W, from 20 lm/W to 35 lm/W, from 6 lm/W to 30 lm/W, from 10 lm/W to 30 lm/W, from 15 lm/W to 30 lm/W, or from 20 lm/W to 30 lm/W; a EQE at 1000 cd m$^{-2}$ of at least 10%, at least 11%, at least 12%, at least 13%, at least 14%, at least 15%, in a range from 10% to 40%, from 10% to 20%, from 10% to 20%, from 11% to 40%, from 11% to 30%, from 11% to 20%, from 12% to 20%, from 12% to 40%, from 12% to 30%, from 13% to 20%, from 13% to 40%, from 13% to 30%, from 14% to 20%, from 14% to 40%, from 14% to 30%, from 15% to 40%, from 15% to 30%, or from 15% to 20% (for a single light-emitting layer of the platinum (II) complexes); and a LT95 at 1000 cd/m$^2$ of at least 9000 h, at least 9300 h, or at least 9500 h.

In some forms, NIR OLEDs containing the disclosed Pt(II) complexes having $\lambda_{max}$ in a range from 700 nm to about 1000 nm can have a CE at 1000 cd m$^{-2}$ of at least 18 cd A-', at least 20 cd/A, at least 25 cd/A, at least 30 cd/A, in a range from 18 cd/A to 60 cd/A, from 20 cd/A to 60 cd/A, from 25 cd/A to 60 cd/A, from 30 cd/A to 60 cd/A, from 18 cd/A to 50 cd/A, from 20 cd/A to 50 cd/A, from 25 cd/A to 50 cd/A, from 30 cd/A to 50 cd/A, from 18 cd/A to 40 cd/A, from 20 cd/A to 40 cd/A, from 25 cd/A to 40 cd/A, or from 30 cd/A to 40 cd/A; a PE at 1000 cd/m$^2$ of at least 6 lm/W, at least 10 lm/W, at least 15 lm/W, at least 20 lm/W, at least 25 lm/W, in a range from 6 lm/W to 60 lm/W, from 10 lm/W to 60 lm/W, from 15 lm/W to 60 lm/W, from 20 lm/W to 60 lm/W, from 6 lm/W to 50 lm/W, from 10 lm/W to 50 lm/W, from 15 lm/W to 50 lm/W, from 20 lm/W to 50 lm/W, from 6 lm/W to 40 lm/W, from 10 lm/W to 40 lm/W, from 15 lm/W to 40 lm/W, from 20 lm/W to 40 lm/W, from 6 lm/W to 35 lm/W, from 10 lm/W to 35 lm/W, from 15 lm/W to 35 lm/W, from 20 lm/W to 35 lm/W, from 6 lm/W to 30 lm/W, from 10 lm/W to 30 lm/W, from 15 lm/W to 30 lm/W, or from 20 lm/W to 30 lm/W; a EQE at 100 mA cm$^{-2}$ of at least 2.5%, at least 4%, at least 5%, at least 6%, in a range from 2.5% to 20%, from 4% to 20%, from 5% to 20%, or from 6% to 20%; and a LT95 at 1000 cd/m$^2$ of at least 1000 h, at least 1200 h, at least 1500 h, at least 2000 h, at least 2500 h, or at least 3000 h.

In some forms, OLEDs containing the disclosed Pt(II) complexes having $\lambda_{max}$ in a range from about 600 nm to about 700 nm and at a concentration in a range from about 4 wt % to about 16 wt % or from about 6 wt % to about 16 wt %, such as about 4 wt % or about 8 wt %, can have a current efficiency, a power efficiency, an external quantum efficiency, and/or a LT95 at 1000 cd m$^{-2}$ in any one of the above-described ranges. In some forms, the OLEDs containing the disclosed Pt(II) complexes at a concentration in a range from about 4 wt % to about 16 wt % or from about 6 wt % to about 16 wt %, such as about 4 wt % or about 8 wt %, can have a current efficiency at 1000 cd m$^{-2}$ of at least 24 cd/A, from 24 cd/A to 60 cd/A, from 24 cd/A to 50 cd/A, from 30 cd/A to 60 cd/A, from 30 cd/A to 50 cd/A, from 24 cd/A to 40 cd/A, or from 30 cd/A to 40 cd/A; and an external quantum efficiency at 1000 cd m$^{-2}$ of at least 10%, at least 11%, at least 12%, at least 13%, at least 14%, at least 15%, in a range from 10% to 40%, from 10% to 20%, from 10% to 20%, from 11% to 40%, from 11% to 30%, from 11% to 20%, from 12% to 20%, from 12% to 40%, from 12% to 30%, from 13% to 20%, from 13% to 40%, from 13% to 30%, from 14% to 20%, from 14% to 40%, from 14% to 30%, from 15% to 40%, from 15% to 30%, or from 15% to 20% (for a single light-emitting layer of the platinum (II) complexes).

In some forms, NIR OLEDs containing the disclosed Pt(II) complexes having $\lambda_{max}$ in a range from 700 nm to about 1000 nm and at a concentration in a range from about 4 wt % to about 16 wt % or from about 6 wt % to about 16 wt %, such as about 4 wt % or about 8 wt %, can have a current efficiency at 1000 cd m$^{-2}$ of at least 24 cd/A, from 24 cd/A to 60 cd/A, from 24 cd/A to 50 cd/A, from 30 cd/A to 60 cd/A, from 30 cd/A to 50 cd/A, from 24 cd/A to 40 cd/A, or from 30 cd/A to 40 cd/A; and an external quantum efficiency at 100 mA cm$^{-2}$ of at least 2.5%, at least 4%, at least 5%, at least 6%, in a range from 2.5% to 20%, from 4% to 20%, from 5% to 20%, or from 6% to 20%.

In some forms, the OLEDs containing the disclosed Pt(II) complexes having $\lambda_{max}$ in a range from about 600 nm to about 700 nm and at a concentration in a range from about 4 wt % to about 16 wt % or from about 6 wt % to about 16 wt %, such as about 4 wt % or about 8 wt %, can have a current efficiency at 1000 cd m$^{-2}$ of at least 24 cd/A, from 24 cd/A to 60 cd/A, from 24 cd/A to 50 cd/A, from 30 cd/A to 60 cd/A, from 30 cd/A to 50 cd/A, from 24 cd/A to 40 cd/A, or from 30 cd/A to 40 cd/A; a power efficiency at 1000 cd m$^{-2}$ of at least 10 lm/W, at least 15 lm/W, at least 20 lm/W, at least 25 lm/W, in a range from 10 lm/W to 60 lm/W, from 15 lm/W to 60 lm/W, from 20 lm/W to 60 lm/W, from 10 lm/W to 50 lm/W, from 15 lm/W to 50 lm/W, from 20 lm/W to 50 lm/W, from 10 lm/W to 40 lm/W, from 15 lm/W to 40 lm/W, from 20 lm/W to 40 lm/W, from 6 lm/W to 35 lm/W, from 10 lm/W to 35 lm/W, from 15 lm/W to 35 lm/W, or from 20 lm/W to 35 lm/W; an external quantum efficiency at 1000 cd m$^{-2}$ of at least 10%, at least 11%, at least 12%, at least 13%, at least 14%, at least 15%, in a range from 10% to 40%, from 10% to 20%, from 10% to 20%, from 11% to 40%, from 11% to 30%, from 11% to 20%, from 12% to 40%, from 12% to 30%, from 13% to 20%, from 13% to 40%, from 13% to 30%, from 14% to 20%, from 14% to 40%, from 14% to 30%, from 15% to 40%, from 15% to 30%, or from 15% to 20% (for a single light-emitting layer of the platinum (II) complexes); and a LT95 at 1000 cd m$^{-2}$ of at least 9000 h or at least 9300 h.

In some forms, NIR OLEDs containing the disclosed Pt(II) complexes having $\lambda_{max}$ in a range from 700 nm to about 1000 nm and at a concentration in a range from about 4 wt % to about 16 wt % or from about 6 wt % to about 16 wt %, such as about 4 wt % or about 8 wt %, can have a current efficiency at 1000 cd m$^{-2}$ of at least 24 cd/A, from 24 cd/A to 60 cd/A, from 24 cd/A to 50 cd/A, from 30 cd/A to 60 cd/A, from 30 cd/A to 50 cd/A, from 24 cd/A to 40 cd/A, or from 30 cd/A to 40 cd/A; a power efficiency at 1000 cd m$^{-2}$ of at least 10 lm/W, at least 15 lm/W, at least 20 lm/W, at least 25 lm/W, in a range from 10 lm/W to 60 lm/W, from 15 lm/W to 60 lm/W, from 20 lm/W to 60 lm/W, from 10 lm/W to 50 lm/W, from 15 lm/W to 50 lm/W, from 20 lm/W to 50 lm/W, from 10 lm/W to 40 lm/W, from 15 lm/W to 40 lm/W, from 20 lm/W to 40 lm/W, from 6 lm/W to 35 lm/W, from 10 lm/W to 35 lm/W, from 15 lm/W to 35 lm/W, or from 20 lm/W to 35 lm/W; an external quantum efficiency at 100 mA cm$^{-2}$ of at least 2.5%, at least 4%, at least 5%, at least 6%, in a range from 2.5% to 20%, from 4% to 20%, from 5% to 20%, or from 6% to 20%; and a LT95 at 1000 cd m$^{-2}$ of at least 1000 h or at least 1500 h.

More specific examples of the current efficiency, power efficiency, external quantum efficiency, and LT95 lifetime are described in the Examples.

III. Methods of Making the Platinum (II) Complexes

A. Pt(II) Complexes

The Pt(II) complexes and the ligands forming the Pt(II) complexes described herein can be synthesized using methods known in the art of organic chemical synthesis. The target Pt(II) complex can be synthesized by reacting a bidentate ligand and/or tetradentate ligand with a platinum precursor in a suitable solvent. Exemplary solvents include organic solvents, such as dimethylformamide. The reaction solution containing the bidentate ligand and/or tetradentate ligand and the platinum precursor can be refluxed for a suitable time to form the target Pt(II) complex. More specific reagents, reaction conditions, and Pt(II) complexes formed are described in the Examples.

B. Organic Light-Emitting Devices

Also described are methods of making organic light-emitting devices, such as OLEDs, containing one or more Pt(II) complexes disclosed herein. An exemplary method for making the OLEDs involves vacuum deposition or solution processing techniques such as spin-coating and ink-jet printing. A specific exemplary method of making an OLED containing a Pt(II) complex disclosed herein is disclosed in the Examples.

IV. Methods of Using the Platinum(II) Complexes

The Pt(II) complexes described herein can emit in the red and/or deep red regions at room temperatures with high quantum yield (such as >50%) and short emission lifetime (such as <3 μs). Accordingly, the Pt(II) complexes described herein can be incorporated into an organic light-emitting device to emit red and/or deep red light with high efficiency and prolonged operational lifetime, such as those described above.

For example, Pt(II) complexes described herein can be incorporated into an OLEDs, a light-emitting electrochemical cell (LEEC), a stationary visual display unit, a mobile visual display unit, or an illumination device. Examples of units or devices suitable for use as red/deep red light-emitting devices that incorporate the Pt(II) complexes disclosed herein include commercial applications such as smart phones, televisions, monitors, digital cameras, tablet computers, and lighting fixtures that usually operate at room temperatures.

The disclosed compounds, methods of using, and methods of making can be further understood through the following enumerated paragraphs.

Paragraph 1. A platinum (II) complex having a structure:

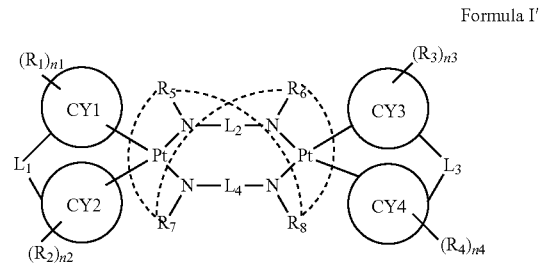

Formula I′ wherein:
(a) the compound has an overall neutral, negative, or positive charge;

(b) CY1, CY2, CY3, and CY4 are independently substituted or unsubstituted aryl, substituted or unsubstituted polyaryl, substituted or unsubstituted heteroaryl, substituted or unsubstituted polyheteroaryl, substituted or unsubstituted heterocyclyl, substituted or unsubstituted cycloalkyl, substituted or unsubstituted cycloalkenyl, or substituted or unsubstituted cycloalkynyl;

(c) $R_1$, $R_2$, $R_3$, and $R_4$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol; preferably, $R_5$, $R_6$, $R_7$, and $R_8$ are independently substituted or unsubstituted aryl, substituted or unsubstituted polyaryl, substituted or unsubstituted heteroaryl, substituted or unsubstituted polyheteroaryl; preferably, $R_5$, $R_6$, $R_7$, and $R_8$ are independently substituted or unsubstituted aryl, substituted or unsubstituted heteroaryl; preferably, $R_5$, $R_6$, $R_7$, and $R_8$ are independently substituted or unsubstituted aryl;

(d) n1, n2, n3, and n4 are independently an integer between zero and 10;

(e) $L_1$ and $L_3$ are independently a single bond, a double bond, a triple bond, absent, oxygen, sulfur, amino, amido, substituted or unsubstituted alkyl, substituted or unsubstituted alkenyl, carbonyl, sulfonyl, sulfonic acid, phosphoryl, or phosphonyl;

(f) $R_5$, $R_6$, $R_7$, and $R_8$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy;

(g) $L_2$ and $L_4$ are independently a single bond, a double bond, a triple bond, substituted or unsubstituted alkyl, substituted or unsubstituted alkenyl, amino, amido, or carbonyl; preferably, $L_2$ and $L_4$ are substituted or unsubstituted alkenyl;

(h) ------ is absent, a single bond, a double bond, a triple bond, a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether; and (i) the substituents are independently a substituted or unsubstituted alkyl, a substituted or unsubstituted alkenyl, a substituted or unsubstituted alkynyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, a substituted or unsubstituted aralkyl, a substituted or unsubstituted carbonyl, a substituted or unsubstituted alkoxy, a halogen, a hydroxyl, a phenoxy, an aroxy, an alkylthio, a phenylthio, an arylthio, a cyano, an isocyano, a nitro, an carboxyl, an amino, an amido, an oxo, a silyl, a sulfinyl, a sulfonyl, a sulfonic acid, a phosphonium, a phosphanyl, a phosphoryl, a phosphonyl, or a thiol, or a combination thereof.

Paragraph 2. The platinum (II) complex of paragraph 1, wherein the complex has a structure:

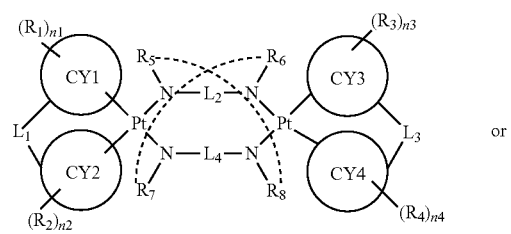

Formula I or

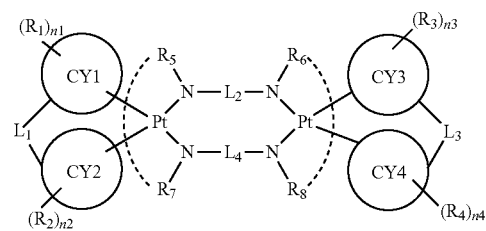

Formula I''

Paragraph 3. The platinum (II) complex of paragraph 1 or 2, having an overall neutral charge.

Paragraph 4. The platinum (II) complex of any one of paragraphs 1-3, wherein CY1, CY2, CY3, and CY4 are independently substituted or unsubstituted aryl, substituted or unsubstituted polyaryl, substituted or unsubstituted heteroaryl, substituted or unsubstituted polyheteroaryl, or substituted or unsubstituted heterocyclyl.

Paragraph 5. The platinum (II) complex of any one of paragraphs 1-4 having a structure:

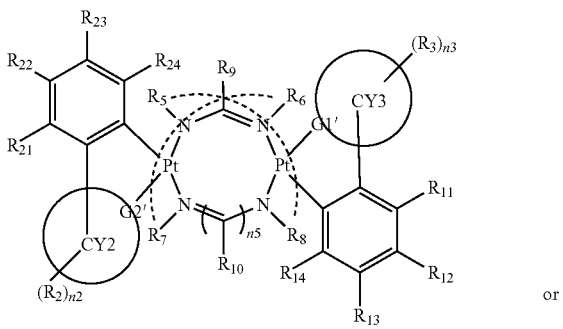

Formula II or

-continued

Formula II'

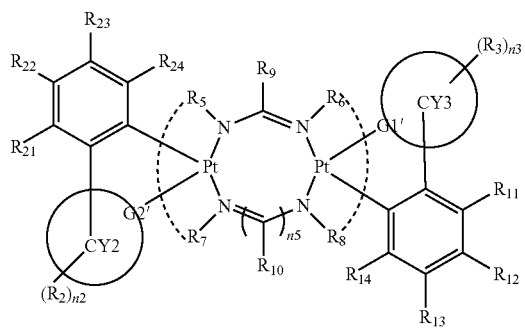

wherein:
(a) CY2 and CY3 are independently substituted or unsubstituted aryl, substituted or unsubstituted polyaryl, substituted or unsubstituted heteroaryl, substituted or unsubstituted polyheteroaryl, substituted or unsubstituted heterocyclyl, substituted or unsubstituted cycloalkyl, substituted or unsubstituted cycloalkenyl, or substituted or unsubstituted cycloalkynyl;
(b) $R_2$ and $R_3$ are independently hydrogen, substituted or unsubstituted alkyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, oxo, amino, alkoxy, aroxy, cyano, isocyano, carbonyl, nitro, or thiol;
(c) n2, n3, n5, and n6 are independently an integer between zero and 10;
(d) $R_5$, $R_6$, $R_7$, and $R_8$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy; preferably, $R_5$, $R_6$, $R_7$, and $R_8$ are independently substituted or unsubstituted aryl, substituted or unsubstituted polyaryl, substituted or unsubstituted heteroaryl, substituted or unsubstituted polyheteroaryl; preferably, $R_5$, $R_6$, $R_7$, and $R_8$ are independently substituted or unsubstituted aryl, substituted or unsubstituted heteroaryl; preferably, $R_5$, $R_6$, $R_7$, and $R_8$ are independently substituted or unsubstituted aryl;
(e) $R_9$ and $R_{10}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol;
(f) $R_{11}$-$R_{14}$ and $R_{21}$-$R_{24}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol, and optionally $R_{11}$ and $R_{12}$ together, $R_{12}$ and $R_{13}$ together, $R_{13}$ and $R_{14}$ together, $R_{21}$ and $R_{22}$ together, $R_{22}$ and $R_{23}$ together, and/or $R_{23}$ and $R_{24}$ together form a substituted or unsubstituted aryl, a substituted or unsubstituted polyaryl, a substituted or unsubstituted heteroaryl, a substituted or unsubstituted polyheteroaryl, a substituted or unsubstituted cycloalkyl, a substituted or unsubstituted cycloalkenyl, a substituted or unsubstituted cycloalkynyl, or a substituted or unsubstituted heterocyclyl;
(g) G1' and G2' are independently C or N;
(h) ------ is absent, a single bond, a double bond, a triple bond, a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether; and
(i) the substituents are independently a substituted or unsubstituted alkyl, a substituted or unsubstituted alkenyl, a substituted or unsubstituted alkynyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, a substituted or unsubstituted aralkyl, a substituted or unsubstituted carbonyl, a substituted or unsubstituted alkoxy, a halogen, a hydroxyl, a phenoxy, an aroxy, an alkylthio, a phenylthio, an arylthio, a cyano, an isocyano, a nitro, an carboxyl, an amino, an amido, an oxo, a silyl, a sulfinyl, a sulfonyl, a sulfonic acid, a phosphonium, a phosphanyl, a phosphoryl, a phosphonyl, or a thiol, or a combination thereof.

Paragraph 6. The platinum (II) complex of any one of paragraphs 1-5, CY2 and CY3 are independently substituted or unsubstituted heteroaryl, substituted or unsubstituted polyheteroaryl, or substituted or unsubstituted heterocyclyl, and/or wherein n2 and n3 are independently an integer between 2 and 4, and two adjacent $R_2$ and/or two adjacent $R_3$ forms a substituted or unsubstituted aryl, substituted or unsubstituted polyaryl, substituted or unsubstituted heteroaryl, substituted or unsubstituted polyheteroaryl, substituted or unsubstituted heterocyclyl, substituted or unsubstituted cycloalkyl, substituted or unsubstituted cycloalkenyl, or substituted or unsubstituted cycloalkynyl.

Paragraph 7. The platinum (II) complex of any one of paragraphs 1-6 having a structure:

Formula III¢

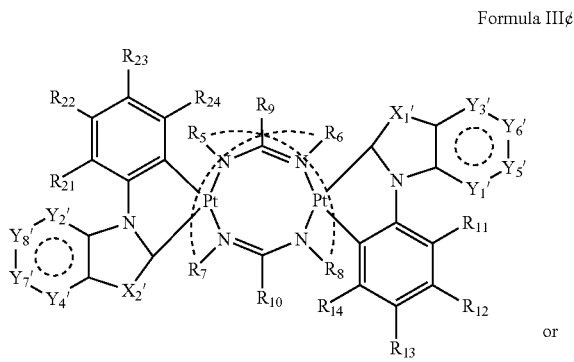

or

-continued

Formula III'''

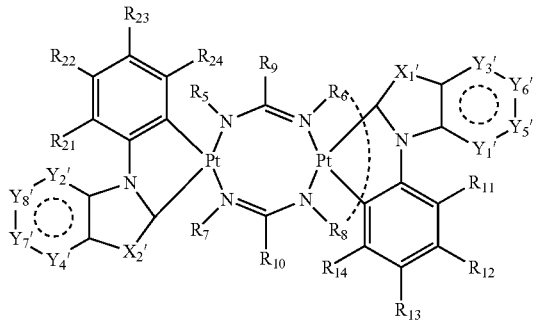

wherein:
(a) $R_5$, $R_6$, $R_7$, and $R_8$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy; preferably, $R_5$, $R_6$, $R_7$, and $R_8$ are independently substituted or unsubstituted aryl, substituted or unsubstituted polyaryl, substituted or unsubstituted heteroaryl, substituted or unsubstituted polyheteroaryl; preferably, $R_5$, $R_6$, $R_7$, and $R_8$ are independently substituted or unsubstituted aryl, substituted or unsubstituted heteroaryl; preferably, $R_5$, $R_6$, $R_7$, and $R_8$ are independently substituted or unsubstituted aryl;
(b) $R_9$ and $R_{10}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol;
(c) $R_{11}$-$R_{14}$ and $R_{21}$-$R_{24}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol, and optionally $R_{11}$ and $R_{12}$ together, $R_{12}$ and $R_{13}$ together, $R_{13}$ and $R_{14}$ together, $R_{21}$ and $R_{22}$ together, $R_{22}$ and $R_{23}$ together, and/or $R_{23}$ and $R_{24}$ together form a substituted or unsubstituted aryl, a substituted or unsubstituted polyaryl, a substituted or unsubstituted heteroaryl, a substituted or unsubstituted polyheteroaryl, a substituted or unsubstituted cycloalkyl, a substituted or unsubstituted cycloalkenyl, a substituted or unsubstituted cycloalkynyl, or a substituted or unsubstituted heterocyclyl;
(d) each ------ can be independently absent, a bond (single, double, or triple), a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether;
(e) $X_1'$, $X_2'$, $Y_1'$-$Y_8'$ can be independently O, S, $CR_{15}$, or $NR_{18}$, $R_{15}$ and $R_{18}$ can be independently absent, hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol; and
(f) the substituents are independently a substituted or unsubstituted alkyl, a substituted or unsubstituted alkenyl, a substituted or unsubstituted alkynyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, a substituted or unsubstituted aralkyl, a substituted or unsubstituted carbonyl, a substituted or unsubstituted alkoxy, a halogen, a hydroxyl, a phenoxy, an aroxy, an alkylthio, a phenylthio, an arylthio, a cyano, an isocyano, a nitro, an carboxyl, an amino, an amido, an oxo, a silyl, a sulfinyl, a sulfonyl, a sulfonic acid, a phosphonium, a phosphanyl, a phosphoryl, a phosphonyl, or a thiol, or a combination thereof.

Paragraph 8. The platinum (II) complex of any one of paragraphs 1-7 having a structure:

Formula III

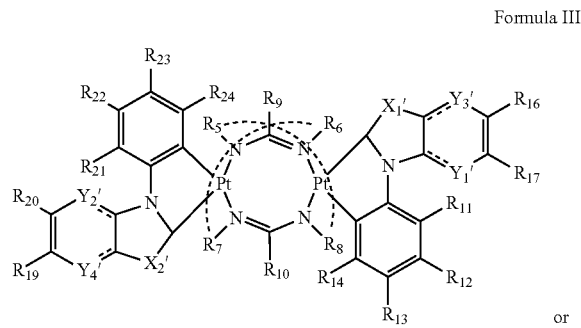

or

Formula III''''

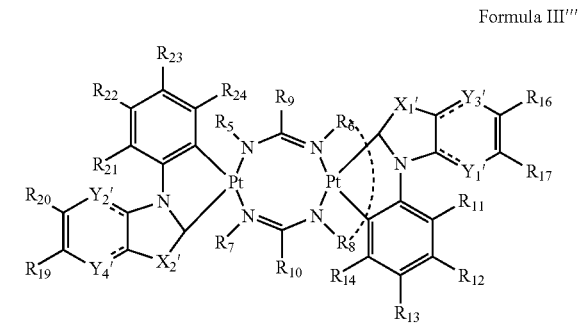

wherein:
(a) $R_5$, $R_6$, $R_7$, and $R_8$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy; preferably, $R_5$, $R_6$, $R_7$, and $R_8$ are independently substituted or unsubstituted aryl, substituted or unsubstituted polyaryl, substituted or unsubstituted heteroaryl, substituted or unsubstituted polyheteroaryl; preferably, $R_5$, $R_6$, $R_7$, and $R_8$ are independently substituted or unsubstituted aryl, substituted or unsubstituted heteroaryl; preferably, $R_5$, $R_6$, $R_7$, and $R_8$ are independently substituted or unsubstituted aryl;

(b) $R_9$ and $R_{10}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol;

(c) $R_{11}$-$R_{14}$, $R_{16}$, $R_{17}$, and $R_{19}$-$R_{24}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol, and optionally $R_{11}$ and $R_{12}$ together, $R_{12}$ and $R_{13}$ together, $R_{13}$ and $R_{14}$ together, $R_{16}$ and $R_{17}$ together, $R_{19}$ and $R_{20}$ together, $R_{21}$ and $R_{22}$ together, $R_{22}$ and $R_{23}$ together, and/or $R_{23}$ and $R_{24}$ together form a substituted or unsubstituted aryl, a substituted or unsubstituted polyaryl, a substituted or unsubstituted heteroaryl, a substituted or unsubstituted polyheteroaryl, a substituted or unsubstituted cycloalkyl, a substituted or unsubstituted cycloalkenyl, a substituted or unsubstituted cycloalkynyl, or a substituted or unsubstituted heterocyclyl;

(d) ------ is absent, a single bond, a double bond, a triple bond, a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether;

(e) $X_1'$, $X_2'$, $Y_1'$, $Y_2'$, $Y_3'$, and $Y_4'$ are independently O, S, $CR_{15}$, or $NR_{18}$, $R_{15}$ and $R_{18}$ are independently absent, hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol; and (f) the substituents are independently a substituted or unsubstituted alkyl, a substituted or unsubstituted alkenyl, a substituted or unsubstituted alkynyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, a substituted or unsubstituted aralkyl, a substituted or unsubstituted carbonyl, a substituted or unsubstituted alkoxy, a halogen, a hydroxyl, a phenoxy, an aroxy, an alkylthio, a phenylthio, an arylthio, a cyano, an isocyano, a nitro, an carboxyl, an amino, an amido, an oxo, a silyl, a sulfinyl, a sulfonyl, a sulfonic acid, a phosphonium, a phosphanyl, a phosphoryl, a phosphonyl, or a thiol, or a combination thereof.

Paragraph 9. The platinum (II) complex of paragraph 8, wherein $X_1'$, $X_2'$, $Y_1'$, $Y_2'$, $Y_3'$, and $Y_4'$ are independently $CR_{15}$ or $NR_{18}$, $R_{15}$ and $R_{18}$ are independently absent, hydrogen, substituted or unsubstituted alkyl, or substituted or unsubstituted aryl.

Paragraph 10. The platinum (II) complex of paragraph 8 or 9, wherein $X_1'$, $X_2'$, $Y_1'$ and/or $Y_3'$, and $Y_2'$ and/or $Y_4'$ are independently $NR_{18}$, each occurrence of $R_{18}$ is absent, hydrogen, substituted or unsubstituted alkyl, or substituted or unsubstituted aryl.

Paragraph 11. The platinum (II) complex of any one of paragraphs 8-10, wherein $R_{16}$, $R_{17}$, $R_{19}$, and $R_{20}$ are independently hydrogen, substituted or unsubstituted alkyl, substituted or unsubstituted alkenyl, substituted or unsubstituted alkynyl, substituted or unsubstituted aryl, substituted or unsubstituted heteroaryl, substituted or unsubstituted heterocyclyl, or hydroxyl.

Paragraph 12. The platinum (II) complex of any one of paragraphs 1-7 having a structure:

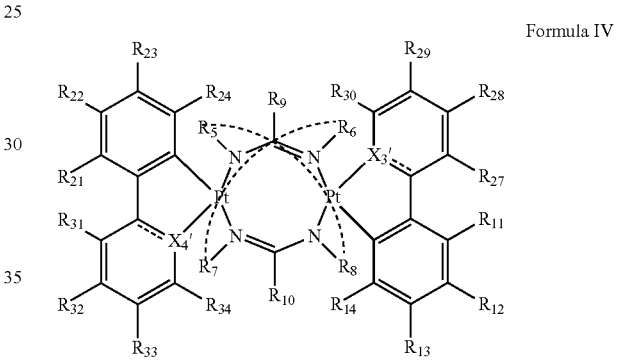

Formula IV

Formula IV' wherein:

(a) $R_5$, $R_6$, $R_7$, and $R_8$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy; preferably, $R_5$, $R_6$, $R_7$, and $R_8$ are independently substituted or unsubstituted aryl, substituted or unsubstituted polyaryl, substituted or unsubstituted heteroaryl, substituted or unsubstituted polyheteroaryl; preferably, $R_5$, $R_6$, $R_7$, and $R_8$ are independently substituted or unsubstituted aryl, substituted or unsubstituted heteroaryl; preferably, $R_5$, $R_6$, $R_7$, and $R_8$ are independently substituted or unsubstituted aryl;

(b) $R_9$ and $R_{10}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol; preferably, $R_9$ and $R_{10}$ are independently hydrogen, or substituted or unsubstituted alkyl; preferably, $R_9$ and $R_{10}$ independently hydrogen;

(c) $R_{11}$-$R_{14}$, $R_{21}$-$R_{24}$, and $R_{27}$-$R_{34}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol, and optionally Rn and $R_{12}$ together, $R_{12}$ and $R_{13}$ together, $R_{13}$ and $R_{14}$ together, $R_{21}$ and $R_{22}$ together, $R_{22}$ and $R_{23}$ together, $R_{23}$ and $R_{24}$, $R_{27}$ and $R_{28}$ together, $R_{28}$ and $R_{29}$ together, $R_{29}$ and $R_{30}$ together, $R_{31}$ and $R_{32}$ together, $R_{32}$ and $R_{33}$ together, and/or $R_{33}$ and $R_{34}$ together, form a substituted or unsubstituted aryl, a substituted or unsubstituted polyaryl, a substituted or unsubstituted heteroaryl, a substituted or unsubstituted polyheteroaryl, a substituted or unsubstituted cycloalkyl, a substituted or unsubstituted cycloalkenyl, a substituted or unsubstituted cycloalkynyl, or a substituted or unsubstituted heterocyclyl;

(d) ------ is absent, a single bond, a double bond, a triple bond, a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether;

(e) $X_3'$ and $X_4'$ are independently $CR_{25}$ or $NR_{26}$, $R_{25}$ and $R_{26}$ are independently absent, hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol; and (f) the substituents are independently a substituted or unsubstituted alkyl, a substituted or unsubstituted alkenyl, a substituted or unsubstituted alkynyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, a substituted or unsubstituted aralkyl, a substituted or unsubstituted carbonyl, a substituted or unsubstituted alkoxy, a halogen, a hydroxyl, a phenoxy, an aroxy, an alkylthio, a phenylthio, an arylthio, a cyano, an isocyano, a nitro, an carboxyl, an amino, an amido, an oxo, a silyl, a sulfinyl, a sulfonyl, a sulfonic acid, a phosphonium, a phosphanyl, a phosphoryl, a phosphonyl, or a thiol, or a combination thereof.

Paragraph 13. The platinum (II) complex of paragraph 12, wherein $X_3'$ and $X_4'$ are independently $CR_{25}$ or $NR_{26}$, $R_{25}$ and $R_{26}$ are independently absent, hydrogen, substituted or unsubstituted alkyl, substituted or unsubstituted aryl.

Paragraph 14. The platinum (II) complex of paragraph 12 or 13, wherein $X_3'$ and $X_4'$ are independently $NR_{26}$, each occurrence of $R_{26}$ is independently absent, hydrogen, substituted or unsubstituted alkyl, substituted or unsubstituted aryl.

Paragraph 15. The platinum (II) complex of any one of paragraphs 12-14, wherein $R_{27}$-$R_{34}$ are independently hydrogen, substituted or unsubstituted alkyl, substituted or unsubstituted aryl, substituted or unsubstituted heteroaryl, substituted or unsubstituted heterocyclyl, or hydroxyl; Paragraph 16. The platinum (II) complex of any one of paragraphs 12-15, wherein $R_{27}$-$R_{34}$ are independently hydrogen, substituted or unsubstituted alkyl, or substituted or unsubstituted aryl.

Paragraph 17. The platinum (II) complex of any one of paragraphs 5-16 wherein $R_9$ and $R_{10}$ are independently hydrogen or substituted or unsubstituted alkyl.

Paragraph 18. The platinum (II) complex of any one of paragraphs 5-17, wherein $R_{11}$-$R_{14}$ and $R_{21}$-$R_{24}$ are independently hydrogen, substituted or unsubstituted alkyl, substituted or unsubstituted aryl, substituted or unsubstituted heteroaryl, substituted or unsubstituted polyheteroaryl, substituted or unsubstituted heterocyclyl, hydroxyl, alkoxy, or aroxy.

Paragraph 19. The platinum (II) complex of any one of paragraphs 5-18, wherein $R_{11}$, $R_{12}$, $R_{21}$, $R_{22}$ are hydrogen or $R_{11}$ and $R_{12}$ together forms a substituted or unsubstituted heteroaryl, substituted or unsubstituted polyheteroaryl, or substituted or unsubstituted heterocyclyl and/or $R_{21}$ and $R_{22}$ together forms a substituted or unsubstituted heteroaryl, substituted or unsubstituted polyheteroaryl, or substituted or unsubstituted heterocyclyl.

Paragraph 20. The platinum (II) complex of any one of paragraphs 5-19, wherein $R_{11}$, $R_{12}$, $R_{21}$, $R_{22}$ are hydrogen or $R_{11}$ and $R_{12}$ together forms and/or $R_{21}$ and $R_{22}$ together forms

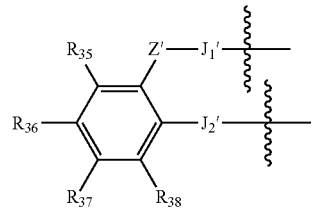

Formula V wherein:
(a) Z' is O, S, $CR_{39}$, or $NR_{40}$, $R_{39}$ and $R_{40}$ are independently absent, hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol;

(b) $J_1'$ and $J_2'$ are independently

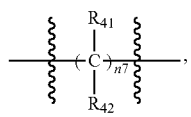

$R_{41}$ and $R_{42}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol, and optionally $J_1'$ and $J_2'$ together form a substituted or unsubstituted cycloalkyl, a substituted or unsubstituted cycloalkenyl, or a substituted or unsubstituted cycloalkynyl;

(c) n7 is an integer from 0 to 4; and (d) $R_{35}$-$R_{38}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol.

Paragraph 21. The platinum (II) complex of paragraph 20, wherein n7 and n8 are 0 and $Z'$ is O, S, or $NR_{40}$, each occurrence of $R_{40}$ is independently hydrogen, substituted or unsubstituted alkyl, substituted or unsubstituted aryl, substituted or unsubstituted heteroaryl, substituted or unsubstituted heterocyclyl, or hydroxyl.

Paragraph 22. The platinum (II) complex of paragraph 20 or 21, wherein $R_{35}$-$R_{38}$ are independently hydrogen, substituted or unsubstituted alkyl, substituted or unsubstituted aryl, substituted or unsubstituted heteroaryl, substituted or unsubstituted polyheteroaryl, or substituted or unsubstituted heterocyclyl, hydroxyl, alkoxy, or aroxy.

Paragraph 23. The platinum (II) complex of any one of paragraphs 1-22, wherein the ------ between $R_5$ and $R_8$, between $R_6$ and $R_7$, between $R_5$ and $R_7$, and/or between $R_6$ and $R_8$ is absent or wherein

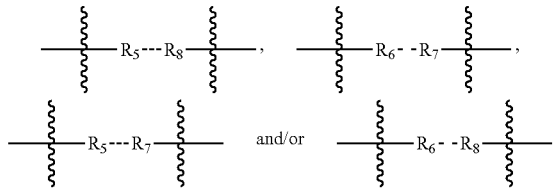

have a structure:
wherein:

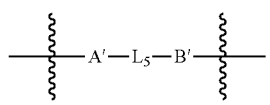

(a) A' and B' are independently substituted or unsubstituted cycloalkyl, substituted or unsubstituted cycloalkenyl, substituted or unsubstituted cycloalkynyl, substituted or unsubstituted aryl, substituted or unsubstituted polyaryl, substituted or unsubstituted heteroaryl, substituted or unsubstituted polyheteroaryl, or substituted or unsubstituted heterocyclyl; and (b) each occurrence of $L_5$ is independently ether, polyether, alkoxyl, sulfonyl, thioether, substituted or unsubstituted heterocyclyl, substituted or unsubstituted aryl, substituted or unsubstituted alkyl, substituted or unsubstituted alkenyl, or substituted or unsubstituted alkynyl.

Paragraph 24. The platinum (II) complex of paragraph 23, wherein A' and B' are independently substituted or unsubstituted aryl or substituted or unsubstituted polyaryl; and $L_5$ has a structure:

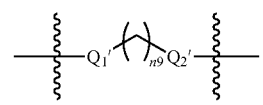

wherein:

(a) $Q_1'$ and $Q_2'$ are independently absent, O or S; and (b) n9 is an integer from 1 to 10.

Paragraph 25. The platinum (II) complex of paragraph 1 having a structure:

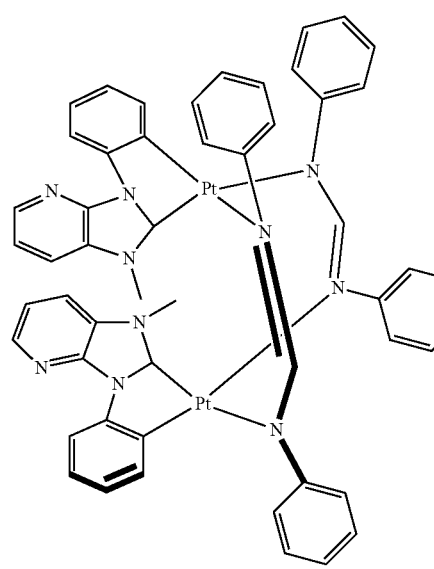

1a

1b
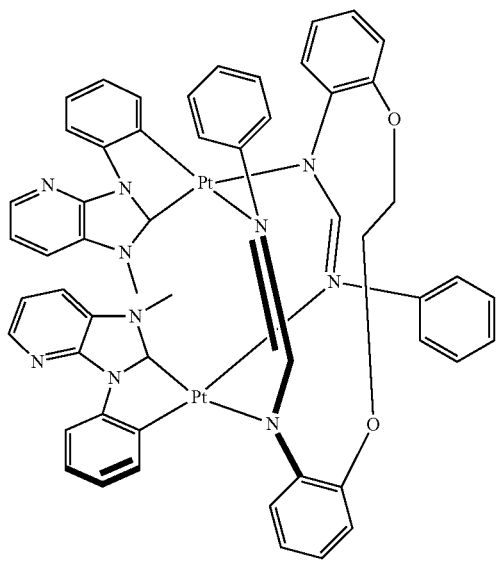
1c
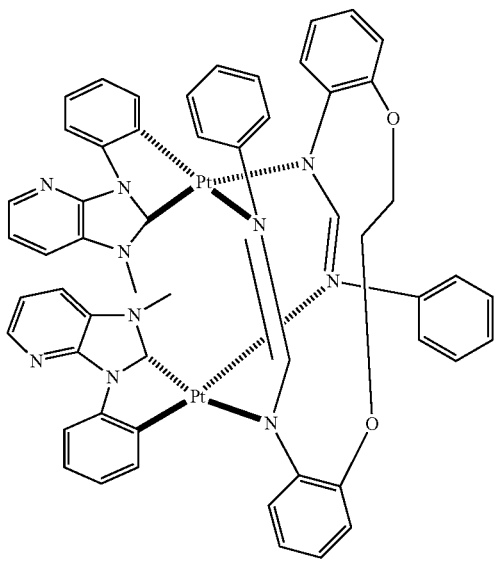
1b'
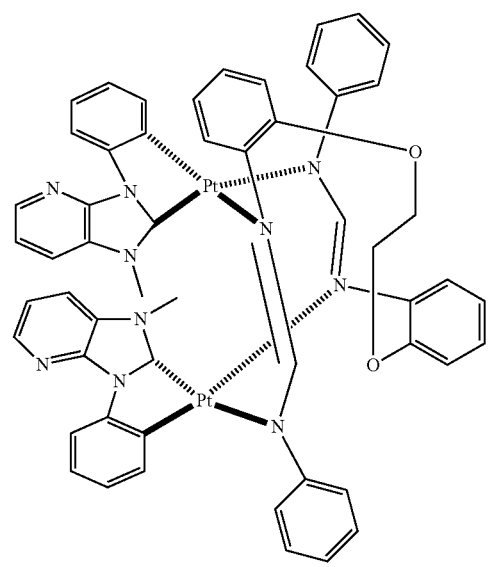
1c
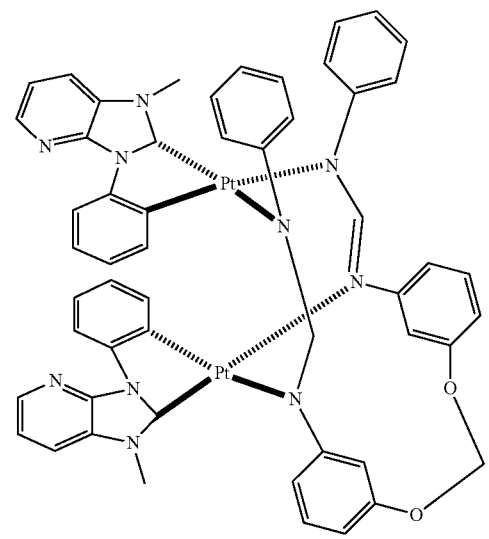

1d
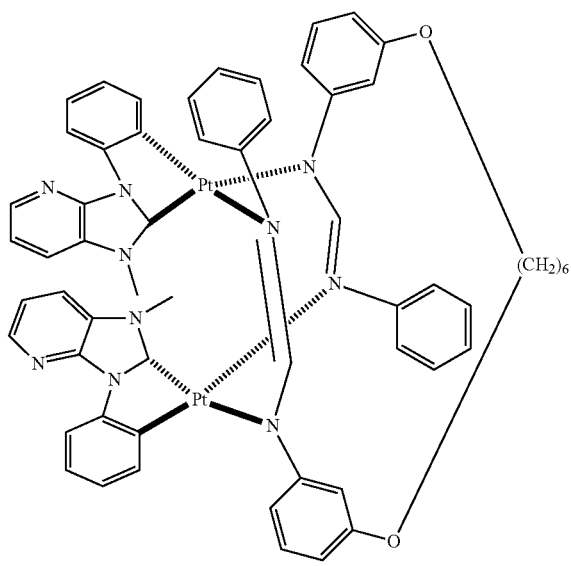
2a
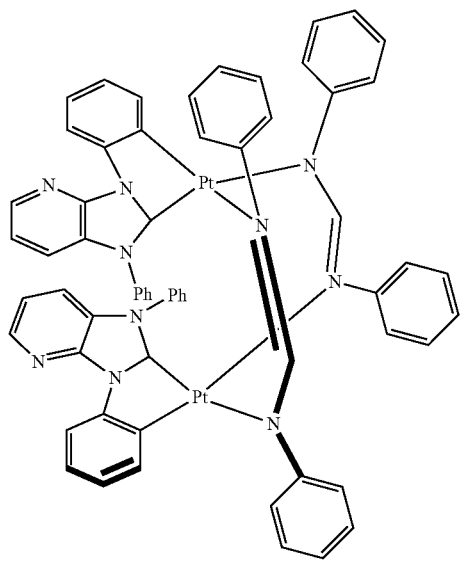
1d'
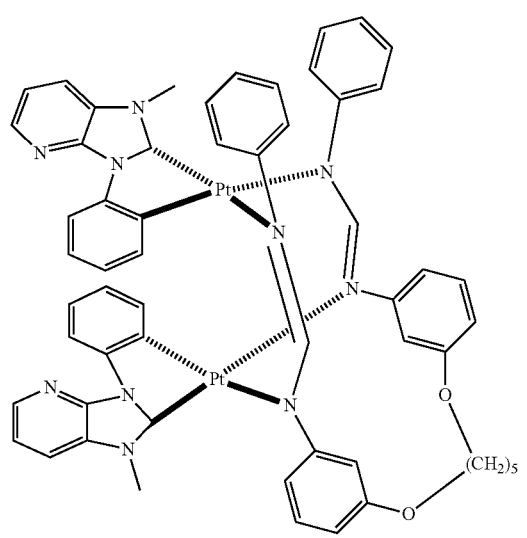
3a
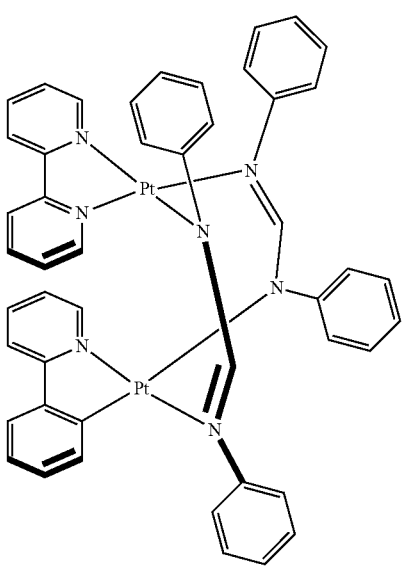

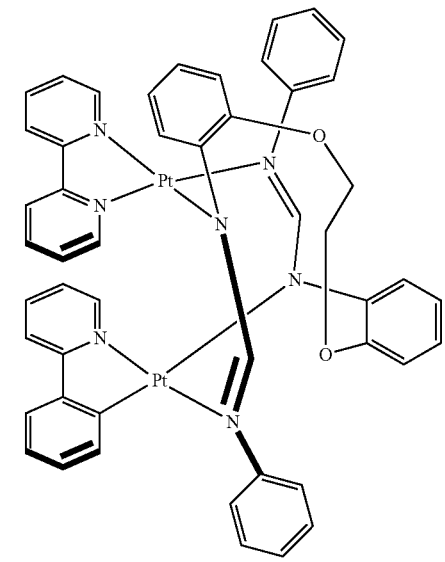
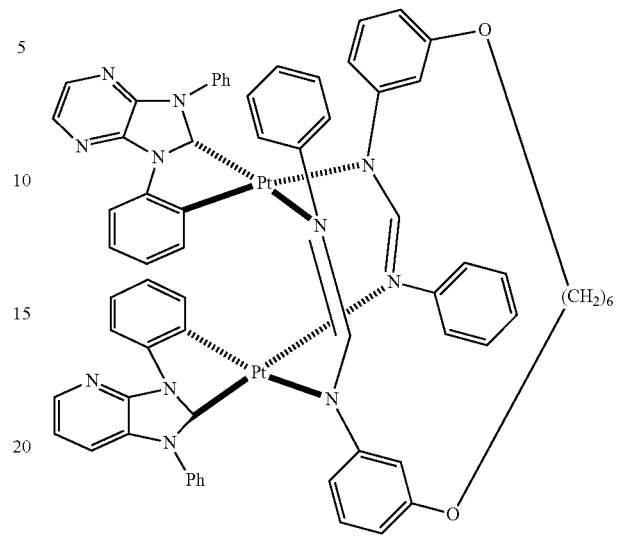
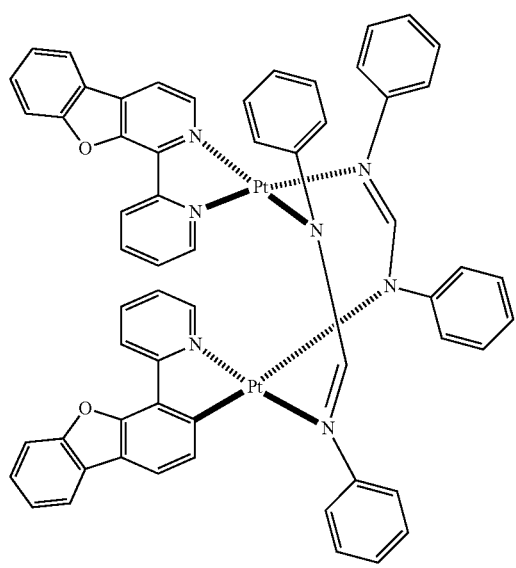
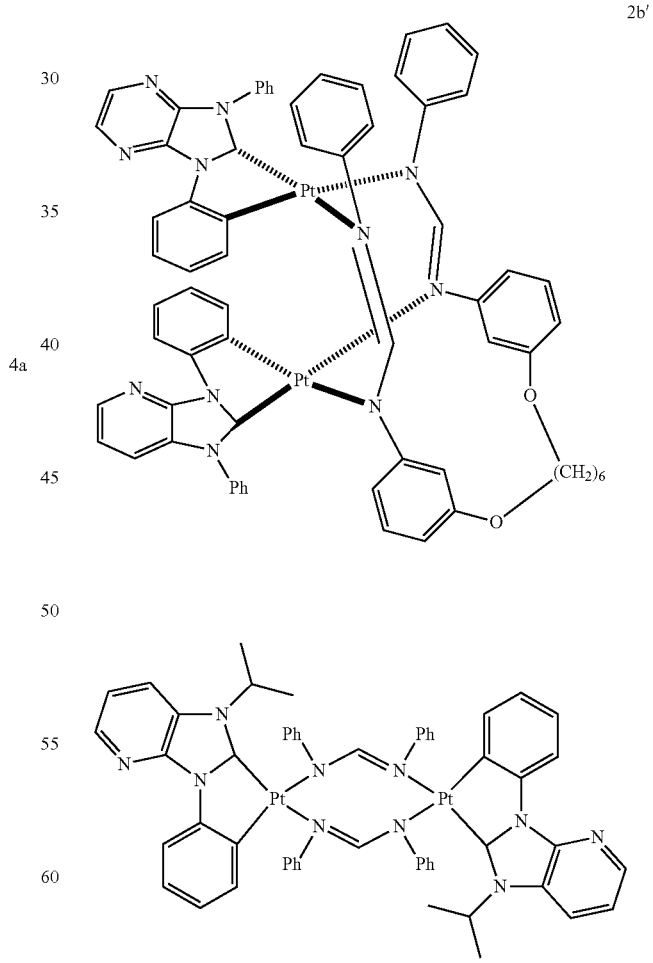

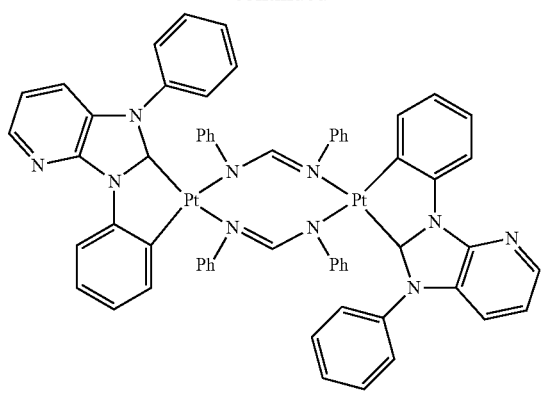
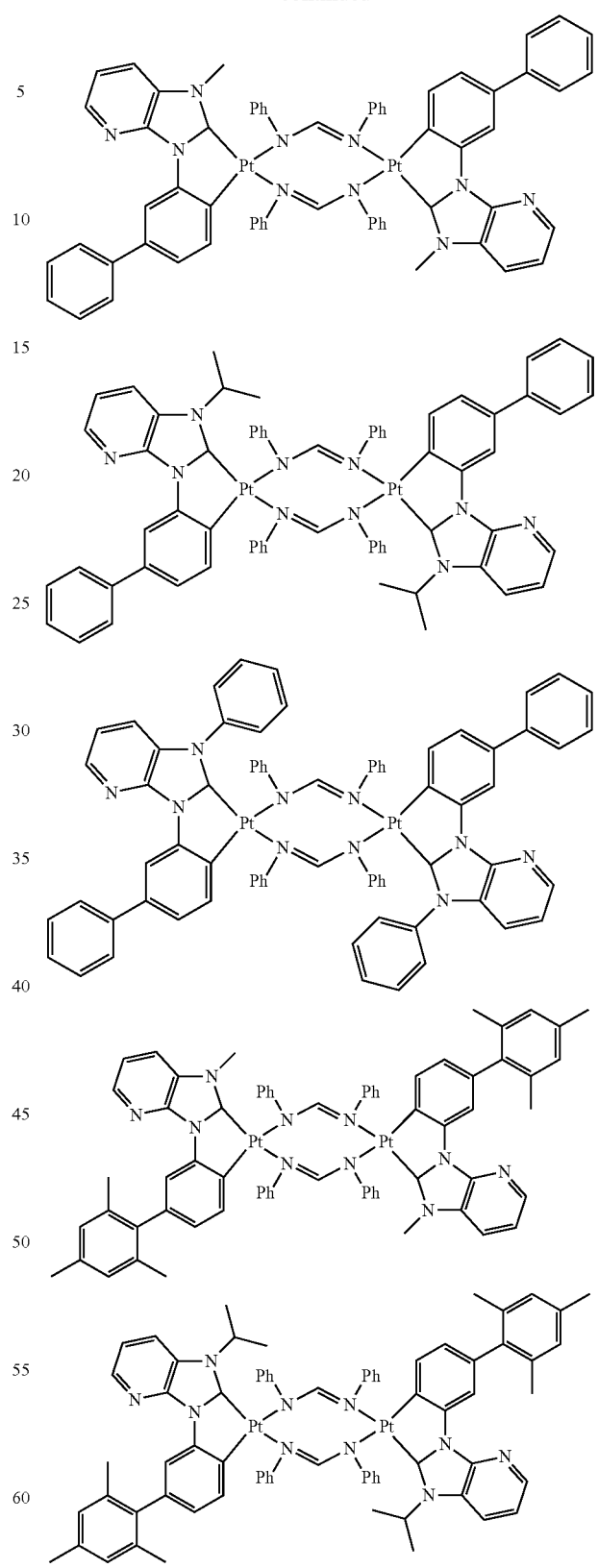

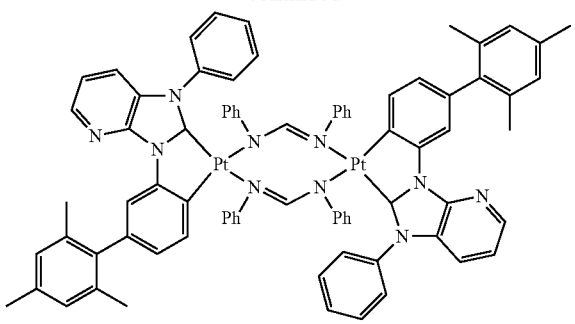
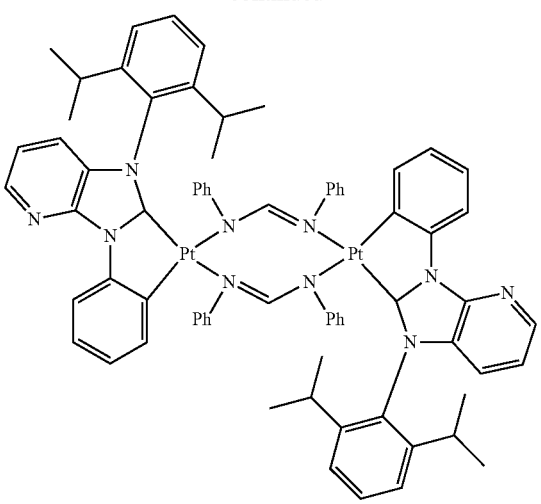
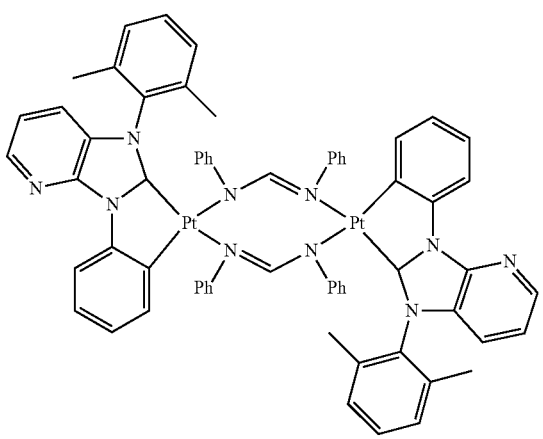
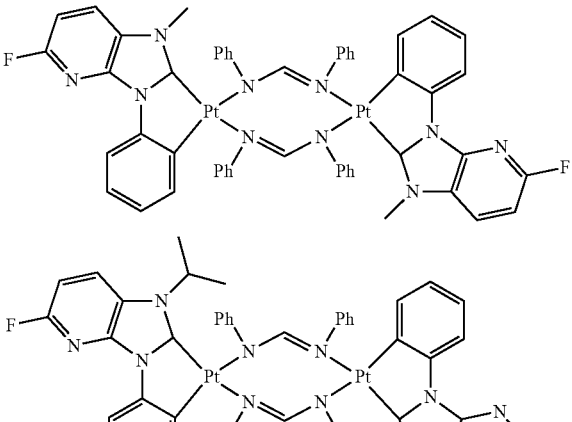
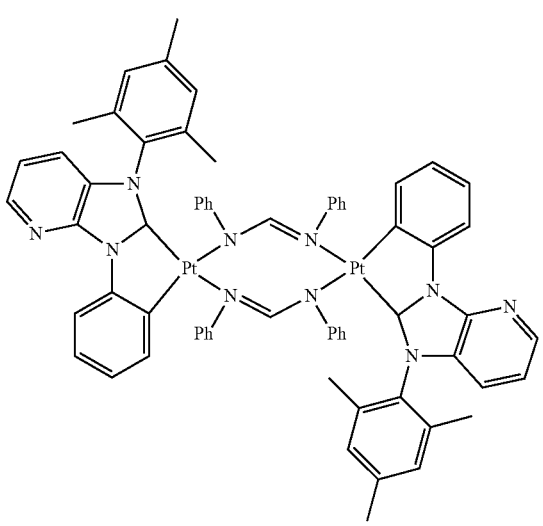
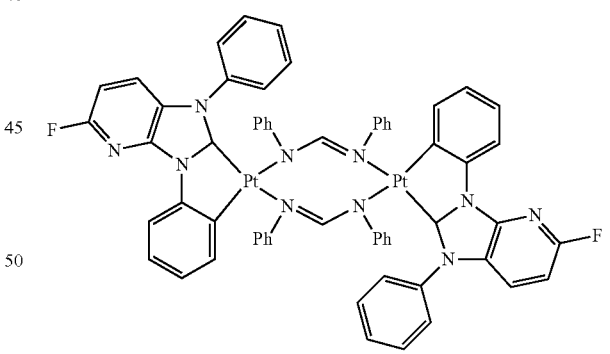
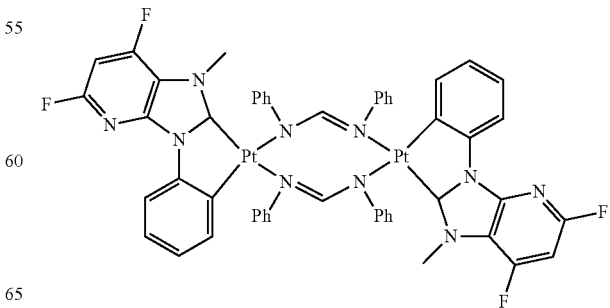

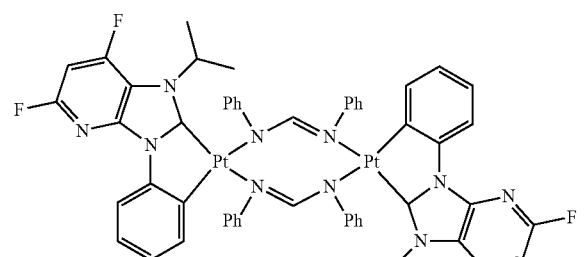
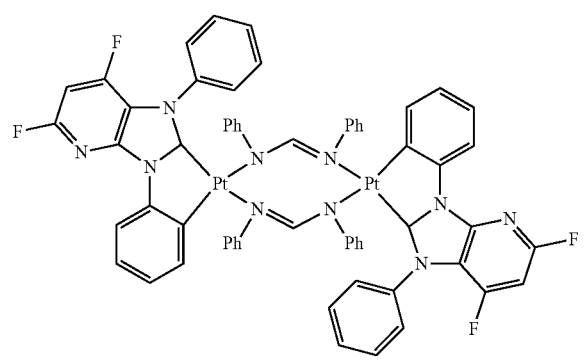
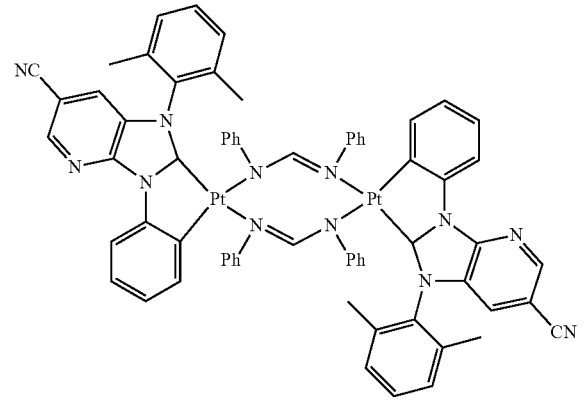
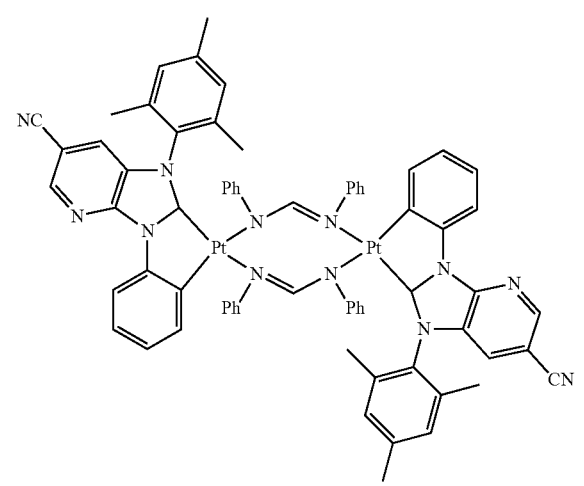
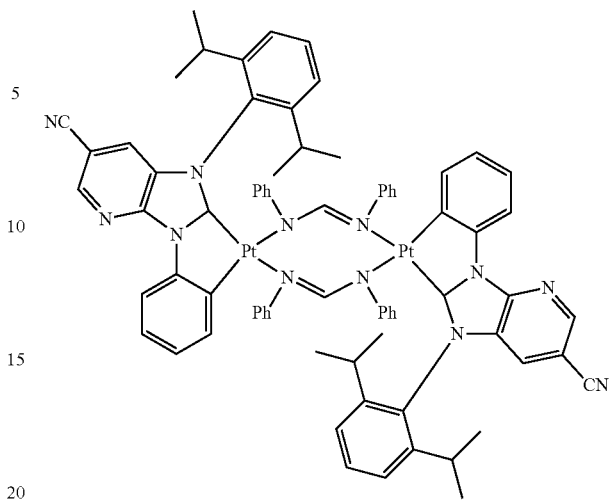
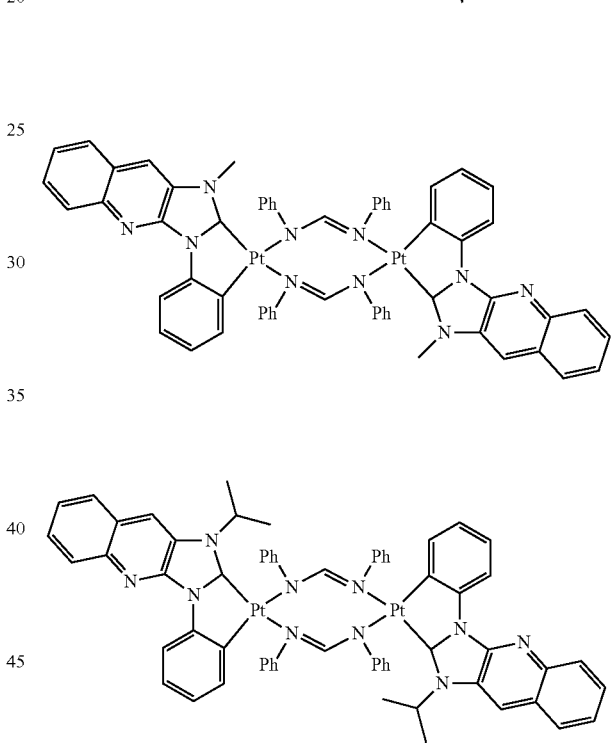
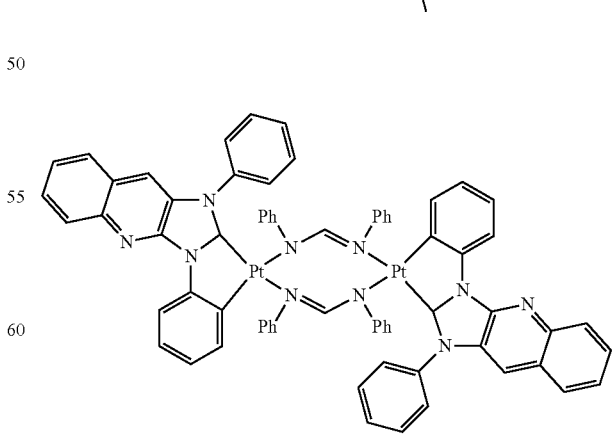

109
-continued
110
-continued
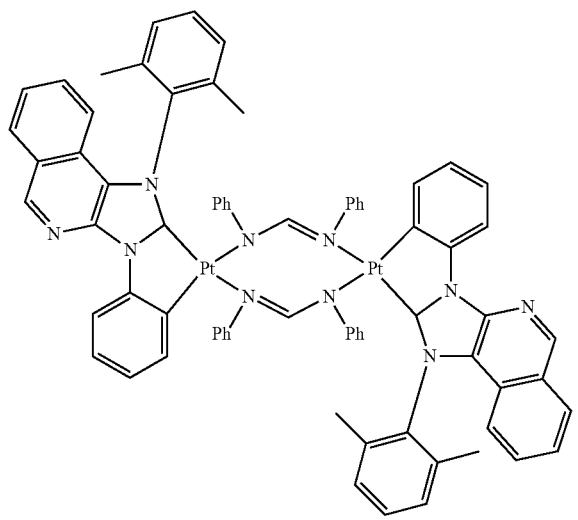
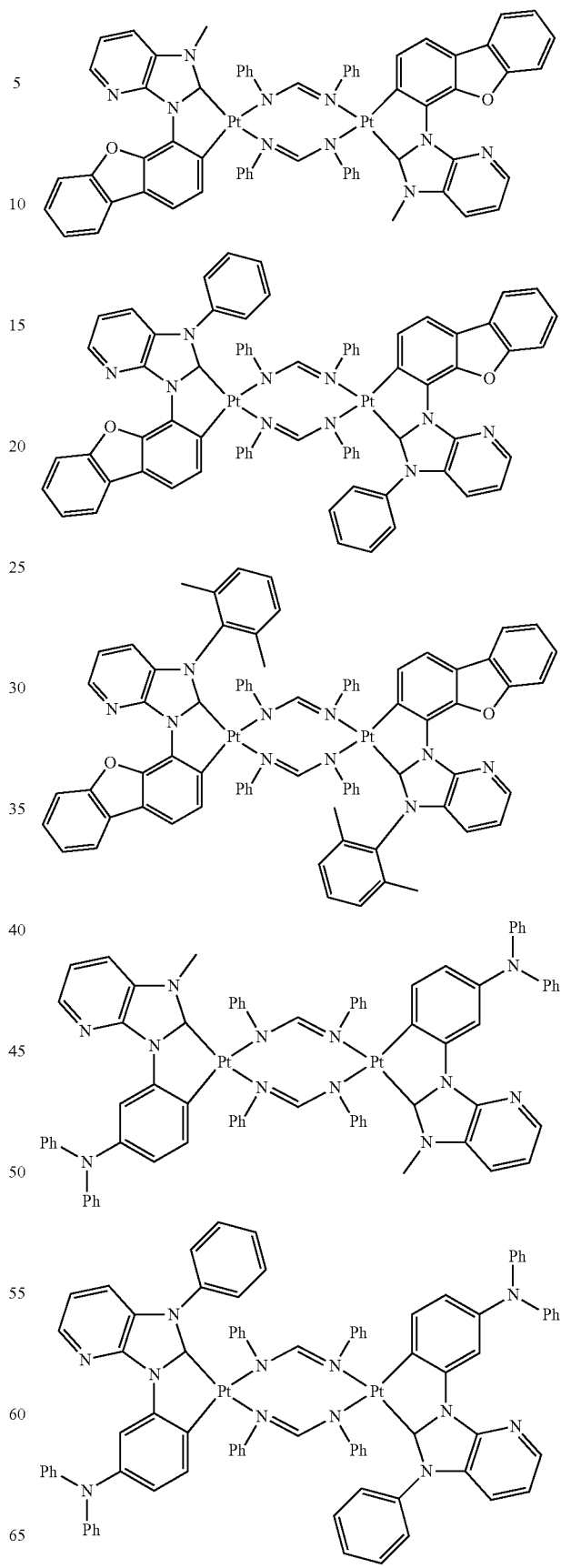

111
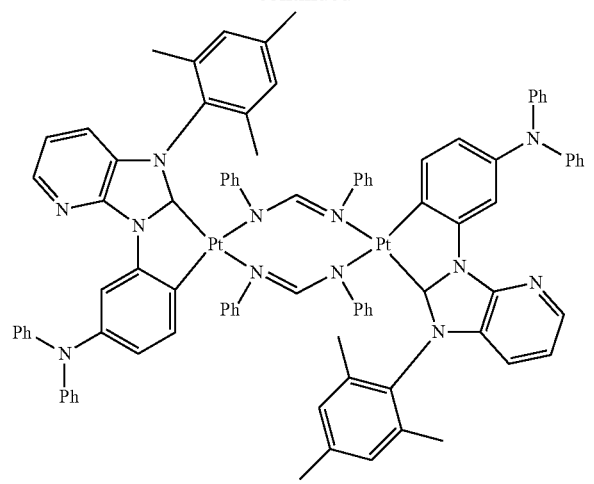
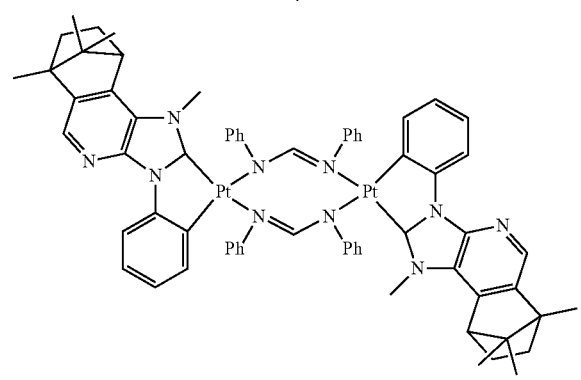
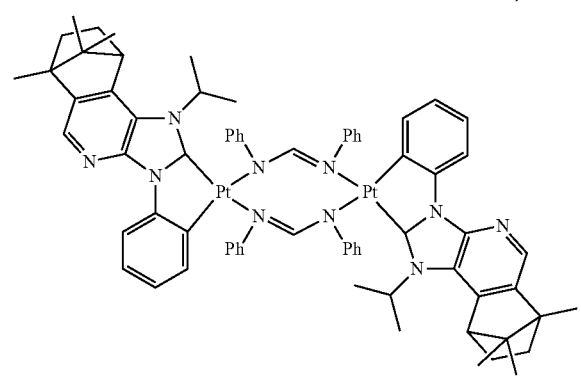
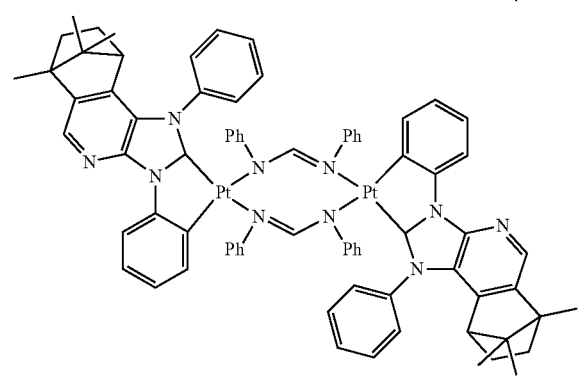
112
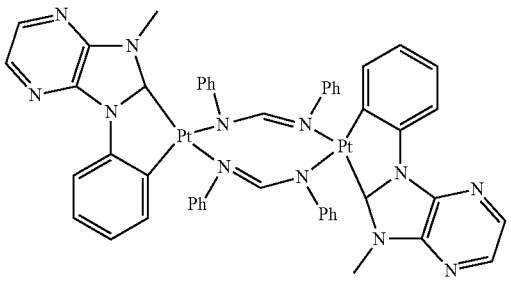
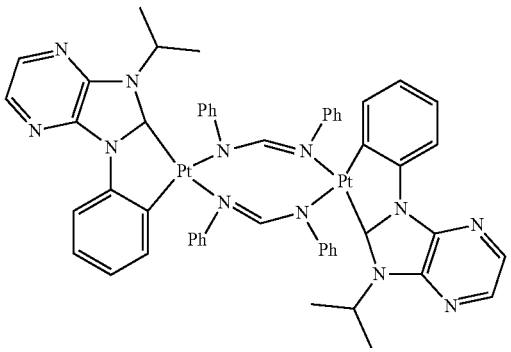
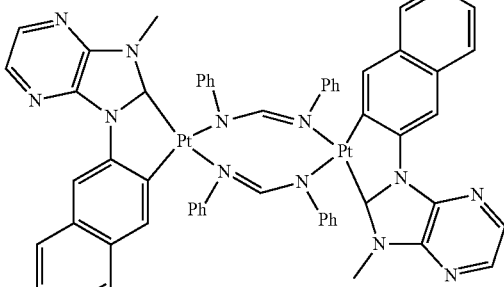
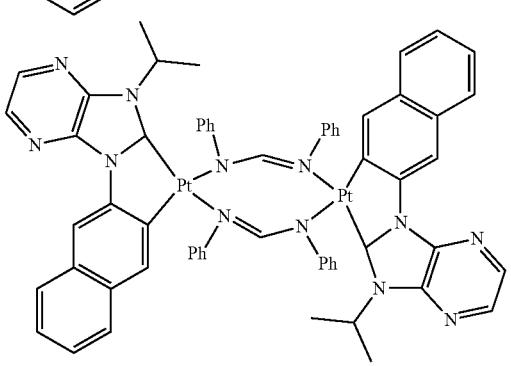
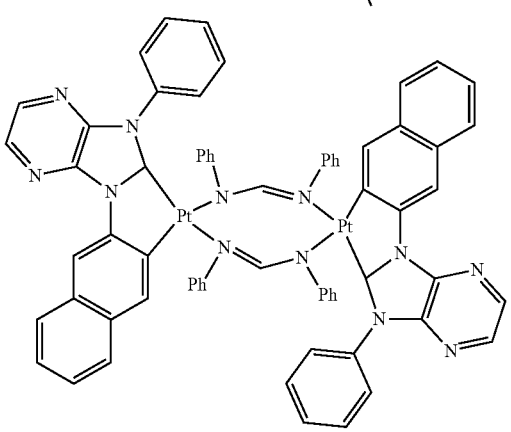

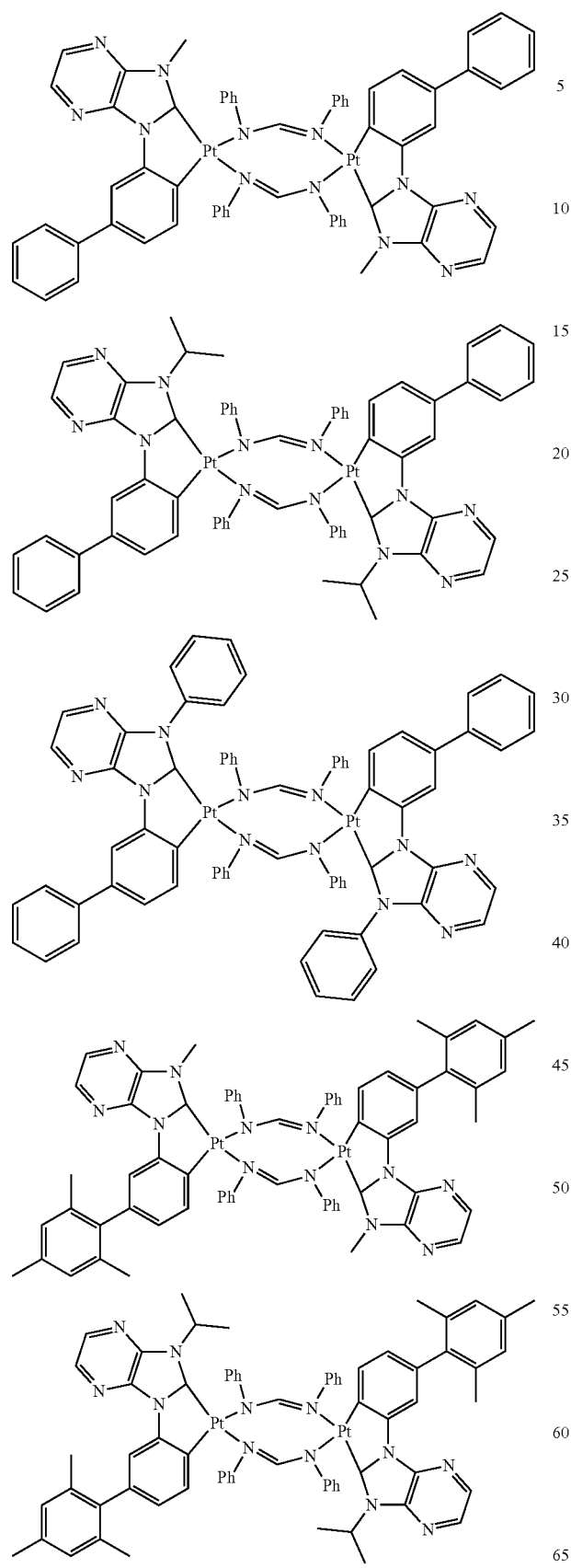
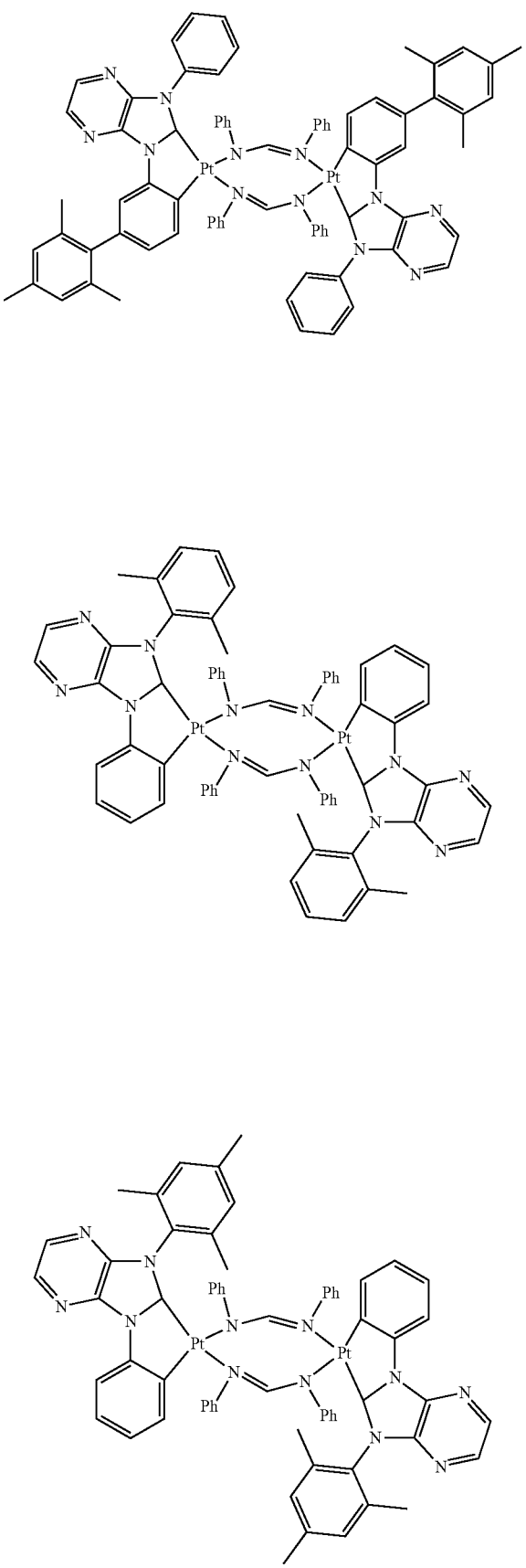

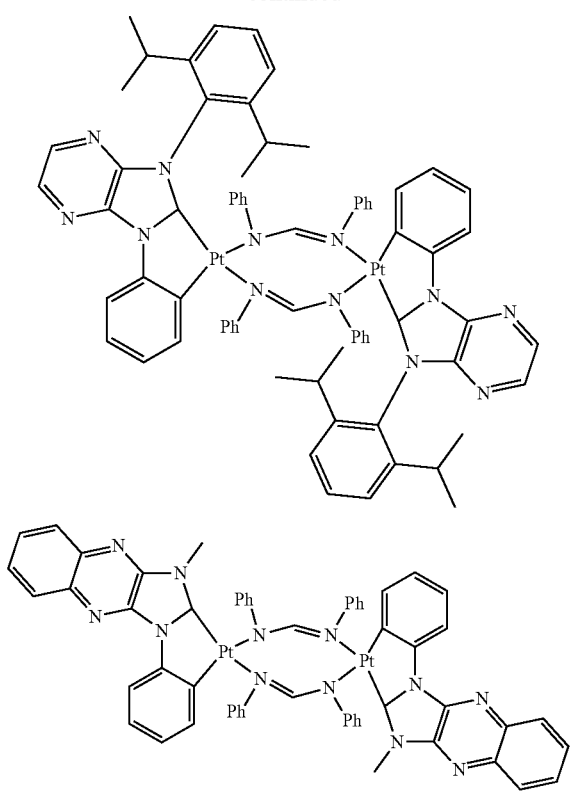
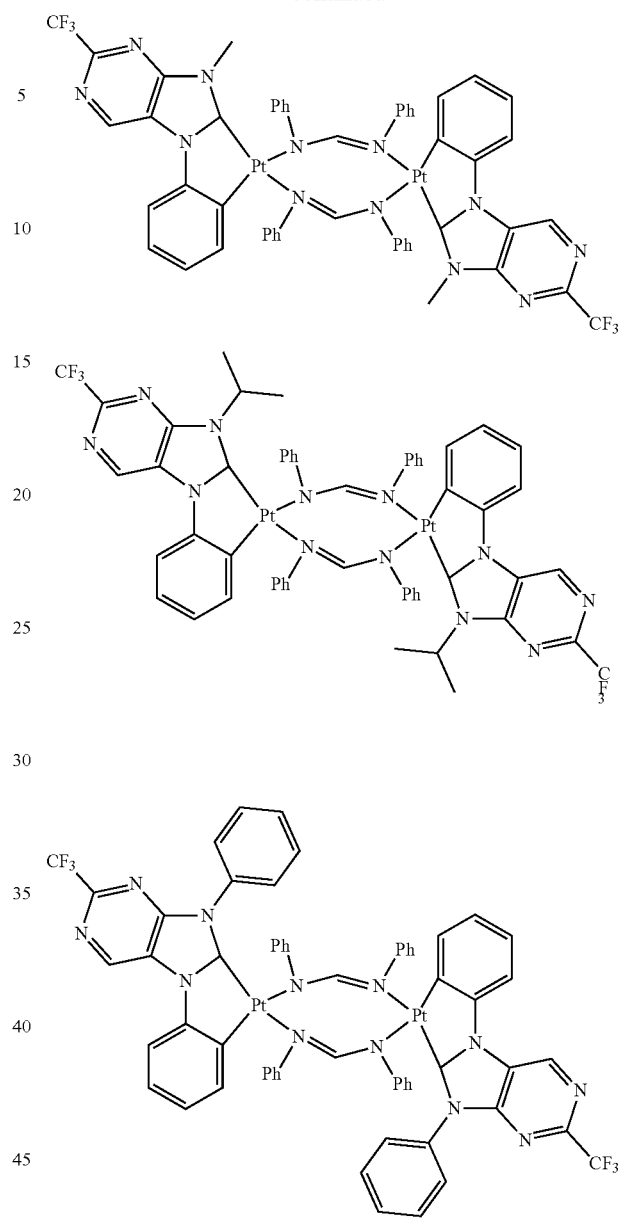
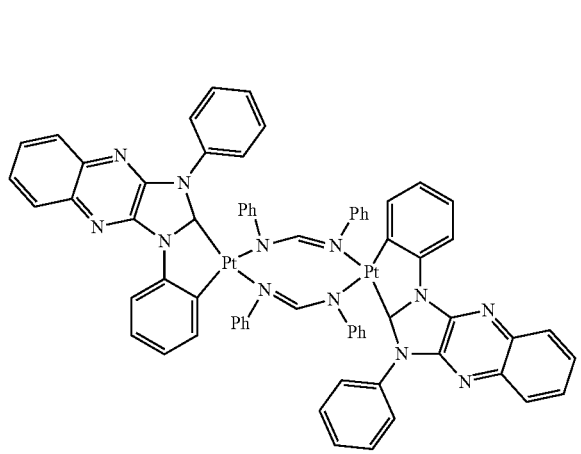
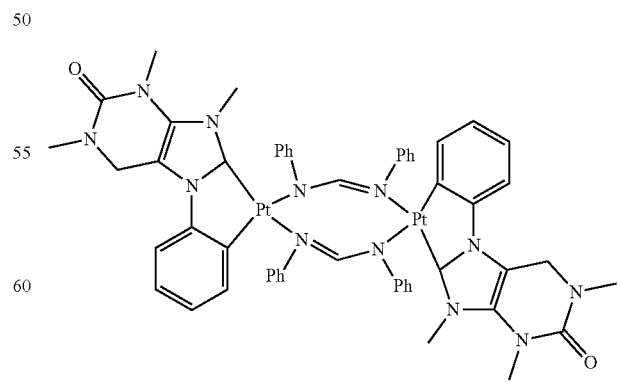

117
-continued
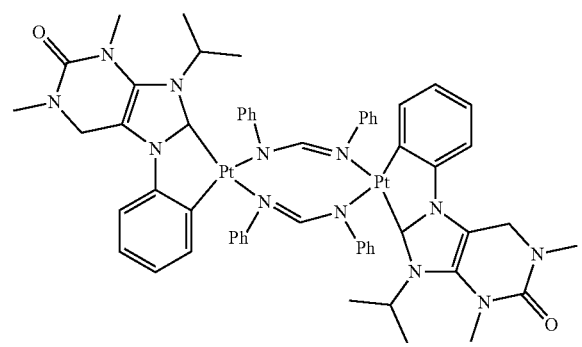
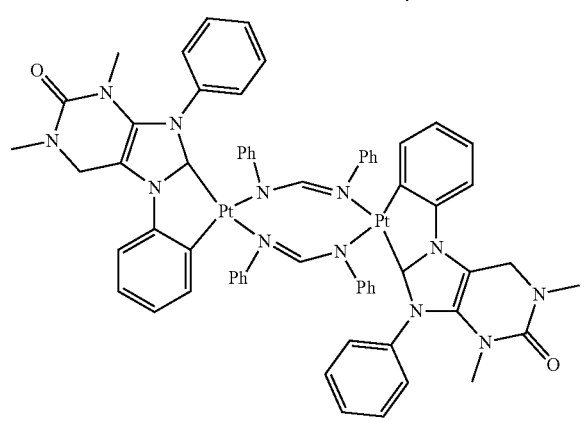
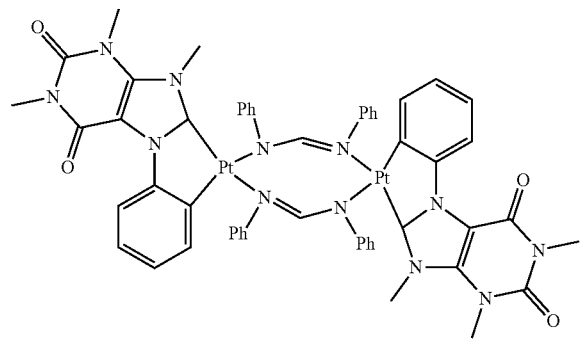
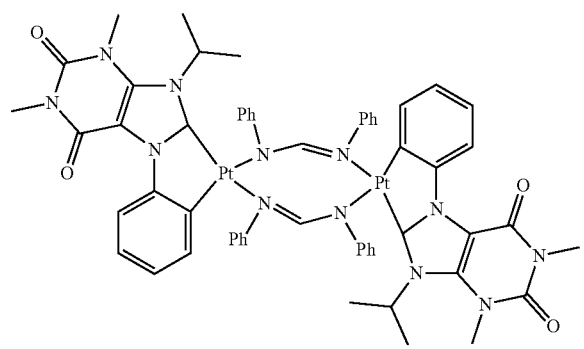
118
-continued
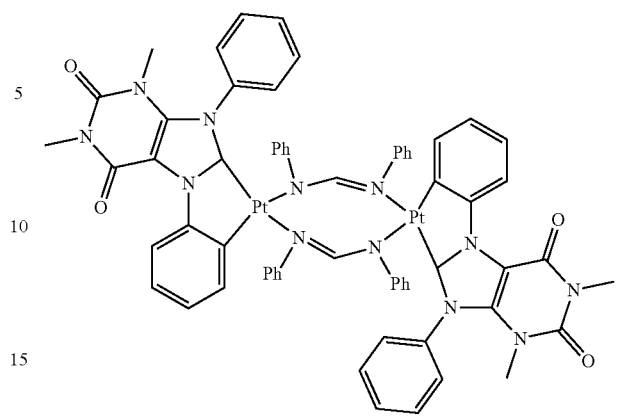
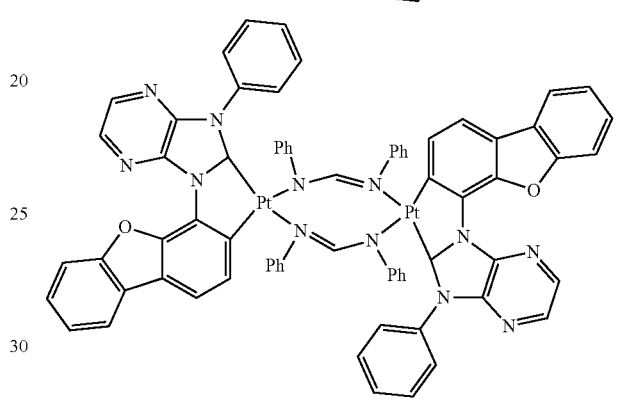
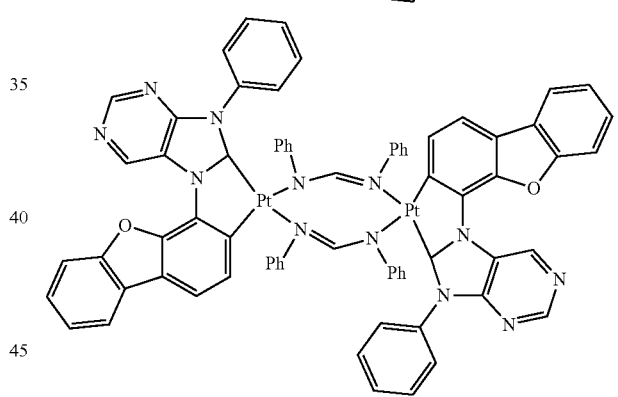
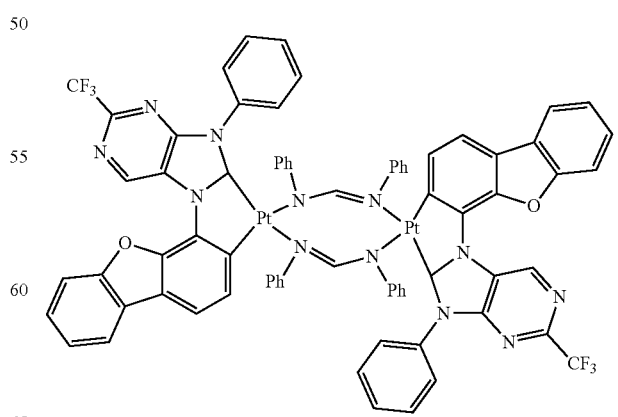

119
-continued
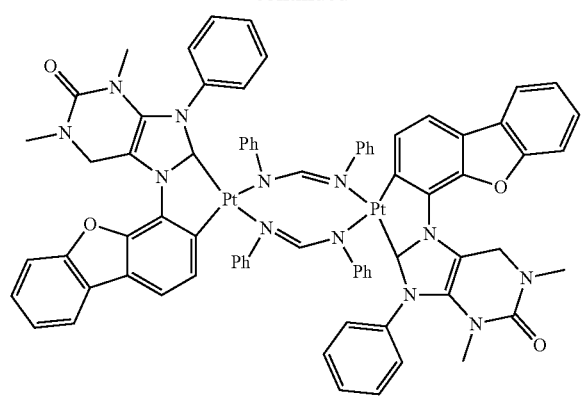
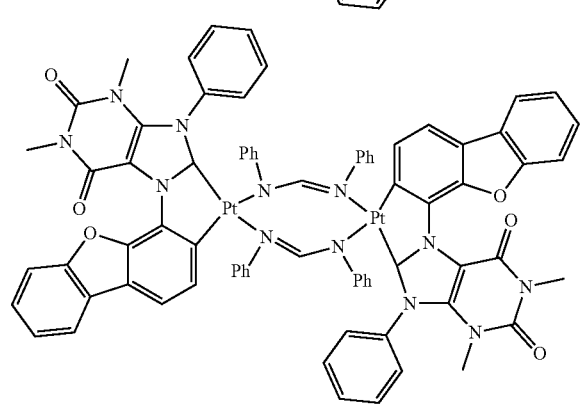
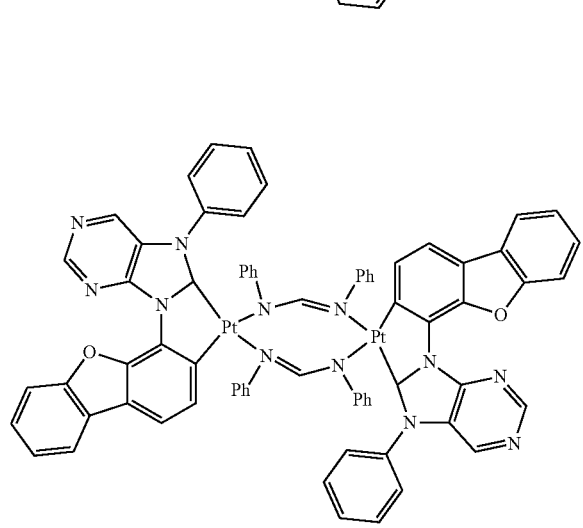
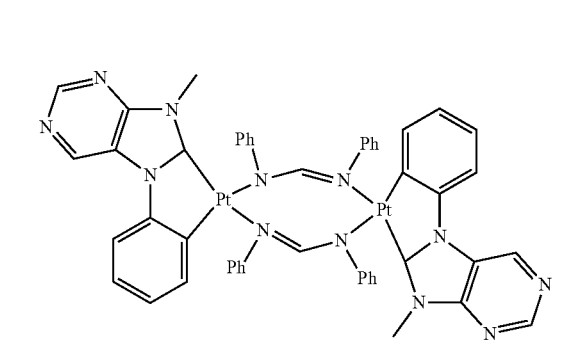
120
-continued
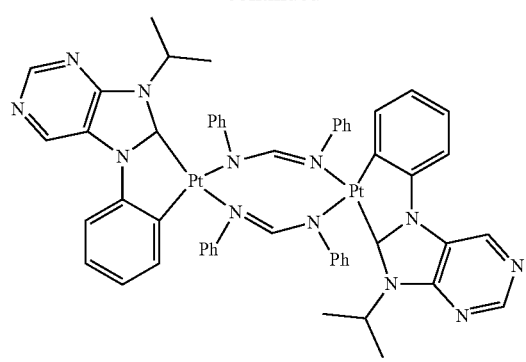
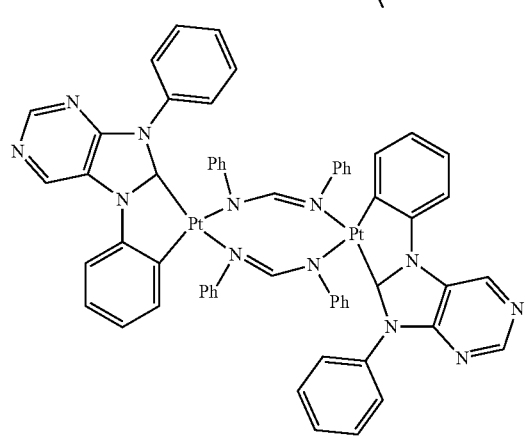
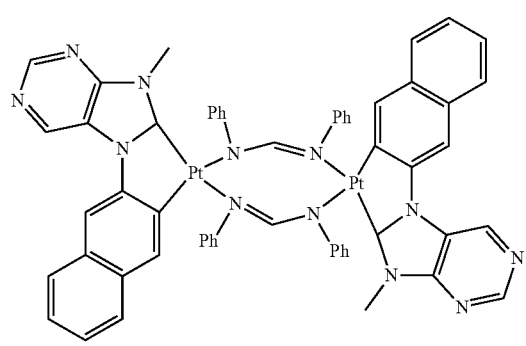
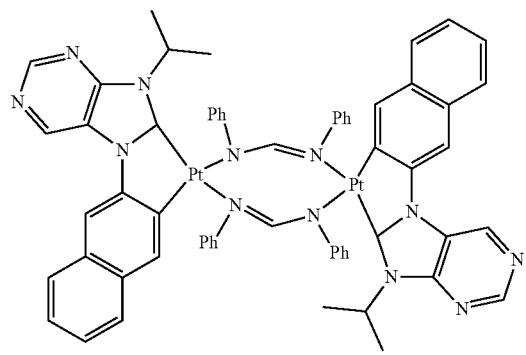

121
-continued
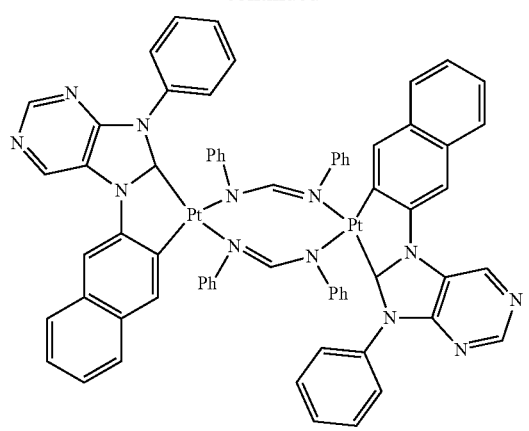
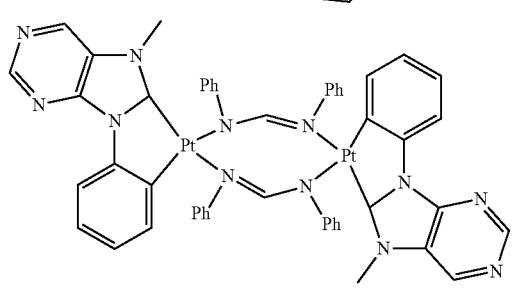
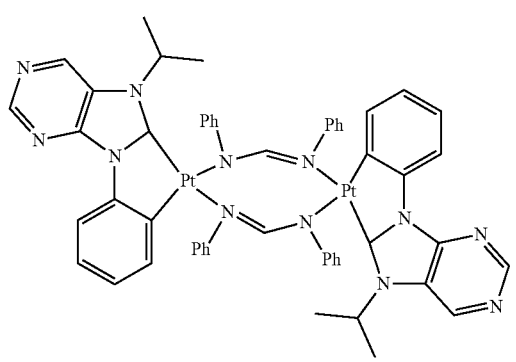
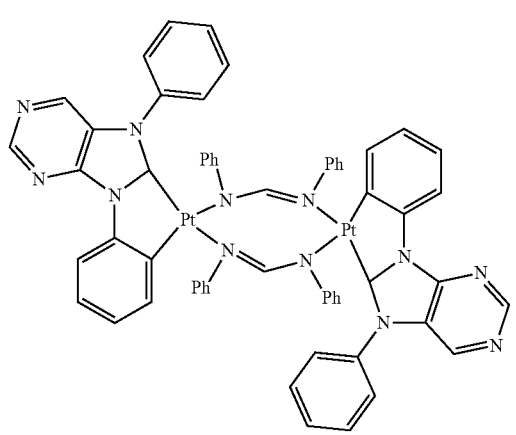
122
-continued
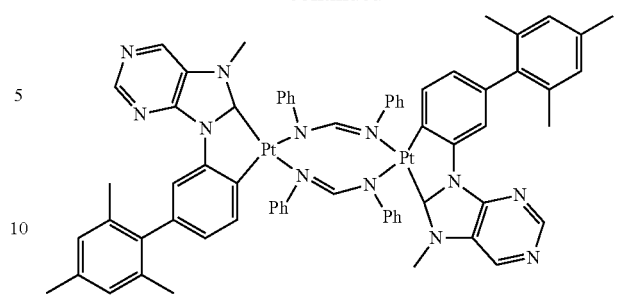
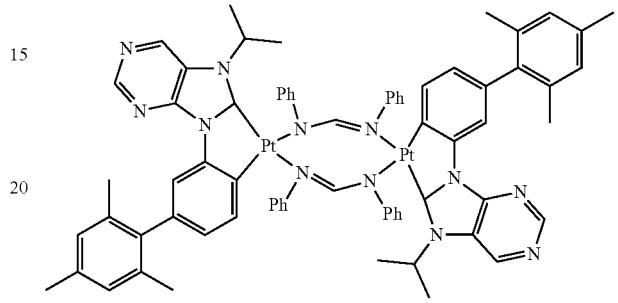
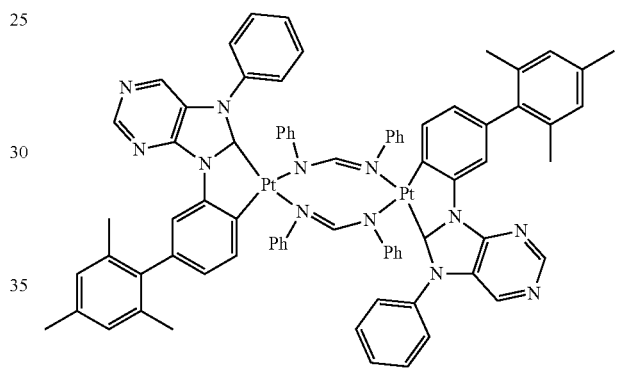
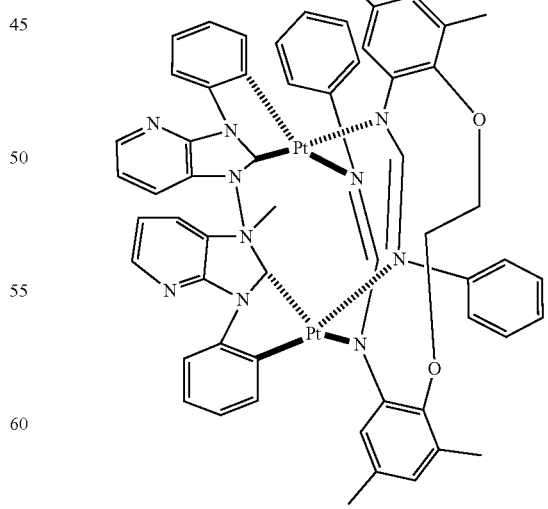

123
-continued
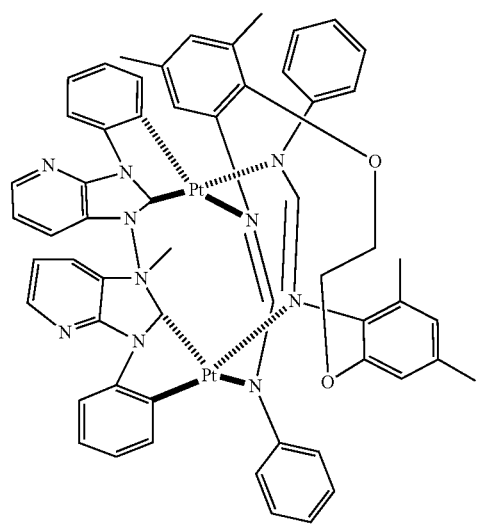
124
-continued
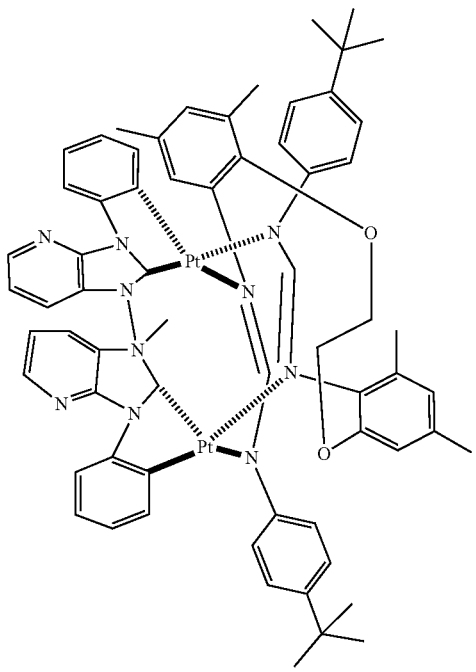
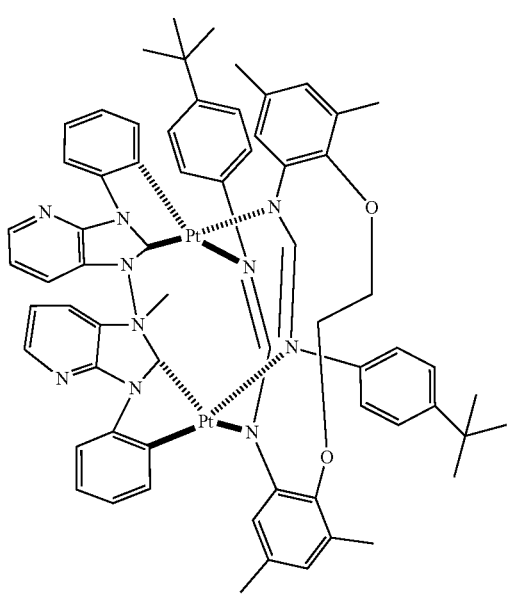
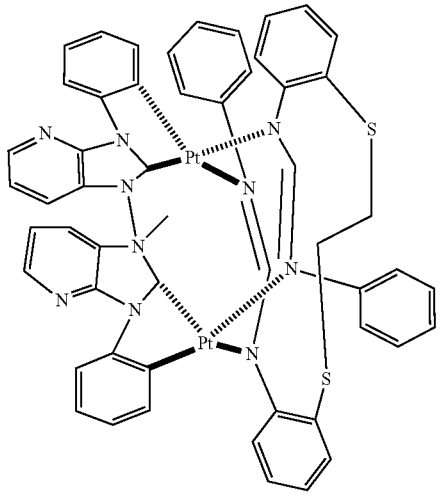
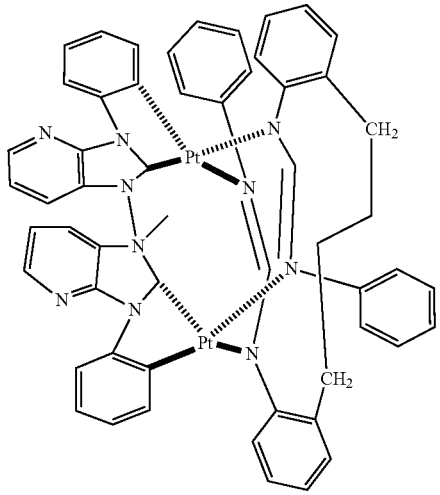

125
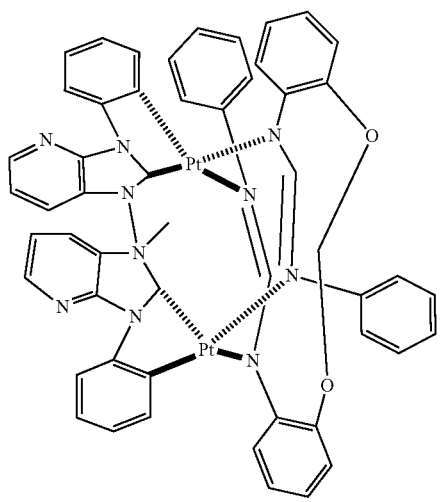
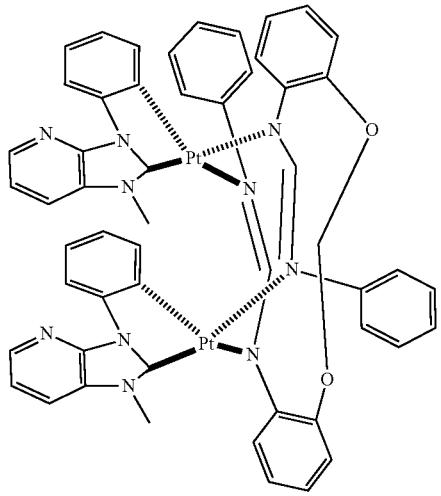
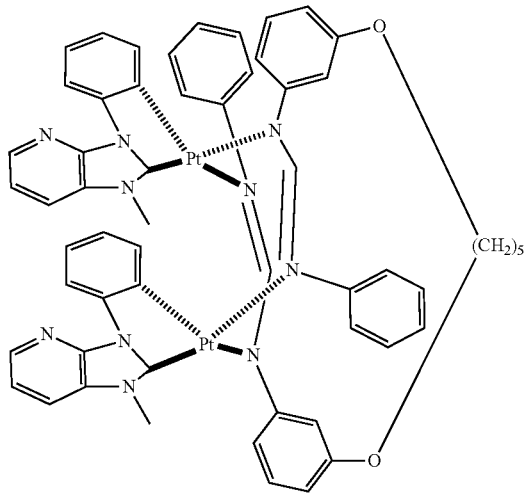
126
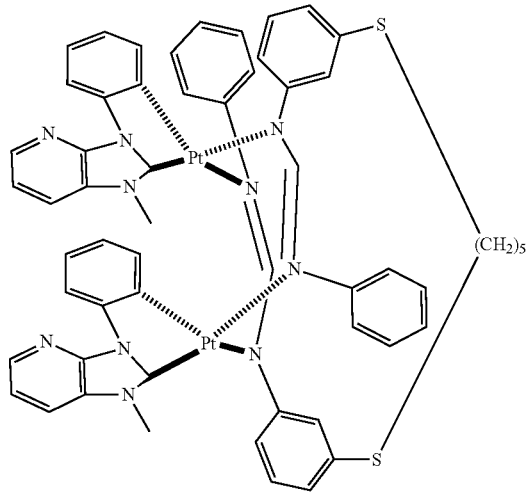
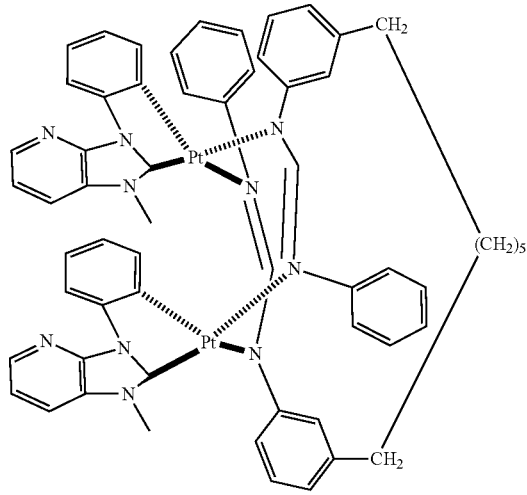
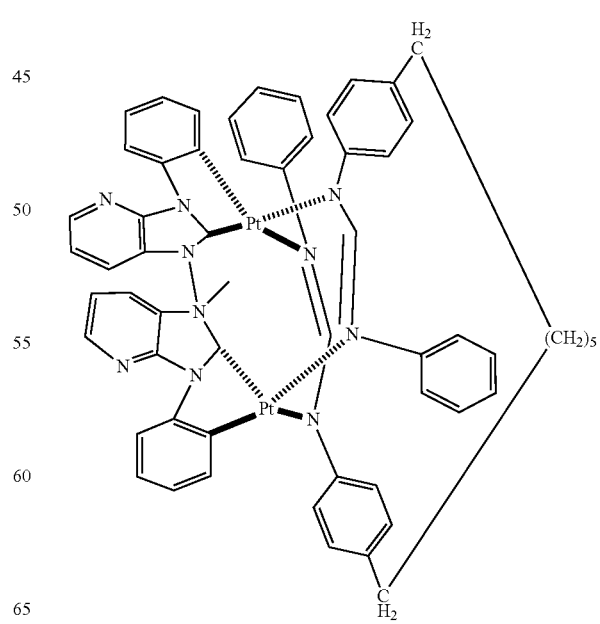

127
-continued
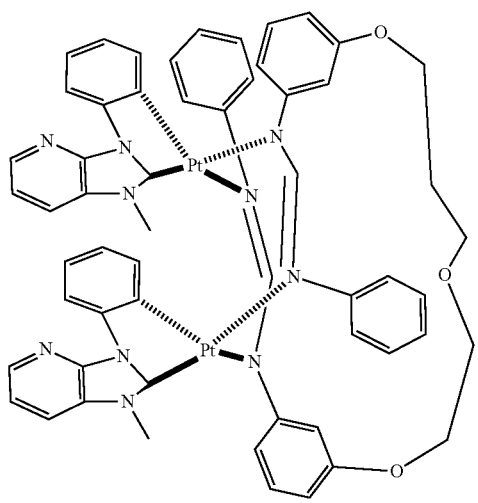
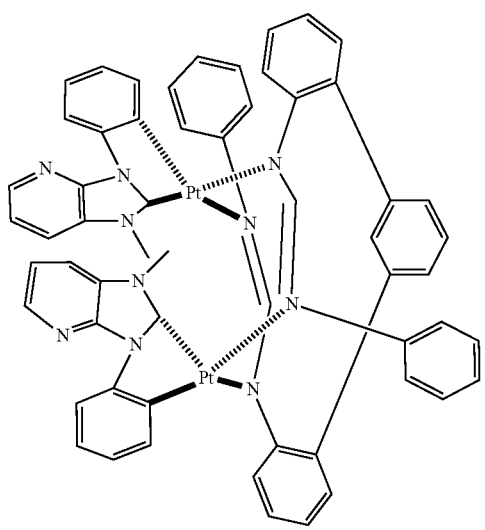
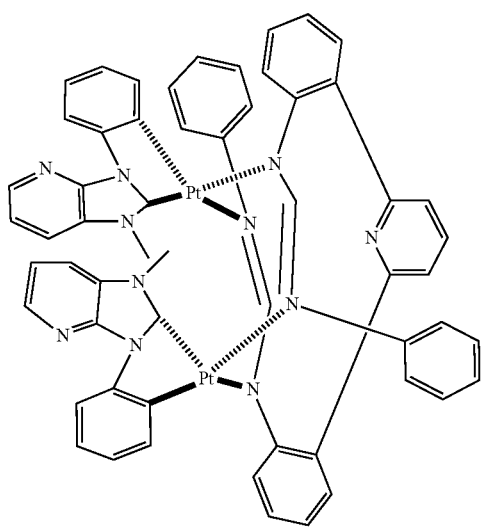
128
-continued
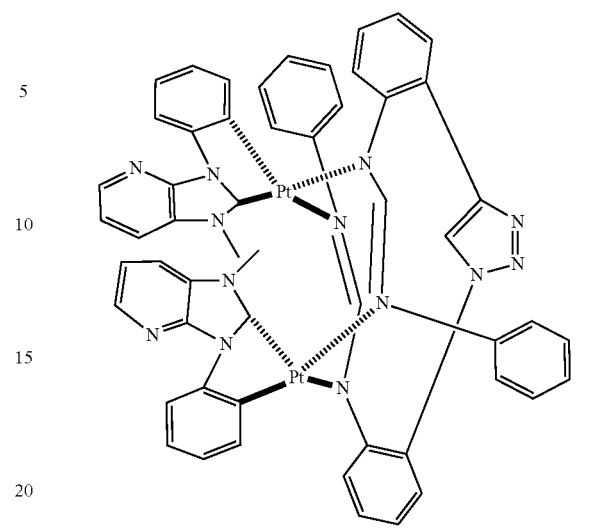
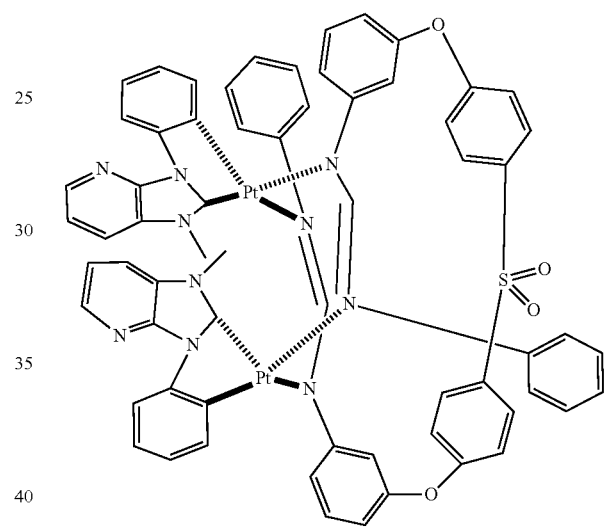
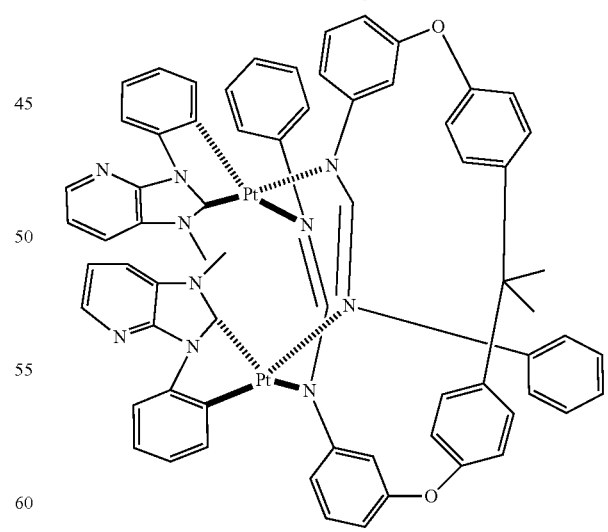

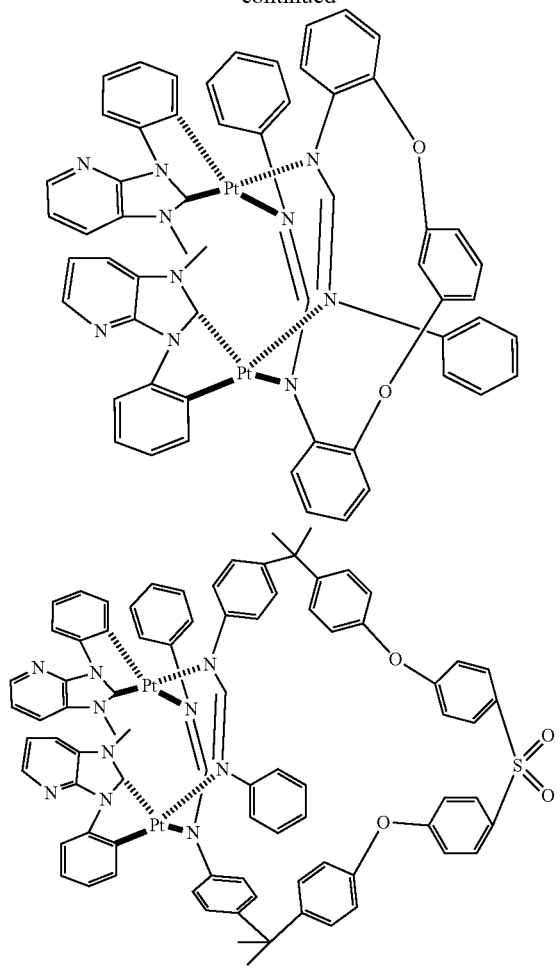

Paragraph 26. The platinum (II) complex of any one of paragraphs 1-25 having an emission lifetime ($\tau_{em}$) of up to 3.0 µs, up to 2.5 µs, up to 2.0 µs, in a range from 0.5 µs to 3.0 µs, from 0.8 µs to 3.0 µs, from 1.0 µs to 3.0 µs, from 0.5 µs to 2.5 µs, from 0.8 µs to 2.5 µs, from 1.0 µs to 2.5 µs, from 0.5 µs to 2.0 µs, from 0.8 µs to 2.0 µs, or from 1.0 µs to 2.0 µs, in solution or in films.

Paragraph 27. The platinum (II) complex of any one of paragraphs 1-26 having a radiative decay rate ($k_r$) of at least $1.0 \times 10^5$ s$^{-1}$, at least $1.4 \times 10^5$ s$^{-1}$, in a range from $1.0 \times 10^5$ s$^{-1}$ to $25.0 \times 10^5$ s$^{-1}$, from $1.0 \times 10^5$ s$^{-1}$ to $20.0 \times 10^5$ s$^{-1}$, from $1.0 \times 10^5$ s$^{-1}$ to $15.0 \times 10^5$ s$^{-1}$, from $1.0 \times 10^5$ s$^{-1}$ to $12.0 \times 10^5$ s$^{-1}$, from $1.0 \times 10^5$ s$^{-1}$ to $10.0 \times 10^5$ s$^{-1}$, from $1.0 \times 10^5$ s$^{-1}$ to $8.0 \times 10^5$ s$^{-1}$, from $1.0 \times 10^5$ s$^{-1}$ to $6.0 \times 10^5$ s$^{-1}$, from $1.4 \times 10^5$ s$^{-1}$ to $25.0 \times 10^5$ s$^{-1}$, from $1.4 \times 10^5$ s$^{-1}$ to $20.0 \times 10^5$ s$^{-1}$, from $1.4 \times 10^5$ s$^{-1}$ to $15.0 \times 10^5$ s$^{-1}$, from $1.4 \times 10^5$ s$^{-1}$ to $12.0 \times 10^5$ s$^{-1}$, from $1.4 \times 10^5$ s$^{-1}$ to $10.0 \times 10^5$ s$^{-1}$, from $1.4 \times 10^5$ s$^{-1}$ to $8.0 \times 10^5$ s$^{-1}$, or from $1.4 \times 10^5$ s$^{-1}$ to $6.0 \times 10^5$ s$^{-1}$, in solution or in films.

Paragraph 28. The platinum (II) complex of any one of paragraphs 1-27 having an emission quantum yield ("QY") of at least 50%, at least 55%, at least 60%, at least 65%, at least 70%, in a range from 50% to 90%, from 55% to 90%, from 60% to 90%, from 50% to 80%, from 55% to 80%, or from 60% to 80%, in solution or in films, at room temperature.

Paragraph 29. The platinum (II) complex of any one of paragraphs 1-28 having a maximum emission wavelength ("$\lambda_{max}$") in a range from 600 nm to 760 nm, from 604 nm to 733 nm, from 600 nm to 700 nm, or from 700 nm to 1000 nm.

Paragraph 30. The platinum (II) complex of any one of paragraphs 1-29 having a full width at half maximum ("FWHM") of up to 270 nm, up to 250 nm, up to 200 nm, up to 180 nm, up to 160 nm, up to 145 nm, up to 135 nm, up to 120 nm, up to 110 nm, up to 100 nm, up to 90 nm, up to 80 nm, in a range from 50 nm to 270 nm, from 50 nm to 250 nm, from 50 nm to 200 nm, from 50 nm to 180 nm, from 50 nm to 160 nm, from 50 nm to 145 nm, from 50 nm to 110 nm, from 60 nm to 145 nm, from 60 nm to 110 nm, from 70 nm to 145 nm, or from 70 nm to 110 nm.

Paragraph 31. An organic light-emitting component comprising a light-emitting layer or two or more light-emitting layers, wherein the light-emitting layer or each light-emitting layer of the two or more light-emitting layers comprises one or more platinum (II) complexes of any one of paragraphs 1 to 30.

Paragraph 32. The organic light-emitting component of paragraph 31, wherein the light emitting layer or each light-emitting layer of the two or more light-emitting layers further comprises one or more host materials, and wherein the total concentration of the one or more host materials is greater than the total concentration of the one or more complexes in the light-emitting layer or each light-emitting layer of the two or more light-emitting layers.

Paragraph 33. The organic light-emitting component of paragraph 32, wherein the total concentration of the one or more platinum (II) complexes in the light-emitting layer or each light-emitting layer of the two or more light-emitting layers is up to 50 wt %, up to 40 wt %, up to 30 wt %, up to 20 wt %, at least 1 wt %, in a range from about 1 wt % to about 50 wt %, from about 1 wt % to about 40 wt %, from about 1 wt % to about 30 wt %, from about 1 wt % to about 20 wt %, from about 2 wt % to about 50 wt %, from about 2 wt % to about 40 wt %, from about 2 wt % to about 30 wt %, from about 2 wt % to about 20 wt %, from about 4 wt % to about 50 wt %, from about 4 wt % to about 40 wt %, from about 4 wt % to about 30 wt %, from about 4 wt % to about 20 wt %, from about 1 wt % to about 16 wt %, from about 2 wt % to about 16 wt %, from about 4 wt % to about 16 wt %, such as about 4 wt %, about 6 wt %, about 8 wt %, about 10 wt %, about 12 wt %, or about 16 wt %.

Paragraph 34. The organic light-emitting component of any one of paragraphs 31-33 further comprising an anode, a cathode, a hole transport region, and an electron transport region,
  wherein the hole transport region comprises a hole injection layer and/or a hole transport layer, and optionally an electron blocking layer,
  wherein the electron transport region comprises an electron transport layer and/or an electron injection layer, and optionally a hole blocking layer,
  wherein the light emitting layer is located in between the anode and the cathode,
  wherein the hole transport region is located in between the anode and the light-emitting layer, and
  wherein the electron transport region is located in between the cathode and the light emitting layer.

Paragraph 35. The organic light-emitting component of any one of paragraphs 31-34 having a current efficiency ("CE") at 1000 cd/m² of at least 18 cd/A, at least 20 cd/A, at least 25 cd/A, at least 30 cd/A, in a range from 18 cd/A to 60 cd/A, from 20 cd/A to 60 cd/A, from 25 cd/A to 60 cd/A, from 30 cd/A to 60 cd/A, from 18 cd/A to 50 cd/A, from 20 cd/A to 50 cd/A, from 25 cd/A to 50 cd/A, from 30 cd/A to 50 cd/A, from 18 cd/A to 40 cd/A, from 20 cd/A to 40 cd/A, from 25 cd/A to 40 cd/A, or from 30 cd/A to 40 cd/A.

Paragraph 36. The organic light-emitting component of any one of paragraphs 31-35 having a power efficiency ("PE") at 1000 cd/m² of at least 6 lm/W, at least 10 lm/W, at least 15 lm/W, at least 20 lm/W, at least 25 lm/W, in a range from 6 lm/W to 60 lm/W, from 10 lm/W to 60 lm/W, from 15 lm/W to 60 lm/W, from 20 lm/W to 60 lm/W, from 6 lm/W to 50 lm/W, from 10 lm/W to 50 lm/W, from 15 lm/W to 50 lm/W, from 20 lm/W to 50 lm/W, from 6 lm/W to 40 lm/W, from 10 lm/W to 40 lm/W, from 15 lm/W to 40 lm/W, from 20 lm/W to 40 lm/W, from 6 lm/W to 35 lm/W, from 10 lm/W to 35 lm/W, from 15 lm/W to 35 lm/W, from 20 lm/W to 35 lm/W, from 6 lm/W to 30 lm/W, from 10 lm/W to 30 lm/W, from 15 lm/W to 30 lm/W, or from 20 lm/W to 30 lm/W.

Paragraph 37. The organic light-emitting component of any one of paragraphs 31-36 having an external quantum efficiency ("EQE") at 1000 cd m$^{-2}$ of at least 10%, at least 11%, at least 12%, at least 13%, at least 14%, at least 15%, in a range from 10% to 40%, from 10% to 20%, from 10% to 20%, from 11% to 40%, from 11% to 30%, from 11% to 20%, from 12% to 20%, from 12% to 40%, from 12% to 30%, from 13% to 20%, from 13% to 40%, from 13% to 30%, from 14% to 20%, from 14% to 40%, from 14% to 30%, from 15% to 40%, from 15% to 30%, or from 15% to 20% for a single layer of the platinum (II) complexes.

Paragraph 38. The organic light-emitting component of any one of paragraphs 31-37, wherein the one or more platinum (II) complexes have a $\lambda_{max}$ in a range from 600 nm to 700 nm and the organic light-emitting component has a LT95 at 1000 cd/m² of at least 9000 h, at least 9300 h, or at least 9500 h, or wherein the one or more platinum (II) complexes have a $\lambda_{max}$ in a range from 700 nm to 1000 nm and the organic light-emitting component has a LT95 at 1000 cd/m² of at least 1000 h, at least 1500 h, or at least 2000 h.

Paragraph 39. The organic light-emitting component of any one of paragraphs 31-38, wherein the organic light-emitting component is an organic light-emitting diode ("OLED") or a light-emitting electrochemical cell ("LEEC").

Paragraph 40. The organic light-emitting component of any one of paragraphs 31-39, wherein the light-emitting layer or each of the light-emitting layer of the two or more light-emitting layers is formed by vacuum-evaporation deposition, spin-coating, ink-printing, or roll-to-roll printing.

Paragraph 41. A device comprising one or more organic light-emitting components of any one of paragraphs 31-40, wherein the device is a stationary visual display unit, a mobile visual display unit, an illumination device, a wearable device, or a medical monitoring device.

The present invention will be further understood by reference to the following non-limiting examples.

EXAMPLES

Example 1. Synthesis of Exemplary Platinum (II) Complexes

Materials and Methods

Preparation of Cyclometalating Ligands L1 and L2

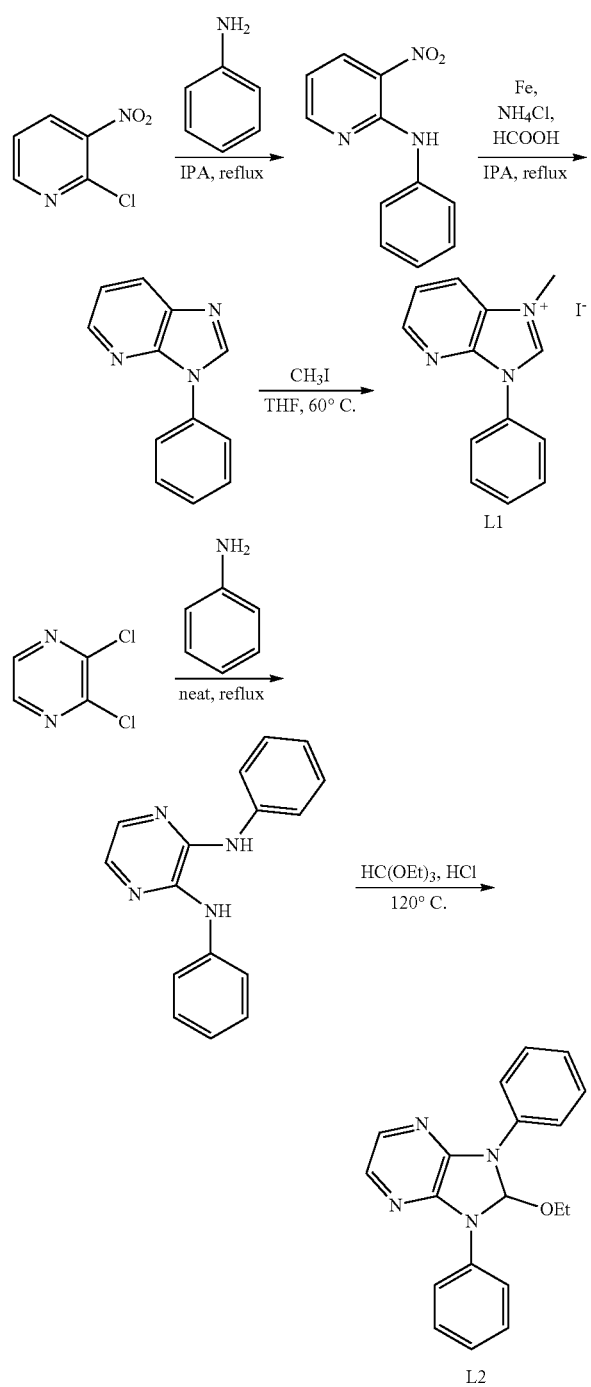

L1 and L2 were prepared according to the literature methods (Pinter, et al., Organometallics 2016, 35, 673-680; Pinter, et al., *Chem. Eur. J.* 2019, 25, 14495-14499).

Preparation of Bidentate and Tetradentate Bridging Ligands L3-L6

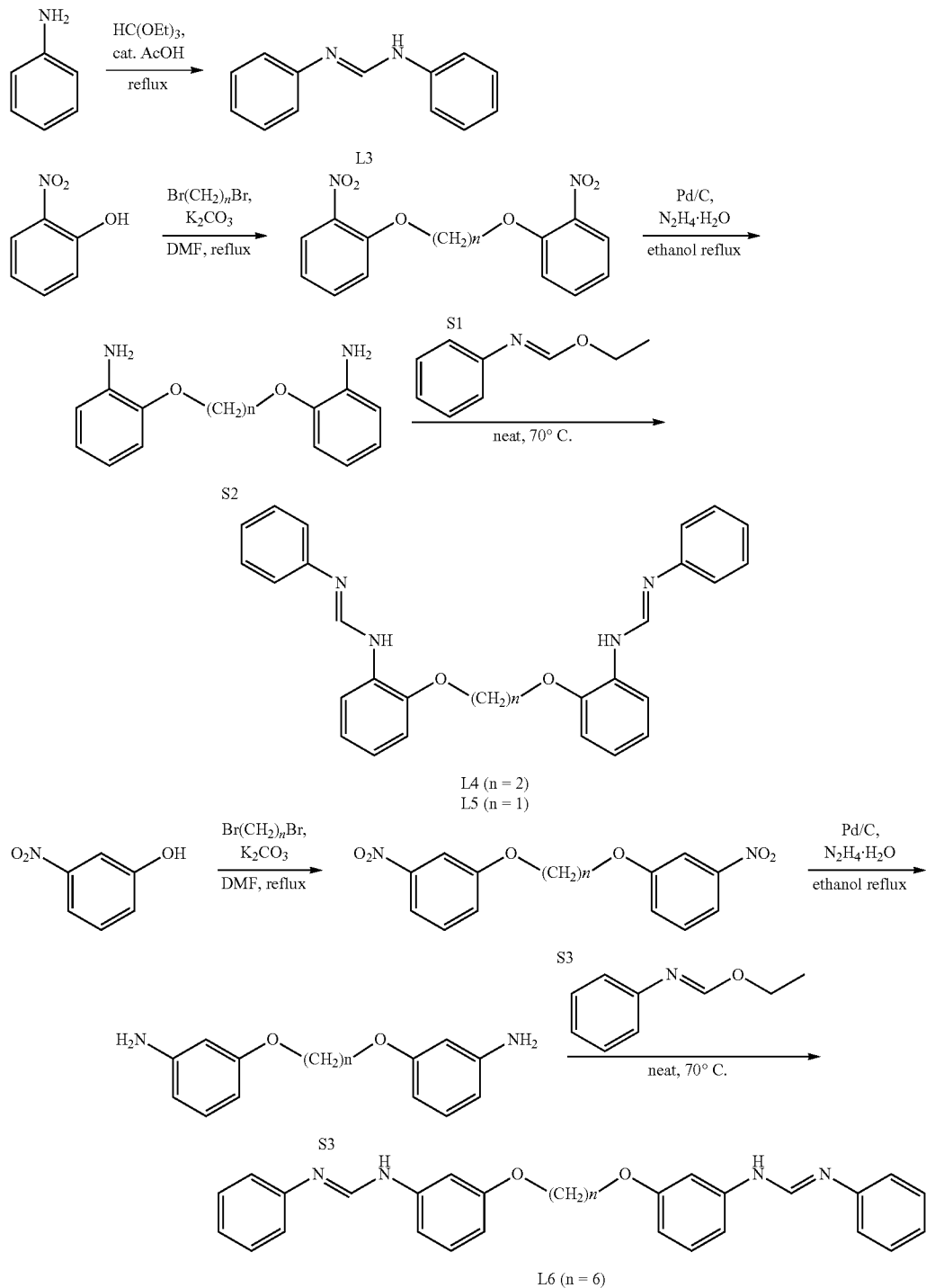

L3 was prepared according to the literature method (Hirano, et al., Org. Lett. 2009, 11, 1019-1022). To prepare S1 and S3, the corresponding nitrophenol (7.2 mmol), the corresponding Br(CH$_2$)$_n$Br (3.6 mmol) and K$_2$CO$_3$ (0.50 g, 3.6 mmol) were refluxed in DMF solution (20 ml) for 12 hours. After reaction, the mixture was cooled down to room temperature and iced water was poured into the reaction flask. The resulting precipitate was filtered, washed with water several times and dried in a 60° C. oven for 3 hrs to obtain the product.

To prepare S2 (n=1) or S4, the corresponding S1 or S3 (1.7 mmol), Pd/C 5% (0.028 g) and N₂H₄·H₂O (1.72 ml) were refluxed at absolute ethanol (6 ml) for 12 hours. After reaction, the mixture was cooled down to room temperature, and filtered through celite to remove Pd/C. The filtrate was evaporated and dissolved in DCM. The resulting solution was washed with water three times, followed by washing with brine and dried with Na₂SO₄. Solvent was evaporated under vacuum to obtain the product. S2 (n=2): 1,2-bis(2-aminophenoxy)ethane was received from BLDpharm chemical company and used directly.

To prepare L4, 1,2-bis(2-aminophenoxy)ethane (0.1 g, 0.41 mmol) and ethyl N-phenylformimidate (0.38 g, 2.6 mmol) were heated at 70° C. for 1 hour. The resulting sticky oil was triturated with hexane until it solidified. The resulting white solid was used directly without further purification. The preparation procedure for L5 is similar to L4, using 1,1-bis(2-aminophenoxy)methane instead of 1,2-bis(2-aminophenoxy)ethane. The preparation procedure for L6 is similar to L4, using 1,6-bis(3-aminophenoxy)hexane instead of 1,1-bis(2-aminophenoxy)ethane.

Preparation of Dinuclear Pt(II) Complexes

Scheme 3. Synthesis of dinuclear Pt(II) complexes

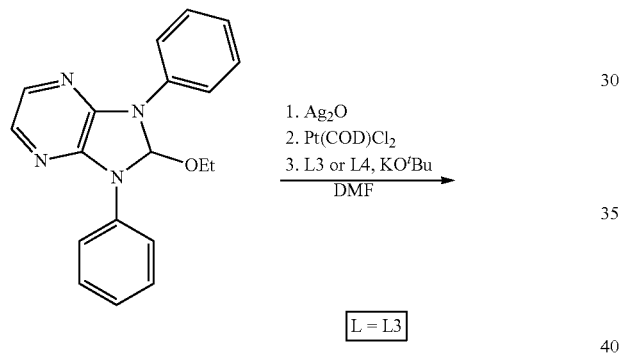

1. Ag₂O
2. Pt(COD)Cl₂
3. L3 or L4, KOᵗBu

DMF

L = L3

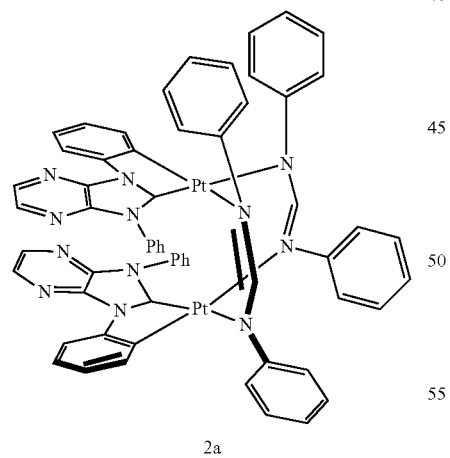

2a

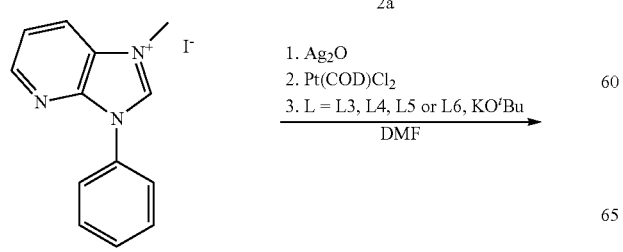

1. Ag₂O
2. Pt(COD)Cl₂
3. L = L3, L4, L5 or L6, KOᵗBu

DMF

-continued

L = L3

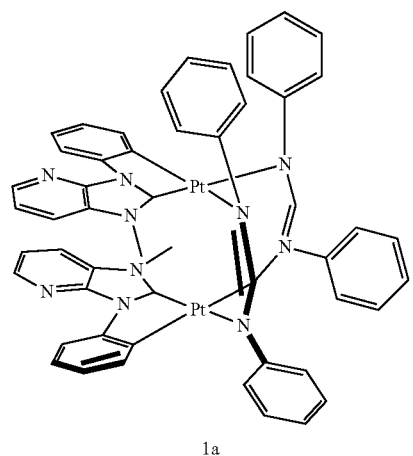

1a

L = L4

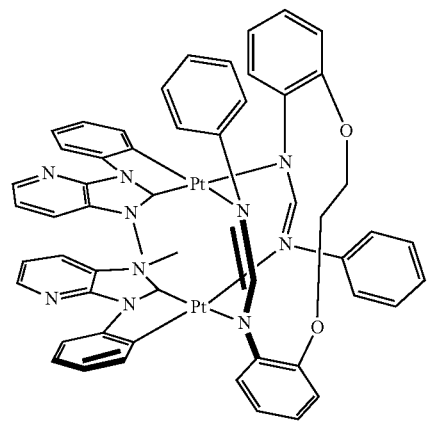

1b &

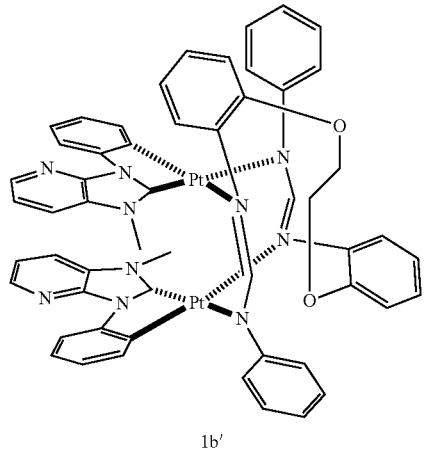

1b'

-continued
L = L5
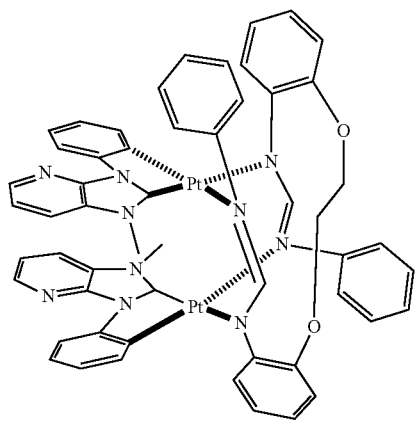
1c &
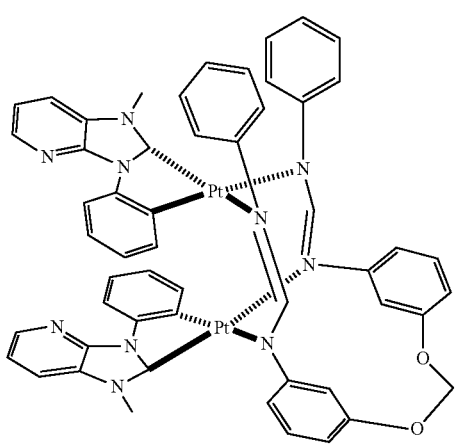
1c'
L = L6
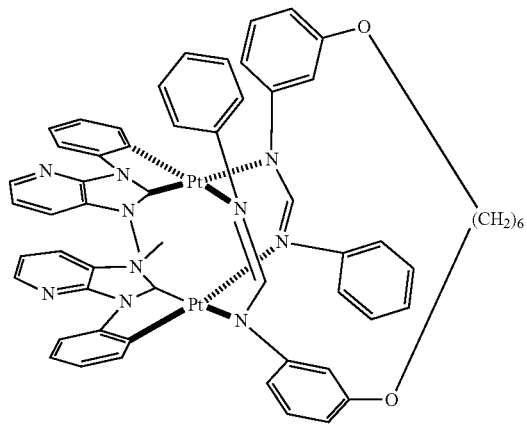
1d &
-continued
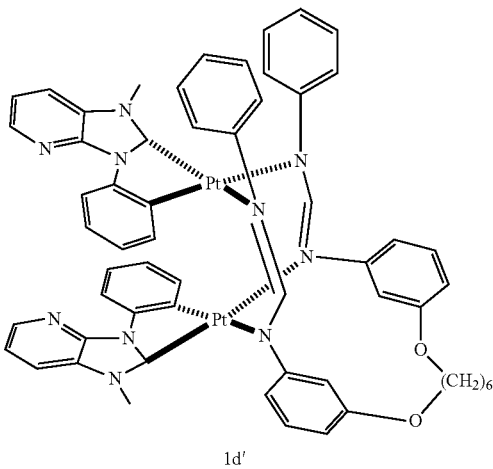
1d'
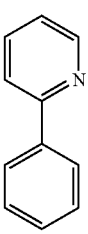
$\xrightarrow{\text{K2PtCl4}}{\text{AcOH}}$
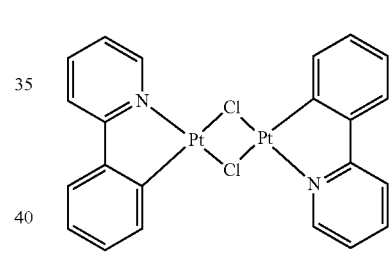
$\xrightarrow{\text{L = L3 or L4, KO}^t\text{Bu}}{\text{DMF}}$
L = L3
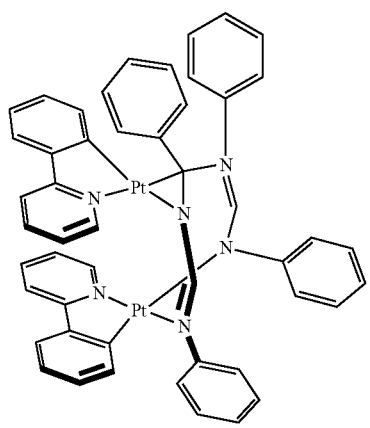
3a

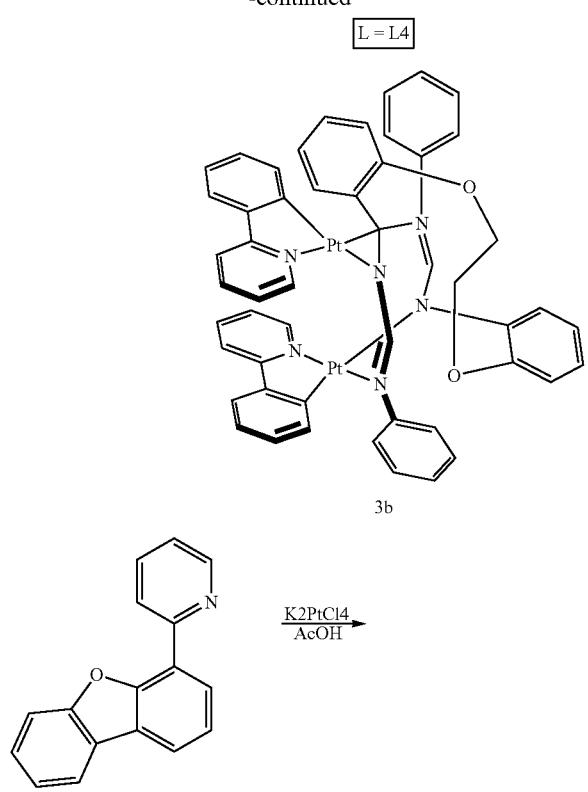

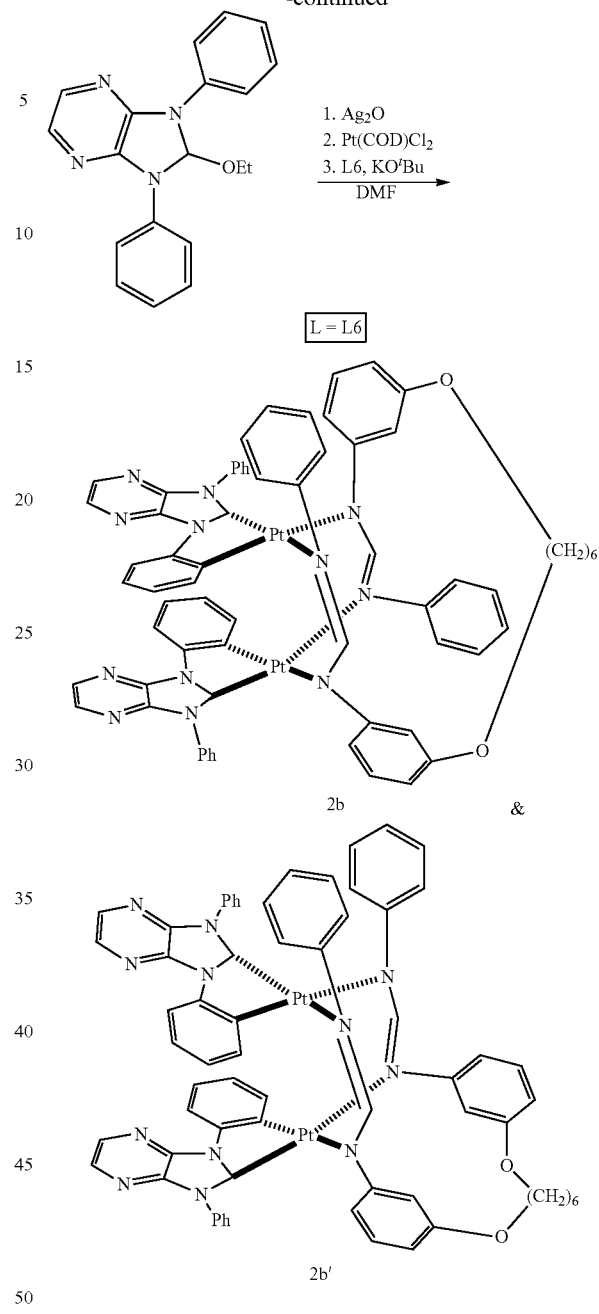

1a: To a solution of L1 (200 mg, 0.59 mmol) in dry DMF (10 ml) was added Ag$_2$O (76 mg, 0.32 mmol). The mixture was stirred overnight at room temperature in dark. Solvent was then removed under vacuum and Pt(COD)Cl$_2$ (221 mg, 0.59 mmol) was added to the reaction mixture. The resulting mixture was heated at 110° C. for 24 hours. After cooling to room temperature, to the mixture was added L3 (116 mg, 0.59 mmol) and potassium tert-butoxide (66 mg, 0.59 mmol) subsequently and heated at 100° C. for 18 hrs. After cooling to room temperature, the reaction mixture was filtered through a short pad of celite and the solvent was removed under vacuum. The resulting mixture was directed to a SiO$_2$ column and the product was isolated as orange solids with DCM/Hexane (v/v=1:2) as eluent.

1b: The mixture of [Pt(C^C)(μ-Cl)]$_2$ (C^C=1-methyl-3-phenyl-3H-imidazo[4,5-b]pyridin-1-ium-2-ylidene) (100 mg, 0.11 mmol), L4 (96 mg, 0.22 mmol) and K$_2$CO$_3$ (30 mg, 0.22 mmol) was refluxed in 1,2-dichloroethane (10 ml) under argon for 12 hours. After reaction, the solvent was removed under vacuum and the product was purified by column chromatography on SiO$_2$ with DCM/Hexane (v/v=3:1) as eluent.

1b': It was isolated from the same pot of reaction yielding 1b. The product was purified by column chromatography on SiO$_2$ with DCM/Hexane (v/v=3:1) as eluent.

1c: The synthetic method for 1c is similar to that of 1b, using L5 instead of L4. The product was purified by column chromatography on SiO$_2$ with DCM/Hexane (v/v=3:1) as eluent.

1c': It was isolated from the same pot of reaction yielding 1c. The product was purified by column chromatography on SiO$_2$ with DCM/Hexane (v/v=3:1) as eluent.

1d: The synthetic method for 1d is similar to that of 1b, using L6 instead of L4. The product was purified by column chromatography on SiO$_2$ with DCM/Hexane (v/v=3:1) as eluent.

1d': It was isolated from the same pot of reaction yielding 1d. The product was purified by column chromatography on SiO$_2$ with DCM/Hexane (v/v=3:1) as eluent.

2a: The synthetic method for 2a is similar to that of 1a, using L2 instead of L1. The compound was isolated by collum chromatography with DCM/hexane (v/v=1:1) as eluent.

3a: The mixture of [Pt(2-phenylpyridine)Cl]$_2$ (100 mg, 0.13 mmol), L3 (59 mg, 0.3 mmol) and potassium tert-butoxide (34 mg, 0.3 mmol) was heated at 80° C. in DMF solution (9 ml) under argon overnight. After cooling to room temperature, DCM was added to the reaction mixture and the mixture was filtered through a short pad of celite. Solvent was then removed under vacuum and the product was isolated as deep red solid by column chromatography on SiO$_2$ with DCM/Hexane (v/v=1:3) as eluent.

3b: The synthetic method of 3b is similar to that of 3a, using L4 instead of L3.

4a: The synthetic method of 4a is similar to that of 3a, using [Pt(2-(dibenzo[b,d]furan-4-yl)pyridine)Cl]$_2$ instead of [Pt(2-phenylpyridine)Cl]$_2$.

2b: The synthetic method for 2b is similar to that of 2a, using L6 instead of L3. The compound was isolated by column chromatography with DCM/hexane (v/v=3:1) as eluent.

2b': It was isolated from the same pot of reaction yielding 2b. The product was purified by column chromatography on SiO$_2$ with DCM/hexane (v/v=3:1) as eluent.

Results

S1 (n=1): Pale yellow solid, yield: 48%. $^1$H NMR (400 MHz, CDCl$_3$) δ 7.85 (dd, J=8.1, 1.6 Hz, 2H), 7.63-7.56 (m, 2H), 7.51 (dd, J=8.4, 0.9 Hz, 2H), 7.22-7.14 (m, 2H), 5.93 (s, 2H). $^{13}$C NMR (101 MHz, CDCl$_3$) δ 149.63, 140.80, 134.52, 125.69, 123.14, 117.62, 91.88. HRMS(ESI-QTOF) m/z: cald. 313.0431; found 313.0437[(M$^+$)].

S3 (n=6): Brown solid, yield: 50%. $^1$H NMR (400 MHz, CDCl3) δ 7.81 (d, J=8.0 Hz, 2H), 7.72 (s, 2H), 7.42 (t, J=8.2 Hz, 2H), 7.22 (dd, J=8.2, 1.5 Hz, 2H), 4.06 (t, J=6.3 Hz, 4H), 1.97-1.78 (m, 4H), 1.58 (m, 4H). $^{13}$C NMR (101 MHz, CDCl3) δ 159.74, 149.35, 130.03, 121.80, 115.76, 108.78, 68.62, 29.07, 25.88. HRMS(ESI-QTOF) m/z: cald. 361.1394; found 361.1405[(M$^+$)].

S2 (n=1): White crystallized solid, yield:0.68 g (86%). $^1$H NMR (500 MHz, CDCl3) δ 7.10 (d, J=7.9 Hz, 2H), 6.88 (t, J=7.5 Hz, 2H), 6.72 (t, J=8.1 Hz, 4H), 5.74 (s, 2H), 3.58 (s, 6H). 13C NMR (126 MHz, CDCl3) δ 144.68, 137.48, 123.48, 118.69, 115.96, 115.58, 92.93. EI-MS (+ve, m/z): 230.1.

S4 (n=6): Off-white crystallized solid, yield: 80%. $^1$H NMR (500 MHz, CDCl3) δ 7.04 (t, J=8.0 Hz, 2H), 6.31 (dd, J=8.2, 1.5 Hz, 2H), 6.26 (t, J=7.8 Hz, 2H), 6.24 (d, J=2.0 Hz, 2H), 3.92 (t, J=6.5 Hz, 4H), 3.63 (m, 4H), 1.89-1.69 (m, 4H), 1.56-1.40 (m, 4H). $^{13}$C NMR (101 MHz, CDCl3) δ 160.38, 147.85, 130.18, 107.89, 104.72, 101.80, 67.72, 29.35, 25.99. EI-MS (+ve, m/z): 300.2.

L4: white solid, yield: 95%. $^1$H NMR (400 MHz, CDCl3) δ 8.12 (s, 2H), 7.25 (m, 5H), 7.07-6.89 (m, 13H), 4.35 (s, 4H). $^{13}$C NMR (101 MHz, CDCl3) δ 155.28, 129.51, 129.31, 129.21, 124.38, 123.48, 123.46, 123.31, 122.24, 121.55, 120.15, 119.04, 113.44, 66.96, 62.53. EI-MS (+ve, m/z): 450.2.

L5: white solid, yield: 90%. $^1$H NMR (400 MHz, CDCl$_3$) δ 8.14 (s, 2H), 7.27 (m, 5H), 7.15-6.92 (m, 13H), 5.73 (s, 2H). $^{13}$C NMR (101 MHz, CDCl$_3$) δ 155.29, 129.56, 129.43, 129.39, 129.22, 124.07, 123.75, 123.62, 123.56, 121.56, 119.83, 62.54. HRMS(ESI-QTOF) m/z: cald. 437.1972; found 437.1976[(M$^+$)].

L6: off-white solid, yield: 88%. $^1$H NMR (400 MHz, CDCl$_3$) δ 8.22 (s, 2H), 7.28 (dd, J=14.6, 6.4 Hz, 4H), 7.18 (t, J=9.4 Hz, 3H), 7.09-6.99 (m, 7H), 6.61 (dd, J=17.0, 8.4 Hz, 5H), 3.88 (t, J=6.2 Hz, 4H), 1.76 (m, 4H), 1.58-1.45 (m, 4H). $^{13}$C NMR (101 MHz, CDCl$_3$) δ 160.21, 130.26, 129.57, 129.51, 123.59, 123.55, 119.42, 119.09, 110.58, 109.43, 106.42, 67.43, 28.67, 25.28. HRMS(ESI-QTOF) m/z: cald. 507.2755; found 507.2741 [(M$^+$)].

1a: Orange solid, yield: 35 mg (49%). $^1$H NMR (600 MHz, DMSO) δ (ppm) 8.45 (s, 2H), 8.15 (dd, J=4.9, 1.1 Hz, 2H), 7.69 (dd, J=8.1, 1.0 Hz, 2H), 7.67-7.63 (m, 2H), 7.50 (d, J=7.8 Hz, 4H), 7.45 (d, J=7.8 Hz, 4H), 7.24 (dd, J=8.1, 4.9 Hz, 2H), 7.17 (t, J=7.9 Hz, 4H), 7.10 (t, J=7.9 Hz, 4H), 6.91 (dt, J=18.9, 7.4 Hz, 6H), 6.43 (td, J=7.7, 1.0 Hz, 2H), 6.24 (td, J=7.4, 1.0 Hz, 2H), 3.22 (s, 6H). $^{13}$C NMR (151 MHz, DMSO) δ 167.80, 160.17, 152.08, 150.73, 146.08, 143.65, 143.31, 133.83, 130.84, 128.47, 128.19, 127.21, 123.40, 123.26, 122.99, 122.62, 122.55, 121.16, 118.75, 117.94, 112.63, 31.77. HRMS(ESI-QTOF) m/z: cald. 1197.2959; found 1197.2980 [(M$^+$)].

1b: Orange solid, yield: 11%. $^1$H NMR (500 MHz, CD$_2$Cl$_2$) δ 8.86 (s, 2H), 8.21 (d, J=7.5 Hz, 2H), 8.14 (t, J=3.1 Hz, 2H), 7.72 (d, J=7.4 Hz, 2H), 7.46 (d, J=7.8 Hz, 2H), 7.28 (d, J=7.9 Hz, 4H), 7.11 (d, J=3.1 Hz, 4H), 7.00-6.87 (m, 10H), 6.81 (dd, J=18.1, 8.9 Hz, 4H), 6.75 (t, J=7.2 Hz, 2H), 4.33 (d, J=7.2 Hz, 2H), 3.72 (d, J=7.3 Hz, 2H), 2.73 (s, 6H). HRMS(ESI-QTOF) m/z: cald. 1255.3014; found 1255.3027 [(M$^+$)].

1b': Orange solid, yield: 1.8%. $^1$H NMR (500 MHz, CD$_2$Cl$_2$) δ 8.73 (s, 2H), 8.28 (ddd, J=9.4, 6.4, 1.3 Hz, 4H), 7.64 (d, J=6.9 Hz, 2H), 7.38 (dd, J=8.0, 1.1 Hz, 2H), 7.21 (d, J=7.8 Hz, 4H), 7.13 (dd, J=8.0, 4.9 Hz, 2H), 7.05-6.88 (m, 8H), 6.88-6.76 (m, 4H), 6.69 (d, J=6.5 Hz, 2H), 6.08 (t, J=7.0 Hz, 2H), 5.98 (t, J=7.4 Hz, 2H), 4.32 (d, J=7.3 Hz, 2H), 4.03 (s, 6H), 3.69 (d, J=7.2 Hz, 2H). $^{13}$C NMR (126 MHz, CD$_2$Cl$_2$) δ 168.73, 165.25, 153.59, 152.11, 146.69, 144.77, 143.79, 142.80, 134.08, 130.65, 128.62, 128.46, 128.27, 123.72, 123.53, 123.05, 122.29, 121.91, 120.88, 117.76, 117.65, 115.66, 113.29, 70.13, 32.91. HRMS(ESI-QTOF) m/z: cald. 1255.3014; found 1255.3008 [(M$^+$)].

1c: orange solid, yield: 15 mg (11%). $^1$H NMR (400 MHz, CD$_2$Cl$_2$) δ 8.87 (s, 2H), 8.32 (d, J=6.8 Hz, 2H), 7.94-7.80 (m, 4H), 7.61 (d, J=6.4 Hz, 2H), 7.44 (d, J=7.7 Hz, 4H), 7.16-6.88 (m, 18H), 6.84 (t, J=7.2 Hz, 2H), 5.53 (s, 2H), 2.26 (s, 6H). HRMS(ESI-QTOF) m/z: cald. 1240.2779; found 1240.2769 [(M+)].

1c': orange solid, yield: 1.4%. $^1$H NMR (500 MHz, CD$_2$Cl$_2$) δ 8.74 (s, 1H), 8.68 (s, 1H), 8.41-8.29 (m, 2H), 7.77 (d, J=6.5 Hz, 1H), 7.71 (d, J=6.7 Hz, 1H), 7.64-7.53 (m, 4H), 7.50 (d, J=6.9 Hz, 1H), 7.44 (d, J=7.7 Hz, 2H), 7.28 (ddd, J=12.8, 8.0, 1.3 Hz, 3H), 7.14 (ddd, J=12.5, 6.3, 3.9 Hz, 4H), 7.07 (t, J=7.9 Hz, 2H), 6.93-6.83 (m, 4H), 6.64 (ddt, J=23.0, 14.0, 7.1 Hz, 5H), 6.54 (dd, J=7.3, 6.2 Hz, 1H), 6.36 (t, J=7.1 Hz, 1H), 6.30 (t, J=7.1 Hz, 1H), 5.90 (d, J=7.1 Hz, 1H), 5.76 (d, J=7.0 Hz, 1H), 3.89 (s, 3H), 3.66 (s, 3H). $^{13}$C NMR (126 MHz, CD$_2$Cl$_2$) δ 169.19, 168.49, 164.49, 164.37, 153.34, 152.68, 151.42, 151.35, 147.16, 146.88, 145.15, 145.04, 144.83, 144.65, 144.17, 143.99, 136.55, 135.34, 131.71, 130.94, 128.96, 128.69, 128.41, 128.25, 127.71, 124.20, 123.74, 123.64, 123.61, 123.56, 123.36, 123.34, 123.19, 122.76, 122.75, 122.65, 122.44, 120.31, 119.49, 117.99, 117.88, 117.85, 112.89, 112.68, 98.97, 77.99, 33.85, 33.25. HRMS(ESI-QTOF) m/z: cald. 1240.2779; found 1240.2736 [(M+)].

1d: orange solid, yield: 2%. $^1$H NMR (500 MHz, CD$_2$Cl$_2$) δ 8.59 (s, 2H), 7.92-7.83 (m, 4H), 7.75-7.70 (m, 2H), 7.54 (dd, J=11.9, 4.4 Hz, 6H), 7.18 (t, J=8.0 Hz, 2H), 7.14-7.03 (m, 10H), 6.96 (td, J=7.4, 1.2 Hz, 2H), 6.90 (t, J=7.3 Hz, 2H), 6.56 (dd, J=10.8, 2.0 Hz, 4H), 4.24-4.06 (m, 2H), 3.82 (td, J=9.2, 5.1 Hz, 2H), 2.26 (s, 6H), 1.83 (m, 2H), 1.69 (ddd, J=19.7, 10.9, 6.4 Hz, 4H), 1.60-1.54 (m, 2H). $^{13}$C NMR (126 MHz, CD$_2$Cl$_2$) δ 169.68, 161.23, 160.28, 153.16, 152.32, 147.47, 144.33, 144.19, 135.33, 132.40, 129.33, 128.58, 126.87, 124.91, 123.57, 123.31, 122.86, 119.32, 118.05, 117.98, 114.02, 109.29, 108.35, 67.90, 31.00, 28.53, 25.29. HRMS(ESI-QTOF) m/z: cald. 1310.3562; found 1310.3583 [(M+)].

1d': orange solid, yield: 10%. $^1$H NMR (500 MHz, CD$_2$Cl$_2$) δ 8.59 (s, 1H), 8.54 (s, 1H), 8.03 (t, J=4.5 Hz, 2H), 7.78 (m, 4H), 7.57-7.42 (m, 4H), 7.35-7.03 (m, 12H), 6.99 (t, J=7.3 Hz, 1H), 6.90 (t, J=7.2 Hz, 1H), 6.82 (t, J=7.3 Hz, 2H), 6.71-6.51 (m, 5H), 6.48 (d, J=6.4 Hz, 1H), 4.05-3.94 (m, 2H), 3.84 (dd, J=10.3, 6.5 Hz, 1H), 3.75 (dd, J=9.1, 5.3 Hz, 1H), 2.77 (s, 3H), 2.72 (s, 3H), 1.65 (dd, J=19.2, 15.3 Hz, 6H), 1.43 (s, 2H). $^{13}$C NMR (126 MHz, CD$_2$Cl$_2$) δ 169.60, 161.21, 161.11, 159.91, 159.84, 154.48, 152.96, 152.83, 151.37, 147.39, 147.24, 144.40, 144.39, 144.20, 144.18, 135.03, 135.02, 131.83, 129.56, 129.49, 128.82, 128.67, 127.37, 127.36, 124.29, 123.72, 123.41, 122.97, 122.72, 122.69, 117.99, 117.97, 117.94, 117.91, 114.17, 113.91, 113.84, 113.72, 113.37, 113.24, 107.86, 107.63, 67.48, 66.86, 31.67, 31.63, 27.91, 24.88, 24.73. HRMS(ESI-QTOF) m/z: cald. 1311.3640; found 1311.3682[(M+)].

2a: deep red solid, yield: 20%. $^1$H NMR (500 MHz, CD$_2$Cl$_2$) δ (ppm) 8.37-8.25 (m, 2H), 8.24-8.18 (m, 2H), 7.91 (d, J=7.1 Hz, 2H), 7.64 (d, J=7.1 Hz, 6H), 7.57-7.44 (m, 6H), 7.29 (dd, J=15.6, 7.5 Hz, 6H), 7.13 (t, J=7.8 Hz, 4H), 7.05 (t, J=7.8 Hz, 4H), 6.93 (t, J=7.3 Hz, 3H), 6.84 (t, J=7.2 Hz, 3H), 6.73 (d, J=6.9 Hz, 2H), 6.38 (t, J=7.4 Hz, 2H), 5.87 (t, J=6.9 Hz, 2H). $^{13}$C NMR (126 MHz, CD$_2$Cl$_2$) δ (ppm) 171.95, 159.19, 150.53, 149.72, 146.39, 141.99, 139.11, 138.22, 137.77, 135.58, 135.15, 131.88, 129.40, 128.05, 128.00, 124.25, 123.49, 122.77, 122.71, 122.65, 121.99, 114.21. HRMS(ESI-QTOF) m/z: cald. 1323.3177; found 1323.3227 [(M+)].

3a: deep red solid, yield: 42 mg (30%). $^1$HNMR (500 MHz, CD$_2$Cl$_2$) δ (ppm) 8.38 (s, 2H), 7.60 (d, J=7.8 Hz, 4H), 7.55 (d, J=5.4 Hz, 2H), 7.48 (d, J=7.8 Hz, 4H), 7.37-7.27 (m, 4H), 7.25 (t, J=7.8 Hz, 4H), 7.06 (dt, J=17.0, 7.5 Hz, 8H), 6.95 (dd, J=13.2, 7.0 Hz, 4H), 6.87 (dd, J=13.0, 6.9 Hz, 4H), 6.06 (t, J=6.2 Hz, 2H). $^{13}$C NMR (101 MHz, DMSO) δ (ppm) 165.98, 159.35, 151.12, 150.50, 149.90, 144.76, 144.53, 137.10, 132.27, 128.83, 128.42, 128.33, 123.86, 123.23, 123.15, 122.37, 121.75, 120.64, 117.70. HRMS (ESI-QTOF) m/z: cald. 1089.0129; found 1089.2523[(M+)].

3b: deep red solid, yield: 10%. $^1$H NMR (500 MHz, CD$_2$Cl$_2$) δ (ppm) 8.86 (d, J=5.3 Hz, 1H), 8.51 (s, 1H), 8.02 (d, J=7.9 Hz, 1H), 7.43 (t, J=7.6 Hz, 1H), 7.28 (d, J=7.8 Hz, 2H), 7.03 (d, J=8.0 Hz, 1H), 7.01-6.88 (m, 7H), 6.88-6.78 (m, 2H), 6.58 (t, J=7.4 Hz, 1H), 6.39 (d, J=7.4 Hz, 1H), 6.28 (t, J=7.3 Hz, 1H), 4.30 (d, J=7.3 Hz, 1H), 3.68 (d, J=7.1 Hz, 1H).

4a: deep red solid, yield: 25%. $^1$H NMR (500 MHz, CD$_2$Cl$_2$) δ (ppm) 8.44 (s, 2H), 8.01 (d, J=7.8 Hz, 2H), 7.92 (d, J=7.4 Hz, 2H), 7.72-7.56 (m, 8H), 7.54-7.39 (m, 10H), 7.36 (t, 2H), 7.30 (t, J=7.6 Hz, 4H), 7.09 (q, J=7.8 Hz, 6H), 6.91 (dt, J=23.4, 7.3 Hz, 4H), 5.58 (t, J=6.4 Hz, 2H). $^{13}$C NMR (126 MHz, CDCl$_3$) δ (ppm) 164.61, 160.44, 155.00, 152.80, 151.52, 150.75, 150.66, 145.85, 135.77, 129.27, 128.86, 128.61, 128.17, 127.91, 125.91, 124.76, 124.59, 123.95, 123.06, 122.99, 122.88, 121.61, 120.90, 120.23, 119.80, 111.39. HRMS(ESI-QTOF) m/z: cald. 1269.1723; found 1268.2657[(M+)].

2b: Deep red solid, yield: 0.5%. $^1$H NMR (500 MHz, CD$_2$Cl$_2$) δ (ppm) 8.30 (s, 2H), 8.22 (s, 2H), 7.91 (d, J=7.4 Hz, 2H), 7.81 (d, J=7.9 Hz, 2H), 7.64 (m, 6H), 7.48 (d, J=8.0 Hz, 8H), 7.34 (s, 2H), 7.14 (t, J=7.5 Hz, 4H), 7.04 (t, J=7.8 Hz, 2H), 6.95 (t, J=7.0 Hz, 2H), 6.65 (d, J=7.2 Hz, 2H), 6.37 (d, J=7.5 Hz, 4H), 5.81 (s, 4H), 4.00 (s, 2H), 3.65 (t, J=7.8 Hz, 2H), 1.71 (m, 2H), 1.61 (m, 2H), 1.44 (m, 2H). $^{13}$C NMR (126 MHz, CD$_2$Cl$_2$) δ (ppm) 172.06, 159.71, 159.45, 151.69, 149.68, 146.34, 141.83, 139.12, 138.33, 137.69, 135.41, 135.12, 131.80, 129.32, 128.02, 127.98, 123.88, 122.81, 122.46, 122.12, 120.45, 114.25, 109.22, 106.60, 67.64, 29.08, 25.93. HRMS(ESI-QTOF) m/z: calcd: 1437.3859; found: 1437.3829 [(M+H)+].

2b': Deep red solid, yield: 14%. $^1$H NMR (500 MHz, CD$_2$Cl$_2$) δ (ppm) 8.31 (t, J=2.3 Hz, 2H), 8.21 (t, J=3.0 Hz, 2H), 7.94 (d, J=7.7 Hz, 1H), 7.91 (d, J=7.7 Hz, 1H), 7.85 (s, 2H), 7.70-7.43 (m, 10H), 7.34-7.21 (m, 4H), 7.12 (t, J=7.9 Hz, 3H), 7.03 (t, J=7.7 Hz, 2H), 6.97-6.66 (m, 7H), 6.51 (dd, J=8.2, 2.0 Hz, 1H), 6.47-6.28 (m, 4H), 5.87 (t, J=8.2 Hz, 3H), 4.22-4.12 (m, 1H), 4.09-3.99 (m, 1H), 3.86 (dd, J=8.3, 4.9 Hz, 1H), 3.80 (d, J=9.3 Hz, 1H), 1.83-1.62 (m, 5H), 1.54 (s, 2H), 1.45-1.35 (m, 1H). $^{13}$C NMR (126 MHz, CD$_2$Cl$_2$) δ (ppm) 172.09, 159.65, 159.33, 159.22, 159.15, 152.27, 151.28, 150.46, 149.75, 146.46, 146.39, 142.04, 139.10, 138.22, 137.75, 135.59, 135.13, 135.09, 132.00, 131.95, 129.43, 129.38, 128.92, 128.62, 128.03, 127.96, 124.29, 123.48, 122.79, 122.68, 122.60, 122.02, 115.78, 114.49, 114.21, 112.78, 111.99, 108.32, 106.59, 67.08, 66.52, 28.26, 27.44, 24.65, 24.16. HRMS(ESI-QTOF) m/z: calcd: 1437.3859; found: 1437.3823 [(M+H)+].

The structures of the synthesized Pt(II) complexes are shown below:

-continued
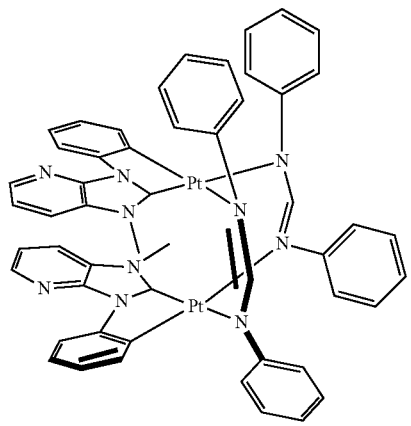
1a
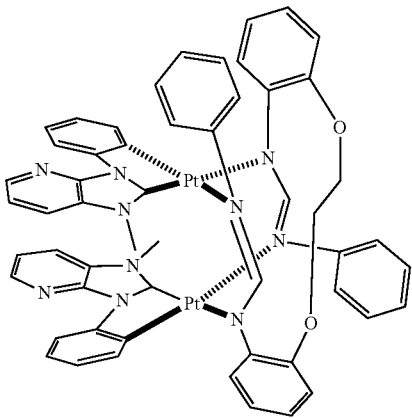
1c
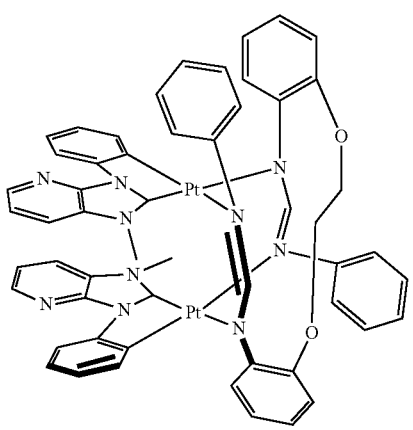
1b
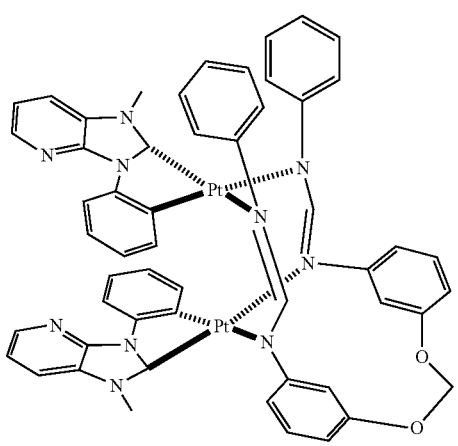
1c′
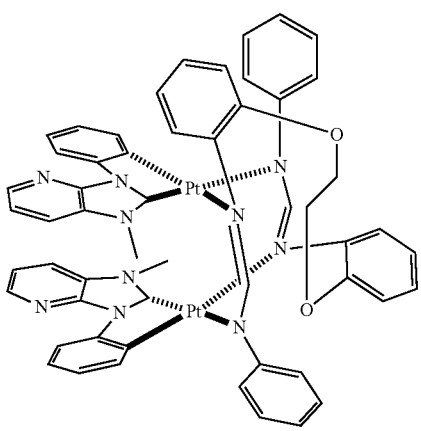
1b′
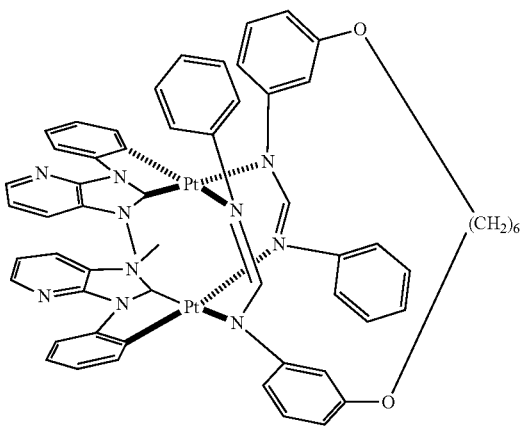
1d -continued
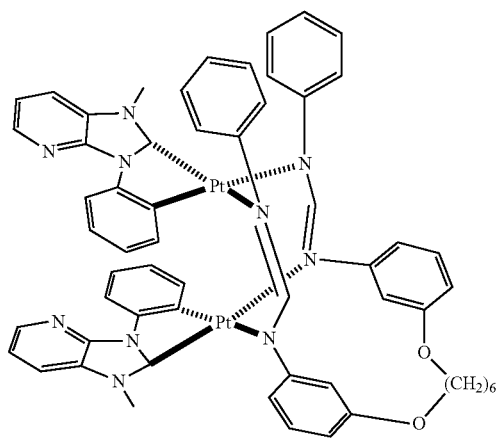
1d'
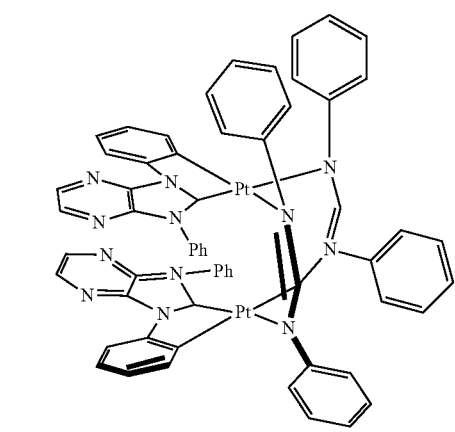
2a
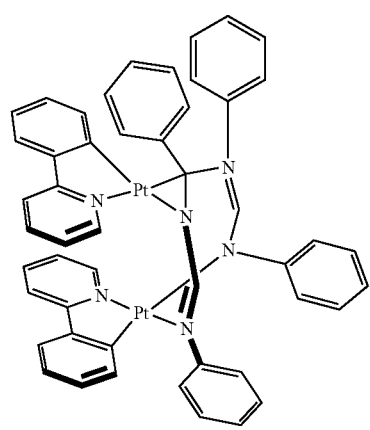
3a
-continued
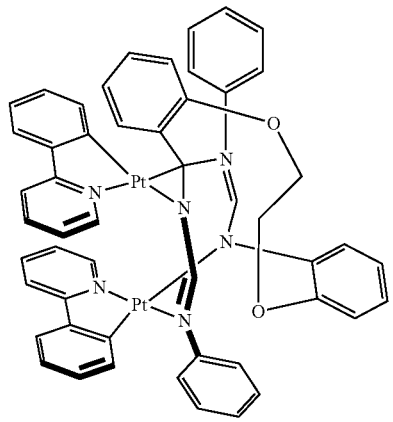
3b
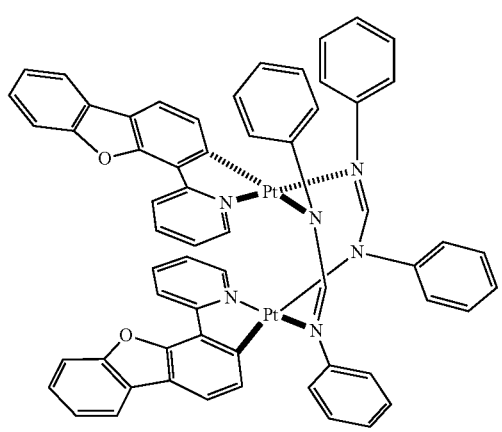
4a
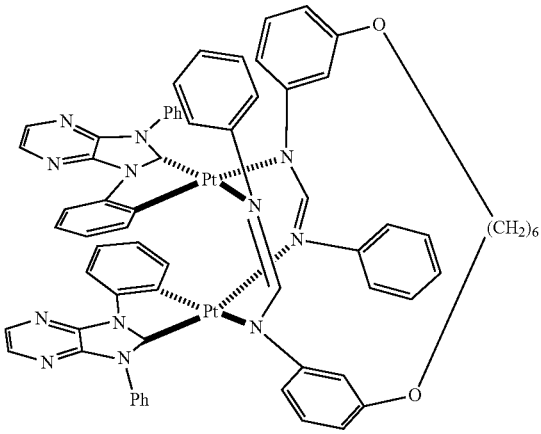
2b -continued

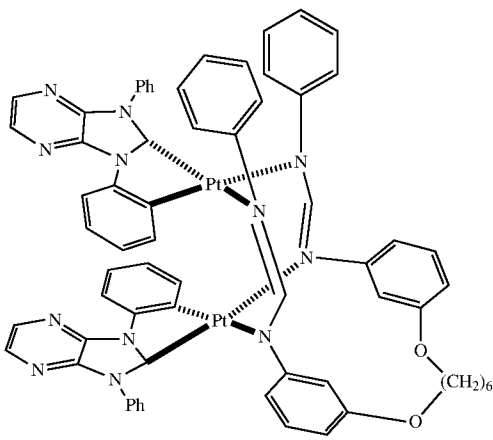

2b'

The X-ray crystal structures of Pt(II) complexes 1a, 1b, 1c, 2b', 3a, and 3b and their Pt—Pt contacts are shown in FIGS. 1A-1D, respectively.

Example 2. The Platinum (II) Complexes Show High Emission Quantum Yield and Shortened Emission Lifetime Materials and Methods The emission spectra of Pt(II) complexes 1a, 1b, 1b', 1c, 1c', 1d, 1d', 2a, 3a, 3b, and 4a were measure in poly(methyl methacrylate) ("PMMA") and 1,3-bis(N-carbazolyl)benzene ("MCP") films at room temperature respectively. The radiative decay rates $k_r$ was calculated by $\Phi_{em}/\tau_{em}$. The $\tau_{em}$ of the platinum (II) complexes was obtained as follows: (i) monitor the intensity of emission decay as a function of time using a Quanta Ray GCR 150-10 pulsed Nd:YAG laser system (pulse output: 355 nm), and (ii) determine the $\tau_{em}$ by fitting the exponential decay of formula (1) using Origin software, where $I_0$ is the initial emission intensity, I(t) is the emission intensity at time t, $\tau$ is the emission lifetime, and t is the time.

$$I(t) = I_0 e^{-t/\tau} \quad \text{formula (1)}$$

The $\Phi_{em}$ values of the Pt(II) complexes 1a, 1b, 1b', 1c, 1c', 1d, 1d', 2a, 3a, 3b, in solutions or thin films, were directly obtained by absolute measurement using Hamamatsu C11347 Quantaurus-QY Absolute PL quantum yield spectrometer (PL stands for photoluminescence). The solution $\Phi_{em}$ value of the Pt(II) complex 4a in the NIR region ($\lambda_{max}=753_{(max)}$, 903 nm), was measured by relative method using Pt(tpdbp) as standard reference ($\Phi_r$:0.51, $\lambda_{em}=770$ nm). $\Phi_{em}$ was then calculated by the equation: $\Phi_{em}=\Phi_r (B_r/B_s)(n_s/n_r)^2 (D_s/D_r)$, where r and s represent sample and reference standard respectively, $B=1-10^{-AL}$, where A is the absorbance at excitation wavelength and L is the optical path length in cm, n is the refractive index of solvents, and D is the integrated emission intensity.

Results

Photophysical Properties

The Pt(II) complexes 1a, 1b, 1b', 1c, 1c', 1d, 1d', 2a, 2b, 2b', 3a, 3b, and 4b display red to deep red emissions ($\lambda_{max}=604-733$ nm) in both solutions and thin films upon light excitation at room temperature (see FIGS. 2A-2H). The emission data of these Pt(II) complexes are summarized in Table 1 below. A high emission quantum yield of up to 0.8 (i.e. 80%) and a short lifetime down to 1.3 μs have been observed. The calculated radiative decay rates by $k_r=\Phi_{em}/\tau_{em}$, are all in the order of $10^5$ s$^{-1}$.

TABLE 1

Emission data of Pt(II) complexes at room temperature

| | Medium | $\lambda_{em}$/nm | FWHM/ cm$^{-1}$ | $\Phi_{em}$; $\tau_{em}$/μs | $k_r$; $k_{nr}$/×10$^5$ s$^{-1}$ |
|---|---|---|---|---|---|
| 1a | CH$_2$Cl$_2$ | 619 | 2241 | 0.62; 1.43 | 4.3; 2.7 |
| | 2 wt % in PMMA | 604 | 2159 | 0.76; 1.62 | 4.7; 1.5 |
| | 2 wt % in MCP | 604 | 2088 | 0.83; 1.25 | 6.6; 1.4 |
| 1b | CH$_2$Cl$_2$ | 632 | 2111 | 0.72; 1.90 | 3.3; 1.8 |
| | 2 wt % in PMMA | 617 | 2127 | 0.47; 1.65 | 3.5; 2.5 |
| | 2 wt % in MCP | 616 | 2037 | 0.43; 1.35 | 5.0; 2.4 |
| 1b' | CH$_2$Cl$_2$ | 630 | 2143 | 0.73; 2.02 | 3.6; 1.3 |
| | 2 wt % in PMMA | 621 | 2018 | 0.74; 1.90 | 3.9; 1.4 |
| | 2 wt % in MCP | 619 | 2011 | 0.67; 1.59 | 4.2; 2.1 |
| 1c | CH$_2$Cl$_2$ | 627 | 2247 | 0.76; 1.78 | 4.3; 1.3 |
| | 2 wt % in PMMA | 613 | 2117 | 0.64; 1.49 | 4.3; 2.4 |
| | 2 wt % in MCP | 604 | 2110 | 0.65; 1.30 | 5.0; 2.7 |
| 1c' | CH$_2$Cl$_2$ | 640 | 2081 | 0.73; 2.57 | 2.8; 1.1 |
| | 2 wt % in PMMA | 628 | 2069 | 0.66; 1.90 | 3.5; 1.8 |
| | 2 wt % in MCP | 634 | 2053 | 0.54; 1.88 | 2.9; 2.4 |
| 1d | CH$_2$Cl$_2$ | 617 | 2164 | 0.79; 1.68 | 4.7; 1.3 |
| | 2 wt % in PMMA | 605 | 2098 | 0.74; 1.47 | 5.0; 1.8 |
| | 2 wt % in MCP | 609 | 2105 | 0.69; 1.66 | 4.2; 1.9 |
| 1d' | CH$_2$Cl$_2$ | 619 | 2188 | 0.74; 1.81 | 4.1; 1.4 |
| | 2 wt % in PMMA | 602 | 2173 | 0.74; 1.41 | 5.2; 1.8 |
| | 2 wt % in MCP | 605 | 1875 | 0.67; 1.14 | 5.9; 2.9 |
| 2a | CH$_2$Cl$_2$ | 691 | 2163 | 0.62; 1.99 | 3.1; 1.9 |
| | 2 wt % in PMMA | 675 | 2181 | 0.64; 1.68 | 3.8; 2.1 |
| | 2 wt % in MCP | 679 | 1975 | 0.77; 1.46 | 5.3; 1.6 |
| 2b | CH$_2$Cl$_2$ | 689 | 2123 | 0.68; 1.89 | 3.6; 1.7 |
| | 2 wt % in PMMA | 675 | 2131 | 0.72; 1.73 | 4.2; 1.6 |
| 2b' | CH$_2$Cl$_2$ | 689 | 2153 | 0.61; 2.39 | 2.6; 1.6 |
| | 2 wt % in PMMA | 672 | 2092 | 0.82; 1.84 | 4.5; 0.98 |
| 3a | CH$_2$Cl$_2$ | 733$_{(max)}$, 899 | 2605 | 0.27; 0.84 | 3.2; 8.7 |
| | 2 wt % in PMMA | 662 | 2793 | 0.46; 1.62 | 2.8; 3.3 |
| | 2 wt % in MCP | 678 | 2562 | 0.43; 1.41 | 3.0; 4.0 |
| 3b | CH$_2$Cl$_2$ | 698 | 2338 | 0.48; 1.34 | 3.6; 3.8 |
| | 2 wt % in PMMA | 667 | 2610 | 0.36; 1.99 | 1.8; 3.2 |
| | 2 wt % in MCP | 677 | 2574 | 0.26; 1.80 | 1.4; 4.1 |
| 4a | CH$_2$Cl$_2$ | 753$_{(max)}$, 903 | 3760 | 0.35; 0.81 | 4.3; 8.0 |
| | 2 wt % in PMMA | 693 | 2693 | 0.40; 1.57 | 2.6; 3.8 |
| | 2 wt % in MCP | 701 | 2683 | 0.34; 0.86 | 4.0; 7.7 |

Example 3. OLEDs Containing the Platinum (II) Complexes Show High Emission Quantum Yield and Prolonged Lifetime Materials and Methods The fabrication process of vacuum-deposited OLEDs OLEDs are formed by vacuum depositing the Pt(II) complexes in the form of a film. Specifically, indium-tin-oxide (ITO) coated glass with a sheet resistance of 10 Ω/sq was used as the anode substrate. Before film deposition, patterned ITO substrates were cleaned with detergent, rinsed in de-ionized water, acetone, and isopropanol, and then dried in an oven for 1 h in a cleanroom. The slides were then treated in an ultraviolet-ozone chamber for 5 min. The OLEDs were fabricated in a Kurt J. Lesker SPECTROS vacuum deposition system with a base pressure of $10^{-7}$ mbar. In the vacuum chamber, organic materials were thermally deposited in sequence at a rate of 0.5 Ås$^{-1}$. The doping process in the EMLs was realized using co-deposition technology. Afterward, LiF (1.2 nm) and Al (100 nm) were thermally deposited at rates of 0.02 and 0.2 nm s$^{-1}$, respectively. The film thicknesses were determined in situ with calibrated oscillating quartz-crystal sensors.

Results

The emission luminescence spectra and the performance characteristics of devices containing Pt(II) complexes 1a, 1b, 1d', 2a, 4a, 1c, and 2b' are shown in FIGS. 3A-3D, 4A-4D, 5A-5D, 6A-6B, 7A-7F, 8A-8D, 9A-9D, 14A-14B, and 15A-15D, respectively. The performance data of these devices is summarized in Tables 2-8, 15, and 16, respectively. The device lifetime measurement results of devices containing Pt(II) complexes 1a, 1d', 2a, 1b, 1c, and 2b' are shown in FIGS. 10-12 and 16-18, respectively and their lifetime measurement data is summarized in Tables 9-11, and 17-19, respectively. The performance of devices containing Pt(II) complexes 1a and 2a are compared with known red emitters in Table 12. The performance data of commercially available OLEDs from Merck, Sumitomo, DuPont, and UDC is summarized in Table 13. The performance data of red and deep red OLEDs reported by Universal Display is summarized in Table 14.

The vacuum deposited OLEDs based on 1a and 1b show red electroluminescence with CIE coordinates around (0.63, 0.37) and (0.64, 0.36), respectively. In both cases, there is no significant change in the EL maxima and the FWHM remains ~80 nm, when increasing the dopant concentration from 6 wt % to 12 wt %. The external quantum efficiency of these devices has reached 18.7% for 1a and 15.1% for 1b, at a high luminance level of 1000 cd m$^{-2}$. In particular, the device lifetime measurement of devices based on 1a shows a high value of LT90~150 hours with initial luminance (L$_O$) at 8000 cd m$^{-2}$.

Further, near-IR ("NIR") OLEDs have been fabricated with 2a by vacuum deposition. The EL maximum has shifted from 688 to 706 nm, when increasing the thickness of electron transport layer (ETL) from 40 to 120 nm, while the FWHM have remained around 100 nm. The device shows a high EQE of up to 13% at a luminance level of 1000 cd m$^{-2}$. The NIR OLEDs based on 2a also shows a high value of LT90~380 hours with initial luminance (L$_O$) at 2000 cd m$^{-2}$.

TABLE 2

Performance data of vapor-deposited devices (system I*) with 1a.

| 1a conc. | L [cd m$^{-2}$] | CE [cd A$^{-1}$] | | PE [lm W$^{-1}$] | | EQE [%] | | CIE [(x, y)] | FWHM [nm] | $\lambda_{max}$ [nm] |
|---|---|---|---|---|---|---|---|---|---|---|
| | | Max | at 1000 cd m$^{-2}$ | Max | at 1000 cd m$^{-2}$ | Max | at 1000 cd m$^{-2}$ | | | |
| 6 wt % | 74000 | 29.88 | 26.69 | 42.48 | 16.25 | 19.37 | 17.60 | 0.63, 0.37 | 78 | 620 |
| 8 wt % | 75000 | 37.61 | 28.70 | 59.09 | 15.52 | 23.53 | 18.71 | 0.63, 0.37 | 79 | 620 |
| 10 wt % | 65000 | 33.72 | 27.93 | 50.54 | 14.70 | 21.78 | 18.66 | 0.63, 0.37 | 79 | 620 |
| 12 wt % | 66200 | 31.78 | 27.13 | 48.34 | 14.10 | 21.14 | 18.02 | 0.63, 0.37 | 79 | 620 |

*System I device structure: ITO/HAT-CN(5 nm)/TAPC(20 nm)/Tris-PCz (10 nm)/Tris-PCz:B4PYPPM:Pt-1a (30 nm)/B4PYPPM(50 nm)/Liq (1 nm)/Al (100 nm).

TABLE 3

Performance data of vapor-deposited devices (system II*) with 1a.

| 1a conc. | L [cd m$^{-2}$] | CE [cd A$^{-1}$] | | PE [lm W$^{-1}$] | | EQE [%] | | CIE [(x, y)] | $\lambda_{max}$ [nm] |
|---|---|---|---|---|---|---|---|---|---|
| | | Max | at 1000 cd m$^{-2}$ | Max | at 1000 cd m$^{-2}$ | Max | at 1000 cd m$^{-2}$ | | |
| 4 wt % | 58400 | 36.88 | 35.10 | 41.08 | 30.74 | 19.90 | 18.93 | 0.60, 0.40 | 612 |
| 8 wt % | 63600 | 33.52 | 31.83 | 37.66 | 27.73 | 19.14 | 18.15 | 0.61, 0.39 | 614 |
| 12 wt % | 68100 | 33.63 | 31.92 | 37.17 | 27.14 | 19.87 | 18.89 | 0.62, 0.38 | 618 |
| 16 wt % | 68800 | 32.43 | 31.12 | 35.89 | 25.23 | 19.75 | 18.92 | 0.62, 0.38 | 620 |

*System II device structure: ITO/HAT-CN(5 nm)/TAPC(40 nm)/TCTA(10 nm)/TCTA:TPBi:Pt-1a/TPBi(10 nm)/TmPyPb(40 nm)/LiF(1.2 nm)/Al(100 nm).

TABLE 4

Performance data of vapor-deposited devices with 1b.

| 1b conc. | L [cd m$^{-2}$] | CE [cd A$^{-1}$] Max | CE at 1000 cd m$^{-2}$ | PE [lm W$^{-1}$] Max | PE at 1000 cd m$^{-2}$ | EQE [%] Max | EQE at 1000 cd m$^{-2}$ | CIE [(x, y)] | FWHM [nm] | $\lambda_{max}$ [nm] |
|---|---|---|---|---|---|---|---|---|---|---|
| 4 wt % | 48500 | 25.16 | 21.04 | 26.19 | 15.28 | 17.58 | 14.73 | 0.63, 0.37 | 78 | 623 |
| 12 wt % | 55200 | 20.75 | 18.25 | 22.15 | 13.63 | 16.62 | 14.64 | 0.64, 0.36 | 79 | 626 |
| 16 wt % | 52200 | 20.44 | 18.20 | 23.01 | 13.57 | 17.15 | 15.13 | 0.64, 0.36 | 80 | 627 |

TABLE 5

Performance data of vapor-deposited devices with 1d' at doping concentration of 4 wt %.

| 1d' conc. | L [cd m$^{-2}$] | CE [cd A$^{-1}$] Max | CE at 1000 cd m$^{-2}$ | PE [lm W$^{-1}$] Max | PE at 1000 cd m$^{-2}$ | EQE [%] Max | EQE at 1000 cd m$^{-2}$ | CIE [(x, y)] | FWHM [nm] | $\lambda_{max}$ [nm] |
|---|---|---|---|---|---|---|---|---|---|---|
| 4 wt % | 94000 | 31.5 | 30.1 | 32.3 | 19.9 | 20.6 | 19.6 | 0.63, 0.37 | 76 | 622 |

TABLE 6

Performance data of vapor-deposited devices with 2a at 6 wt % and various thickness of ETL.

| 2a conc. | Thickness Of ETL [nm] | Max. Radiance flux [mW] | EQE [%] Max | EQE [%] at 1000 cd m$^{-2}$ | FWHM [nm] | $\lambda_{max}$ [nm] |
|---|---|---|---|---|---|---|
| 6 wt % | 40 | 4.21 | 15.68 | 10.83 | 96 | 688 |
|  | 80 | 4.20 | 16.94 | 11.14 | 97 | 698 |
|  | 100 | 3.49 | 15.41 | 9.04 | 98 | 702 |
|  | 120 | 2.39 | 11.51 | 6.10 | 100 | 706 |

TABLE 7

Performance data of vapor-deposited devices with 2a at doping concentration of 4 wt %-16 wt %.

| Conc. (wt %) | L (cd m$^{-2}$) | EQE [%] Max | EQE [%] at 1000 cd m$^{-2}$ | $\lambda_{max}$ [nm] | CIE (x, y) |
|---|---|---|---|---|---|
| 4 | 13300 | 11.99 | 9.64 | 683 | 0.59, 0.38 |
| 8 | 12600 | 15.05 | 13.01 | 687 | 0.69, 0.30 |
| 12 | 10500 | 14.85 | 12.58 | 691 | 0.70, 0.30 |
| 16 | 10400 | 14.41 | 12.36 | 693 | 0.70, 0.30 |

TABLE 8

Performance data of vapor-deposited devices with 4a at 6 wt % and various thickness of ETL.

| Thickness of ETL [nm] | Max. Radiance flux [mW] | EQE [%] Max | EQE [%] at 100 mA cm$^{-2}$ | $\lambda_{max}$ [nm] |
|---|---|---|---|---|
| 40 | 3.19 | 10.12 | 6.22 | 704 |
| 80 | 2.11 | 8.92 | 5.35 | 724 |
| 100 | 1.39 | 6.76 | 4.15 | 732 |
| 120 | 1.07 | 4.67 | 2.59 | 759 |

TABLE 9

Lifetime measurement data for OLED containing 1a (the luminance intensity at which LT is measured refers to $L_0$).

| 1a conc. | $L_0$ (cd m$^{-2}$) | LT97 (h) | LT90 (h) |
|---|---|---|---|
| 8 wt % | 8500 | 23 | 134 |
| 12 wt % | 8100 | 21 | 152 |
| 16 wt % | 8030 | 20 | 158 |

TABLE 10

Lifetime measurement data for OLED containing 1d' (the luminance intensity at which LT is measured refers to $L_0$).

| 1d' conc. | $L_0$ (cd m$^{-2}$) | LT97 (h) | LT95 (h) |
|---|---|---|---|
| 4 wt % | 12000 | 35.2 | 90.6 |

TABLE 11

Lifetime measurement data for OLED containing 2a (the luminance intensity at which LT is measured is at 2000 nits, referring to $L_0$).

| 2a conc. | $L_0$ (cd m$^{-2}$) | LT97 (h) | LT95 (h) | LT90 (h) |
|---|---|---|---|---|
| 4 wt % | 2000 | 2.94 | 8.57 | 34.6 |
| 8 wt % | 2000 | 19.5 | 54.1 | 202 |
| 12 wt % | 2000 | 90.4 | 162 | 381 |
| 16 wt % | 2000 | 83.4 | 153 | 368 |

TABLE 12

Performance of devices containing Pt(II) complexes 1a and 2a in comparison with known red emitters, measured under the same conditions (same temperature, pressure, using the same measuring instrument and parameters, etc.).

| | Phosphorescent emitter's data[#] | Fluorescent dye's data[#] | Previous dye data[−] | Current data |
|---|---|---|---|---|
| CIE (x,y) | ~(0.64, 0.36) | (0.67, 0.33) | (0.58, 0.35) | 1a (System I: 0.63, 0.37); 1a (System II: 0.60, 0.40); 2a NIR: 698 nm, ca. (0.70, 0.30) |
| Current efficiency @1000 cd/m² (cd/A) | 30 | 11 | 19.5 | 28.7; 35.1; NA |
| Power efficiency @1000 cd/m² (lm/W) | NA | NA | 20.0 | 15.5; 30.7; (max. radiance: 4.2 mW) |
| External quantum efficiency @1000 cd/m² (%) | NA | NA | 14.5 | 18.7; 18.9; 13.0 |
| LT | LT95: 50000 h | LT50: 160000 h | NA | LT95@1000nits for 1a: ca. 9300 h[?] |
| Price (USD/g) | 350-600[b] | 100 | NA | 500-600* |

[#]Forrest et al., *Nanophotonics* 2021; 10(1): 31-40)
[b]IHS Markit2019
*Estimation in laboratory scale

TABLE 12-continued

Performance of devices containing Pt(II) complexes 1a and 2a in comparison with known red emitters, measured under the same conditions (same temperature, pressure, using the same measuring instrument and parameters, etc.).

| Phosphorescent emitter's data[#] | Fluorescent dye's data[#] | Previous dye data[−] | Current data |
|---|---|---|---|

[?]The device structure used for lifetime measurement for 1a may be different from system I and II. The value of 9300 h is estimated from the results of test conducted by the industrial partner at $L_0$ of 5000 nits (LT95 ~600 h). By using n = 1.7 as acceleration factor in formula $LT(L_1) = LT(L_0) \times (L_0/L_1)^{1.7}$ (where L+ refers to initial luminance and Li refers to desired luminance), LT95 at 1000 nits =~ 600 × (5000/1000)?1.7 = ~9255.
[−]structure of the previous dye tested:

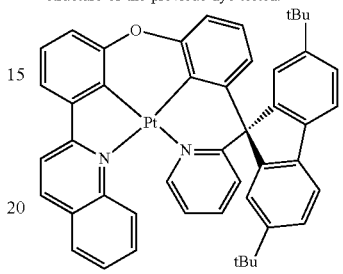

TABLE 13

Performance of commercially available OLEDs from Merck, Sumitomo, DuPont, and UDC, reported by the manufacturer and measured under the same conditions (same temperature, pressure, using the same measuring instrument and parameters, etc.).

| Red | Merck | Sumitomo | DuPont | UDC (Evaporable) |
|---|---|---|---|---|
| Efficiency (cd/A) | 23 | 24 | 22 | 29 |
| CIE (x, y) | 0.65, 0.35 | 0.66, 0.34 | 0.65, 0.35 | 0.66, 0.34 |
| LT95 at 1000 nits (hrs) | 10,000 | 5,800 | 9,500 | 23,000 |

TABLE 14

Performance of red and deep red OLEDs reported by Universal Display (web page oled-info.com/udc-pholed-material-performance-update-green-now-reaches-14-million-hours).

| PHOLED performance | 1932 CIE Color | Luminous Efficiency | Operating Lifetime (hrs) | |
|---|---|---|---|---|
| (at 1000 cd/m²) | Coordinates | (cd/A) | LT95 | LT50 |
| Deep Red | (0.69, 0.31) | 17 | 14,000 | 250,000 |
| Red | (0.66, 0.34) | 24 | 25,000 | 600,000 |
| Red | (0.64, 0.36) | 30 | 50,000 | 900,000 |

TABLE 15

Performance data of vapor-deposited devices with 1c at doping concentration of 4-16 wt %.

| | L | CE [cd A$^{-1}$] | | PE [lm W$^{-1}$] | | EQE [%] | | | | |
|---|---|---|---|---|---|---|---|---|---|---|
| 1c conc. | [cd m$^{-2}$] | Max | at 1000 cd m$^{-2}$ | Max | at 1000 cd m$^{-2}$ | Max | at 1000 cd m$^{-2}$ | CIE [(x, y)] | FWHM [nm] | $\lambda_{max}$ [nm] |
| 4 wt % | 34400 | 23.2 | 20.2 | 22.9 | 4.48 | 16.1 | 14.1 | 0.63, 0.37 | 82 | 624 |
| 8 wt % | 41200 | 22.2 | 18.9 | 18.9 | 4.31 | 17.0 | 14.4 | 0.64, 0.36 | 83 | 627 |
| 16 wt % | 46000 | 20.9 | 17.9 | 17.9 | 4.38 | 17.0 | 14.3 | 0.64, 0.36 | 85 | 632 |

TABLE 16

Performance data of vapor-deposited devices with 2b' at doping concentration of 4-16 wt %.

| 2b' conc. | L [cd m$^{-2}$] Max | CE [cd A$^{-1}$] Max | CE at 1000 cd m$^{-2}$ | PE [lm W$^{-1}$] Max | PE at 1000 cd m$^{-2}$ | EQE [%] Max | EQE at 1000 cd m$^{-2}$ | CIE [(x, y)] | FWHM [nm] | $\lambda_{max}$ [nm] |
|---|---|---|---|---|---|---|---|---|---|---|
| 4 wt % | 9640 | 3.17 | 1.87 | 3.83 | 0.78 | 14.1 | 8.1 | 0.69, 0.31 | 96 | 686 |
| 8 wt % | 10810 | 2.92 | 1.92 | 3.26 | 0.82 | 16.4 | 9.3 | 0.69, 0.31 | 96 | 689 |
| 16 wt % | 11300 | 2.50 | 1.98 | 2.45 | 0.84 | 14.9 | 11.5 | 0.70, 0.30 | 99 | 692 |

TABLE 17

Lifetime measurement data for OLED containing 1b (the luminance intensity at which LT is measured refers to L$_0$)

| 1b conc. | L$_0$ (cd m$^{-2}$) | LT97 (h) | LT95 (h) |
|---|---|---|---|
| 8 wt % | 5000 | 2.9 | 6.2 |

TABLE 18

Lifetime measurement data for OLED containing 1c (the luminance intensity at which LT is measured refers to L$_0$)

| 1c conc. | L$_0$ (cd m$^{-2}$) | LT97 (h) | LT95 (h) |
|---|---|---|---|
| 4 wt % | 14400 | 4.3 | 17.5 |

TABLE 19

Lifetime measurement data for OLED containing 2b' (the luminance intensity at which LT is measured refers to L$_0$)

| 2b' conc. | L$_0$ (cd m$^{-2}$) | LT97 (h) | LT95 (h) |
|---|---|---|---|
| 4 wt % | 2600 | 54.5 | 125.2 |

We claim:

1. A platinum (II) complex having a structure:

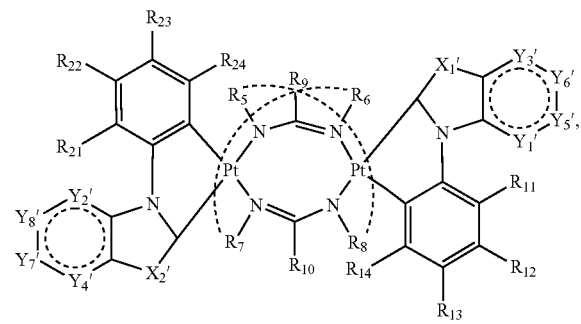

Formula III'

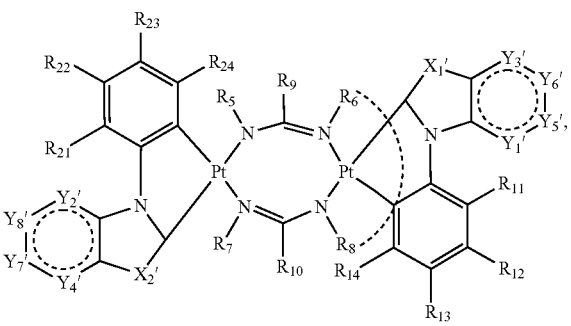

Formula III''

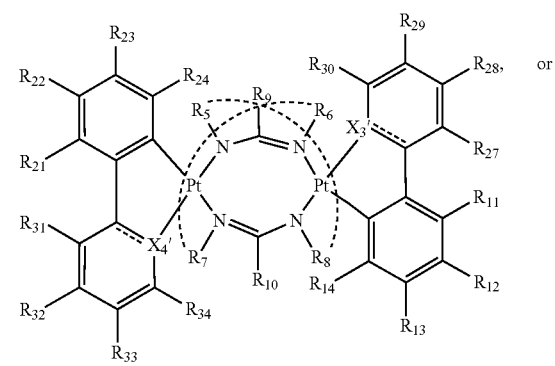

Formula IV

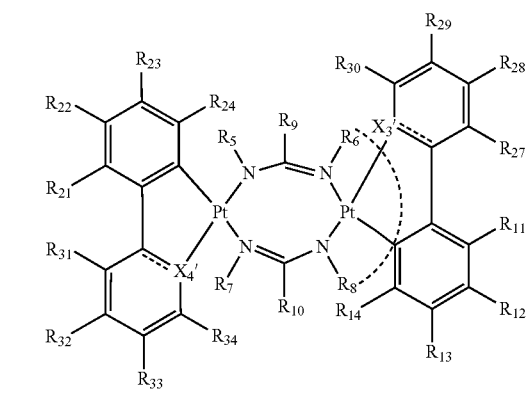

Formula IV' wherein:

(a) $R_5$, $R_6$, $R_7$, and $R_8$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy;

(b) $R_9$ and $R_{10}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol;

(c) when present $R_{11}$-$R_{14}$, $R_{21}$-$R_{24}$ and $R_{27}$-$R_{34}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol, and optionally $R_{11}$ and $R_{12}$ together, $R_{12}$ and $R_{13}$ together, $R_{13}$ and $R_{14}$ together, $R_{21}$ and $R_{22}$ together, $R_{22}$ and $R_{23}$ together, $R_{23}$ and $R_{24}$ together, $R_{27}$ and $R_{28}$ together, $R_{28}$ and $R_{29}$ together, $R_{29}$ and $R_{30}$ together, $R_{31}$ and $R_{32}$ together, $R_{32}$ and $R_{33}$ together, and/or $R_{33}$ and $R_{34}$ together form a substituted or unsubstituted aryl, a substituted or unsubstituted polyaryl, a substituted or unsubstituted heteroaryl, a substituted or unsubstituted polyheteroaryl, a substituted or unsubstituted cycloalkyl, a substituted or unsubstituted cycloalkenyl, a substituted or unsubstituted cycloalkynyl, or a substituted or unsubstituted heterocyclyl;

(d) each ------ is independently absent, a bond, a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether;

(e) $X_1'$-$X_4'$ and $Y_1'$-$Y_8'$ are independently O, S, $CR_{15}$, or $NR_{18}$, $R_{15}$ and $R_{18}$ are independently absent, hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol;

(f) the substituents are independently a substituted or unsubstituted alkyl, a substituted or unsubstituted alkenyl, a substituted or unsubstituted alkynyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, a substituted or unsubstituted aralkyl, a substituted or unsubstituted carbonyl, a substituted or unsubstituted alkoxy, a halogen, a hydroxyl, a phenoxy, an aroxy, an alkylthio, a phenylthio, an arylthio, a cyano, an isocyano, a nitro, an carboxyl, an amino, an amido, an oxo, a silyl, a sulfinyl, a sulfonyl, a sulfonic acid, a phosphonium, a phosphanyl, a phosphoryl, a phosphonyl, or a thiol, or a combination thereof, and (g) wherein at least one of $Y_1'$-$Y_4'$ is $NR_{18}$.

2. The platinum (II) complex of claim 1 having a structure:

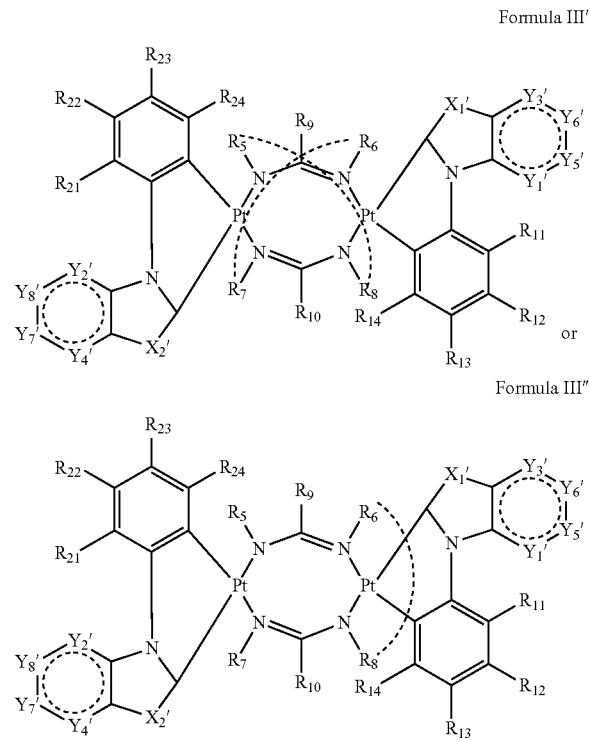

wherein:

(a) $R_5$, $R_6$, $R_7$, and $R_8$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy;

(b) $R_9$ and $R_{10}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol;

(c) $R_{11}$-$R_{14}$ and $R_{21}$-$R_{24}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol, and optionally $R_{11}$ and $R_{12}$ together, $R_{12}$ and $R_{13}$ together, $R_{13}$ and $R_{14}$ together, $R_{21}$ and $R_{22}$ together, $R_{22}$ and $R_{23}$ together, R23 and R24 together form a substituted or unsubstituted aryl, a substituted or unsubstituted polyaryl, a substituted or unsubstituted heteroaryl, a substituted or unsubstituted polyheteroaryl, a substituted or unsubstituted cycloalkyl, a substituted or unsubstituted cycloalkenyl, a substituted or unsubstituted cycloalkynyl, or a substituted or unsubstituted heterocyclyl;

(d) each ------ is independently absent, a bond, a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether;

(e) $X_1'$, $X_2'$, $Y_1'$-$Y_8'$ are independently O, S, $CR_{15}$, or $NR_{18}$, $R_{15}$ and $R_{18}$ can are independently absent, hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol; and (f) the substituents are independently a substituted or unsubstituted alkyl, a substituted or unsubstituted alkenyl, a substituted or unsubstituted alkynyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, a substituted or unsubstituted aralkyl, a substituted or unsubstituted carbonyl, a substituted or unsubstituted alkoxy, a halogen, a hydroxyl, a phenoxy, an aroxy, an alkylthio, a phenylthio, an arylthio, a cyano, an isocyano, a nitro, an carboxyl, an amino, an amido, an oxo, a silyl, a sulfinyl, a sulfonyl, a sulfonic acid, a phosphonium, a phosphanyl, a phosphoryl, a phosphonyl, or a thiol, or a combination thereof.

3. The platinum (II) complex of claim 1 having a structure:

Formula III

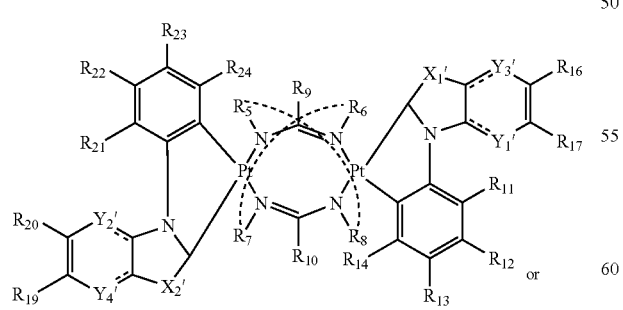

or

Formula III'''

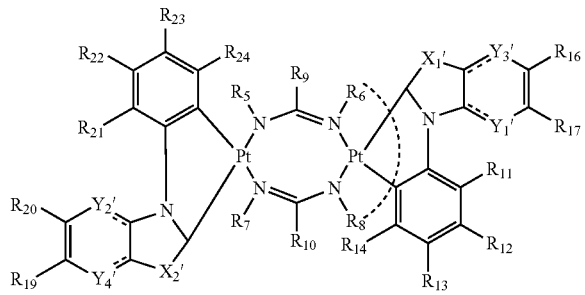

wherein:

(a) $R_5$, $R_6$, $R_7$, and $R_8$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy;

(b) $R_9$ and $R_{10}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol;

(c) $R_{11}$-$R_{14}$, $R_{16}$, $R_{17}$, and $R_{19}$-$R_{24}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol, and optionally $R_{11}$ and $R_{12}$ together, $R_{12}$ and $R_{13}$ together, $R_{13}$ and $R_{14}$ together, $R_{16}$ and $R_{17}$ together, $R_{19}$ and $R_{20}$ together, $R_{21}$ and $R_{22}$ together, $R_{22}$ and $R_{23}$ together, and/or $R_{23}$ and $R_{24}$ together form a substituted or unsubstituted aryl, a substituted or unsubstituted polyaryl, a substituted or unsubstituted heteroaryl, a substituted or unsubstituted polyheteroaryl, a substituted or unsubstituted cycloalkyl, a substituted or unsubstituted cycloalkenyl, a substituted or unsubstituted cycloalkynyl, or a substituted or unsubstituted heterocyclyl;

(d) ------ is absent, a single bond, a double bond, a triple bond, a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether;

(e) $X_1'$, $X_2'$, $Y_1'$, $Y_2'$, $Y_3'$, and $Y_4'$ are independently O, S, $CR_{15}$, or $NR_{18}$, $R_{15}$ and $R_{18}$ are independently absent, hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol; and (f) the substituents are independently a substituted or unsubstituted alkyl, a substituted or unsubstituted alkenyl, a substituted or unsubstituted alkynyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, a substituted or unsubstituted aralkyl, a substituted or unsubstituted carbonyl, a substituted or unsubstituted alkoxy, a halogen, a hydroxyl, a phenoxy, an aroxy, an alkylthio, a phenylthio, an arylthio, a cyano, an isocyano, a nitro, an carboxyl, an amino, an amido, an oxo, a silyl, a sulfinyl, a sulfonyl, a sulfonic acid, a phosphonium, a phosphanyl, a phosphoryl, a phosphonyl, or a thiol, or a combination thereof.

4. The platinum (II) complex of claim 1 having a structure:

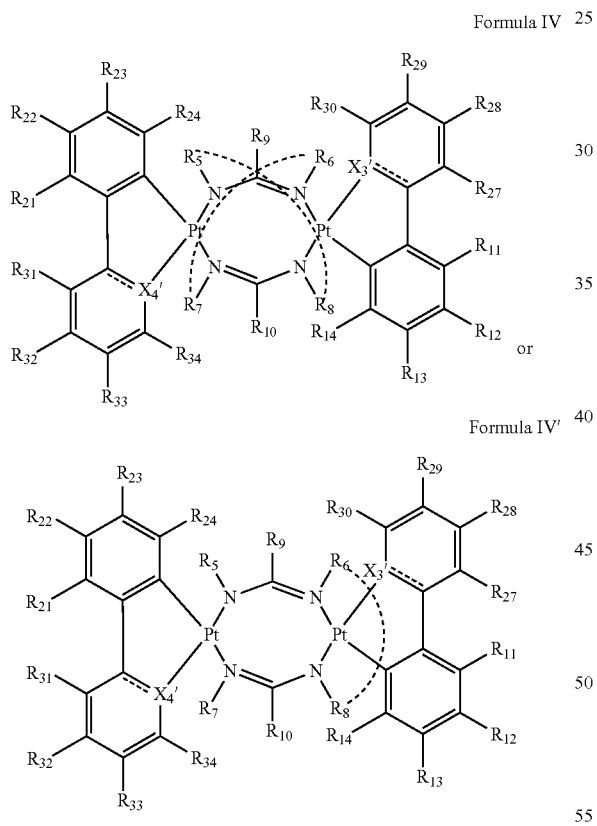

wherein:
(a) $R_5$, $R_6$, $R_7$, and $R_8$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, alkoxy, or aroxy;
(b) $R_9$ and $R_{10}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol;

(c) $R_{11}$-$R_{14}$, $R_{21}$-$R_{24}$, and $R_{27}$-$R_{34}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, oxo, amino, azido, alkoxy, aroxy, cyano, isocyano, carbonyl, nitro, or thiol, and optionally $R_{11}$ and $R_{12}$ together, $R_{12}$ and $R_{13}$ together, $R_{13}$ and $R_{14}$ together, $R_{21}$ and $R_{22}$ together, $R_{22}$ and $R_{23}$ together, $R_{23}$ and $R_{24}$, $R_{27}$ and $R_{28}$ together, $R_{28}$ and $R_{29}$ together, $R_{29}$ and $R_{30}$ together, $R_{31}$ and $R_{32}$ together, $R_{32}$ and $R_{33}$ together, and/or $R_{33}$ and $R_{34}$ together, form a substituted or unsubstituted aryl, a substituted or unsubstituted polyaryl, a substituted or unsubstituted heteroaryl, a substituted or unsubstituted polyheteroaryl, a substituted or unsubstituted cycloalkyl, a substituted or unsubstituted cycloalkenyl, a substituted or unsubstituted cycloalkynyl, or a substituted or unsubstituted heterocyclyl;

(d) ------ is absent, a single bond, a double bond, a triple bond, a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether;

(e) $X_3'$ and $X_4'$ are independently $CR_{25}$ or $NR_{26}$, $R_{25}$ and $R_{26}$ are independently absent, hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol; and (f) the substituents are independently a substituted or unsubstituted alkyl, a substituted or unsubstituted alkenyl, a substituted or unsubstituted alkynyl, a substituted or unsubstituted heterocyclyl, a substituted or unsubstituted aryl, a substituted or unsubstituted heteroaryl, a substituted or unsubstituted polyaryl, a substituted or unsubstituted polyheteroaryl, a substituted or unsubstituted aralkyl, a substituted or unsubstituted carbonyl, a substituted or unsubstituted alkoxy, a halogen, a hydroxyl, a phenoxy, an aroxy, an alkylthio, a phenylthio, an arylthio, a cyano, an isocyano, a nitro, an carboxyl, an amino, an amido, an oxo, a silyl, a sulfinyl, a sulfonyl, a sulfonic acid, a phosphonium, a phosphanyl, a phosphoryl, a phosphonyl, or a thiol, or a combination thereof.

5. The platinum (II) complex of claim 4, wherein $X_3'$ and $X_4'$ are independently $CR_{25}$ or $NR_{26}$, $R_{25}$ and $R_{26}$ are independently absent, hydrogen, substituted or unsubstituted alkyl, substituted or unsubstituted aryl.

6. The platinum (II) complex of claim 4, wherein $R_{27}$-$R_{34}$ are independently hydrogen, substituted or unsubstituted alkyl, substituted or unsubstituted aryl, substituted or unsubstituted heteroaryl, substituted or unsubstituted heterocyclyl, or hydroxyl.

7. The platinum (II) complex of claim 1 wherein $R_9$ and $R_{10}$ are independently hydrogen or substituted or unsubstituted alkyl.

8. The platinum (II) complex of claim 1, wherein $R_{11}$, $R_{12}$, $R_{21}$, $R_{22}$ are hydrogen or $R_{11}$ and $R_{12}$ together forms and/or $R_{21}$ and $R_{22}$ together forms Formula V

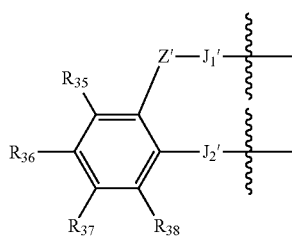

wherein:
(a) Z' is O, S, $CR_{39}$, or $NR_{40}$, $R_{39}$ and $R_{40}$ are independently absent, hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol;
(b) $J_1'$ and $J_2'$ are independently

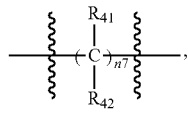

$R_{41}$ and $R_{42}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol, and optionally $J_1'$ and $J_2'$ together form a substituted or unsubstituted cycloalkyl, a substituted or unsubstituted cycloalkenyl, or a substituted or unsubstituted cycloalkynyl;
(c) n7 is an integer from 0 to 4; and
(d) $R_{35}$-$R_{38}$ are independently hydrogen, substituted or unsubstituted alkyl, substituted or unsubstituted alkenyl, substituted or unsubstituted alkynyl, substituted or unsubstituted aryl, substituted or unsubstituted polyaryl, substituted or unsubstituted heteroaryl, substituted or unsubstituted polyheteroaryl, substituted or unsubstituted heterocyclyl, halogen, hydroxyl, amino, azido, alkoxy, aroxy, cyano, isocyano, carbonyl, nitro, or thiol.

9. The platinum (II) complex of claim 8, wherein n7 and n8 are 0 and Z' is O, S, or $NR_{40}$, each occurrence of $R_{40}$ is independently hydrogen, substituted or unsubstituted alkyl, substituted or unsubstituted aryl, substituted or unsubstituted heteroaryl, substituted or unsubstituted heterocyclyl, or hydroxyl.

10. The platinum (II) complex of claim 8, wherein $R_{35}$-$R_{38}$ are independently hydrogen, substituted or unsubstituted alkyl, substituted or unsubstituted aryl, substituted or unsubstituted heteroaryl, substituted or unsubstituted polyheteroaryl, or substituted or unsubstituted heterocyclyl, hydroxyl, alkoxy, or aroxy.

11. The platinum (II) complex of claim 1, wherein the ----- between $R_5$ and $R_8$, between $R_6$ and $R_7$, between $R_5$ and $R_7$, and/or between $R_6$ and $R_8$ is absent or wherein

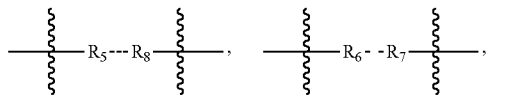

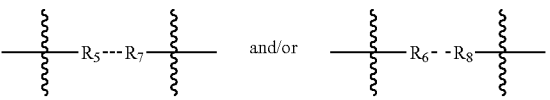

have a structure:

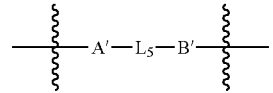

wherein:
(a) A' and B' are independently substituted or unsubstituted cycloalkyl, substituted or unsubstituted cycloalkenyl, substituted or unsubstituted cycloalkynyl, substituted or unsubstituted aryl, substituted or unsubstituted polyaryl, substituted or unsubstituted heteroaryl, substituted or unsubstituted polyheteroaryl, or substituted or unsubstituted heterocyclyl; and
(b) each occurrence of $L_5$ is independently ether, polyether, alkoxyl, sulfonyl, thioether, substituted or unsubstituted heterocyclyl, substituted or unsubstituted aryl, substituted or unsubstituted alkyl, substituted or unsubstituted alkenyl, or substituted or unsubstituted alkynyl.

12. The platinum (II) complex of claim 11, wherein A' and B' are independently substituted or unsubstituted aryl or substituted or unsubstituted polyaryl; and $L_5$ has a structure:

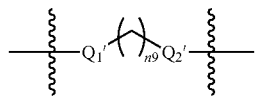

wherein:
(a) $Q_1'$ and $Q_2'$ are independently absent, O or S; and
(b) n9 is an integer from 1 to 10.

13. A platinum (II) complex having any one of the following structures:

-continued
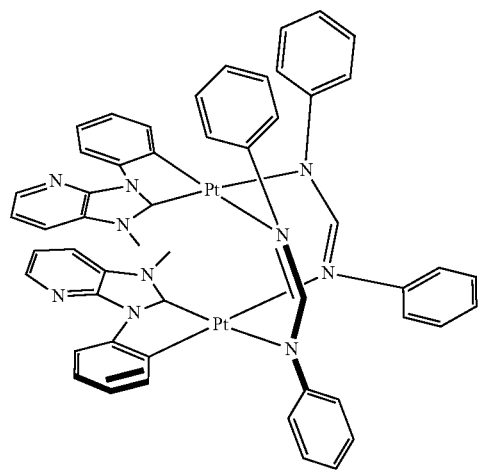
1a
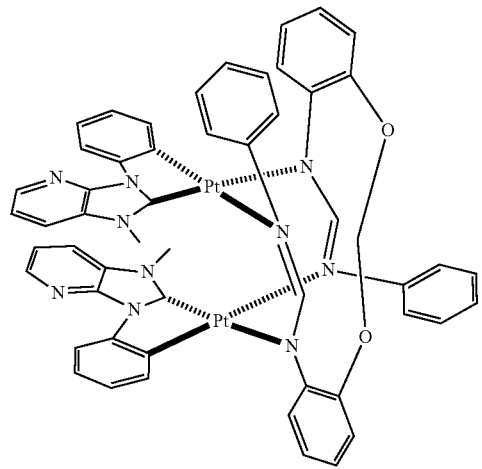
1c
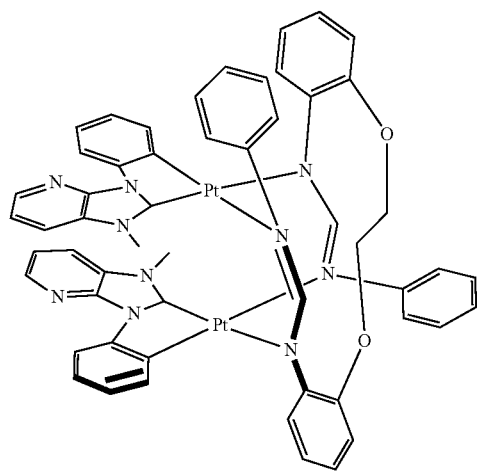
1b
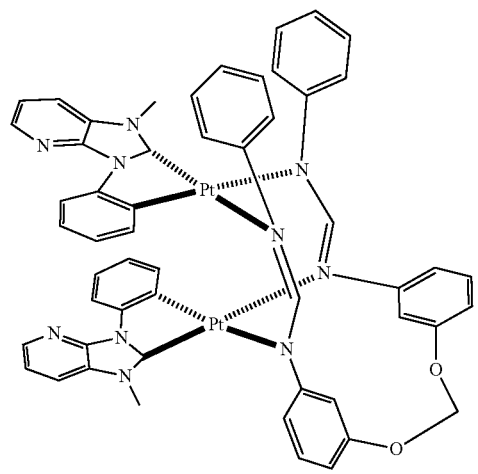
1c'
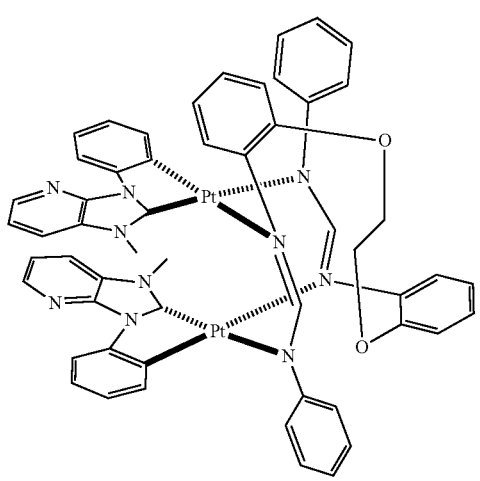
1b'
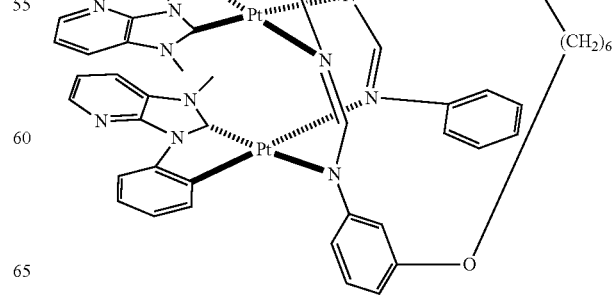
1d -continued
1d'
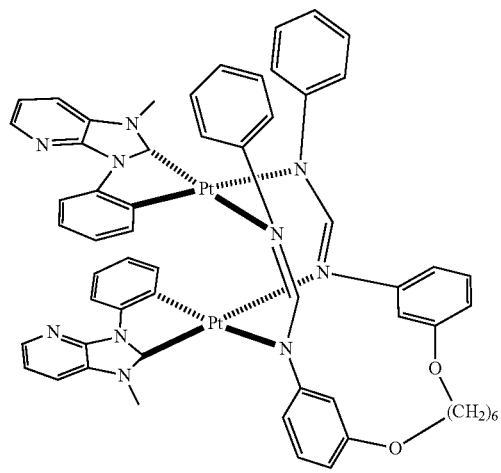
2a
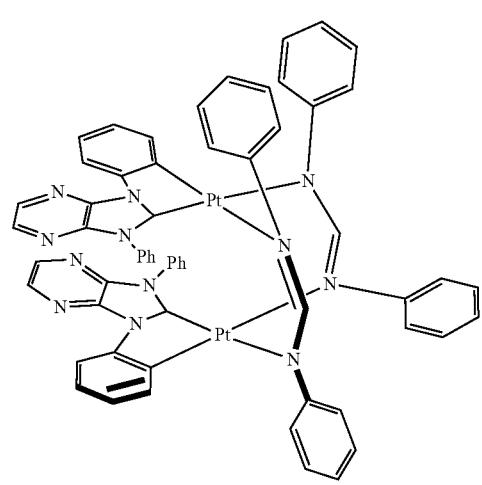
3a
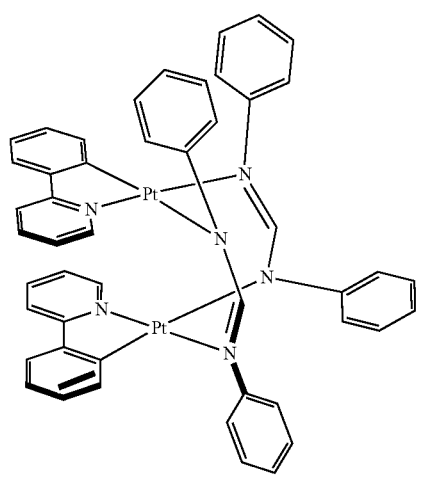
-continued
3b
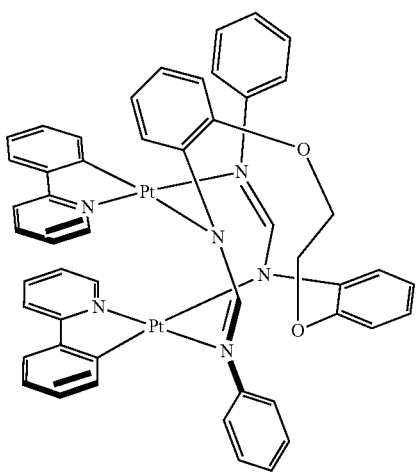
4a
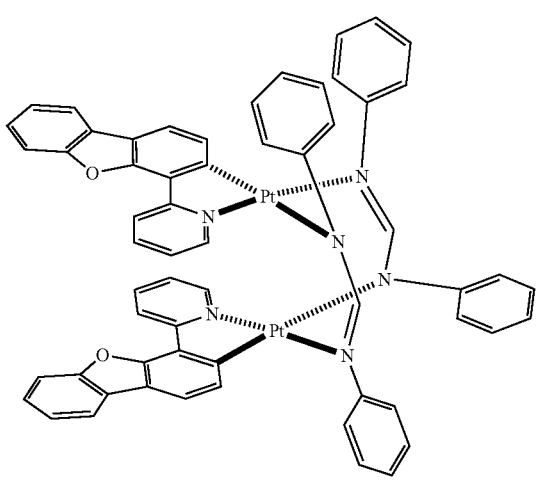
2b
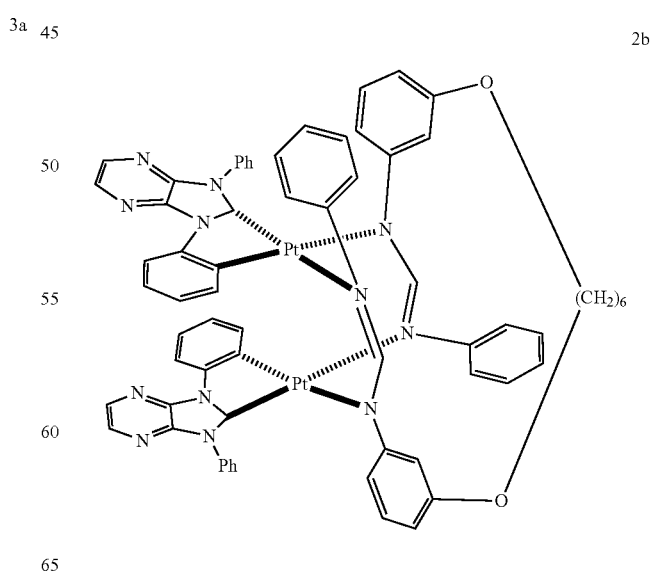

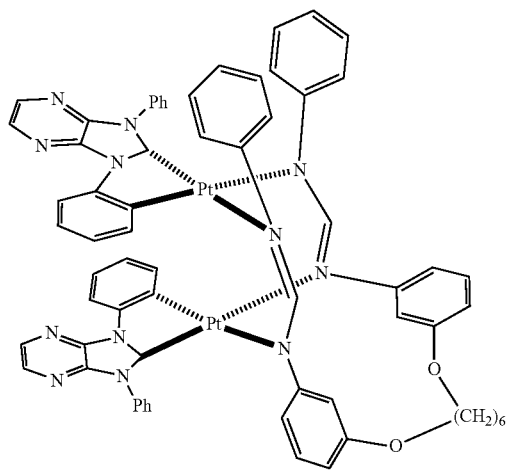
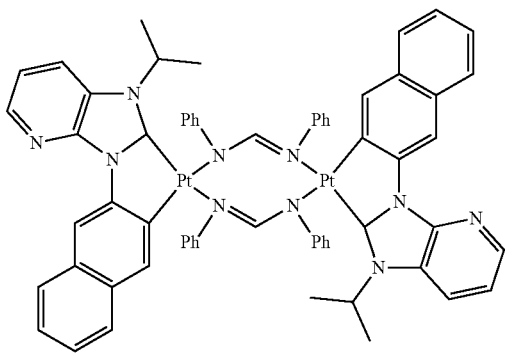
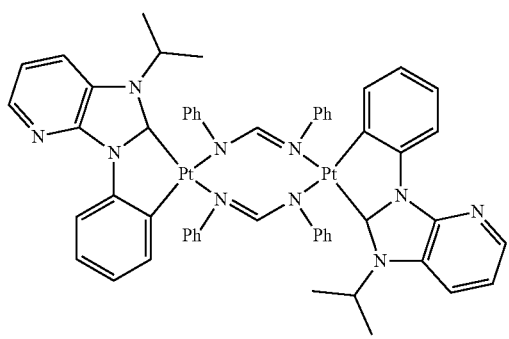
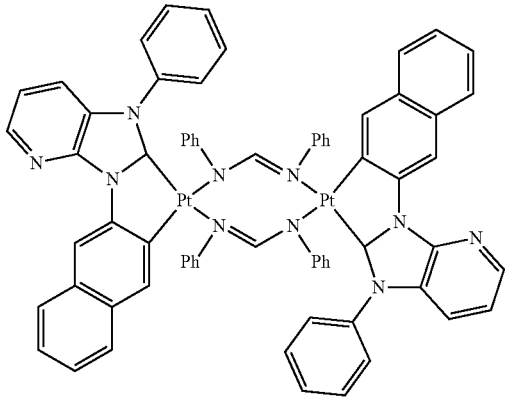
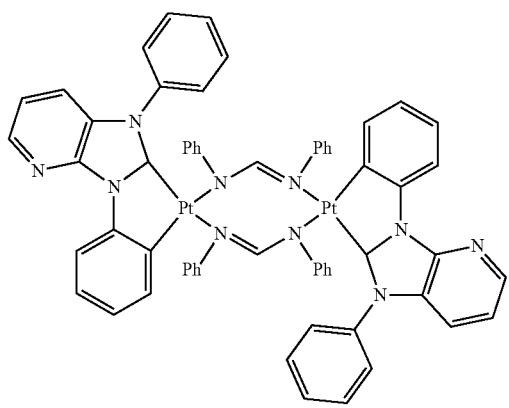
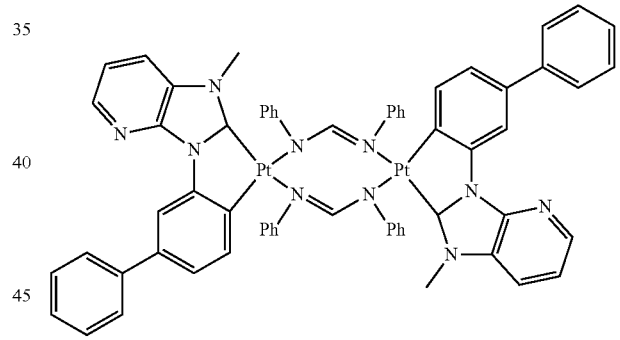
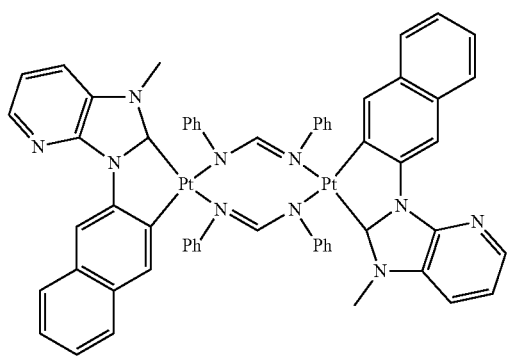
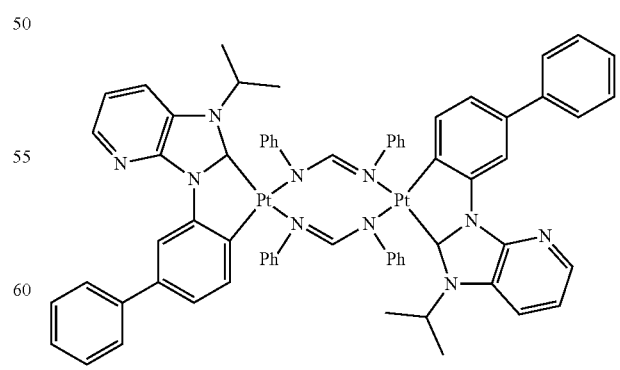

-continued
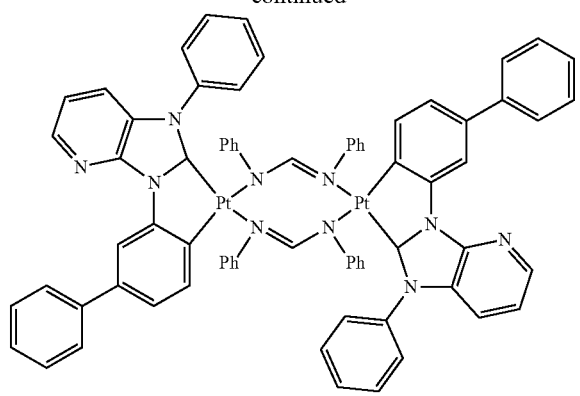
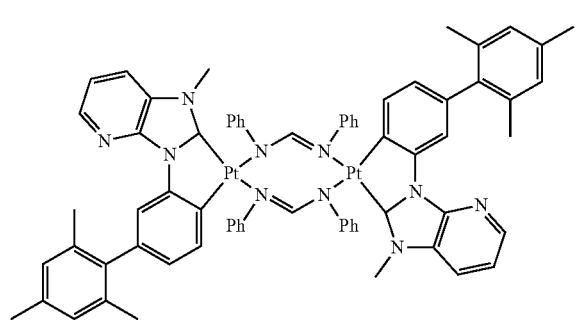
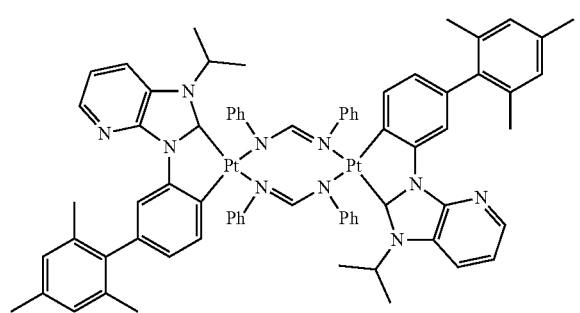
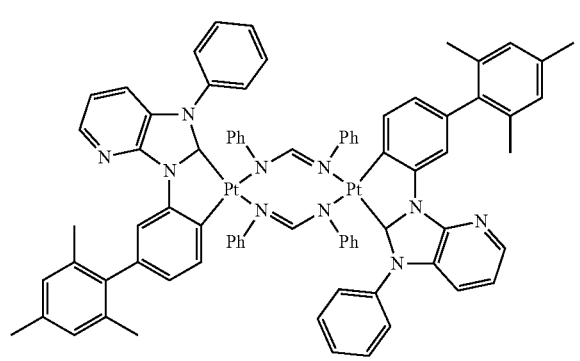
-continued
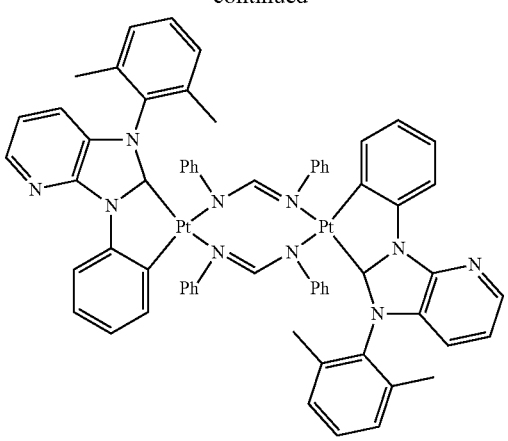
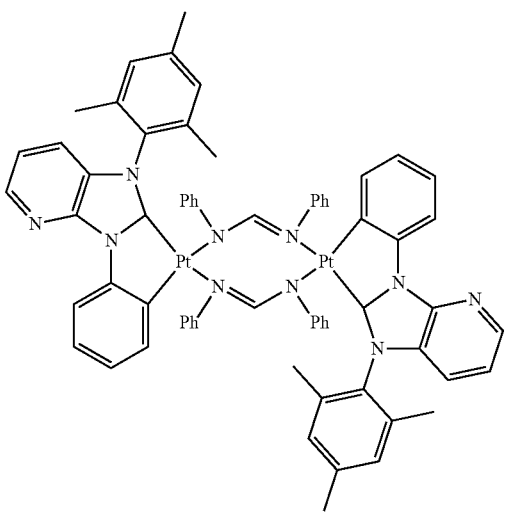
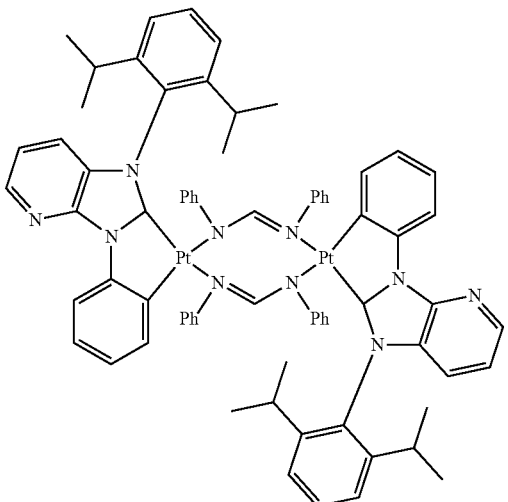
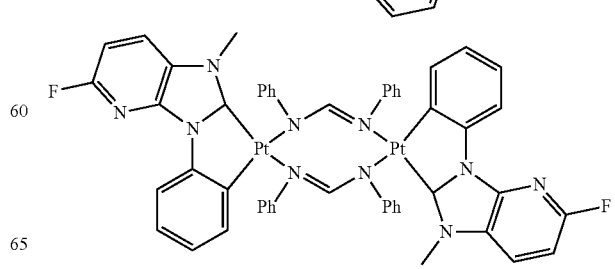

175
-continued
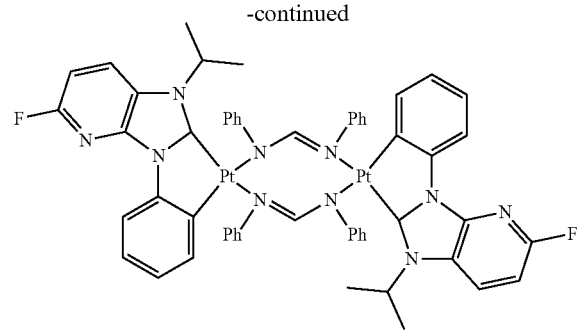
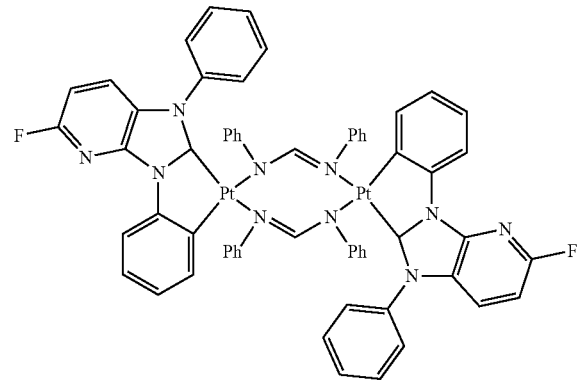
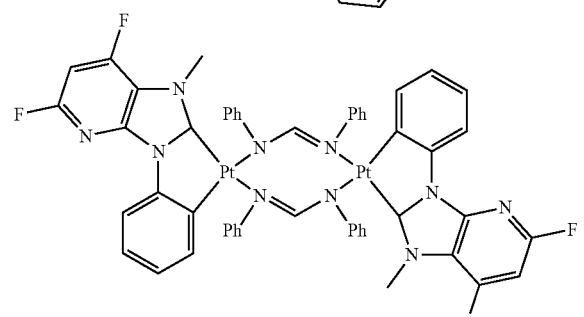
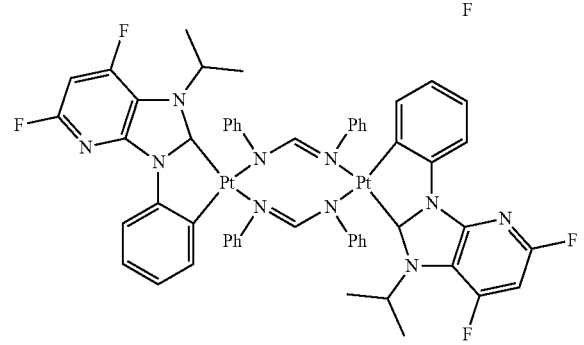
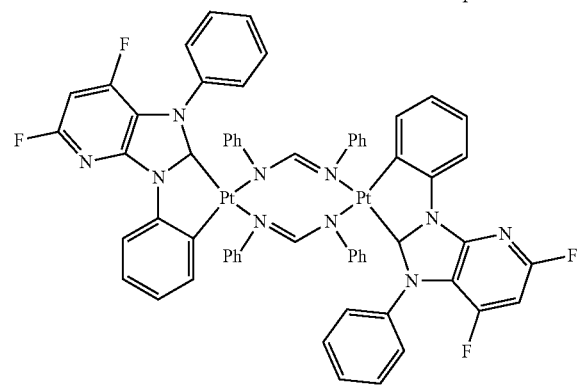
176
-continued
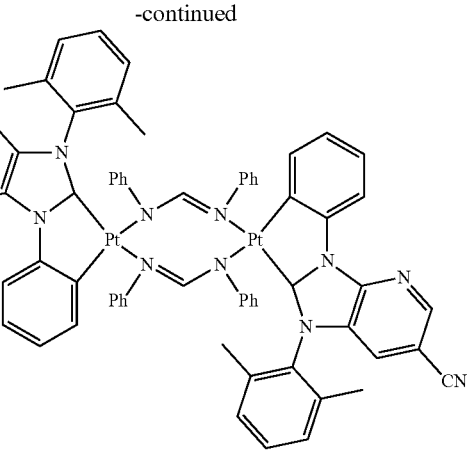
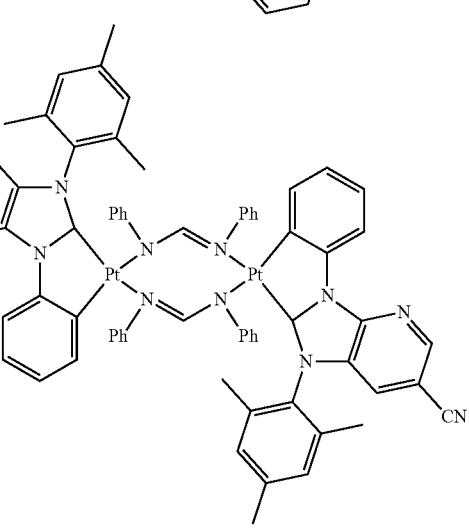
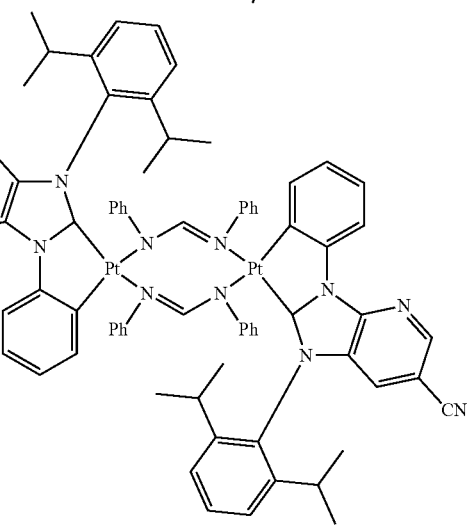
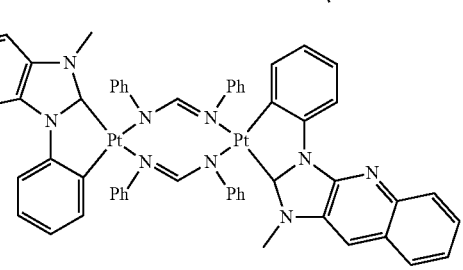

177
-continued
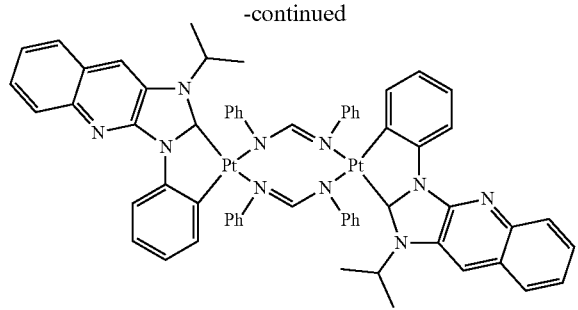
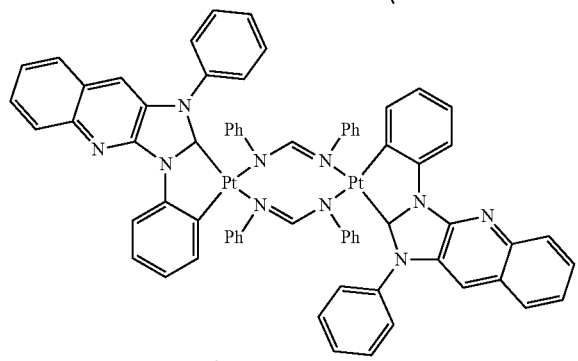
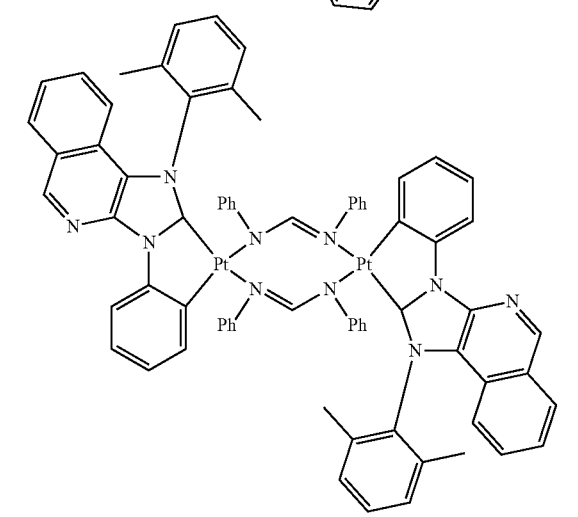
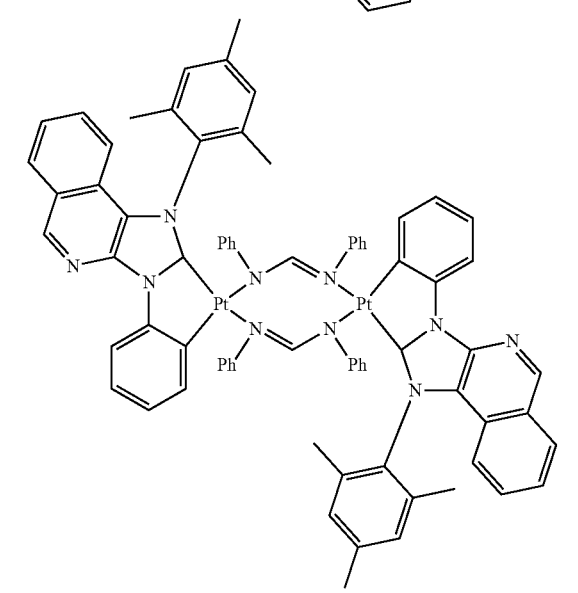
178
-continued
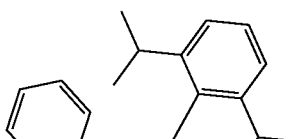
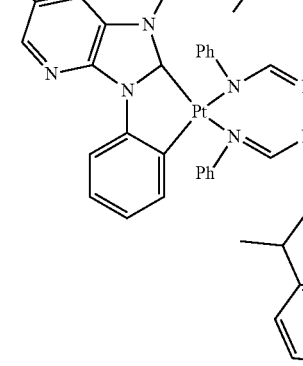
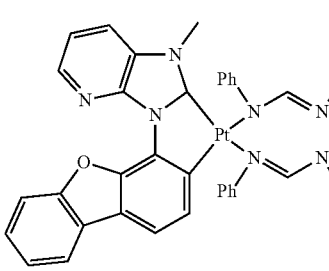
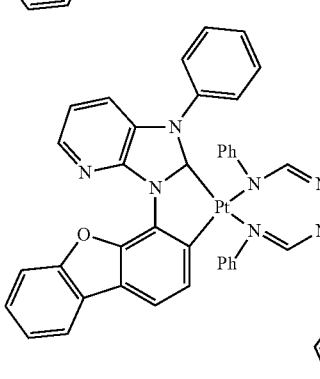
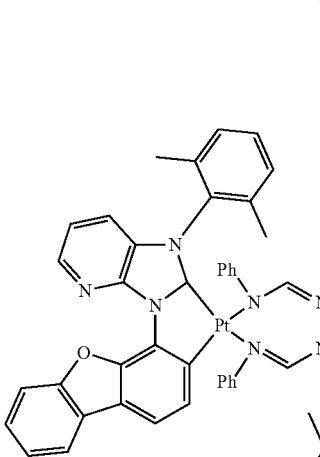

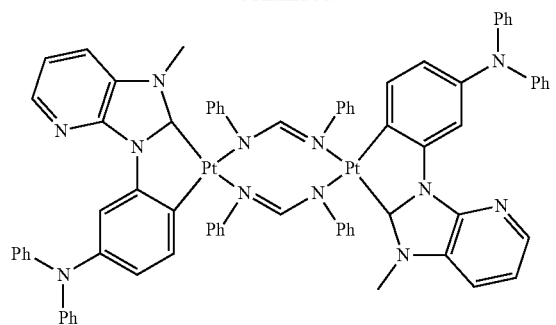
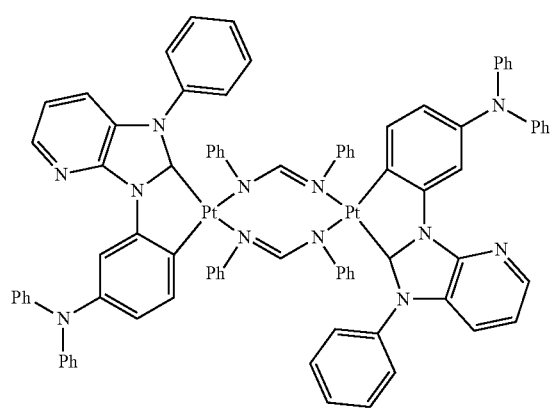
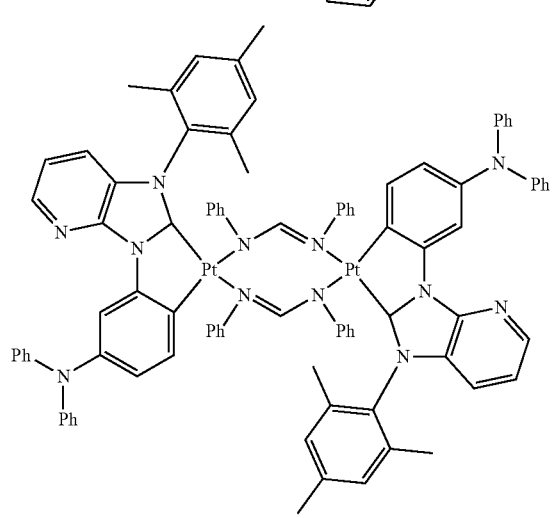
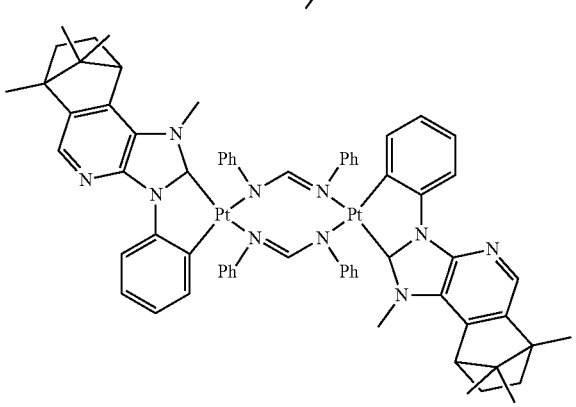
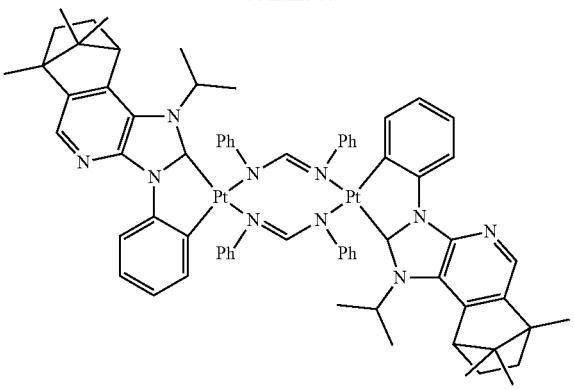
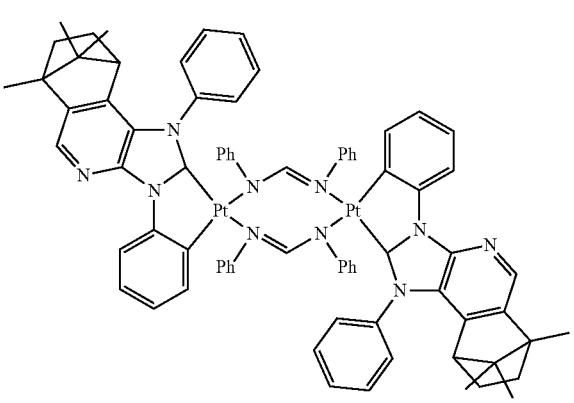
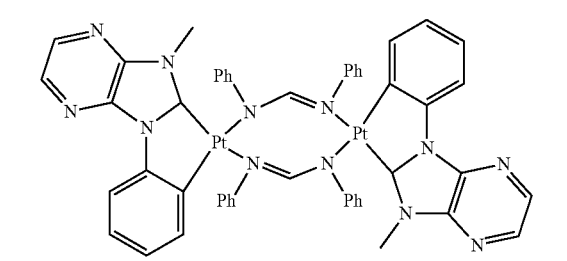
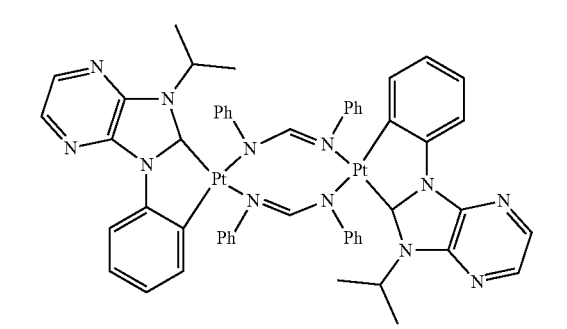

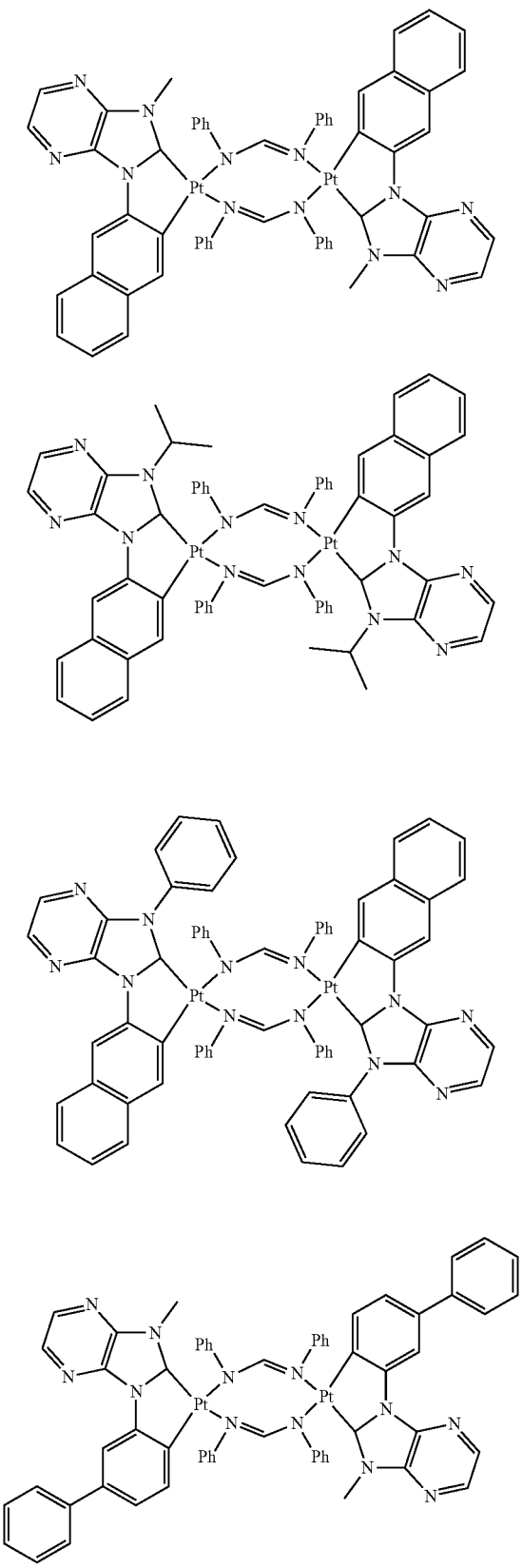
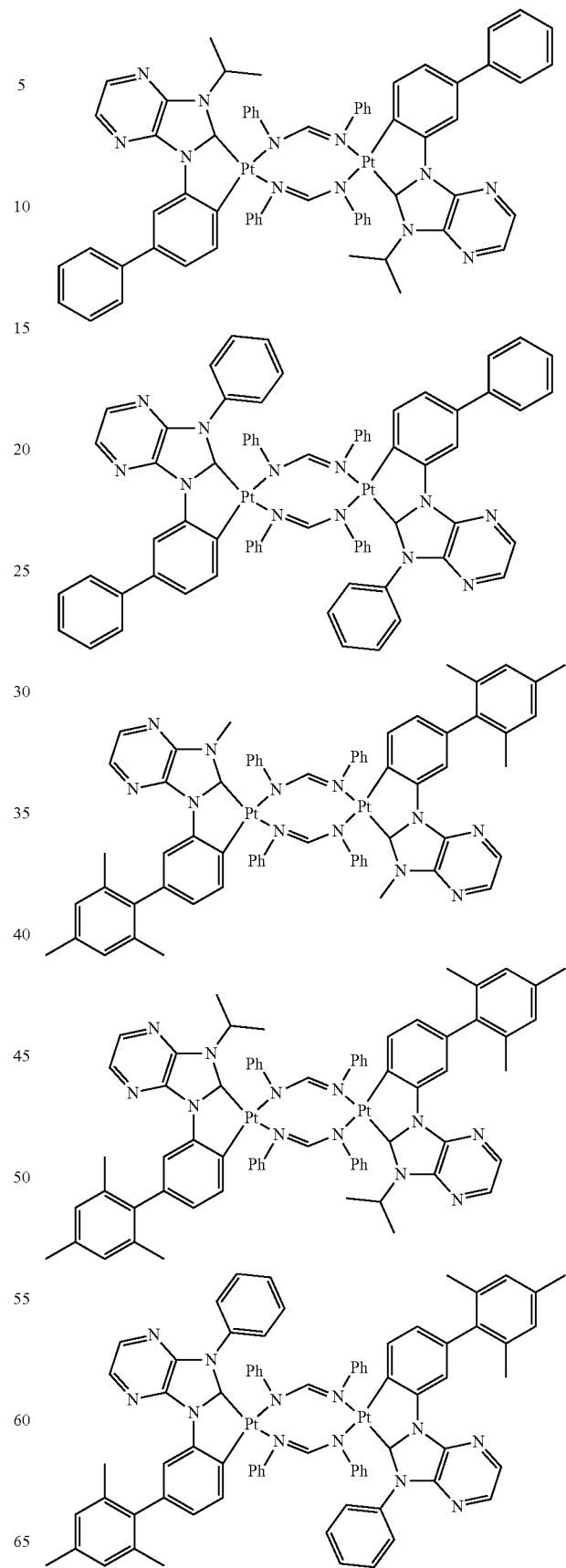

183
-continued
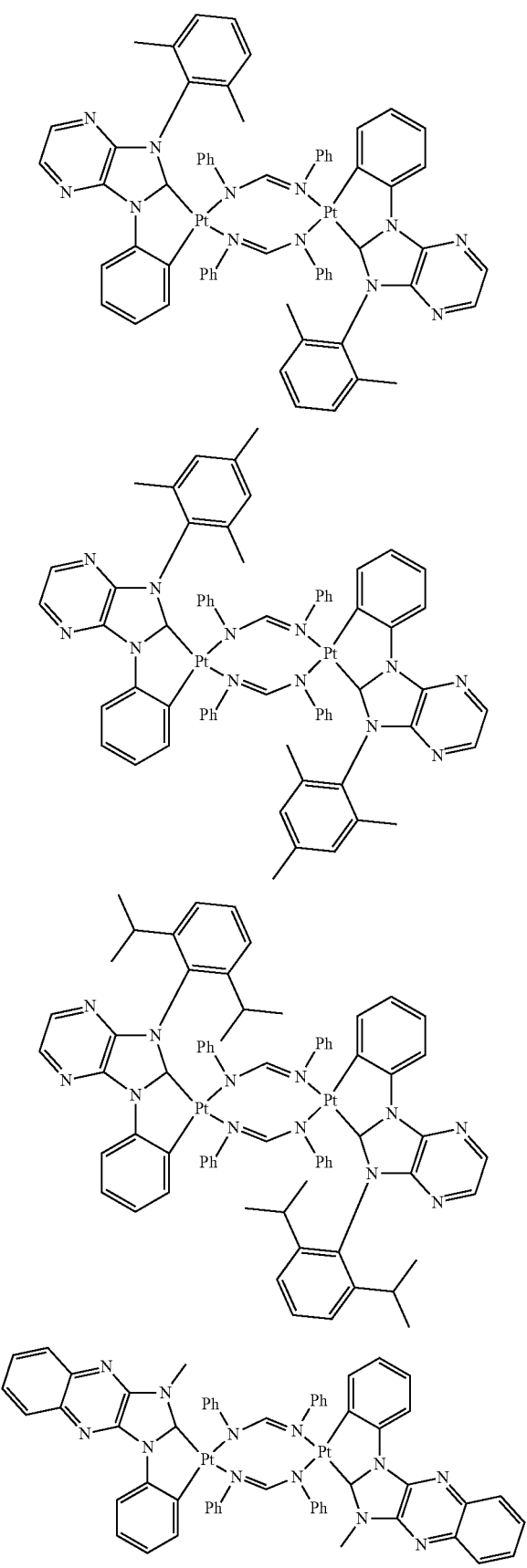
184
-continued
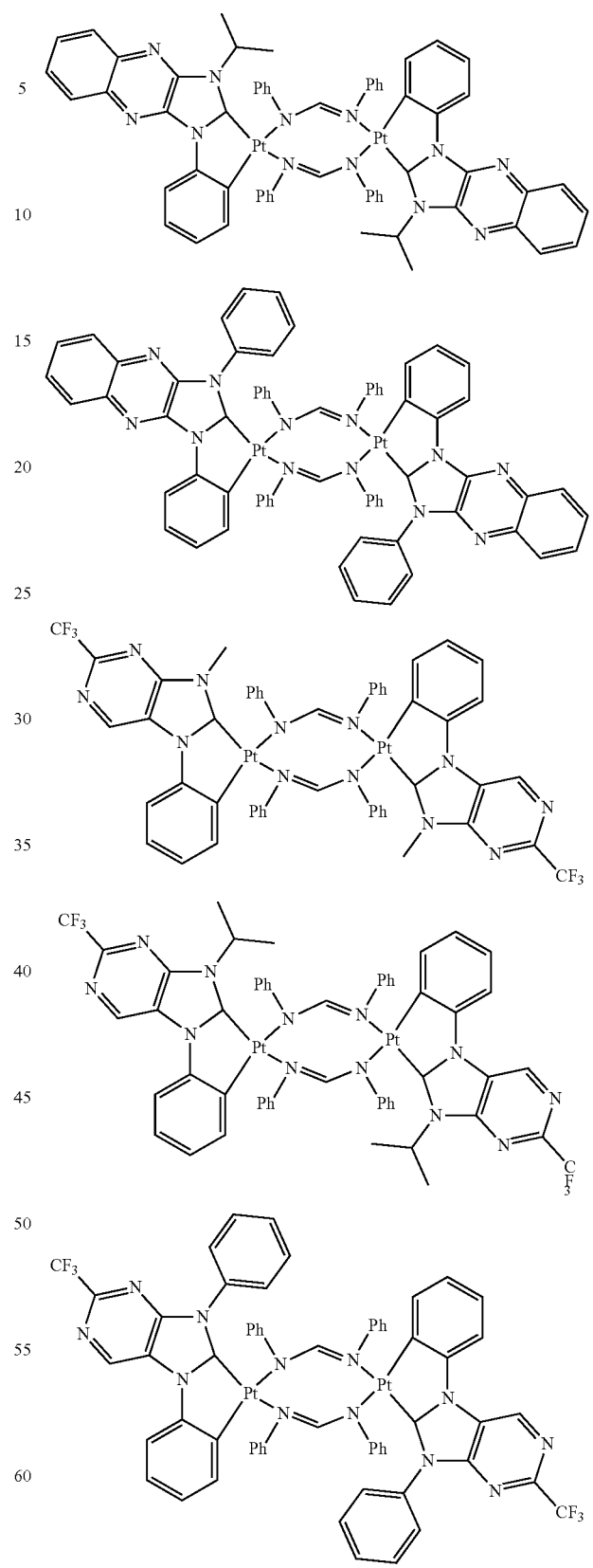

-continued
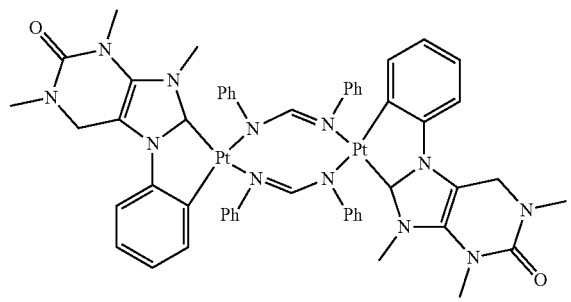
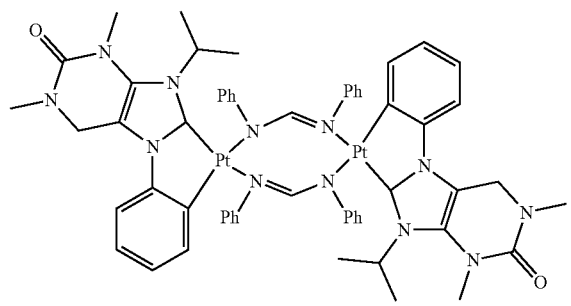
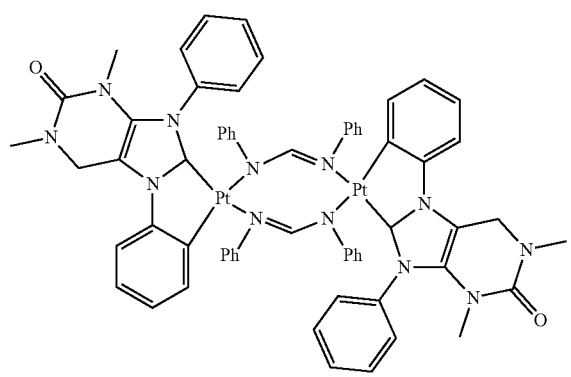
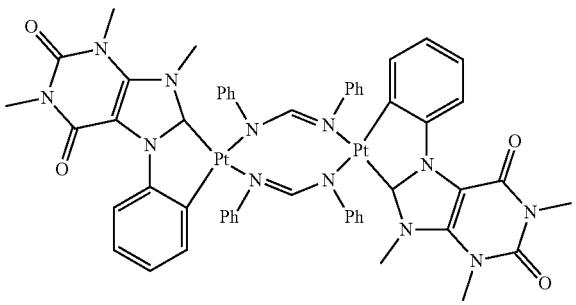
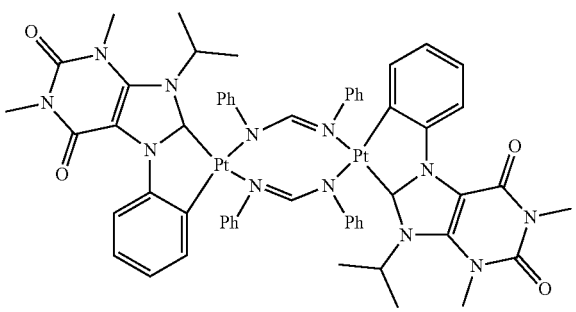
-continued
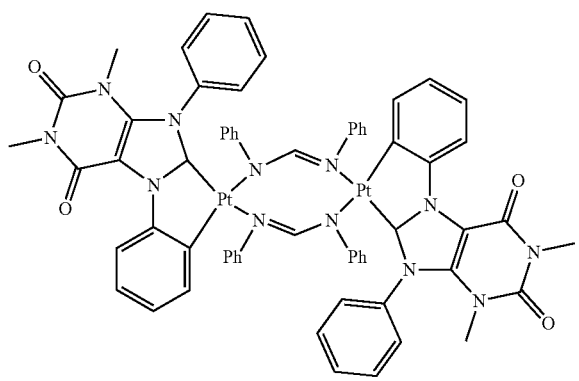
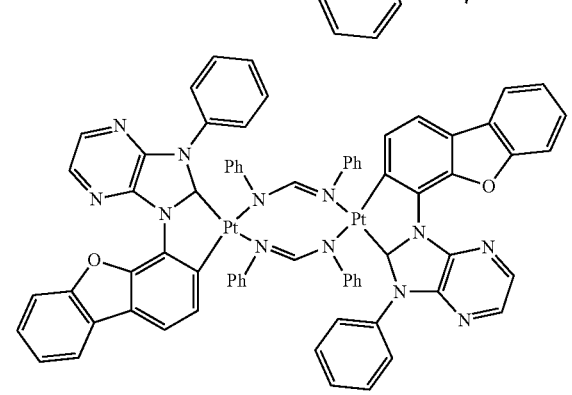
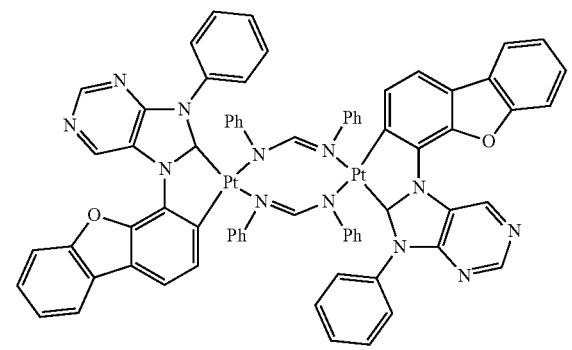
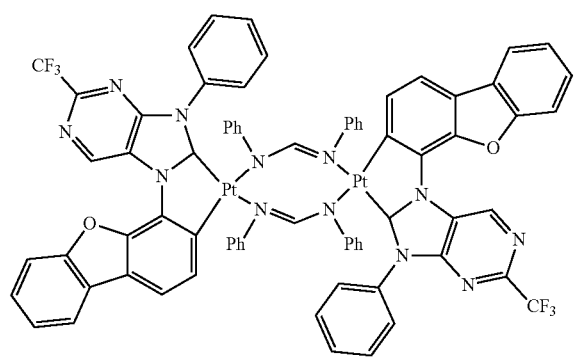

187
-continued
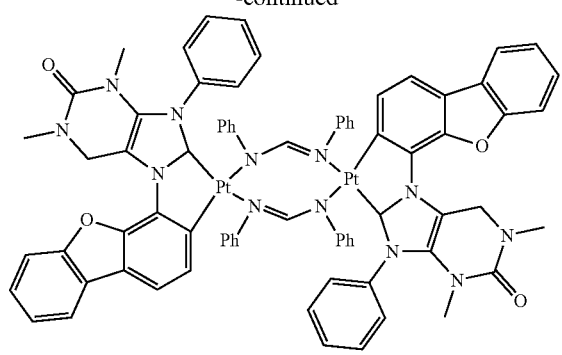
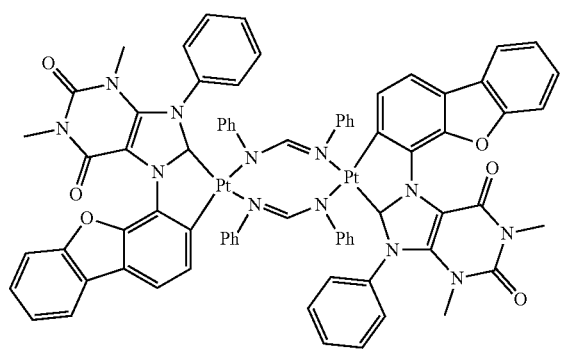
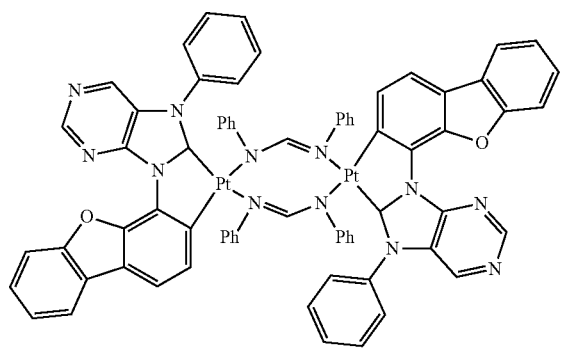
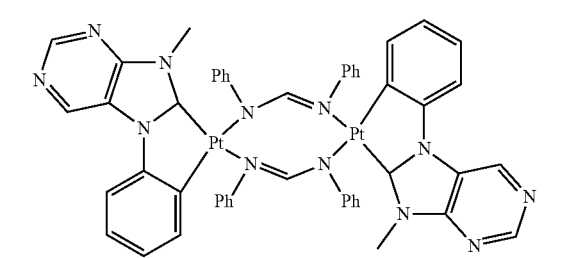
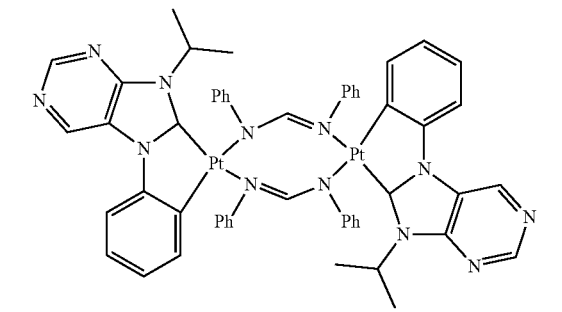
188
-continued
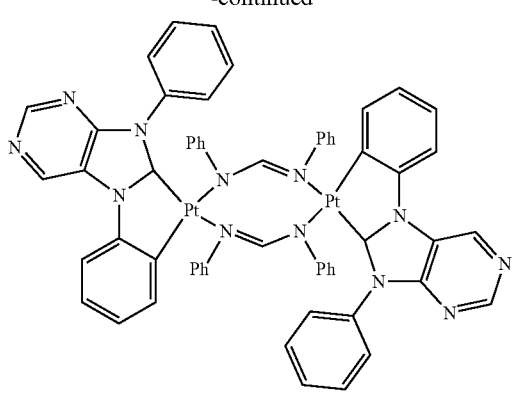
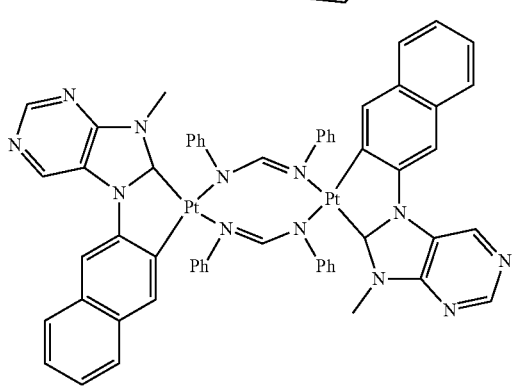
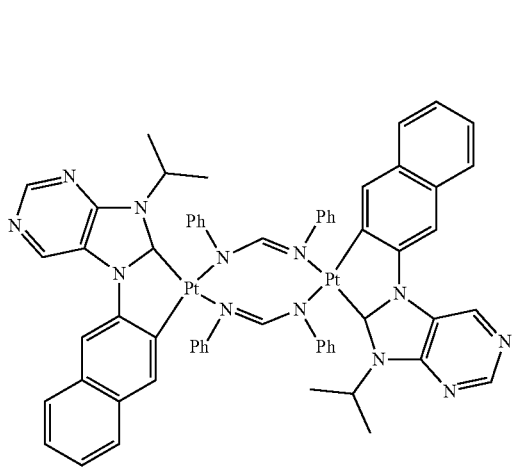
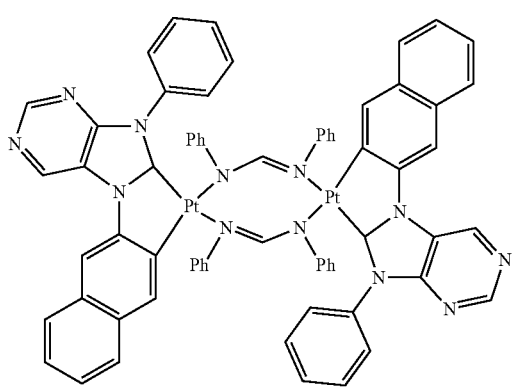

189
-continued
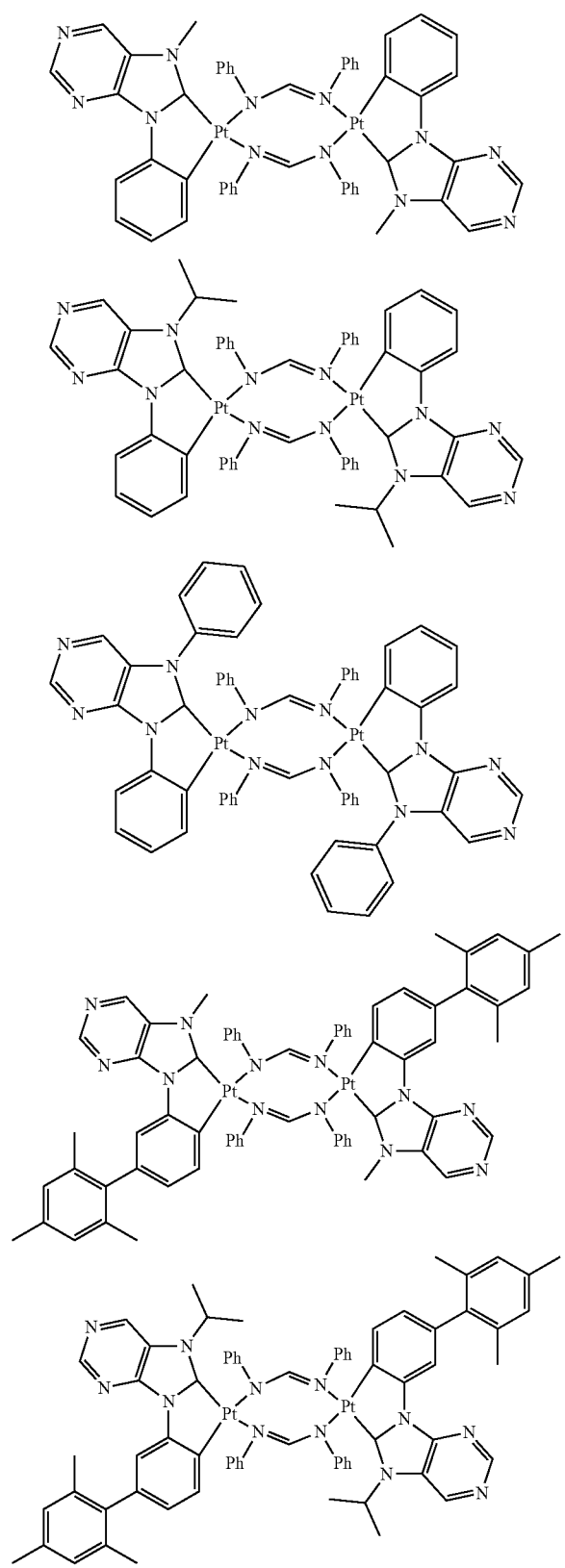
190
-continued
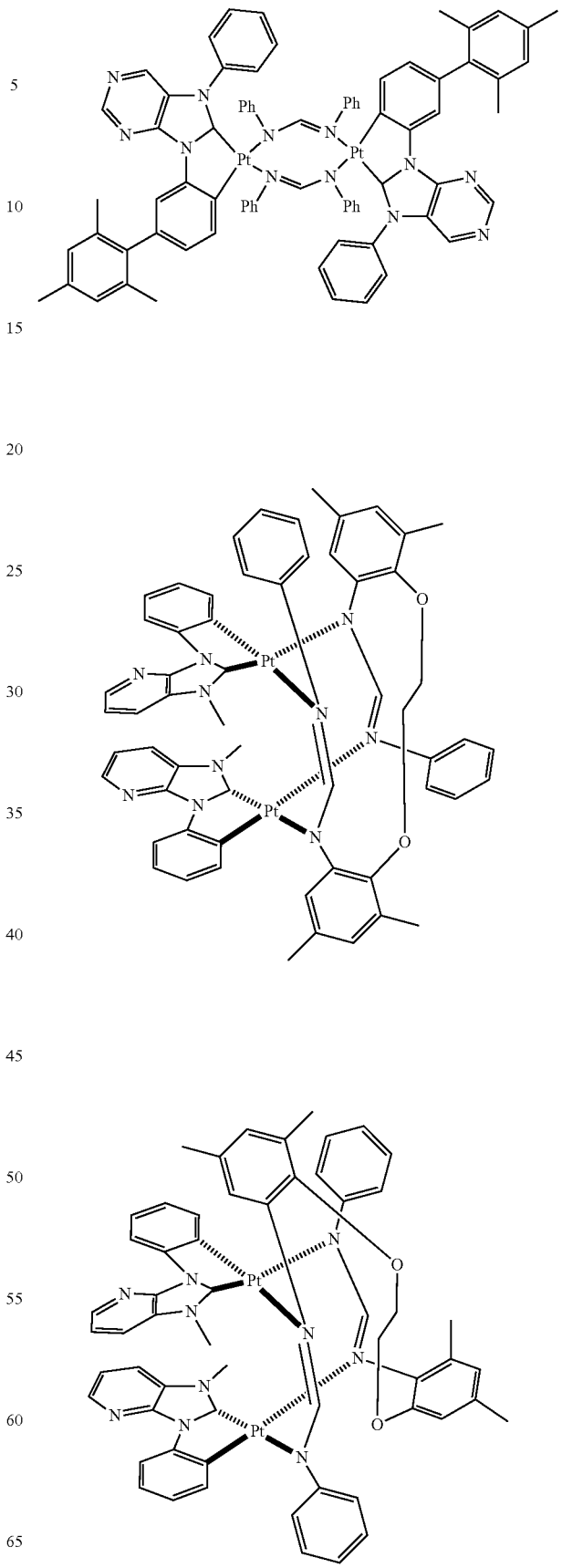

191
-continued
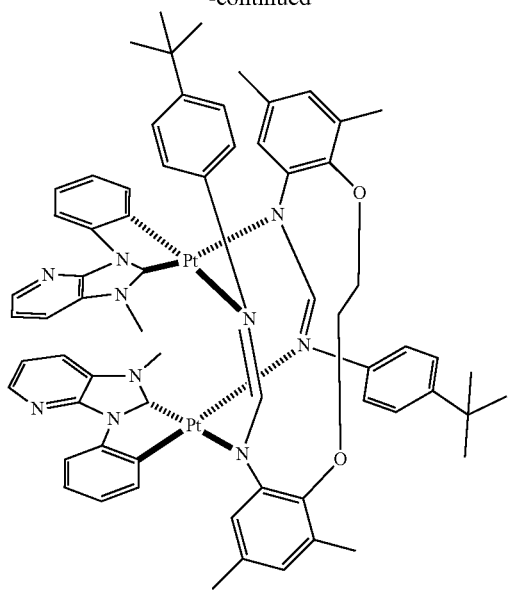
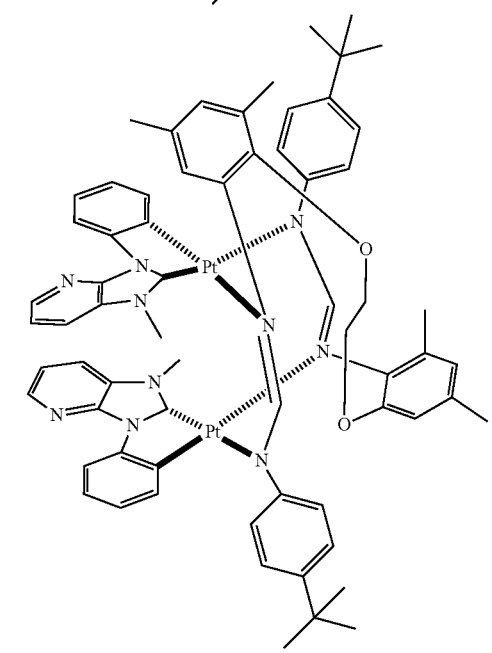
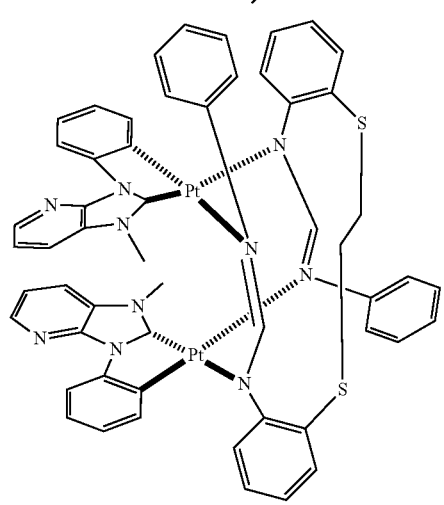
192
-continued
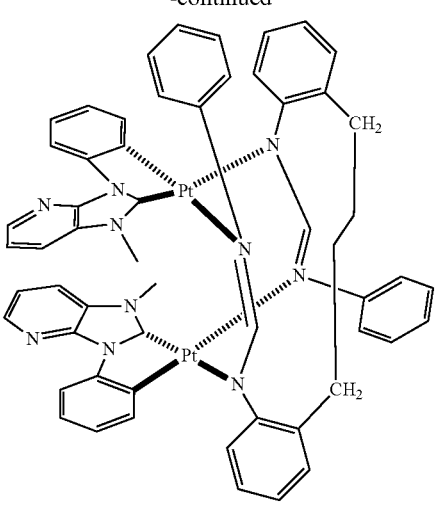
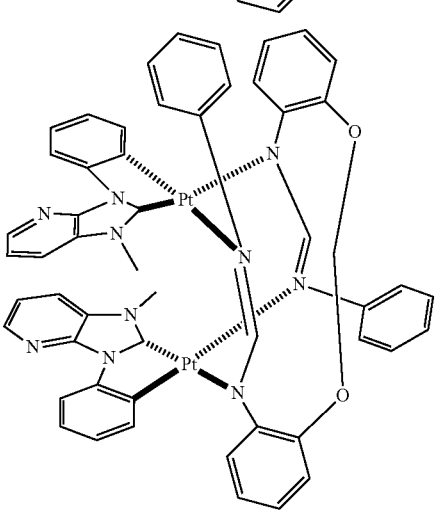
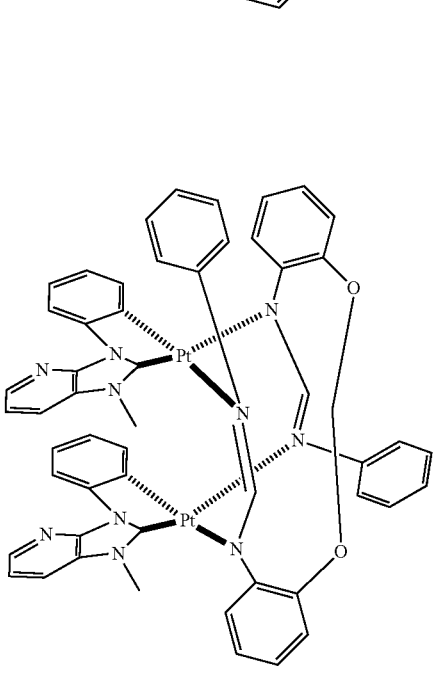

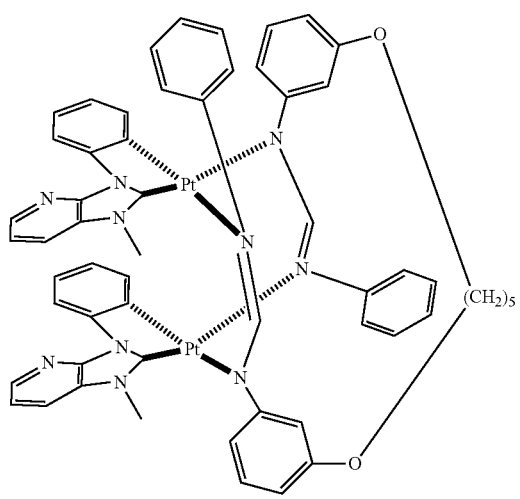
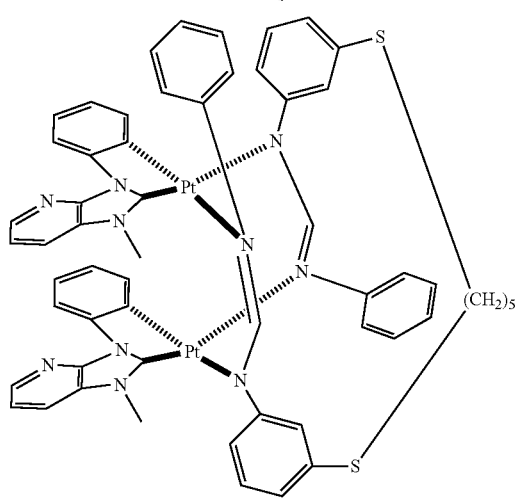
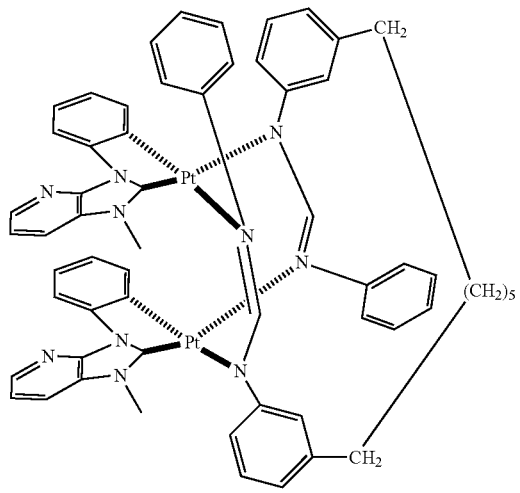
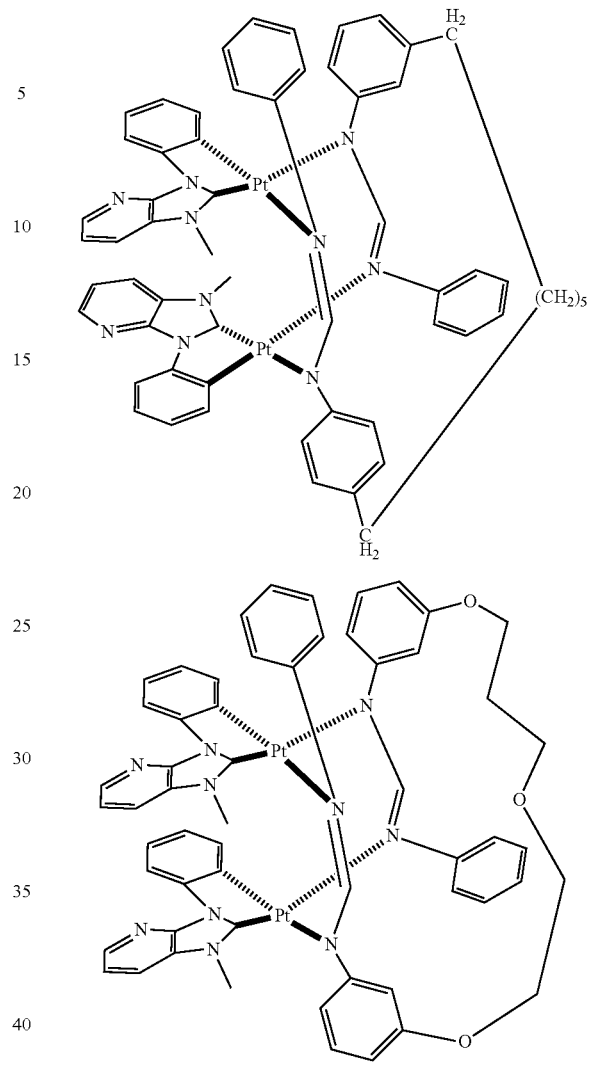
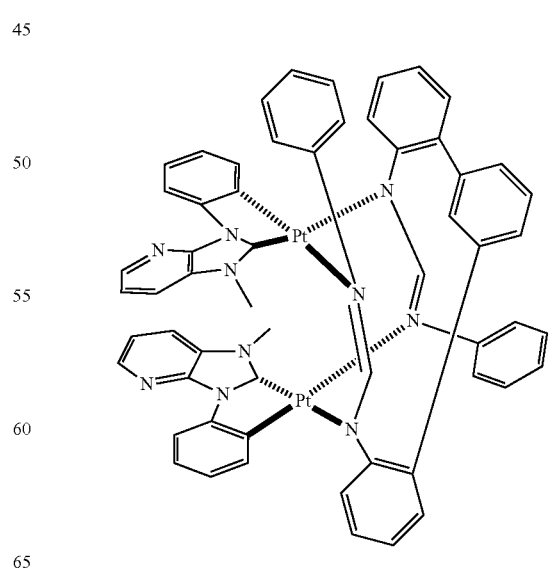

-continued

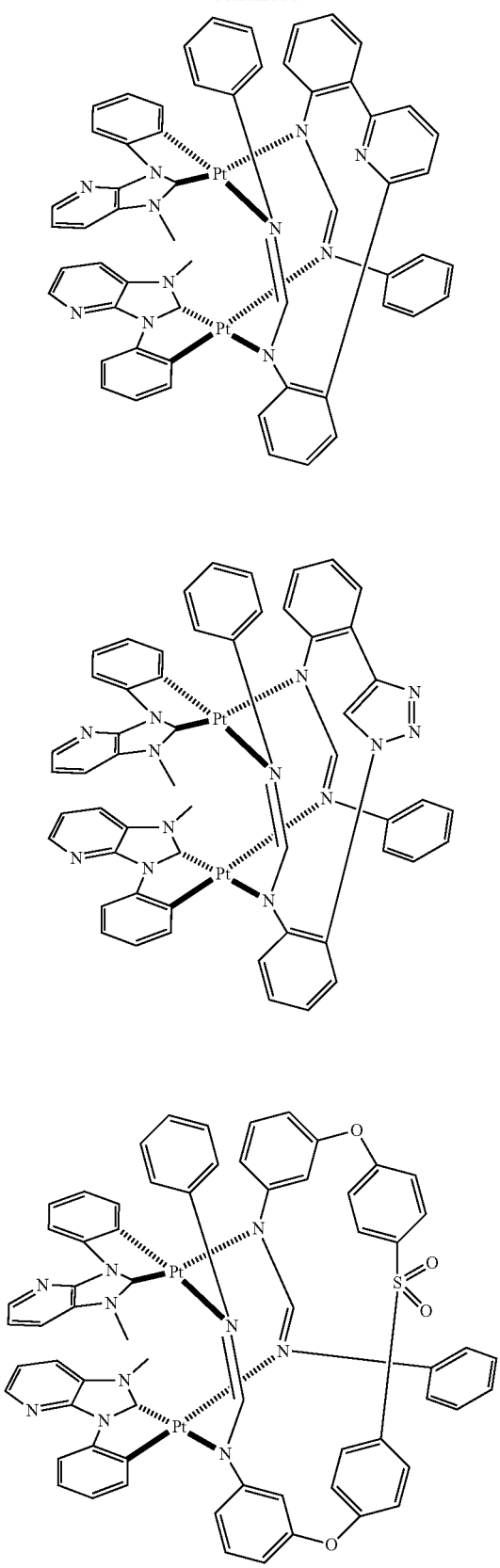

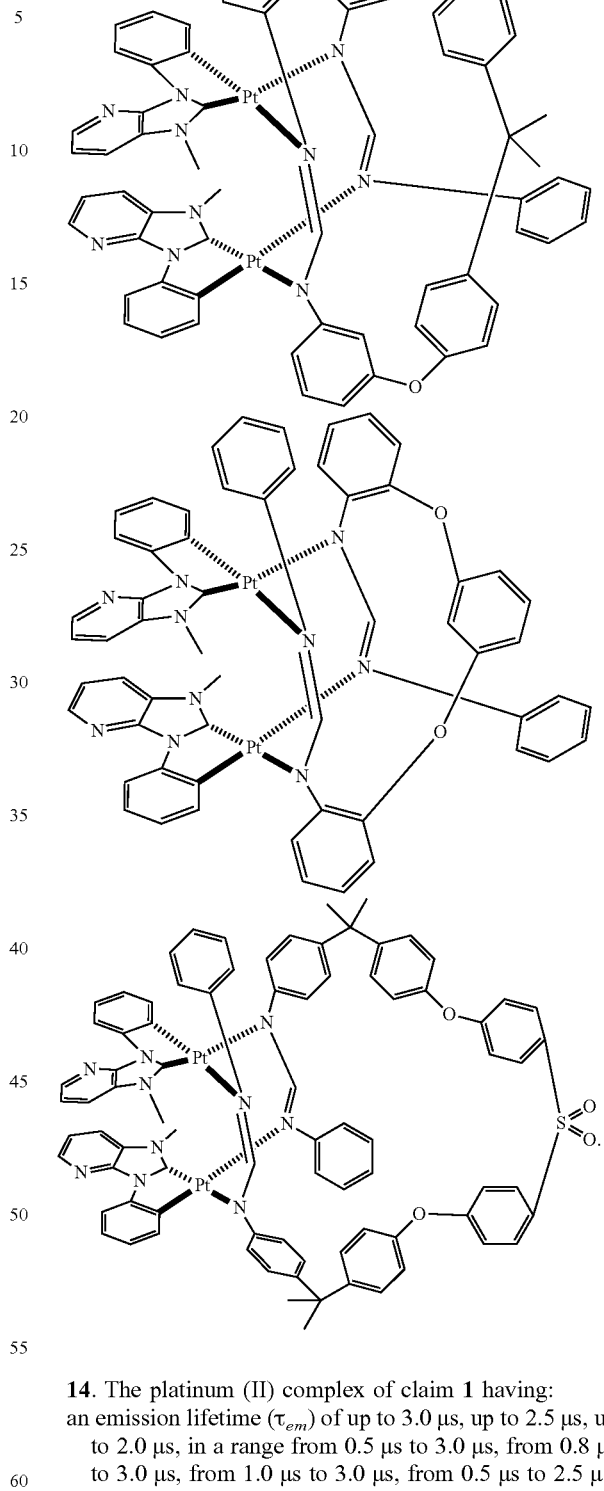

14. The platinum (II) complex of claim 1 having:
an emission lifetime ($\tau_{em}$) of up to 3.0 μs, up to 2.5 μs, up to 2.0 μs, in a range from 0.5 μs to 3.0 μs, from 0.8 μs to 3.0 μs, from 1.0 μs to 3.0 μs, from 0.5 μs to 2.5 μs, from 0.8 μs to 2.5 μs, from 1.0 μs to 2.5 μs, from 0.5 μs to 2.0 μs, from 0.8 μs to 2.0 μs, or from 1.0 μs to 2.0 μs, in solution or in films; or
a radiative decay rate ($k_r$) of at least $1.0 \times 10^5$ s$^{-1}$, at least $1.4 \times 10^5$ s$^{-1}$, in a range from $1.0 \times 10^5$ s$^{-1}$ to $25.0 \times 10^5$ s$^{-1}$, from $1.0 \times 10^5$ s$^{-1}$ to $20.0 \times 10^5$ s$^{-1}$, from $1.0 \times 10^5$ s$^{-1}$ to $15.0 \times 10^5$ s$^{-1}$, from $1.0 \times 10^5$ s$^{-1}$ to $12.0 \times 10^5$ s$^{-1}$, from $1.0 \times 10^5$ s$^{-1}$ to $10.0 \times 10^5$ s$^{-1}$, from $1.0 \times 10^5$ s$^{-1}$ to $8.0 \times 10^5$ s$^{-1}$, from $1.0 \times 10^5$ s$^{-1}$ to $6.0 \times 10^5$ s$^{-1}$, from $1.4 \times 10^5$ s$^{-1}$ to $25.0 \times 10^5$ s$^{-1}$, from $1.4 \times 10^5$ s$^{-1}$ to $20.0 \times 10^5$ s$^{-1}$, from $1.4 \times 10^5$ s$^{-1}$ to $15.0 \times 10^5$ s$^{-1}$, from $1.4 \times 10^5$ s$^{-1}$ to $12.0 \times 10^5$ s$^{-1}$, from $1.4 \times 10^5$ s$^{-1}$ to $10.0 \times 10^5$ s$^{-1}$, from $1.4 \times 10^5$ s$^{-1}$ to $8.0 \times 10^5$ s$^{-1}$, or from $1.4 \times 10^5$ s$^{-1}$ to $6.0 \times 10^5$ s$^{-1}$, in solution or in films; or an emission quantum yield ("QY") of at least 50%, at least 55%, at least 60%, at least 65%, at least 70%, in a range from 50% to 90%, from 55% to 90%, from 60% to 90%, from 50% to 80%, from 55% to 80%, or from 60% to 80%, in solution or in films, at room temperature; or a maximum emission wavelength ("$\lambda_{max}$") in a range from 600 nm to 760 nm, from 604 nm to 733 nm, from 600 nm to 700 nm, or from 700 nm to 1000 nm; or a full width at half maximum ("FWHM") of up to 270 nm, up to 250 nm, up to 200 nm, up to 180 nm, up to 160 nm, up to 145 nm, up to 135 nm, up to 120 nm, up to 110 nm, up to 100 nm, up to 90 nm, up to 80 nm, in a range from 50 nm to 270 nm, from 50 nm to 250 nm, from 50 nm to 200 nm, from 50 nm to 180 nm, from 50 nm to 160 nm, from 50 nm to 145 nm, from 50 nm to 110 nm, from 60 nm to 145 nm, from 60 nm to 110 nm, from 70 nm to 145 nm, or from 70 nm to 110 nm; or a combination thereof.

15. An organic light-emitting component comprising one or more light emitting layers, wherein the one or more light emitting layers comprise one or more platinum (II) complexes of claim 1, optionally wherein the organic light-emitting component is an organic light-emitting diode ("OLED") or a light-emitting electrochemical cell ("LEEC").

16. The organic light-emitting component of claim 15, wherein the one or more light emitting layers further comprise one or more host materials, and wherein the total concentration of the one or more host materials is greater than the total concentration of the one or more complexes in the one or more light emitting layers.

17. The organic light-emitting component of claim 16, wherein the total concentration of the one or more platinum (II) complexes in the one or more light emitting layers is up to 50 wt %, up to 40 wt %, up to 30 wt %, up to 20 wt %, at least 1 wt %, in a range from about 1 wt % to about 50 wt %, from about 1 wt % to about 40 wt %, from about 1 wt % to about 30 wt %, from about 1 wt % to about 20 wt %, from about 2 wt % to about 50 wt %, from about 2 wt % to about 40 wt %, from about 2 wt % to about 30 wt %, from about 2 wt % to about 20 wt %, from about 4 wt % to about 50 wt %, from about 4 wt % to about 40 wt %, from about 4 wt % to about 30 wt %, from about 4 wt % to about 20 wt %, from about 1 wt % to about 16 wt %, from about 2 wt % to about 16 wt %, from about 4 wt % to about 16 wt %.

18. The organic light-emitting component of claim 15 further comprising an anode, a cathode, a hole transport region, and an electron transport region,
wherein the hole transport region comprises a hole injection layer and/or a hole transport layer, and optionally an electron blocking layer,
wherein the electron transport region comprises an electron transport layer and/or an electron injection layer, and optionally a hole blocking layer,
wherein the light emitting layer is located in between the anode and the cathode,
wherein the hole transport region is located in between the anode and the light-emitting layer, and
wherein the electron transport region is located in between the cathode and the light emitting layer.

19. The organic light-emitting component of claim 15 having a current efficiency ("CE") at 1000 cd/m$^2$ of at least 18 cd/A, at least 20 cd/A, at least 25 cd/A, at least 30 cd/A, in a range from 18 cd/A to 60 cd/A, from 20 cd/A to 60 cd/A, from 25 cd/A to 60 cd/A, from 30 cd/A to 60 cd/A, from 18 cd/A to 50 cd/A, from 20 cd/A to 50 cd/A, from 25 cd/A to 50 cd/A, from 30 cd/A to 50 cd/A, from 18 cd/A to 40 cd/A, from 20 cd/A to 40 cd/A, from 25 cd/A to 40 cd/A, or from 30 cd/A to 40 cd/A; or a power efficiency ("PE") at 1000 cd/m$^2$ of at least 6 lm/W, at least 10 lm/W, at least 15 lm/W, at least 20 lm/W, at least 25 lm/W, in a range from 6 lm/W to 60 lm/W, from 10 lm/W to 60 lm/W, from 15 lm/W to 60 lm/W, from 20 lm/W to 60 lm/W, from 6 lm/W to 50 lm/W, from 10 lm/W to 50 lm/W, from 15 lm/W to 50 lm/W, from 20 lm/W to 50 lm/W, from 6 lm/W to 40 lm/W, from 10 lm/W to 40 lm/W, from 15 lm/W to 40 lm/W, from 20 lm/W to 40 lm/W, from 6 lm/W to 35 lm/W, from 10 lm/W to 35 lm/W, from 15 lm/W to 35 lm/W, from 20 lm/W to 35 lm/W, from 6 lm/W to 30 lm/W, from 10 lm/W to 30 lm/W, from 15 lm/W to 30 lm/W, or from 20 lm/W to 30 lm/W; or an external quantum efficiency ("EQE") at 1000 cd m$^{-2}$ of at least 10%, at least 11%, at least 12%, at least 13%, at least 14%, at least 15%, in a range from 10% to 40%, from 10% to 20%, from 10% to 20%, from 11% to 40%, from 11% to 30%, from 11% to 20%, from 12% to 20%, from 12% to 40%, from 12% to 30%, from 13% to 20%, from 13% to 40%, from 13% to 30%, from 14% to 20%, from 14% to 40%, from 14% to 30%, from 15% to 40%, from 15% to 30%, or from 15% to 20% for a single layer of the platinum (II) complexes; or a LT95 at 1000 cd/m$^2$ of at least 9000 h, at least 9300 h, or at least 9500 h, or wherein the one or more platinum (II) complexes have a $\lambda_{max}$ in a range from 700 nm to 1000 nm and the organic light-emitting component has a LT95 at 1000 cd/m$^2$ of at least 1000 h, at least 1500 h, or at least 2000 h; or a combination thereof.

20. A device comprising one or more organic light-emitting components of claim 15, wherein the device is a stationary visual display unit, a mobile visual display unit, an illumination device, a wearable device, or a medical monitoring device.

21. The platinum (II) complex of claim 1, wherein at least one ------ of Formula III', at least one ------ of Formula IV, the ------ of Formula III", and the ------ of Formula IV' are independently a bond, a substituted or unsubstituted alkyl, a substituted or unsubstituted alkenyl, a substituted or unsubstituted alkynyl, a substituted or unsubstituted aryl, a substituted or unsubstituted polyaryl, a substituted or unsubstituted heteroaryl, a substituted or unsubstituted polyheteroaryl, a substituted or unsubstituted heterocyclyl, an alkoxy, an aroxy, an ether, a polyether, a sulfonyl, or a thioether.

22. The platinum (II) complex of claim 1, wherein at least two of $Y_1'$-$Y_4'$ are $NR_{18}$.

* * * * *